US012808315B2

(12) United States Patent
Stoltz et al.

(10) Patent No.: US 12,808,315 B2
(45) Date of Patent: Nov. 24, 2026

(54) AFTERTREATMENT HEATER POWER ELECTRONICS

(71) Applicant: Eaton Intelligent Power Limited, Dublin (IE)

(72) Inventors: Thomas Joseph Stoltz, Allen Park, MI (US); Viken Rafi Yeranosian, Farmington Hills, MI (US); Sarah Elizabeth Behringer, Redford, MI (US); Elizabeth Jane Mercer, West Bloomfield, MI (US); Nicole Downing, Ferndale, MI (US); James E. McCarthy, Jr., Kalamazoo, MI (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 0 days.

(21) Appl. No.: 18/946,458

(22) Filed: Nov. 13, 2024

(65) Prior Publication Data

US 2025/0067204 A1 Feb. 27, 2025

Related U.S. Application Data

(63) Continuation of application No. 17/645,626, filed on Dec. 22, 2021, now Pat. No. 12,152,523.

(Continued)

(51) Int. Cl.

| | |
|---|---|
| ***F01N 3/20*** | (2006.01) |
| ***B60L 1/02*** | (2006.01) |
| ***B60L 1/12*** | (2006.01) |
| ***B60R 16/03*** | (2006.01) |
| ***F01N 9/00*** | (2006.01) |

(Continued)

(52) U.S. Cl.

CPC ................ *F01N 3/208* (2013.01); *B60L 1/02* (2013.01); *B60L 1/12* (2013.01); *B60R 16/03* (2013.01); *F01N 9/00* (2013.01); *F01N 11/002* (2013.01); *H05K 7/20909* (2013.01);

(Continued)

(58) Field of Classification Search

None

See application file for complete search history.

(56) References Cited

U.S. PATENT DOCUMENTS 4,482,008 A * 11/1984 Nomaguchi ............ F25B 13/00 62/509

5,093,583 A 3/1992 Mashino et al.

(Continued)

OTHER PUBLICATIONS

Office Action issued in U.S. Appl. No. 18/946,290, mailed Feb. 13, 2026, 30 pages.

(Continued)

*Primary Examiner* — Daniel L Greene

(74) *Attorney, Agent, or Firm* — Talem IP Law, LLP

(57) ABSTRACT

An aftertreatment system of a vehicle includes an electric heater device; a power converter structured to provide power to the electric heater device, the power converter including at least one phase converter, each phase converter including: a first plurality of switching devices coupled together in parallel; and a second plurality of switching devices coupled together in parallel, wherein the second plurality of switching devices is coupled in series with the first plurality of switching devices, and wherein a number of the first plurality of switching devices is different from a number of the second plurality of switching devices.

20 Claims, 81 Drawing Sheets

Related U.S. Application Data

(60) Provisional application No. 63/189,212, filed on May 16, 2021, provisional application No. 63/189,213, filed on May 16, 2021.

(51) Int. Cl.
*F01N 11/00* (2006.01)
*H05K 7/20* (2006.01)

(52) U.S. Cl.
CPC .... *F01N 2610/105* (2013.01); *F01N 2900/04* (2013.01); *F01N 2900/1811* (2013.01)

(56) References Cited

U.S. PATENT DOCUMENTS

| | | | | |
|---|---|---|---|---|
| 5,985,222 | A | 11/1999 | Sudduth et al. | |
| 7,548,042 | B2 * | 6/2009 | Fassnacht | H02J 7/1492 323/265 |
| 10,288,017 | B1 | 5/2019 | Romanato | |
| 2006/0150959 | A1 * | 7/2006 | Prust | F02N 19/04 123/549 |
| 2008/0028753 | A1 * | 2/2008 | Wagner | F01N 3/0238 60/295 |
| 2010/0123441 | A1 | 5/2010 | Kim et al. | |
| 2010/0201293 | A1 | 8/2010 | Yoshida et al. | |
| 2011/0061373 | A1 | 3/2011 | Zimmerman et al. | |
| 2012/0003131 | A1 * | 1/2012 | Ibrahim | B01D 46/58 422/177 |
| 2016/0118895 | A1 | 4/2016 | Mahmoudi et al. | |
| 2017/0256104 | A1 | 9/2017 | Pradun et al. | |
| 2017/0342947 | A1 * | 11/2017 | Tonkin | F02M 31/13 |
| 2022/0243631 | A1 | 8/2022 | Swart | |
| 2023/0146546 | A1 * | 5/2023 | Marcinkiewicz | H02P 29/68 62/115 |
| 2023/0268844 | A1 * | 8/2023 | Menzi | B60L 53/22 363/13 |

OTHER PUBLICATIONS

Office Action issued in U.S. Appl. No. 18/946,570, mailed Feb. 12, 2026, 24 pages.

Extended European Search Report issued in EPO Application No. 26168056.5, mailed Jun. 10, 2026, 10 pages.

* cited by examiner

Example P2.5 Air-Cooled

Mechanical & Electrical Architecture:

FIG. 51
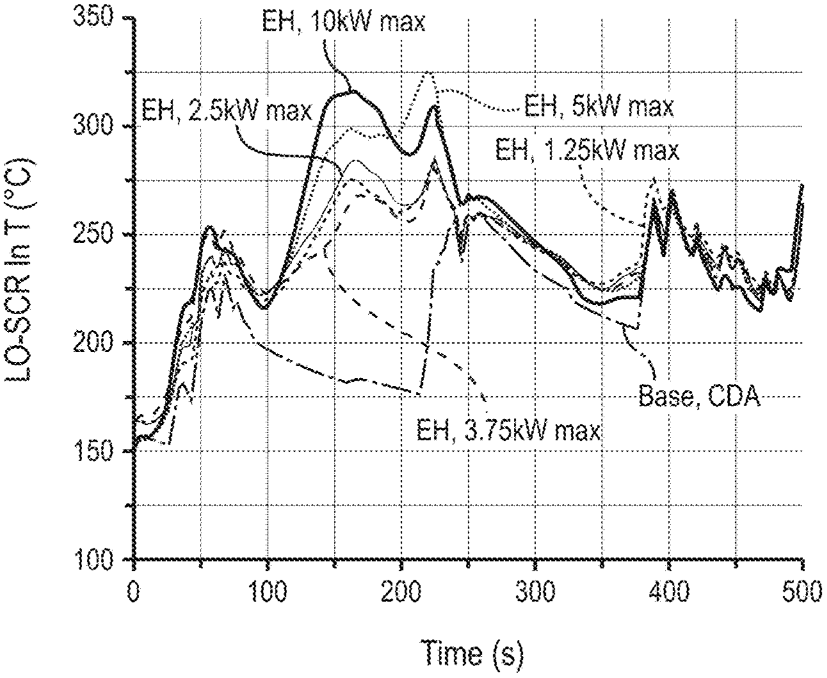
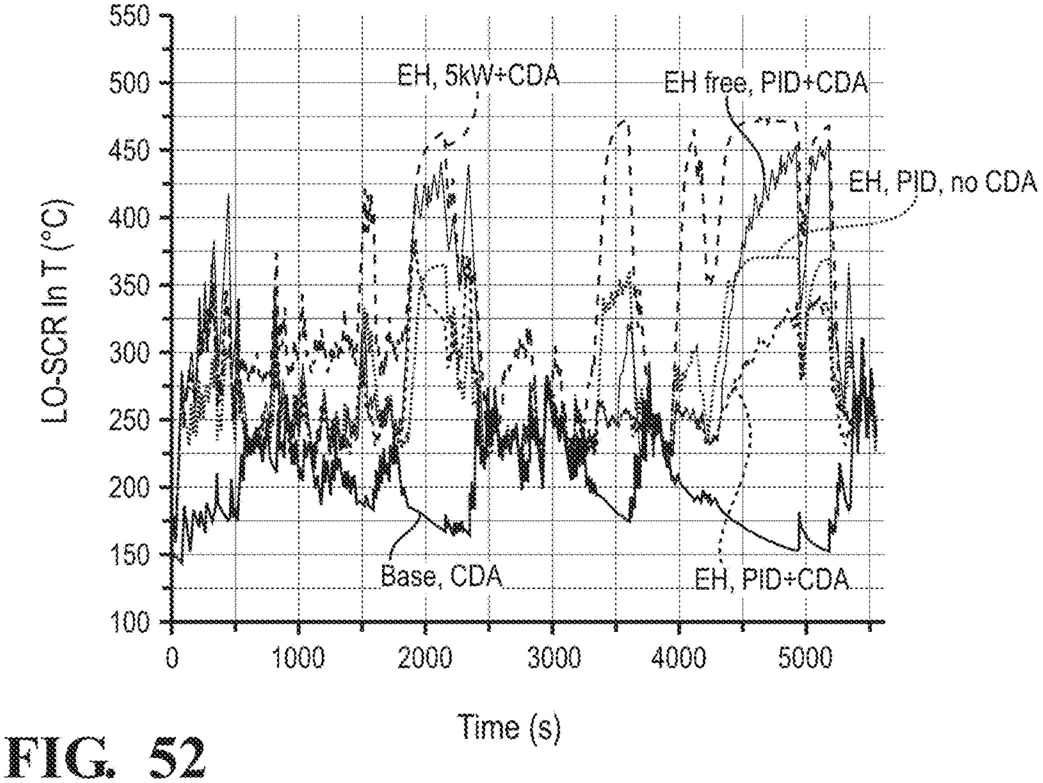
FIG. 52

FIG. 53
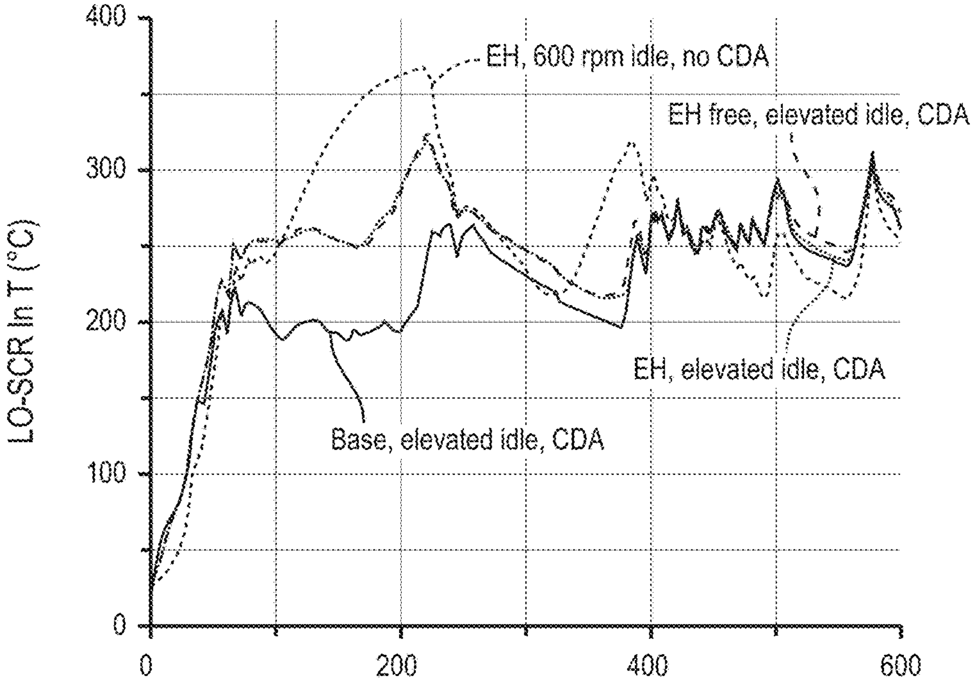
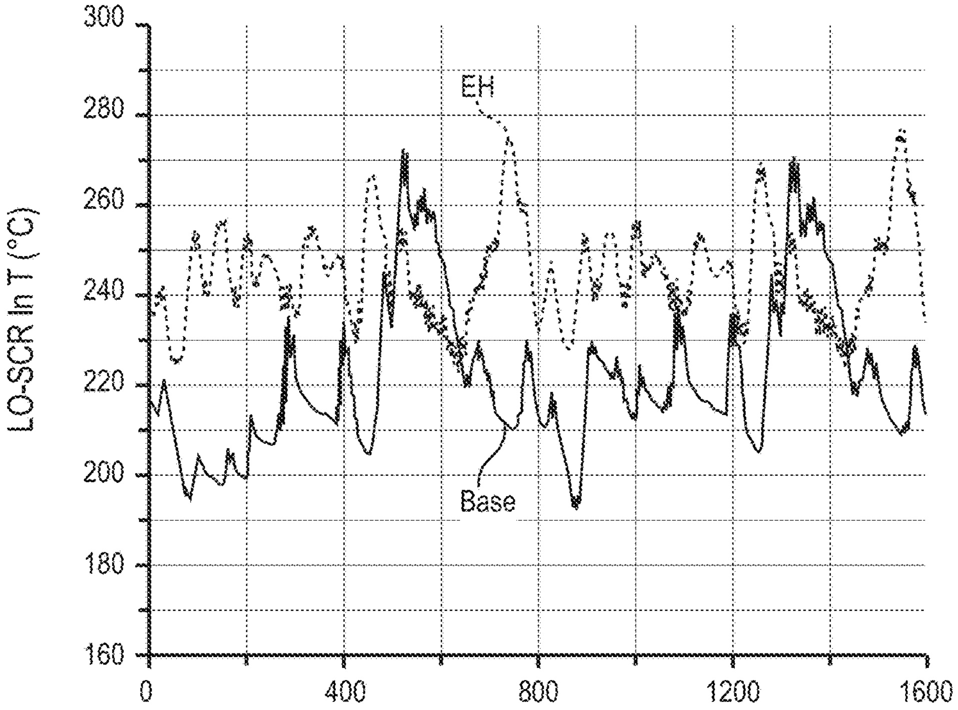
FIG. 54

FIG. 55
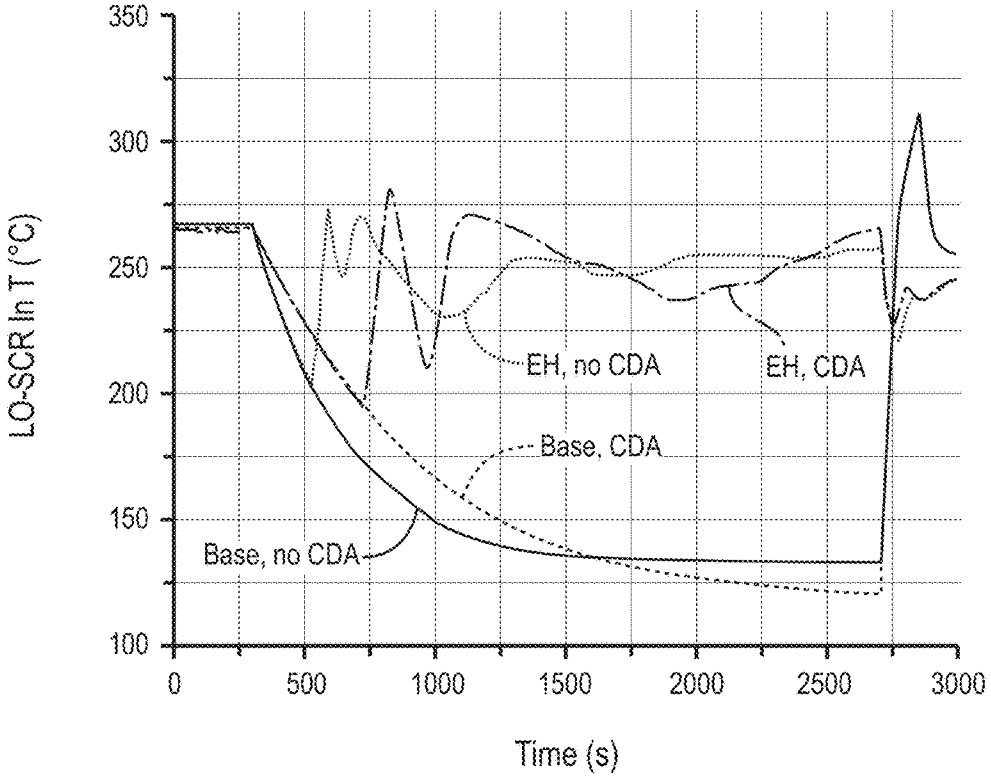
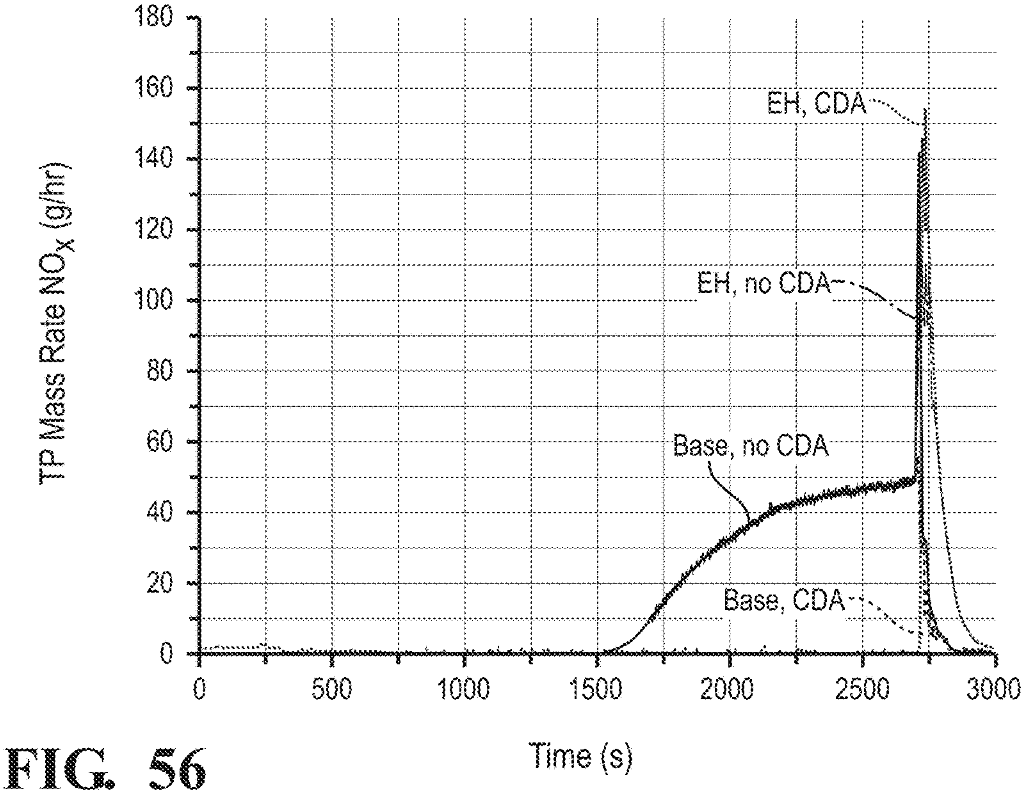
FIG. 56

AFTERTREATMENT HEATER POWER ELECTRONICS

CROSS REFERENCE TO RELATED APPLICATIONS

This application is a continuation of U.S. application Ser. No. 17/645,626, filed Dec. 22, 2021, which claims priority to U.S. Provisional Patent Application Ser. No. 63/189,213, filed May 16, 2021, and U.S. Provisional Patent Application Ser. No. 63/189,212, filed May 16, 2021.

All of the foregoing patent applications are incorporated herein by reference in their entirety.

SUMMARY

An aftertreatment system of a vehicle includes an electric heater device; a power converter structured to provide power to the electric heater device, the power converter including at least one phase converter, each phase converter including: a first plurality of switching devices coupled together in parallel; and a second plurality of switching devices coupled together in parallel, wherein the second plurality of switching devices is coupled in series with the first plurality of switching devices, and wherein a number of the first plurality of switching devices is different from a number of the second plurality of switching devices.

BACKGROUND

Contemporary vehicles using internal combustion engines are subject to significant and increasing emissions regulation. Many vehicles utilize aftertreatment systems to reduce emissions, for example reducing NOx, CO, unburned hydrocarbons, particulate matter, or the like. Many aftertreatment systems utilize catalyzed components, or other components that have a minimum operating temperature before they are effective. Additionally, ongoing regulation changes are making aftertreatment configurations more complex, and even more sensitive to operating periods where the aftertreatment temperature is below the operating temperature, such as after a cold start operation or during an extended idle operation. Presently known systems to address these issues suffer from a number of drawbacks, including having components for powering a heater that have a lower service life than the extended service life expected for commercial and/or passenger vehicles, providing components capable to power a wide range of heaters with varying capabilities, and operating high powered electrical components without disturbing vehicle operations.

BRIEF DESCRIPTION OF THE FIGURES

The disclosure and the following detailed description of certain embodiments thereof may be understood by reference to the following figures:

FIG. 51 depicts data for different modes of electric heater operation;

FIG. 52 depicts illustrative emissions data for a low-load cycle;

FIG. 53 depicts illustrative emissions data for an example drive cycle cold start operation;

FIG. 54 depicts engine and emissions data for a beverage delivery vehicle;

FIG. 55 depicts illustrative data from a stay hot test;

FIG. 56 depicts summary illustrative data from a stay hot test;

DETAILED DESCRIPTION

Figure 1:
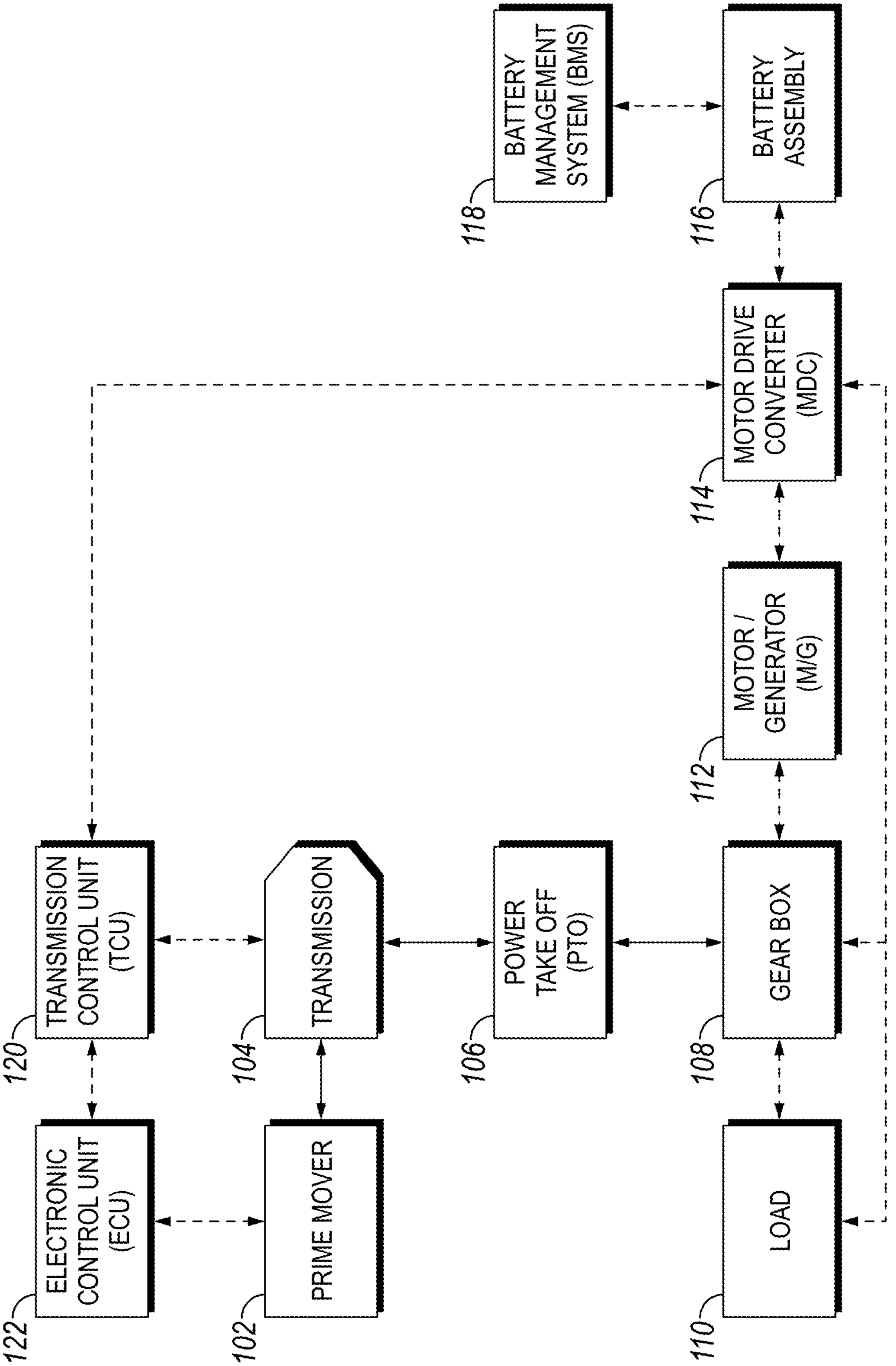
FIG. 1 depicts a top-level schematic block diagram for an electrically regenerative accessory drive in an embodiment of the present disclosure.

Embodiments herein disclose electric heater arrangements for aftertreatment heating in a system including an internal combustion engine. Internal combustion engines generate various emissions as a consequence of operation. Significant emissions include NOx (NO, and/or NO2, generated from high temperatures in the combustion cylinder reacting nitrogen and oxygen from air present in the cylinder), unburned fuel (generally hydrocarbons), and/or soot (larger particles formed during combustion, often aromatic or polycyclic carbon and/or hydrocarbon compounds). In addition to reduction of these emissions through various engine technologies, such as adjusting combustion characteristics, fuel injection characteristics, intake and/or exhaust valve timing, and the like, many systems include aftertreatment components configured to reduce various emissions before final exhaust to the environment. Example and non-limiting aftertreatment components include oxidation catalysts (e.g., a diesel oxidation catalyst, or DOC), soot filters, and selective catalytic reduction (SCR) components. Component elements may be combined (e.g., a 3-way catalyst, 4-way catalyst, combined catalyst/filter, etc.), and in certain embodiments components may be divided and/or multiple versions of a component may be included. For example, two separate components may be included in parallel (e.g., to manage exhaust flow rates through components), in series (e.g., to allow differential operations on each component, compositions or configurations of components, limit component maximum sizing, utilize standard sizing, etc.). Additionally, CO2 generated by operations are released to the atmosphere, contributing to overall atmospheric CO2 and greenhouse gas levels. CO2 is generated as a normal byproduct of combustion, but it is desirable to reduce CO2 emissions to the extent possible, both to reduce CO2 emitted and to promote the utilization of as much fuel energy as possible for useful work rather than parasitic energy streams such as noise or heat. Many aftertreatment components depend upon proper operating temperatures for those components to function optimally, where operation outside the proper operating temperature can result in increased emissions (e.g., release rather than conversion of the emission component) and reduced fuel economy (and therefore increased CO2 emissions).

Certain operating regions of the internal combustion engine cycle contribute significantly to the overall emissions of the system, for example initial operations after a cold start, and/or operations during challenging duty cycle operations such as start/stop operations, engine idling operations, and/or extended operations at a low load. Accordingly, temperature assistance for the aftertreatment system, or portions thereof, are utilized to reduce the impact of challenging operating regimes on overall emissions and $CO_2$ production of the system. However, previously known aftertreatment temperature assistance systems suffer from a number of drawbacks and challenges. For example, an aftertreatment temperature assistance system may only need to operate during a limited number of operating conditions, but may need to be high capability systems (e.g., heating a significant mass of air and/or aftertreatment substrate in a short period of time). Accordingly, it is desirable to provide high capability systems that have a low impact on the overall system cost, capability, and/or integration impact (e.g., installation space, weight, power consumption, and/or supporting systems such as cooling, electrical grounding, interfaces to the rest of the vehicle system, etc.). Additionally, a number of coupled system interactions lead to a desire for flexibility in the aftertreatment temperature assistance system for reduced design impact—for example the sizing of components, operating temperature regime of the components, thermal mass of heated components, air flow rates (and/or heated air mass) of the exhaust system (including during operating regimes of interest), availability and/or desirability of other temperature assistance systems (e.g., cylinder deactivation systems, injection of hydrocarbons in the exhaust for temperature generation, temperature-generating combustion operations such as very late injection and/or combustion capability, and/or residual exhaust mass control in the cylinder), and/or the positioning of aftertreatment components (e.g., the distance of a component from the engine, the environmental position of the component within the vehicle, etc.) lead to a high variability in the temperature assistance that will be utilized for the particular vehicle. Further, a small change or variability in any of these aspects can lead to a high degree of variability in the desired temperature assistance. Further still, the arrangement of the vehicle system may be optimized for other considerations outside of the temperature assistance system—for example the ordering and arrangement of aftertreatment components may be provided that is considered apart from an electric heater, with the electric heater positioned in an available location but possibly not the best location for heating to occur. Additionally, a change in the heating time constraint (e.g., 30 seconds to temperature versus 90 seconds to temperature), which may be determined relatively late in the design cycle, can lead to dramatic differences in the temperature assistance capability required for the vehicle system.

Accordingly, vehicle systems having a relatively small difference in configurations, and/or a minor change in the design of a vehicle system, which may occur late in a design cycle for the vehicle system, can lead to a large difference in temperature assistance capability requirements. Example systems herein provide for a flexible capability for the aftertreatment temperature assistance capability, with relatively small differences in the footprint (e.g., component size, integration differences, and/or interface differences), allowing for a range of capabilities that can be implemented with a low impact to the vehicle design and that can be responsive to changes in the vehicle design between otherwise similar vehicles and/or due to changes in the vehicle design that may occur late in a design cycle.

The overall capability requirements for a temperature assistance system can vary significantly between vehicle designs. For example, in a system where only a single aftertreatment component having a small mass requires heating support to only moderate temperatures, a small capability system may be sufficient, for example a 1.0 kW or 2.5 kW electric heater. By contrast, a system having multiple components that require heating support to higher temperatures, and/or where an intervening component is between an electric heater and the target component to be heated (e.g., a DOC that may not require heating support is positioned between the electric heater and an SCR component that may require heating support), may require a high capability electric heater (e.g., a 5 kW heater, a 10 kW heater, a 25 kW heater, etc.).

The resistor element may be sized to provide a desired power rating at a reduced (but still acceptable) voltage—e.g., 10 KW at 36V (or 30V, etc.) at the 48V nominal. Otherwise, a lower power capability could be accepted at lower (but still nominal) voltages. For example, at one resistance (0.230 Ohms), the voltage and current at 10, 5, and 2.5 KW, respectively, are: 48V and 208 Amps, 33.9V and 147 Amps, and 24V and 104 Amps. When the resistance is doubled to 0.461 Ohms, the voltage and current at 10, 5, and 2.5 kW, respectively, are: 67.9V and 147 Amps, 48V and 104 Amps, and 33.94V and 74 Amps. When the resistance is quadrupled to 0.922 Ohms, the voltage and current at 10, 5, and 2.5 kW, respectively, are: 96V and 104 Amps, 67.9V and 74 Amps, and 48V and 52 Amps.

In embodiments, the specific order of catalyst blocks, their sizing, and loading in exhaust systems may be variable, however, exhaust systems will typically require supplemental heat at light engine load, such as when the engine is first started until the SCR (selective catalytic reduction) can successfully reduce NOx and/or when the engine status is idle or at fuel cut out motoring or other light load conditions where the exhaust temperature is below the effective temperature of the SCR in converting NOx. In an example, in a 48V electric system, the amount of heat input required to maintain the SCR efficacy in converting NOx in a diesel system (e.g., commercial vehicles) may range from 2.5 kW to 25 kW.

Referring to FIG. 1, an embodiment functional block diagram is provided for a power takeoff (PTO) device configured with a prime mover 102 (e.g., an internal combustion engine) coupled with a transmission 104. An electronic control unit (ECU) 122 may provide control functions to the prime mover 102 and a transmission control unit (TCU) 120 may provide control functions to the transmission 104. In embodiments, the PTO device may include a motor/generator (M/G) 112 and a load 110 (e.g., an HVAC system) drivingly coupled by a gear box 108 that is further drivingly coupled to the transmission 104 through the PTO device 106. The motor/generator 112 is provided drive and control signals from a motor drive converter (MDC) 114 that is powered by a battery assembly 116 (e.g., with 48v and 12v supply voltages). The battery assembly 116 may be managed by a battery management system (BMS) 118. The description including various controllers 122, 120, 114 is a non-limiting example, and control functions of a system may be distributed in any manner. In certain embodiments, control functions described throughout the present disclosure may be present in an engine controller, transmission controller, vehicle controller (not shown), a motor drive controller 114, and/or distributed among various devices. In certain embodiments, control functions described throughout the present disclosure may be performed, at least in part, in a separate controller remote from the vehicle—for example from a controller at least intermittently in communication with the vehicle, in a service tool, in a manufacturing tool, and/or on a personal device (e.g., of an operator, owner, fleet personnel, etc.).

Figure 2:
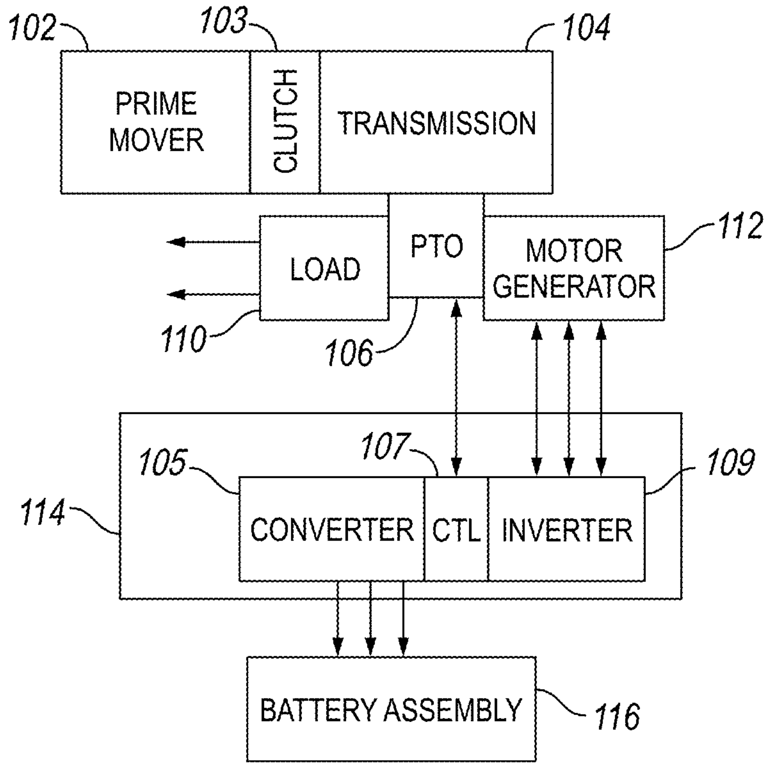
FIG. 2 is a functional block diagram for an electrically regenerative accessory drive in an embodiment of the present disclosure.

Referring to FIG. 2, a schematic block diagram of a PTO device is presented. Here, the prime mover 102 (e.g., engine) is drivingly coupled to the transmission 104 through a clutch 103. The motor/generator 112 selectively couples to the load 110 and to the transmission 104 via a torque coupling (e.g., PTO 106, which may include gear box 108). The MDC 114 is shown as including a DC-to-DC converter 105, a controller 107, and an inverter 109, where the converter 105 provides control signals to the battery assembly 116, the controller 107 provides control signals to the PTO 106, and the inverter 109 provides phased power to the motor/generator 112.

In embodiments, a PTO device coupled with a transmission 104 and prime mover 102 may support different modes of operation, such as cruise mode (e.g., accessories driven by an engine), motive load mode (e.g., accessories driven by wheels in an engine-off down-grade condition of travel), sleep mode (e.g., motor/generator operating as motor drives an HVAC with the engine off), crank mode (e.g., starting engine from the motor/generator operating as a motor, such as with a low PTO gear needed for crank-torque), creep mode (e.g., motor/generator operating as motor drives truck in low-PTO precision backing (e.g., 0-2 mph)), and the like. It will be understood that mode names are provided for clarity of description, and are not limiting to the present disclosure. Additionally or alternatively, in certain embodiments and/or in certain operating conditions, the arrangements and/or configurations of the driveline (e.g., engine, transmission, and/or wheels) may not be known to the PTO device, and/or may not be important to the PTO device. For example, in the example cruise mode and motive load mode, the driveline provides power for the shared load 110, and the PTO device may be arranged to transfer power from the driveline to the load 110 in either of these modes. In certain embodiments, the PTO device may perform distinct operations in a mode even where the power transfer arrangements are the same, and the arrangements and/or configurations of the driveline may be known and considered by the PTO device (and/or a controller of the PTO device). For example, the PTO device may have a controller configured to determine the amount of time the vehicle operates in the cruise mode relative to the motive load mode, and accordingly the controller may make duty cycle determinations, battery charging determinations, or perform other operations in response to the time spent in each mode.

In another example, the motor/generator 112 can be switched from the motoring mode to the generating mode as soon as the engine starts (e.g., reaches a start speed, reaches an idle speed, and/or begins fueling). Accordingly, the motor/generator 112 can directly dampen the engine speed excursion and reduce the tendency of the motor/generator 112 to overspeed. Additionally, energy harvested from the engine on startup can be stored in the battery assembly 116. Any or all of the described overspeed control operations and/or aspects may be included in a particular system.

For the startup sequence of a prime mover 102 having a PTO device integrated therewith, the starter and/or the alternator may be removed and replaced by the PTO device components (e.g., load 110, gearbox 108, motor/generator 112, and the like). In the traditional production system, starting is controlled through a network of relays, which could be cumbersome to control all of the available operating modes for the PTO device, so the PTO device sequence, operating states, and other state control functions may be managed through a networked communication system. For example, a general engine start sequence may be as follows: (1) a driver turns the key to an ignition position, (2) ECU 122, TCU 120, and MDC 114 are turned on, (3) the driver turns the key to a start position, (4) control units check for the system being ready to start (e.g., the TCU 120 checks that transmission is in neutral and broadcasts over network, ECU 122 checks that the engine is ready to start and broadcasts over the network, and the like), (5) engine is started (e.g., MDC 114 cranks engine, ECU 120 starts fueling and controlling the engine, and the like), and (6) the driver returns the key to the ignition position. The PTO device may include a shift control override, such as where the transmission cannot be shifted with PTO load on the countershaft. For example, before each shift, the TCU 120 commands the MDC 114 to bring the motor shaft to zero torque. The PTO device may include a sleep mode and wake mode, such as where the load 110 (e.g., HVAC compressor) can be enabled with the engine off.

In embodiments, the motor drive converter (MDC) 114 may be a combined motor drive and DC-DC converter intended to support electrification of vehicles, such as using a multi-rail 48 V/12 V architecture. The motor drive supports starter and generator operation of a motor/generator 112 (e.g., a permanent magnet synchronous motor, wire-wound synchronous motor, induction motor, and the like) and the DC-DC converter bridges system voltages (e.g., a 48V system and a 12V system with bidirectional power flow). Motor position information is provided from a sensor in the motor/generator 112, such as fed to a field-oriented control algorithm running on a processor in the MDC 114. The MDC 114 may provide for continuous and peak power (e.g., 10 kW peak/5 kW continuous power), such as providing transient 10 kW power (e.g., 30 seconds) during crank mode, continuous 5 kW power during cruise mode in flat road conditions (e.g., split between the 48V sub-system and the DC-to-DC converter sub-system), continuous 3 kW continuous power during sleep mode, and the like. The MDC enclosure may be configured to efficiently dissipate heat, such as being made of an aluminum heatsink. The assembled MDC 114, when mated with electrical connectors, may provide ingress protection for the internal components, as well as oleophobic and hydrophobic protection, such as with a vent to reduce structural loads on the enclosure when exposed to altitude and temperature gradients.

A system can be configured for any motor/generator 112 having sufficient torque (with appropriate gear ratios) and power capability (e.g., a function of the torque multiplied by the speed) to perform the desired interactions with the load and the driveline, and to support the desired operating modes of the PTO device. Certain further considerations for the motor/generator 112 and/or the battery assembly 116 include, without limitation: the required power levels; the driveline speeds at various operating conditions; the time and power output of the sleep mode; the availability to regenerate the battery assembly 116 away from the sleep mode; crank requirements (torque, time, temperature, and speed slew rate or trajectory); the efficiency profile of the motor/generator 112 at various speed and torque values; the cost in components, integration, and design for the provision of multiple gear ratios; and the durability and life expectations of the motor/generator 112.

In certain embodiments, characteristics of the motor/generator 112 beyond just the torque and speed considerations may be valuable for certain embodiments, and may be less desirable for other embodiments. For example, a permanent magnet motor may have higher efficiency at certain operating conditions, but may be higher cost, higher inertial torque, and lower torque capability. A permanent magnet motor may be capable of high speed operation, but may generate undesirable EMF on the motor phase lines. In another example, an externally excited motor may have lower operating efficiency, but have a low cost and the ability to selectively disable the rotor field, minimizing drag torque during no load operation. In another example, an induction motor may have a medium efficiency and high torque capability, but have higher cost, size, and weight compared to an externally excited motor. The capabilities of a particular motor further depend on the specific design, so these criteria may be different for motors of these types depending upon the specific design. Additionally or alternatively, certain aspects such as expected bearing life, brushes, control of rotating torque (e.g., a disconnecting clutch and/or capability to turn off the magnetic field), and/or maintenance requirements may make a particular motor favored or disfavored for a particular system.

In certain embodiments, depending upon the desired operating modes, it may be desirable that a PTO device has an extended lifetime. For example, in certain embodiments, the PTO device, and the motor/generator 112 specifically, operates both during the day (e.g., regenerating the battery assembly 116 and/or recovering motive power) and during the night (e.g., providing climate control and powering personal devices in the sleep mode). Accordingly, the usage of the PTO device over a given period of the vehicle operating cycle may be higher than other accessories on the vehicle. Accordingly, robustness of typical failure components such as bearings may be a strong consideration for system design. Additionally, temperature control of components and/or reduced operating speeds (e.g., through gear ratio selections and/or additional gear options) for the PTO device may have particular value for certain embodiments.

Incorporation of a PTO device having a motor/generator 112 system into a traditional production electrical system may include changes to the electrical system, such as conversion of power distribution from a 12V system to a 12V/48V system, removal of the starter and alternator, restructuring the startup sequence, control of accessory and ignition modes, and the like. In embodiments, a networked communication system (e.g., Controller Area Network (CAN)) may provide for communications amongst PTO electrical components, such as with the ECU 122, TCU 120, and the like.

The MDC 114 may include DC power input signals from the battery assembly 116 (e.g., DC Ground, 12V DC, 48V DC), AC power phased output signals to the motor/generator 112 (e.g., 48-VAC 3-phases), communications signals (e.g., motor communications, PTO communications, truck communications, and the like). The location of the MDC 114 may be near to both the transmission 104 and battery assembly 116 to minimize heavy cabling and voltage drop in the system. For example, the MDC 114 may be located on a surface of battery box of the battery assembly 116. In certain embodiments, the MDC 114 may be distributed and have certain aspects located throughout the system.

Power distribution may be configured to run off one or more configurations of the battery assembly 116, such as banks of 12V batteries, separate 12V and 48V batteries, and the like. For example, the battery assembly 116 may be configured as a battery pack of four 12V batteries in series, providing a 48V power interface. The battery assembly 116 may further include a quarter-tapped 12V power interface providing for the 12V power. Communications to the MDC 114 may include motor speed (e.g., provided by the motor and/or a speed sensor), communications with a system (e.g., providing auxiliary I/O, temperatures, etc.), and/or communications with a vehicle (e.g., providing vehicle state information, keyswitch signal, CAN communications, or the like), and communications between the MDC 114 and the motor 112 (e.g., three-phase AC power from controlled inverters on the MDC 114).

Figure 5:
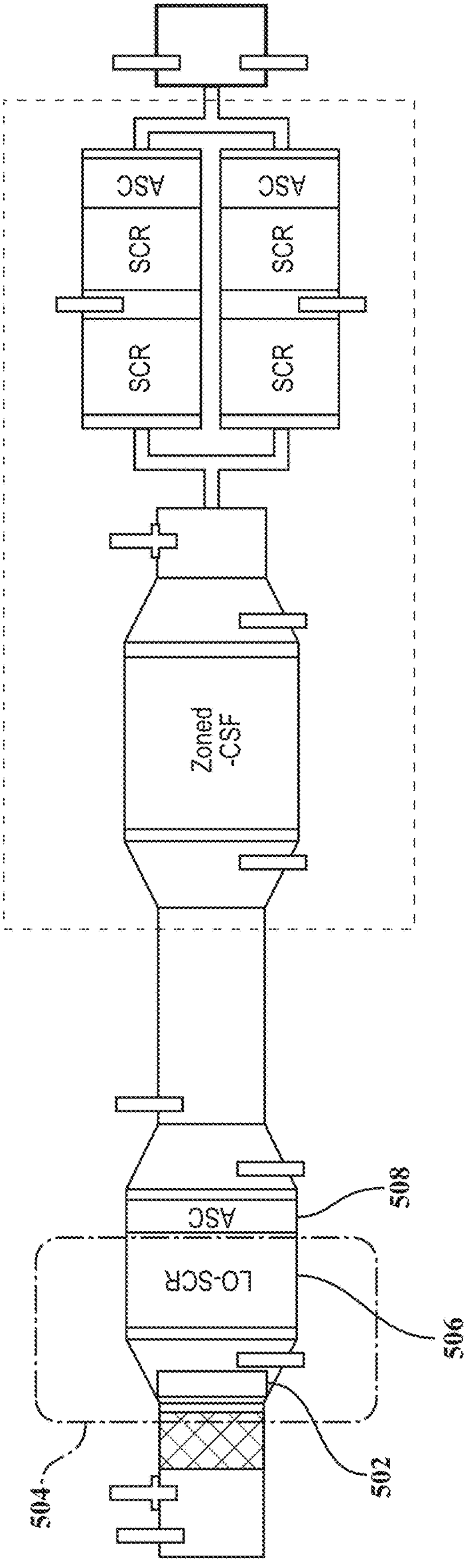
FIG. 5 depicts a block diagram of exhaust treatment configuration having an electric heater upstream of LO_SCR.

For example, FIG. 5 depicts an electric heater 502 situated upstream of a close-coupled SCR catalyst 506 (LO-SCR). The system in FIG. 5 may be designed to operate at a number of peak power ratings, such as 5 KW, 2.5 kW, 10 KW, and the like. In this example, for power electronics rated at 10 kW peak power and running at 48V, by default, the resistive electric heater must be 0.23 Ohms, and as a result, the current to get 10 kW is 208 Amps in accordance with the relationship that power equals $v^2/R$. In this example, if the power electronics operate at 2.5 kW, they are no longer running at 48V, it is running the equivalent of 24V (e.g., bucking from 48V to 24V). If the intention is to operate the power electronics at 2.5 kW at 48V, the resistance of the electric heater needed is now quadrupled to 0.92 Ohm and results in a quarter of the current flow (e.g., 52 Amps). Such a potential reduction in current flow may enable simplification of board design and costs savings for fewer materials (e.g., thinner board, thinner wires needed to carry the current load). This example illustrates that the set point of how much maximum power is contemplated to be delivered is a design concern. Power, voltage, and resistance should be considered when designing power electronics parameters. Feedback and iteration on these parameters may be done to optimize the operation of the power electronics. In this embodiment, CDA is available and catalyst may be aged for testing. This embodiment may include an insulated one-box catalyzed soot filter, parallel SCR, with an upstream close-coupled SCR.

A system designed for peak power being 2.5 kW at 48V, designed for a 0.922 Ohm resistor pulling 52 Amps, may be more cost-effective because less copper is needed to carry the load. The same system designed for peak power of 2.5 kW may be run at 24V, requiring a 0.23 Ohm resistor and 104 Amps of current. These examples demonstrate that the electric heater may effectively run at less than 10 kW and may only need 12 or 24V to run.

For example, in some systems, such as a hybrid transmission with lead-acid batteries, the 48V may get reduced to 36V, and the system which was designed for 48V may not operate as well. In another example, if an alternator is operating maximally, the 48V-designed system may actually be running at 52V. In embodiments, the resistor may be desensitized to the range of voltages actually observed. If variable resistance is available, the voltage may simply be switched, and the system may respond to the voltage selected.

In some embodiments, a urea mixer may not be needed because urea or DEF may be sprayed directly onto the heater and the DOC can be implemented.

Figure 6:
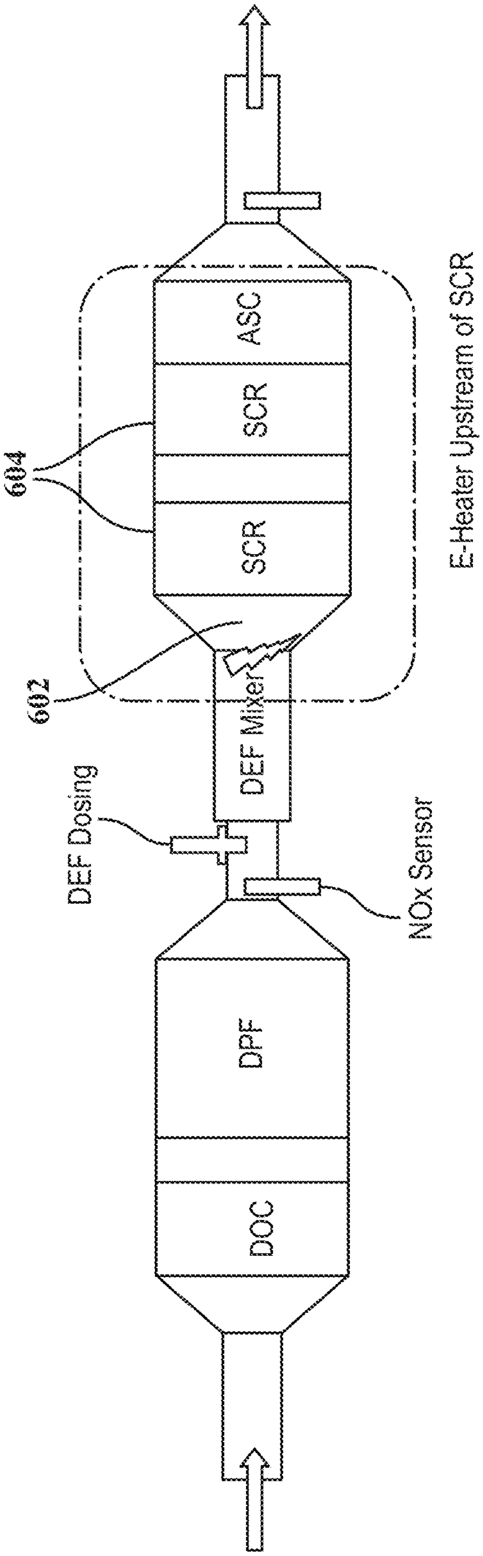
FIG. 6 depicts a block diagram of an exhaust treatment system with an electric heater upstream of SCR.
Figure 7:
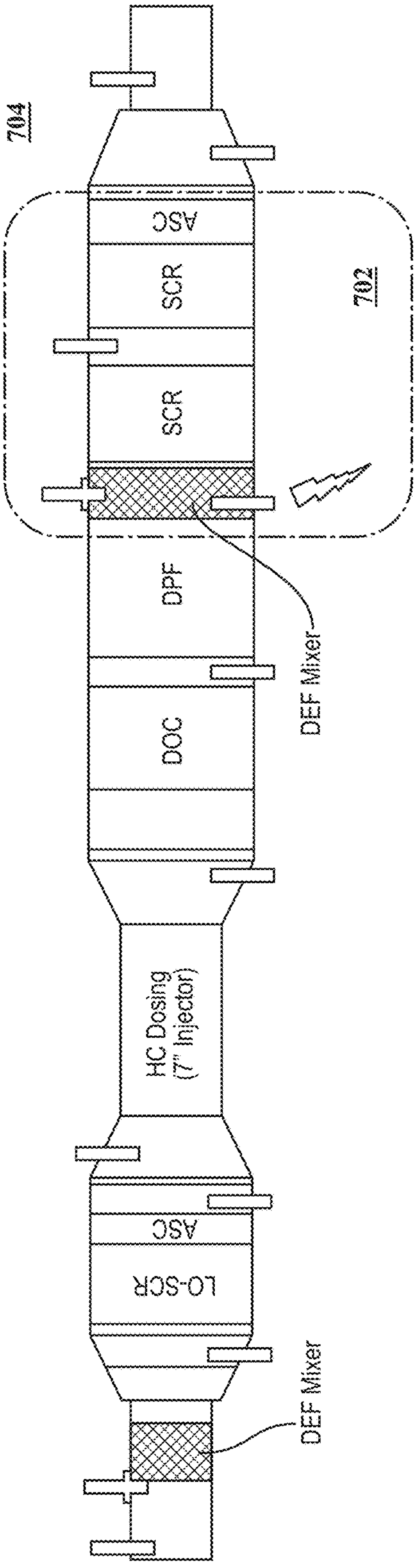
FIG. 7 depicts a block diagram of an exhaust treatment configuration with an electric heater upstream of a primary SCR.

In some embodiments, an aftertreatment system is depicted in FIG. 6, including a conventional aftertreatment and the addition of an electric heater 602 upstream of the Selective Catalytic Reduction (SCR) 604. The more quickly the electric heater can heat the SCR, the lower NOx will be along with $CO_2$ reduction and fuel savings. In the design shown in FIG. 6, a peak power requirement of the electric heater may be 5 KW. A consideration of the system is to waste as much heat as possible as quickly as possible so the system can return to fuel economy mode as quickly as possible. For example, a 50% efficient electric heater requires the engine to run at a higher load which results in producing more heat out of the engine and generating more electricity to power the heater—heating up the system may be quicker. If the electric heater heats up quickly and is only on for a short amount of time (e.g., 30-60 seconds), a cooling phase may not be required. If the electric heater, which can be a 48V or 24V electric heater, can be placed in front of the SCR, as shown in FIG. 6, the close-coupled SCR of FIG. 5 may not be needed, or may not be cost effective. FIG. 7 depicts a system for use cases having two SCRs utilizing diesel CDA for the close-coupled SCR and the electric heater for the downstream primary SCR.

In an embodiment, SMA or inferred values may be used to support OBD level diagnostics and/or diagnostic support for critical components of the EHC and electric heater (e.g., temperature, electrical, rationality support), which may be scheduled and flexible according to overall vehicle OBD design and may, in embodiments, not require a physical sensor in the high current output path. OBD diagnostics relate to anything on a vehicle that might affect emissions that needs to be proven to be working. In some examples, some OBD diagnostics of the electric heater may be based on a detected value. For example, a temperature check of an emission control catalyst that determines it has reached an appropriate temperature may be diagnostic of an electric heater's working status. In another example, confirming the temperature of a resistive element of the electric heater may be diagnostic that the electric heater is functioning. In another example, measuring the output voltage from a battery to the resistive element of the electric heater may be diagnostic of the electric heater's function. In another example, the temperature of the air into or around the catalyst of the electric heater may be diagnostic of the electric heater function.

In an embodiment, power into the EHC may be calculated based on input current times input voltage. In an embodiment, power on the output of the converter may be measured as current out times voltage out. In an embodiment, for the A samples, high side current can be measured and low side current may be calculated based on at least the voltage ratio, the duty cycle, and a compensation for known losses. The estimated or inferred low side current may be reported. When heater power is calculated, it may be based on measured high side current, estimated low side current, and measured low side voltage. Delta temperature and flow rate may be diagnostic for verifying power delivery into the exhaust or into the SCR. In an embodiment, a diagnostic could be a measurement of the input power, knowledge of the conditions, and accounting for an efficiency factor (e.g., such as using an efficiency value from a lookup table).

In some examples, some OBD diagnostics of the electric heater may be based on a simple rationality. For example, the on/off status of a transistor may be a rationality used as a diagnostic for the electric heater. In another example, the status of a connection between a resistor and switches (e.g., open line, closed line) may be a rationality used as a diagnostic for the electric heater.

Figure 4:
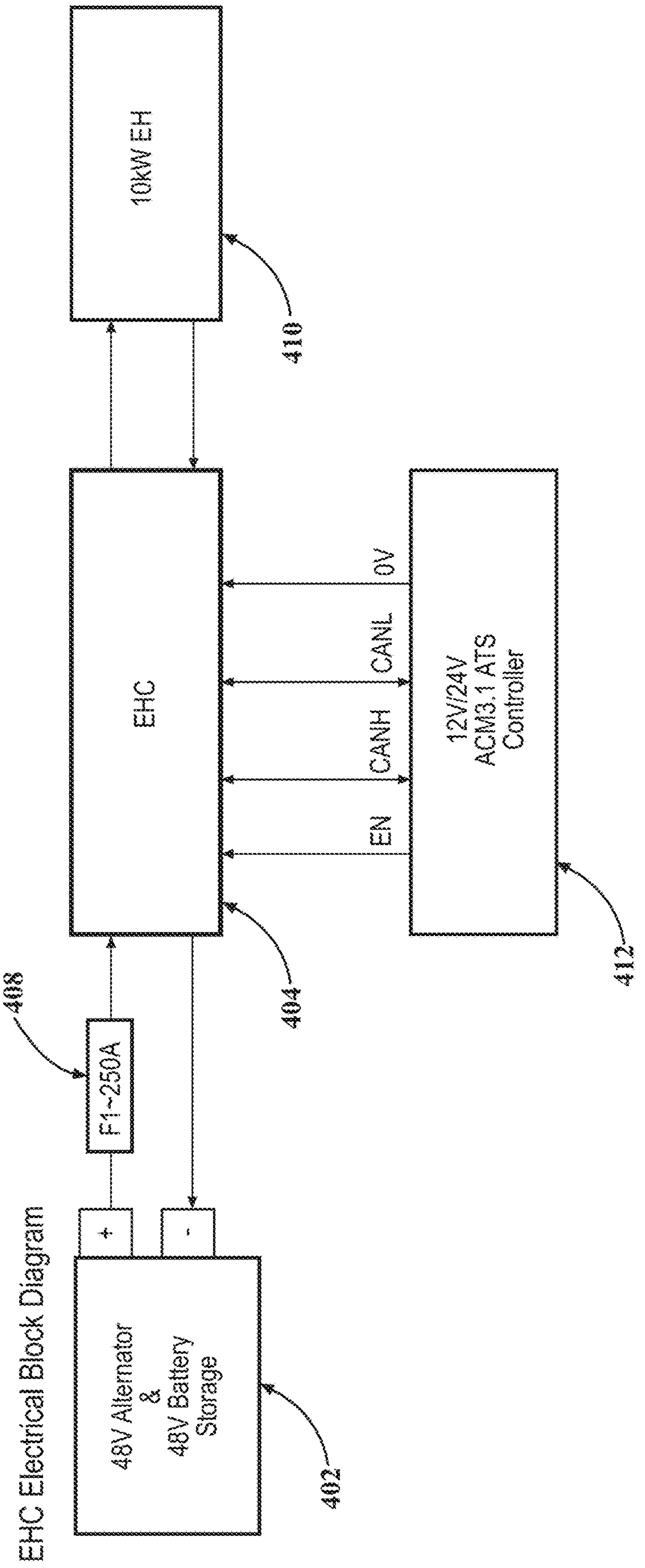
FIG. 4 schematically depicts a system architecture for an electric heater control block diagram.

Power for an electronic heater may be obtained from a variety of locations. In embodiments and referring to FIG. 4, a general EHC electrical block schematic is depicted showing a general arrangement of a 48V alternator and 48V battery storage 402 in relation to an electronic heater control unit (EHC) 404, with or without an intervening fuse 408, in control of, in embodiments, a 10 kW electronic heater (EH) 410 (e.g., a resistive element, a grid heater, etc.), wherein the EHC is in communication with a 12V/24V aftertreatment controller 412 to receive commands. In some embodiments, the high ripple output of an alternator may be used directly to power the e-heater and the DC-to-DC converter without the need for any stored energy usage.

Figure 3:
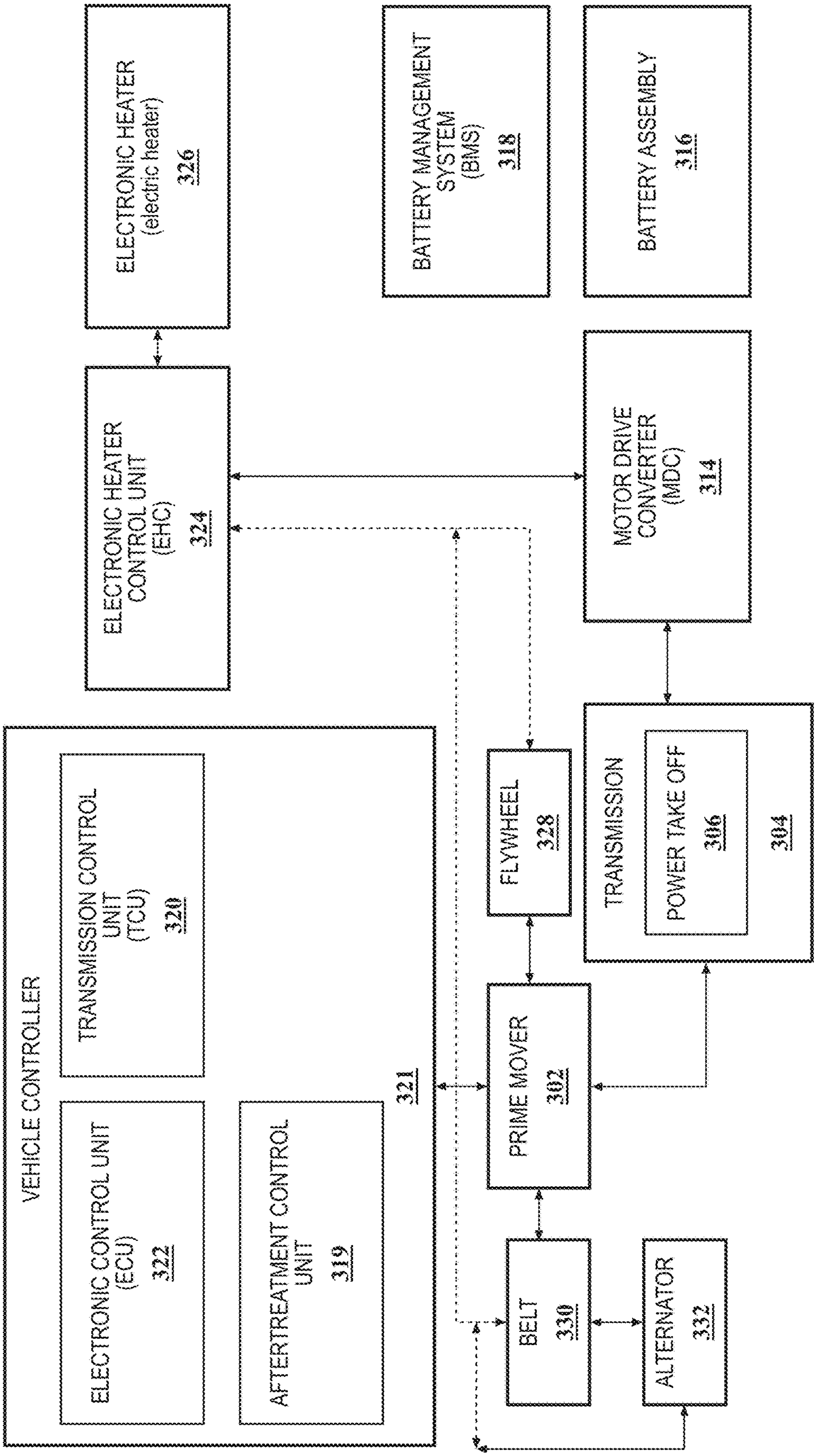
FIG. 3 schematically depicts a block architecture for a vehicle with an electric heater.

Referring to FIG. 3, a prime mover 302 (such as a gas engine) may be connected to a vehicle controller 321. The vehicle controller 321 may include an electronic control unit (ECU) 322, a transmission control unit (TCU) 320, and an aftertreatment control unit 319. The various components of the vehicle controller 321 may be co-located or distributed across multiple locations and boards. In some embodiments, an electric heater controller 324 may be co-located with the vehicle controller 321. The architecture may include a battery assembly 316 and a battery management system (BMS) 318.

Throughout this Specification, the electric heater controller 324 may be alternatively referred to as e-heater controller, electronic heater controller, EHC, exhaust heater controller, or exhaust heater power electronics.

Figure 8:
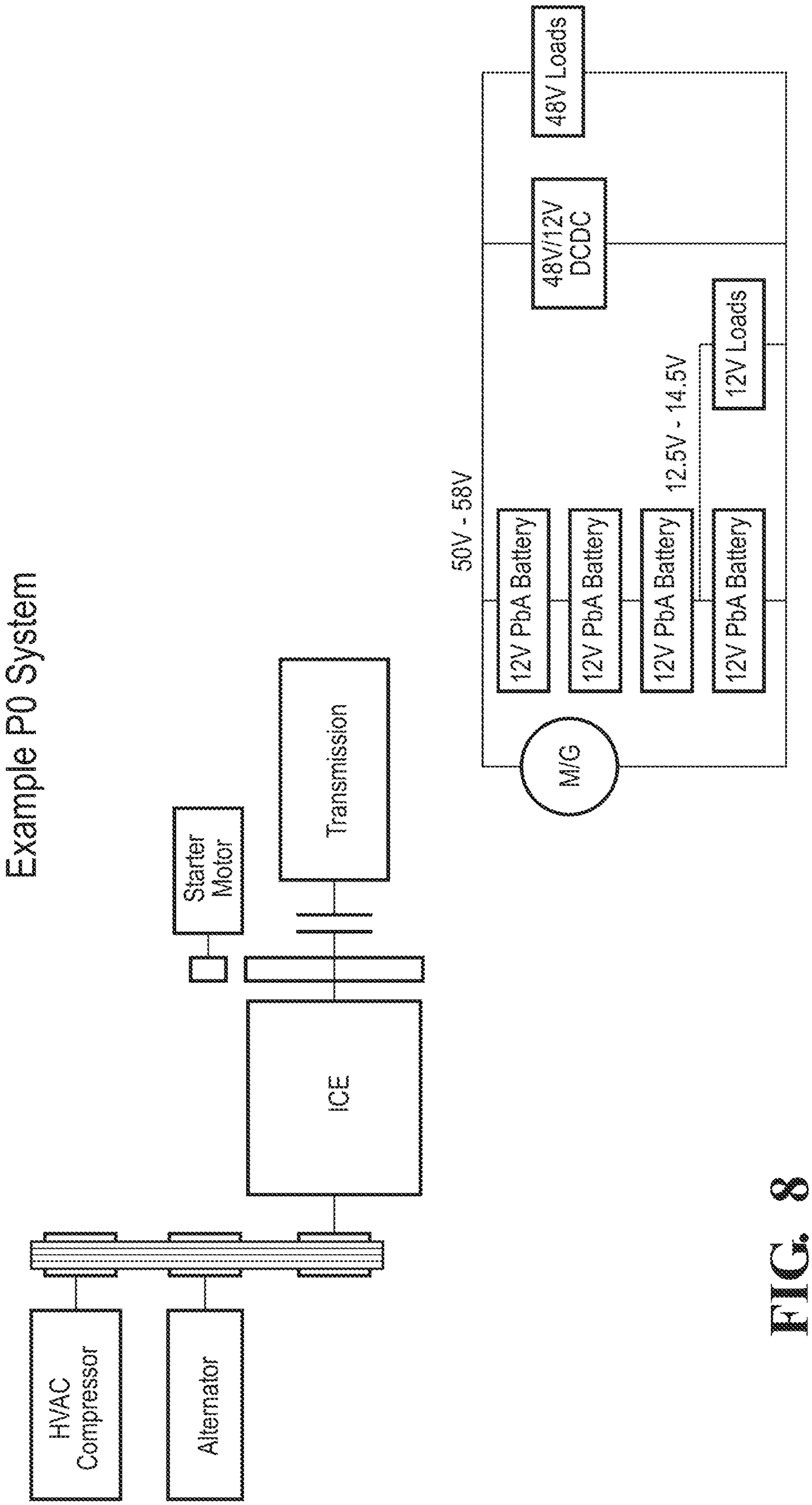
FIG. 8 describes a P0 hybrid architecture.

The prime mover 302 may engage with a belt 330. The belt 330 may provide an engagement location (power connection P0-A) to provide power to the electric heater control 324 and electric heater 326. The belt 330 may engage with an alternator 332. The alternator 332 may include an engagement location (power connection POB) to provide power to the electronic heater control 324. FIG. 8 depicts a P0 hybrid architecture. In this architecture, there are 12 Volt batteries, shown here as lead acid batteries, with a ¼ tap for powering 12V loads in DC-to-DC and 48 Volt loads running directly off a belt alternator without an inverter and retention of a starter motor as a 48 Volt starter. The system features an electric catalyst heater for NOx compliance, power for all 12 Volt electrical loads, a 12 volt battery balancing and Charge/discharge regulation, P0 architecture for low cost, low risk NOx solution, and forms the base 48 Volt electrical system that is used in other hybrid architectures. The components of the system may include a 48 Volt-12 Volt 3 kW DC to DC converter, a 48 Volt PDU, a 48 Volt lead acid battery management system (for four 12 Volt batteries), a 48 Volt Electric heater resistive coil (12 kilowatt peak/4 kilowatt continuous power), a 48 Volt Electric heater controller (12 kilowatt peak/4 kW continuous), a 48 Volt alternator, a front end accessory drive belt, pulleys, tensioner, a 48 Volt starter, and 12 Volt lead acid batteries. In some embodiments, stage P0 includes a belt-mounted alternator. Stage P0, the front-end accessory drive, includes a belt-mounted alternator, is the simplest installation, and does not use an 8-bolt PTO. P0 cons include 4 kW max regen, no engine off-coasting, separate starter motor required, separate HVAC system required for hotel, and no e-assist.

Figure 9:
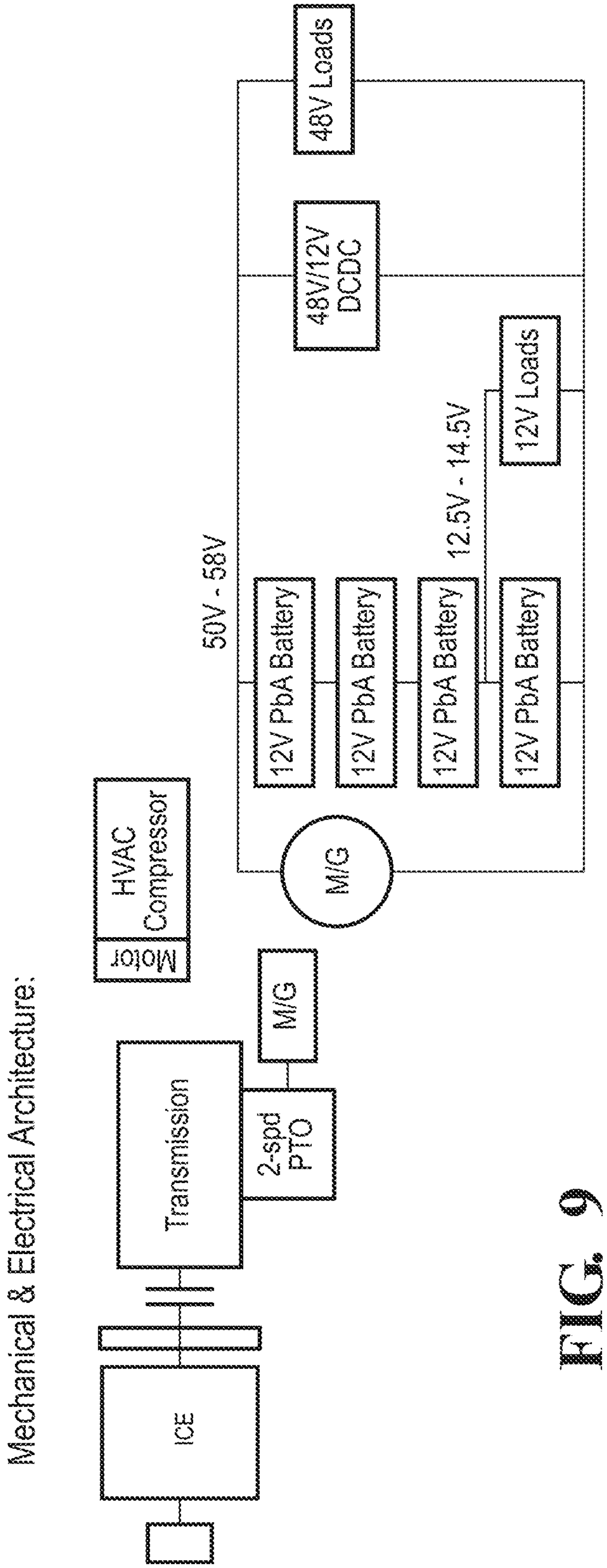
FIG. 9 depicts a P2.5 air-cooled hybrid architecture.

The prime mover 302 may be connected to a transmission 304 which includes an engagement location (power connection P2) to provide power to the electric heater controller 324 and electric heater 326. FIG. 9 depicts a variant P2.5 air-cooled hybrid architecture that builds upon the P0 architecture. In prior embodiments, air conditioning was mechanically driven off the PTO using the same motor to electrically drive it when it was stopped. In this embodiment, air conditioning is electric but still with a 2 speed with the motor cranking the engine, a creep mode, engine off coasting with charging. Like the P0 architecture, the P 2.5 architecture includes A3 kW DC to DC converter, 48 Volt PDU, 48 Volt lead acid battery management system, 48 Volt electric heater resistive coil, a 48 Volt electric heater controller, and lead acid batteries, but also includes an E-HVAC inverter and controls, a 2-speed PTO plus actuator, a motor/generator that is air cooled (15 kW peak/8 kW cont), and an inverter that is air cooled (15 kW peak/8 kW cont), but may not include a 48V alternator and starter. This architecture's features include: performs engine crank and allows for starter and alternator elimination, engine off coasting, electric HVAC for engine off air conditioning, power for all 12 Volt or 24 Volt electrical loads, 12 Volt battery balancing and charge/discharge regulation, low speed engine off creep mode, and builds upon hardware developed in P0 base system and becomes the new base for the liquid cooled system.

Figure 10:
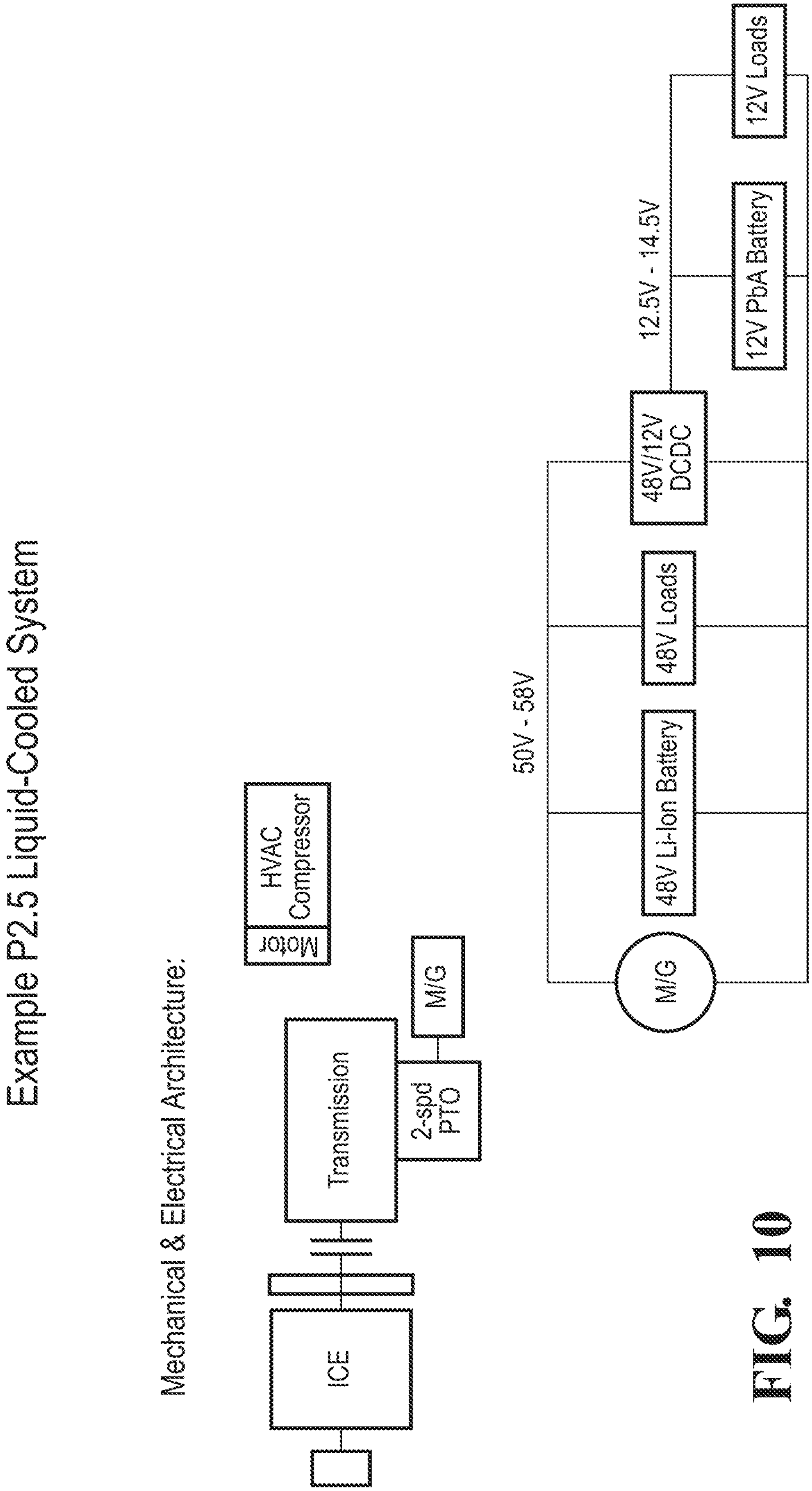
FIG. 10 depicts a P2.5 liquid-cooled hybrid architecture.

FIG. 10 depicts a P2.5 liquid-cooled hybrid architecture. This architecture is liquid cooled and higher power, with reuse of the DC to DC and power distribution from the P0, reuse of HVAC inverter and controls and a 2 speed PTO plus gear change actuator from the P2.5 air cooled, then adds liquid cooled motor/generator (30 kw peak/15 kW cont) and liquid-cooled inverter (30 kW peak/15 kW cont) to get to higher power levels, and also adds a low temperature cooling loop and a lithium-ion battery pack. In this architecture, the 48V battery is lithium ion but lead acid batteries are retained on the 12V bus. This architecture features: engine crank, engine off coasting, electric HVAC for engine off air conditioning, electric catalyst heater for NOx compliance, power for all 12 Volt or 24 Volt electrical loads, low speed engine off creep mode, and builds upon content developed for the P2.5 air cooled and P0 architectures.

The prime mover 302 may be connected to a flywheel 328. An idler gear (not shown) may interact with the flywheel 328 to provide an engagement location (power connection) P1 to the electric heater controller 324, electric heater 326, and the motor drive converter 314.

Figure 11:
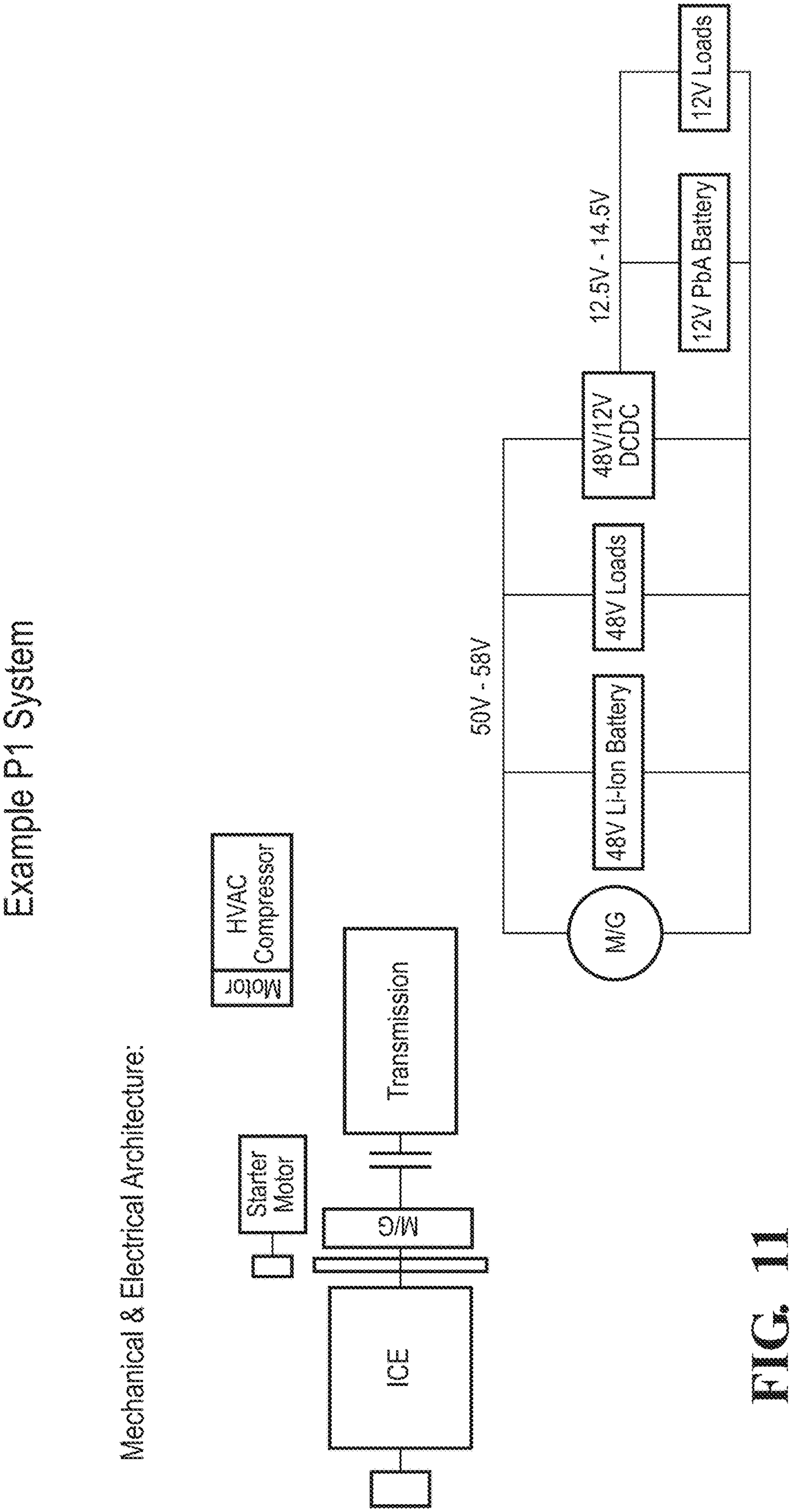
FIG. 11 describes a P1 architecture.
Figure 13:
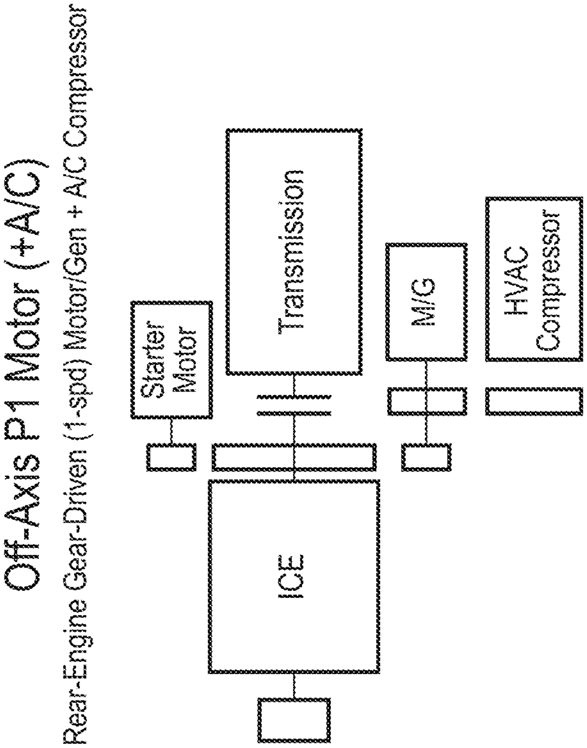
FIGS. 12-15 depict a variety of P1 embodiments.
Figure 12:
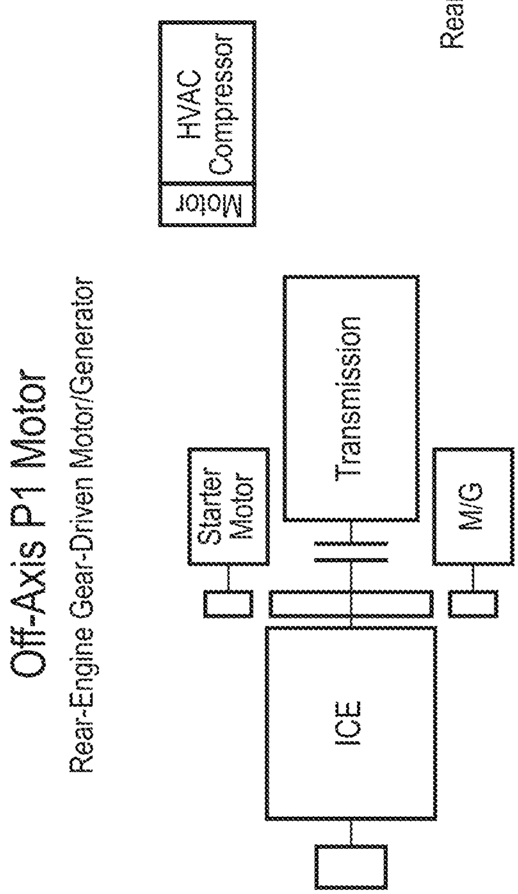
Figure 14:
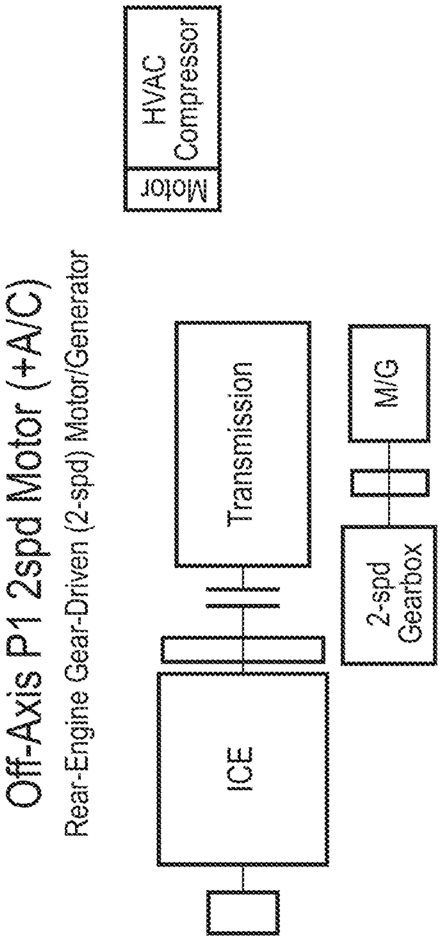
Figure 15:
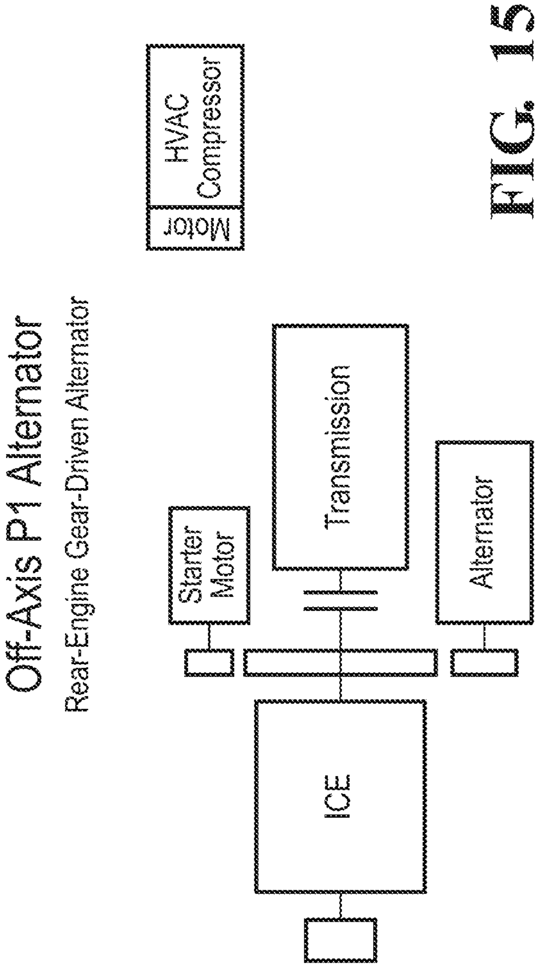

FIG. 11 depicts a P1 architecture. The P1 reuses the DC-to-DC converter, catalyst heater and PDU from the P0 architecture, and adds a P1-located motor generator, an eHVAC inverter and controls, a liquid cooled inverter (22 kW), a low temperature cooling loop, a lithium-ion battery pack, and a 48V (or 12V) starter. Some system features include: Hybrid region and alternator elimination, electric HVAC for engine off air conditioning, electric catalyst heater for NOx compliance, power for all 12 Volt or 24 Volt electrical loads, and low speed engine off creep mode. FIG. 12 depicts a schematic of an off-axis P1 motor. Stage P1, the engine side of the clutch (flywheel) includes a rear-engine gear-driven motor/generator to provide power for 48V accessories and does not use an 8-bolt PTO while enabling e-assist/start stop. Cons include no engine off-coasting, separate starter motor required, and separate HVAC system required for hotel. FIG. 13 depicts another P1 embodiment, an off-axis motor/generator and an HVAC compressor (e.g., rear engine gear-driven (1-spd) motor/gen+A/C compressor) that powers 48V accessories, does not use 8-bolt PTO, allows e-assist, and uses same HVAC system for running and hotel modes while cons include no engine off-coasting and separate starter motor required. In this embodiment, the HVAC compressor can be powered electrically or off of 2-spd gearbox. FIG. 14 depicts a P1 off-axis 2-spd motor as well as an HVAC compressor (e.g., rear engine gear-driven (2-spd) motor/generator) that may be electrically powered or powered by the two speed gearbox. This embodiment powers 48V accessories, does not use 8-bolt PTO, allows e-assist, uses same HVAC system for running and hotel modes, and eliminates the starter motor, while cons include no engine off-coasting and separate HVAC system required for hotel. FIG. 15 depicts a Stage P1 embodiment, the engine side of the clutch (flywheel) which includes an off-axis alternator (e.g., rear-engine gear-driven alternator) to provide power for 48V accessories and does not use an 8-bolt PTO, while cons include no engine off-coasting, separate starter motor required, separate HVAC system required for hotel, and no e-assist.

An electric heater may be positioned at various points in the aftertreatment system. FIG. 5 depicts a base case embodiment of an aftertreatment system with an electric heater 502 positioned downstream of a heated Diesel Exhaust Fluid (DEF) injector 504 but, upstream of a low level, copper, close-coupled SCR 506 and an optional ammonia slip catalyst (ASC) 508.

Figure 16:
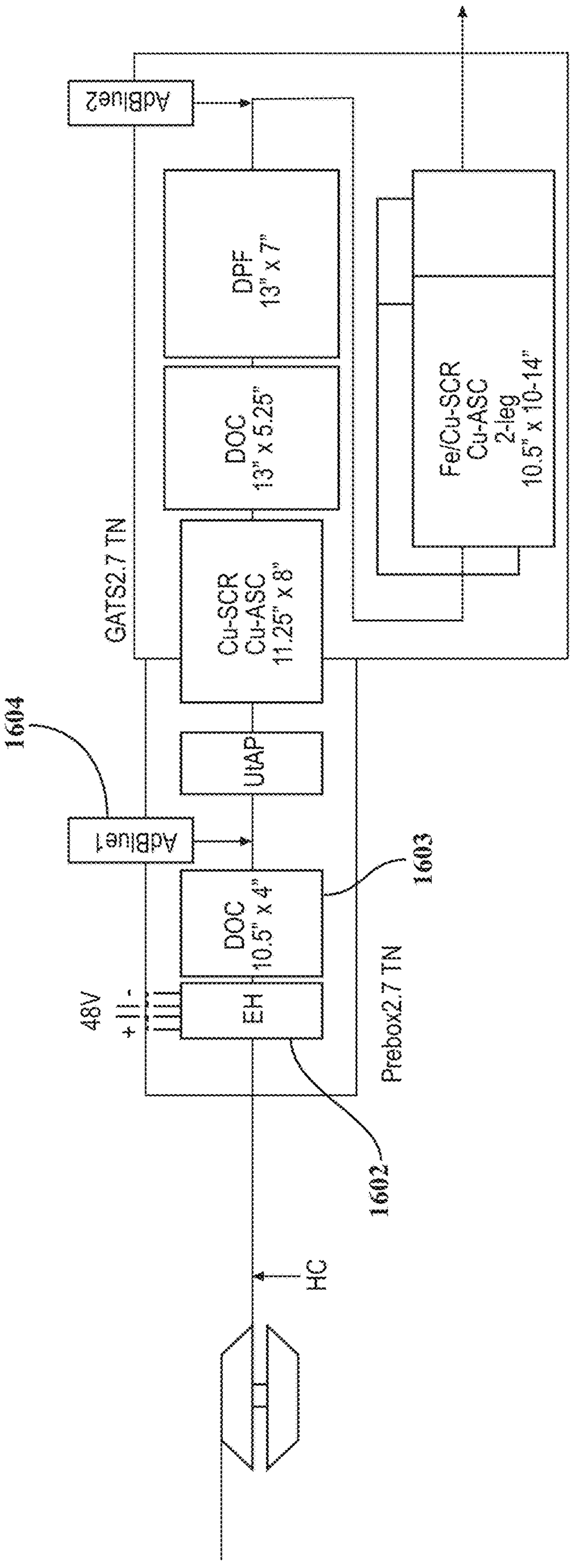
FIG. 16 depicts a block diagram of an exhaust treatment configuration having an electric heater upstream of a diesel oxidation converter (DOC)

FIG. 16 depicts an embodiment of an aftertreatment system with an electric heater 1602 before the diesel oxidation catalyst (DOC) 1603 which is in front of diesel exhaust fuel (DEF) injector 1604.

Figure 17:
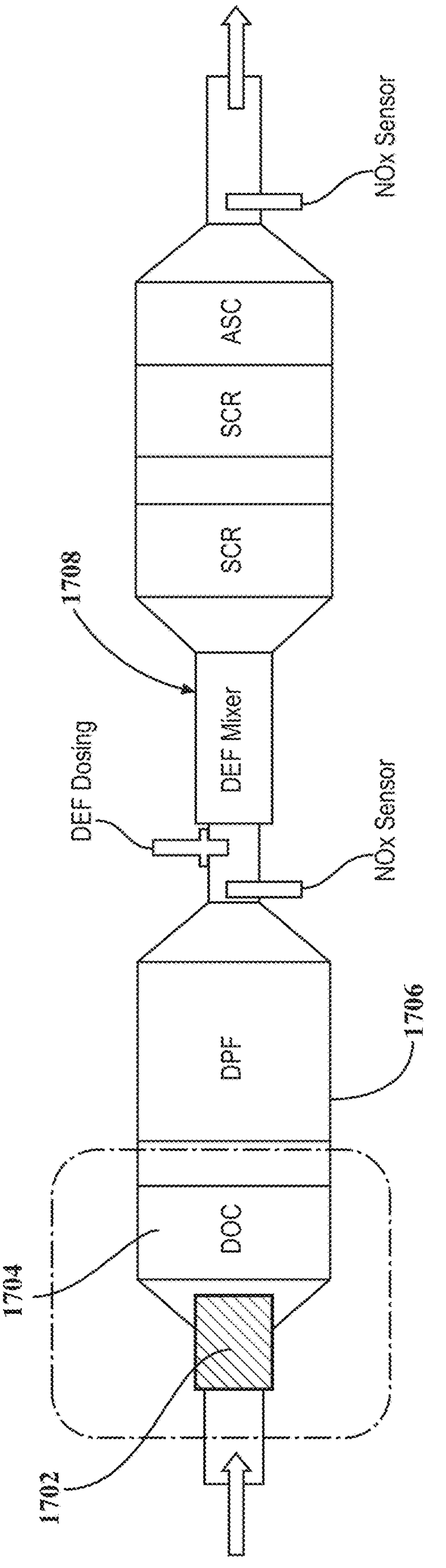
FIG. 17 depicts a block diagram of exhaust treatment system with a burner upstream of DOC-DPF-SCR.

FIG. 17 depicts an aftertreatment system without an electric heater. The system includes a burner 1702 upstream of a conventional treatment of a diesel oxidation catalyst (DOC) 1704, a diesel particulate filter (DPF) 1706, a diesel exhaust fluid (DEF) mixer 1708, and an SCR catalyst 1710.

FIG. 6 depicts an embodiment of an aftertreatment system similar to that of FIG. 17 with a conventional aftertreatment and the addition of an electric heater 602 upstream of the SCR catalyst 604.

Figure 18:
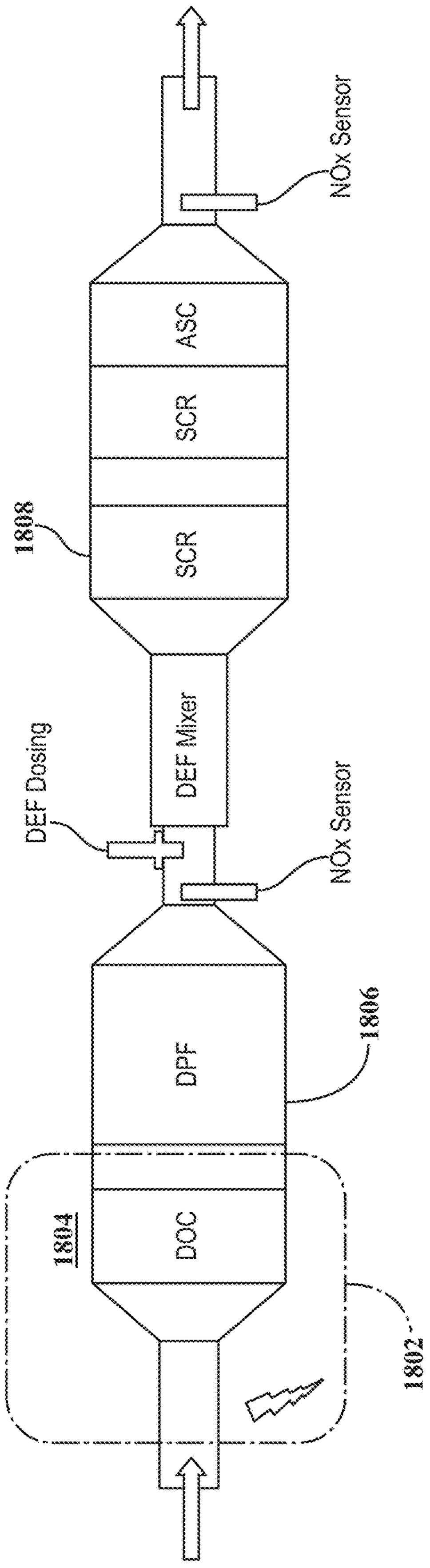
FIG. 18 depicts a block diagram of an electric heater upstream of DOC-DPF-SCR.

FIG. 18 depicts an embodiment of an aftertreatment system with an electric heater 1802 upstream of a diesel oxidation catalyst (DOC) 1804, a diesel particulate filter (DPF) 1806, and a Selective Catalytic Reduction (SCR) 1808.

FIG. 7 depicts another embodiment of an aftertreatment system with an electric heater 702 upstream of primary Selective Catalytic Reduction (SCR) 704.

Figure 19:
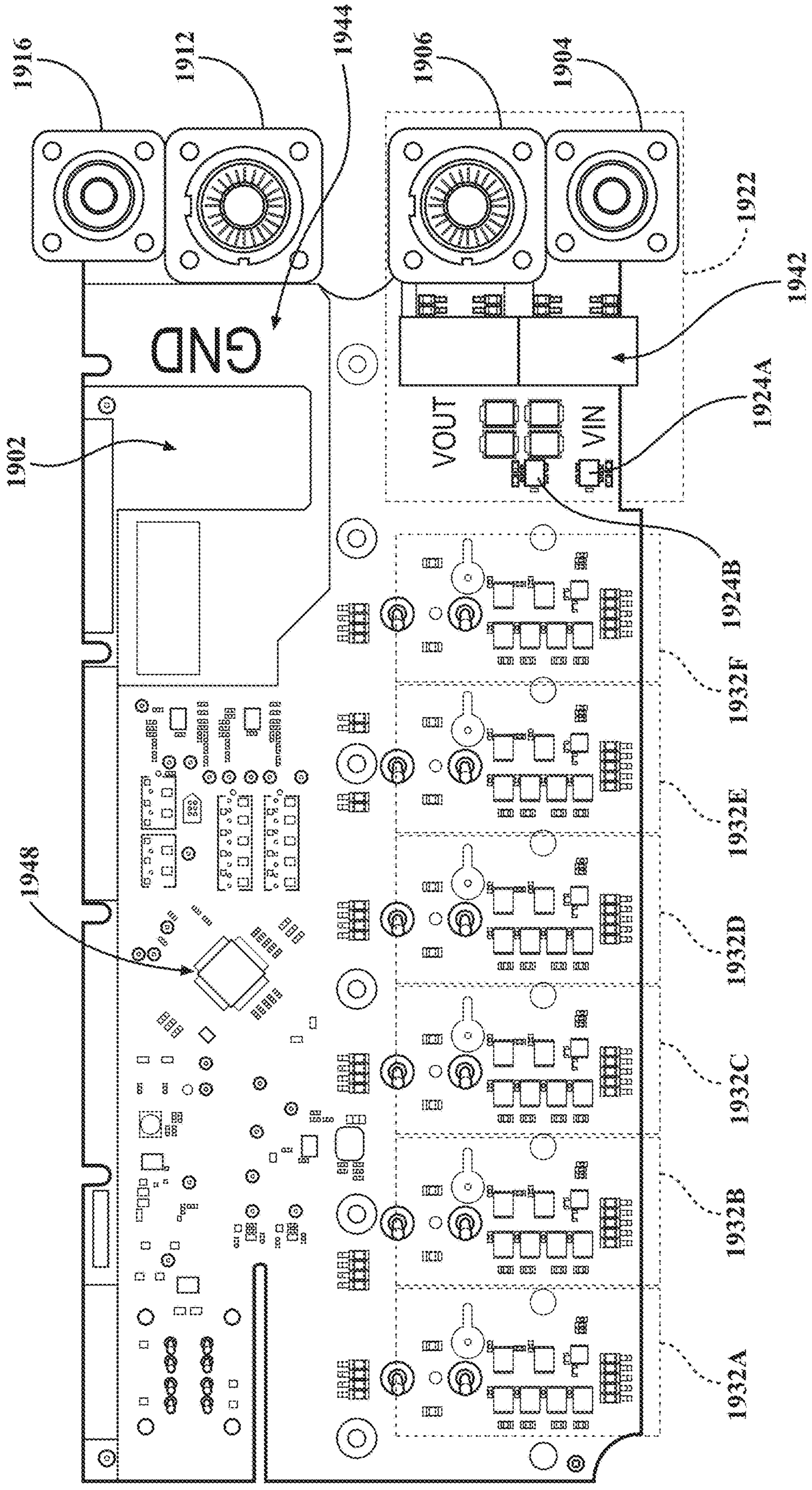
FIG. 19 depicts a rendering of an electric heater control (EHC) board.
Figure 20:
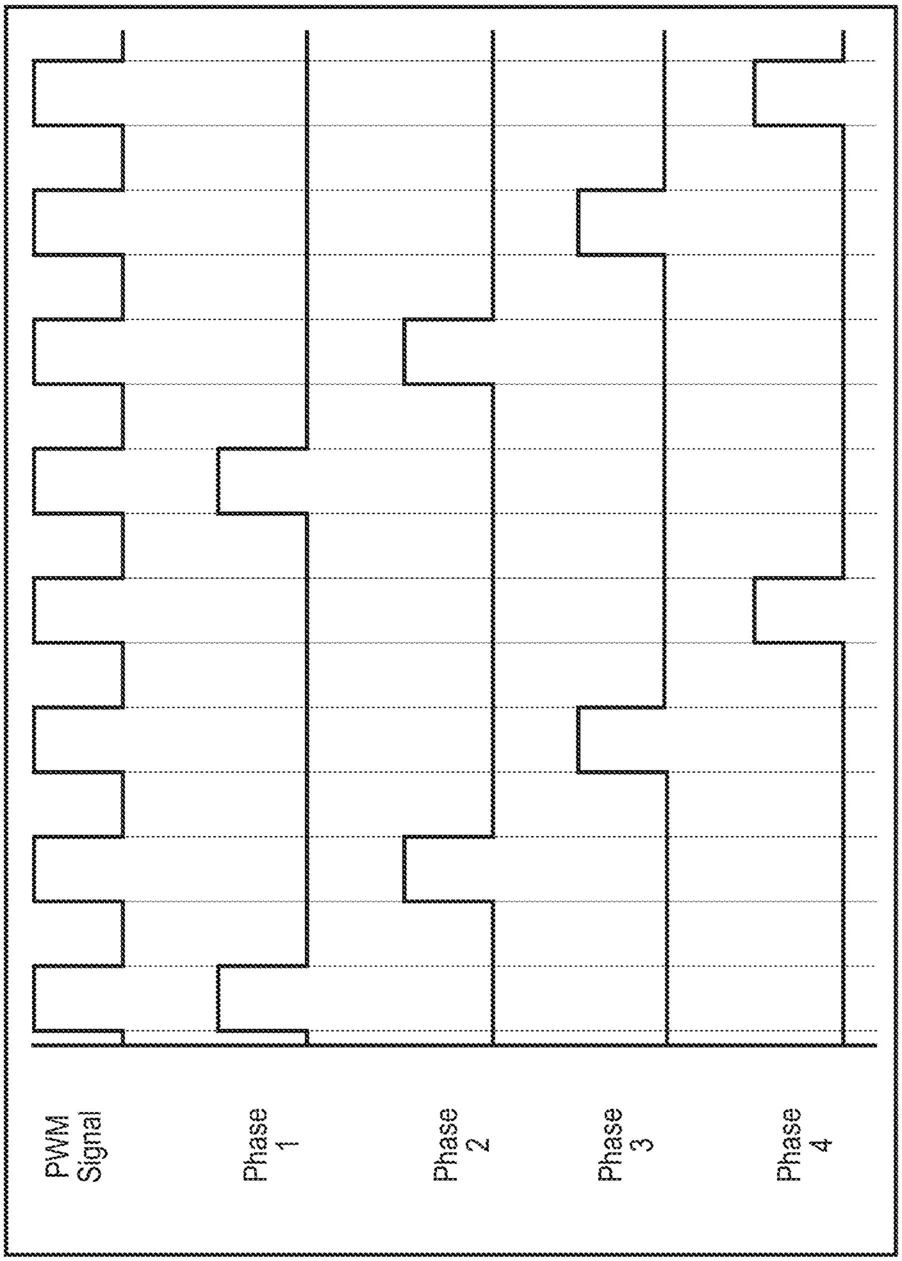
FIG. 20 depicts a pulse width modulation scheme for an electric heater.

Although six phases 1932A-F are shown in FIG. 19, there may be fewer. There may be advantages to running with fewer phases, for example reducing switching losses and reduced circuitry. However, fewer phases may result in higher levels of ripple which may reduce the volt capacitor life. Phases may be selectively enabled and disabled depending on the load and the trade-off between ripple, volt capacitor life and switching losses. FIG. 20 shows a phase control diagram for a four-phase power solution for an electric heater. A controller may rebalance the phases in response to an increase or reduction in the number of phases engaged. The electric heater may be less sensitive to ripple relative to the impact of ripple on other DC devices such as air conditioning, radio, and the like. It may be possible to use a single large phase or to specify a unique capacitor/inductor. In this example, Phase 1 & 3 would go to Coil 1 while Phase 2 & 4 would go to Coil 2. Each phase is 90 degrees offset from the phase before it. This could be controlled when the turn-on and turn-off PWM signals are linearly increased and decreased to minimize the electrical disturbance effect on the voltage bus. Phase numbers may change.

Figure 21:
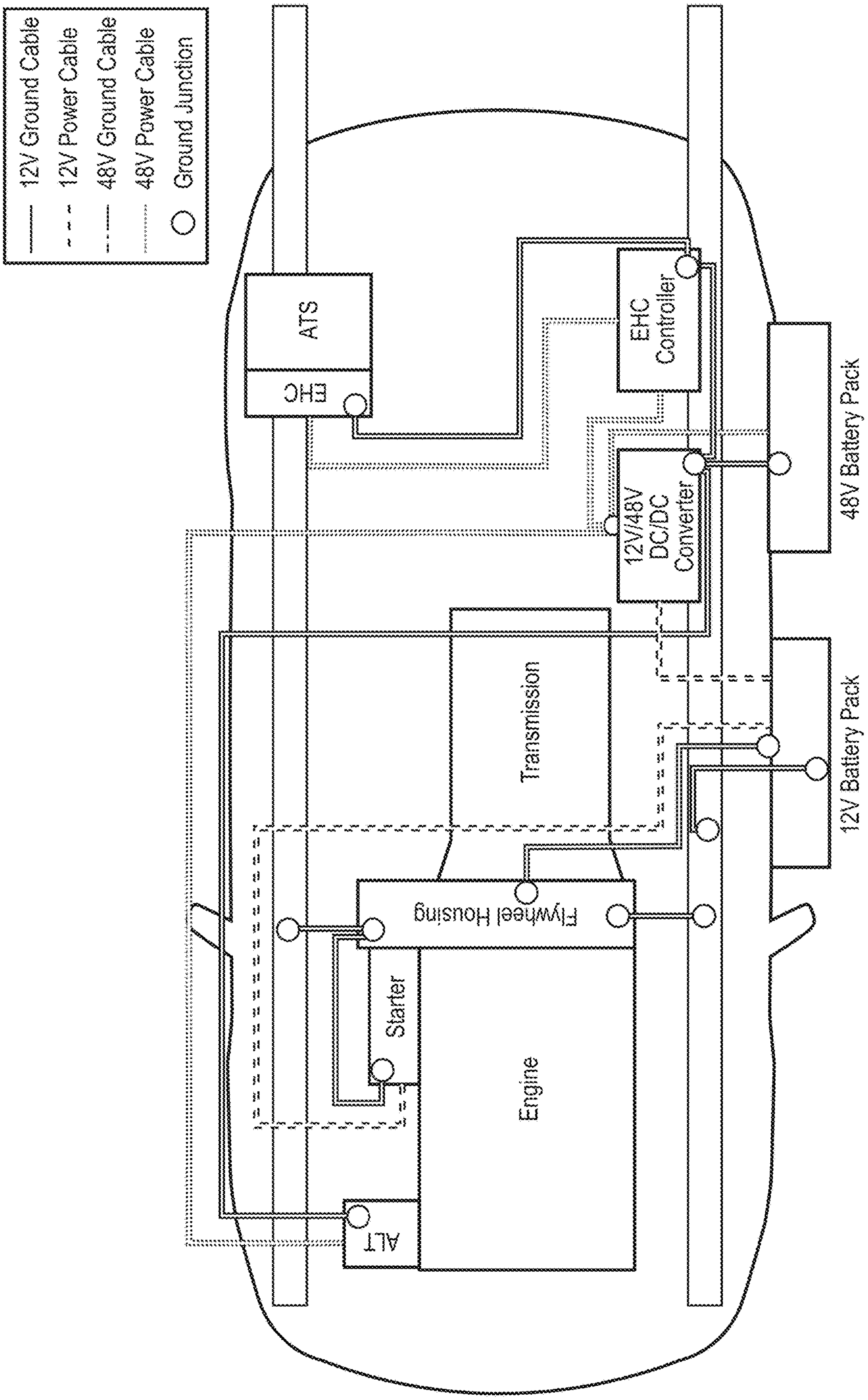
FIG. 21 schematically depicts a single 48V nominal alternator with electronic heater controller (EHC)

FIG. 21 shows an example of a schematic power layout for a truck. The arrangement depicted allows for shorter cable runs.

In embodiments, the behavior of an alternator may be considered. If an alternator is at full output and the load is suddenly removed, the output voltage will spike up 4 to 6× over a timescale of 100 milliseconds, to half a second. Simply turning a large load on and off will create voltage disturbances and transients that, in certain embodiments, are unacceptable to the electrical system. In testing on a 48V alternator, there was a spike of 220 Volt peak on the order of 1/10 of a second. This type of voltage spike may destroy other 100 Volt components attached to a common bus. Therefore, a soft start (ramping it up at a ramp rate that is slower than the response rate of the alternator regulator) and a soft stop (ramping it down again where alternator regulator can maintain voltage in regulated range) may be important to prevent the voltage spikes. In embodiments the alternator regulator may be able, at a sufficiently low load (e.g., nominally under 10% of the alternator capacity), to reduce the output current to maintain the voltage within the regulated range. Under these conditions, it may be possible to use a relay or solid state switch to apply/remove a load (e.g., notionally under 1 kW). Above 50% of the alternator capacity, using pulse width modulation to control the heater directly or turning it on/off with a relay directly would result in a load dump and would result in undesirable vehicle system voltage transients.

Figure 22:
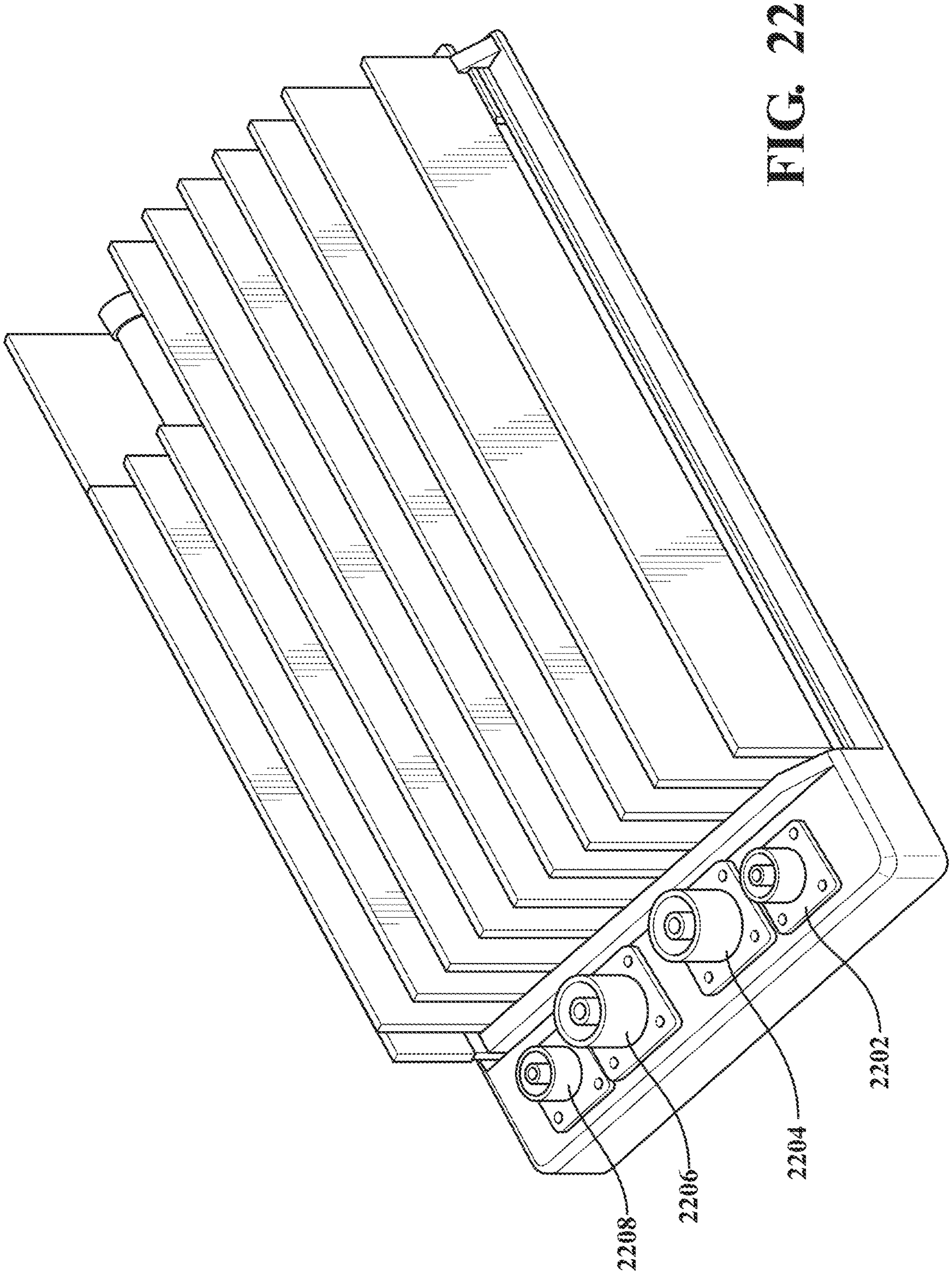
FIG. 22 depicts a 4-terminal EHC design.

In embodiments, as shown in FIG. 22, the electric heat controller may be a four terminal design. The EHC is an air-cooled, power electronic converter designed to regulate 48V to a catalyst heater element for commercial vehicle emission control applications. The controller may control, in embodiments, a total of 200 Amps of load current to either one or two independent heating elements. The EHC features natural convection, and an air-cooled design for ease of integration, low power wake-up (e.g., below 50 mW sleep power), efficient 6 phase design to permit scalability and flexibility for single or dual heating element control, and can be CAN-controlled with diagnostic feedback of heater element current and power. 48V power comes into the controller at input 2202. The input power may come directly from the alternator or from a 48V battery. A larger terminal for the 48V 2204 connects to the electric heater. The larger ground terminal 2206 grounds the electric heater to the controller and the remaining ground 2208 grounds the controller to the vehicle chassis. In embodiments with no energy storage it may be possible to omit a fuse. If the alternator can only output 200 to 300 amps the electric heater controller expects about 200 amps, a fuse would not protect against any over current events. In embodiments with energy storage, there is the possibility of short circuit and it would be desirable to fuse either the battery or the electric heater controller. Because of the large current, it may be desirable to use multiple fuses.

A power scheme may be used to avoid a high temperature generation region (e.g., of the FETs or another electrical component within the EHC or other component of the electric heater power and control system) when operating the FETs, such as by thermal derating to 100% duty cycle.

If the FETs are running at a high, but not maximum duty cycle, certain arrangements of the EHC generate more heat within the FETs than if they were running at maximum duty cycle (e.g., 100% or other maximum defined value). This phenomenon may be described as an offset parabolic loss function in a graph of power loss (in Watts) (e.g., thermal heat that needs to be mitigated) versus Output power (in Watts) (e.g., power delivered to the load). Curves on such a graph may be a function of input voltage, with the highest curve representing the highest voltage (60V) and the lowest curve representing the lowest voltage (36V). Losses are made up of two parts: primarily switching loss at the zero point and primarily conduction losses ($i^2r$) moving away from zero up the curve. At 100% duty cycle, switching losses go to 0, eliminating roughly ⅓ to ¼ of the overall losses for the example system. For example, systems may run cooler at 10 KW than at 9.9 kW. An example operation includes performing a thermal derate strategy, either in response to the commanded power to the electric heater, and/or in response to a measured temperature response for the FETs. For example, instead of running a system at 80 and 90% duty cycle, an example strategy may be to ramp up and saturate to 100%, for a period, switch to a lower power output (e.g., 70-80%) for another period, etc. In the example, the overall power output may be time managed to provide the targeted overall heating. In a further example, a feedback value (e.g., total power provided by the heating element, a measured temperature of the exhaust, an aftertreatment component, and/or the heating element, etc.) may be provided where the switching is controlled from the feedback value. In certain embodiments, a hysteresis may be applied to the switching (e.g., hysteresis based on time, a feedback value, temperature of one or more FET phases, etc.). For example, in an operating mode, the power requirement may be 900 seconds at 10 kilowatts (e.g., which may represent 95% power output for a system), which may be delivered as Max power or 50% of power rather than 95% power, switched over the 900 second period to provide the 95% power output (and/or a best effort as close to 95% as achievable according to the temperature capability and response for the FETs or other component). In a water-cooled design, the time constants are in the 10's of minutes and a thermal steady state is not achieved until well over an hour, or an hour and a half. In an example, the available power may be 0 to 70% and then may be stepped up to 100%. In this strategy, the system may smoothly ramp down to 70% and up to 100% over a one second or ten second PWM. In an example, if 80% power is desired, the system can deliver 70% power for 9 seconds and 100% power for two seconds, along with smoothly modulating through the upper part of the curve to prevent vehicle electric transients while avoiding the 95 to 99% range. In the example, the "derate" may be conceived as a thermal generation derate, not necessarily a power output derate-noting that for a marginally capable, aged, or worn system the thermal generation derate may be significant enough to enforce a power output derate. In the example, as long as the power output at the 100% duty cycle point is more than the required power output, then the board components can theoretically be dithered intelligently to achieve the settings needed for power output without a reduced power output capability (limited by the temperature generation profile, including heating and cooling times at various power output levels). Additionally, depending upon the power output commanded and the capability throughput of each phase, the multiple phases can additionally be cycled to limit temperatures of components within the EHC. For example, there may be multiple phases on the EHC board and the duty cycle of each phase may be programmed (and/or controlled utilizing feedback, such as direct temperature feedback and/or a modeled/estimated temperature feedback) such that the combination of their activity achieves a desired overall duty cycle. For example, in a 6 phase design, 4 phases may be programmed to run at 100% duty cycle while two other phases run at 50%. In embodiments, the thermal envelope may be designed for zero airflow (e.g., assuming a worst-case where air flow over the EHC and cooling fins is assumed to be zero). In some embodiments, a similar phenomenon of an offset parabolic loss function may be observed in a graph of power loss (in Watts) (e.g., thermal heat that needs to be mitigated) versus Load current (in Amps). Curves on such a graph may be a function of input voltage, with the highest curve representing the highest voltage (60V) and the lowest curve representing the lowest voltage (36V).

Figure 23:
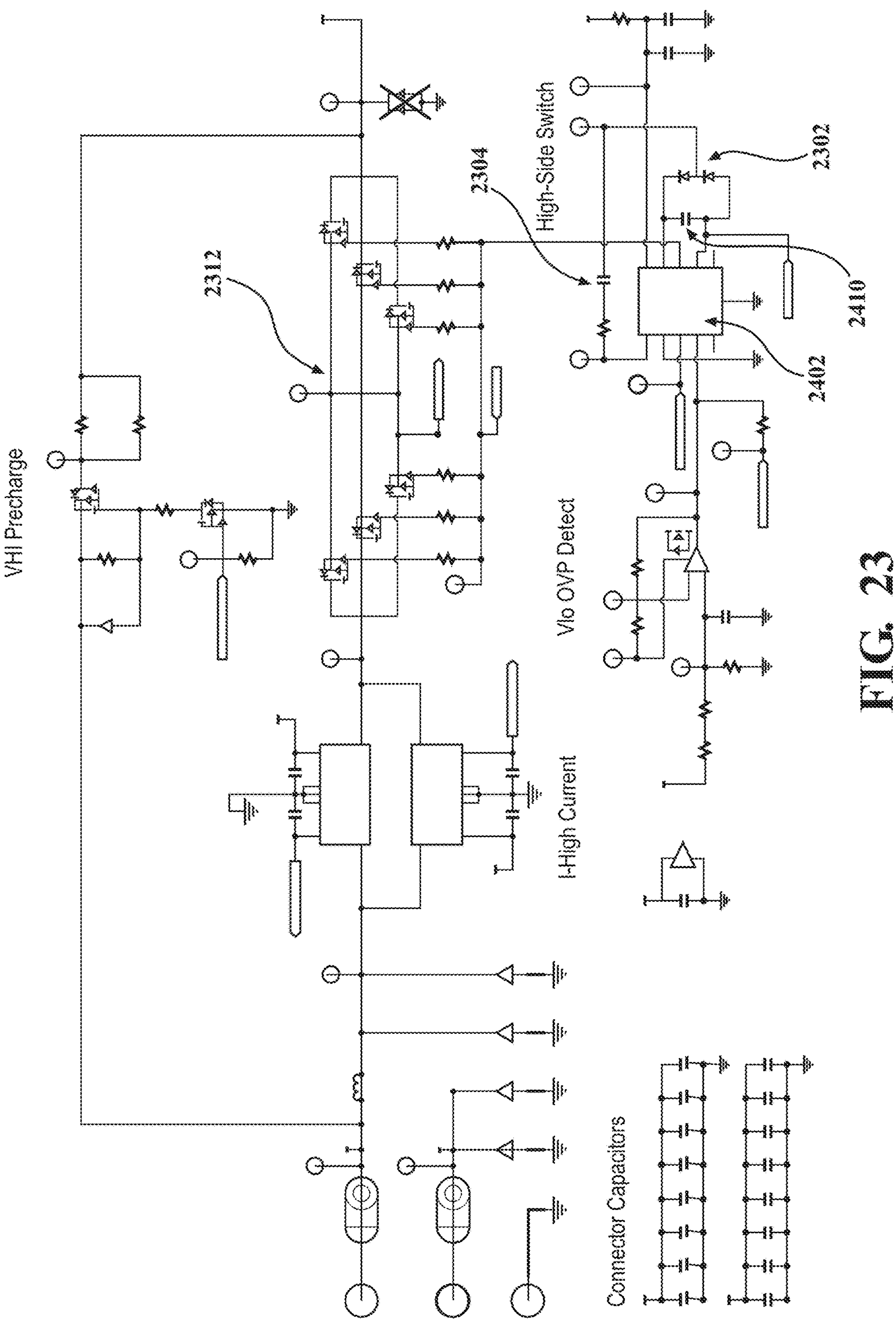
FIG. 23 depicts a circuit schematic of an embodiment of a main power circuit including a high side switch.
Figure 24:
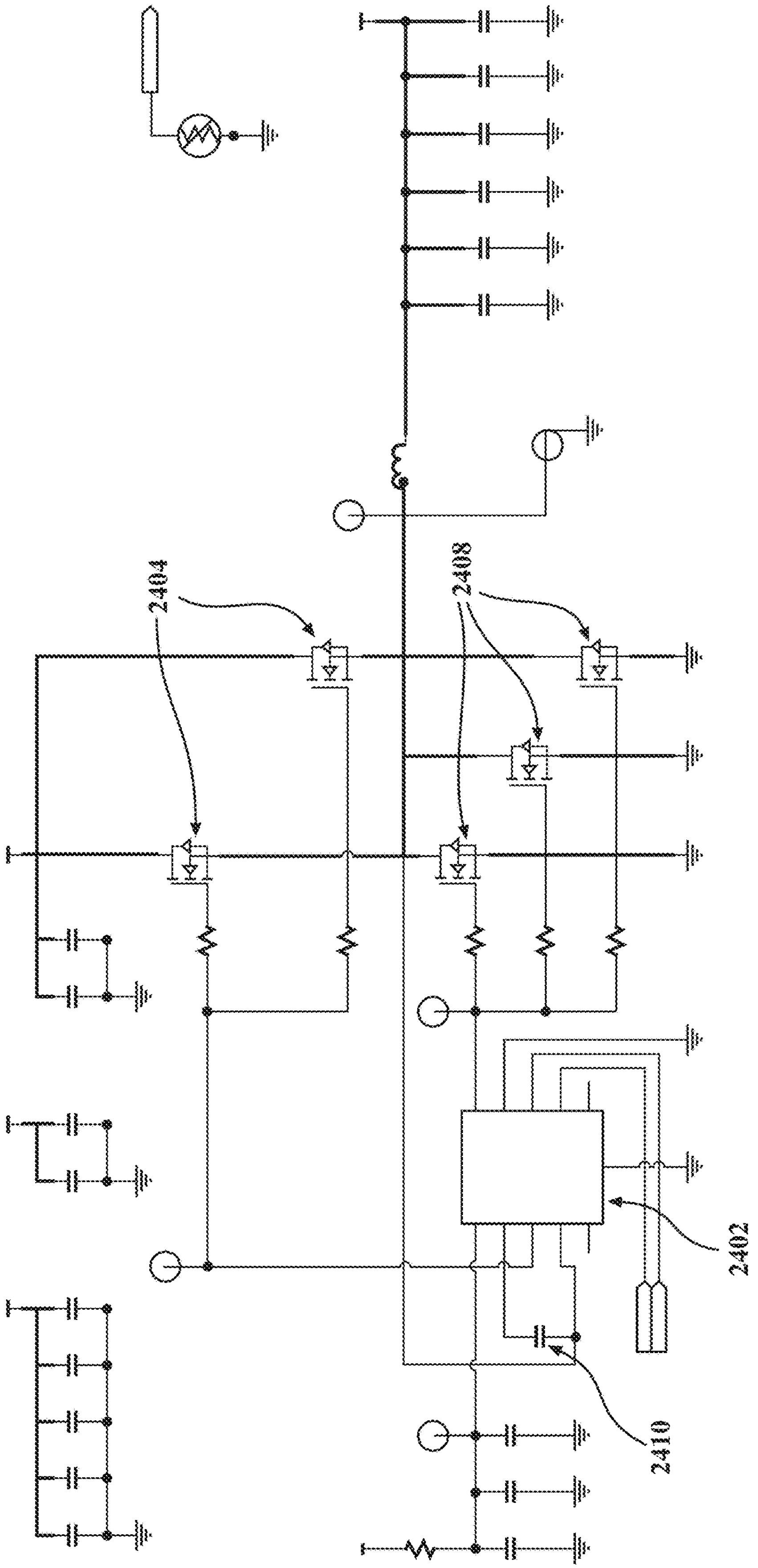
FIG. 24 depicts a circuit schematic of an embodiment of phase architecture.

In embodiments and referring to FIG. 24 and FIG. 23, a challenge associated with 100% duty cycle will be described where frequency reduction may be employed for 99.9% loss reduction. Pre-drivers 2402 that generate the 12V pulses to turn the FETs 2404, 2408 on and off, particularly the high-side FET 2404, is run off of a bootstrap capacitor 2410. The bootstrap capacitor 2410 will charge up to 12V when the low-side FET 2408 is on, and then it will carry that 12 volts on the switching mode on the source so as to keep the gate 12 volts above that point. The flying Bootstrap capacitor 2410 may leak off charge over time and the high-side FETs 2404 cannot stay on at 100% duty cycle without losing charge in the bootstrap 2410. If 100% duty cycle is desired, a charge pump to maintain the voltage on the bootstrap 2410 may be needed. FIG. 23 depicts a circuit for the charge pump depicting the pre-driver 2402 and bootstrap 2410, a pair of diodes 2302, another capacitor 2304, and another driver with a square wave to capacitively couple charge back so that the switch 2312 (FETs) can achieve 100% duty cycle. FIG. 23 depicts a main power circuit such as might be used for a DC-to-DC converter. An EHC may have a similar or reduced power infrastructure, such as that shown in FIG. 26.

Switching may be done at approximately 120 kHz or so. To achieve 100% duty cycle, the bootstrap may have to be refreshed, but it may not have to be refreshed at 120 kHz. Thus, an example 100% duty cycle may be implemented as a 99.99% duty cycle, but at 1 KHz or 5 kHz, not at 120 kHz or the normal switching frequency that is limited by the inductor. This example shows that both the switching frequency and the on time may be selected and/or modified to get to 100% duty cycle or nearly 100% within the limitations of the bootstrap capacitor versus the duty cycle operations (e.g., power required, timing of power, thermal margin availability on the housing).

Figure 25:
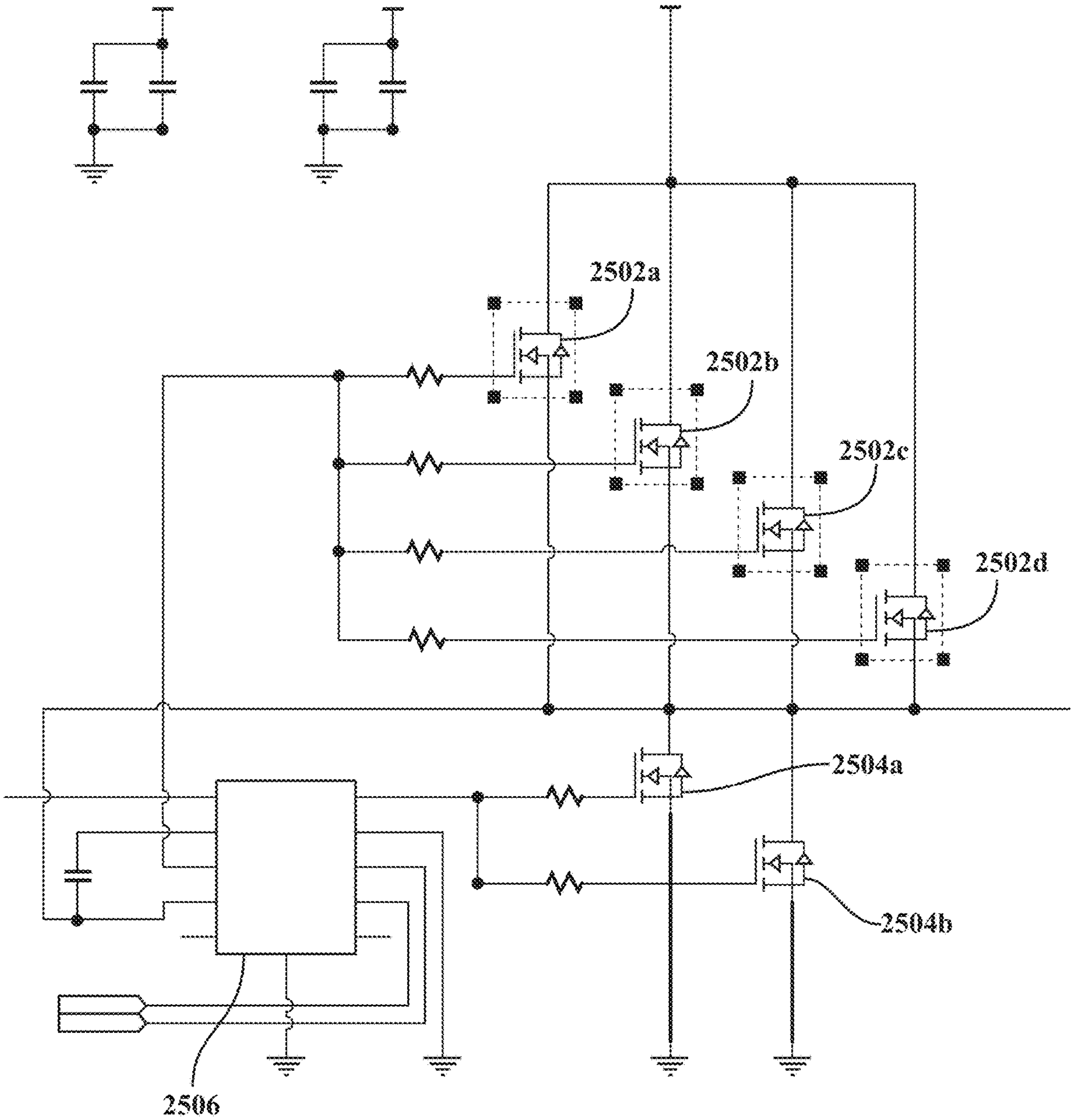
FIG. 25 schematically depicts a phase circuit for the electronic heater controller.

FIG. 25 is a circuit diagram illustrating an example phase converter of a power converter with a different number of high side FETs as opposed to low side FETs. In this example, FIG. 25 depicts 4 high side FETs 2502*a*, 2502*b*, 2502*c*, and 2502*d*, and 2 low side FETs 2504*a* and 2504*b*, as well as a pre-driver 2506. In certain embodiments, the power converter includes a plurality of phase converters having the topology of the exemplary phase converter described herein. In certain embodiments, the power converter includes four phase converters, six phase converters, or another number of phase converters. The power converter may be structured to receive power having a first voltage, decrease the first voltage to a second voltage, and output a converted power having the second voltage. In certain embodiments, the power converter is structured to receive direct current (DC) power having a voltage between 36V-60V and output DC power having a voltage between 6V-18V, to name but one example. The output terminals of the power converter may be coupled to an electric heater device and structured to provide power to the electric heater device. The electric heater device may be a resistive heater of an aftertreatment system of a vehicle, to name but one example.

The phase converter includes a first plurality of switching devices coupled together in parallel. The first plurality switching devices may be coupled between an input terminal and an output terminal. In certain embodiments, one or more of the switching devices of the phase converter includes a field effect transistor. In certain embodiments, the switching device of the phase converter may include insulated gate bipolar transistors (IGBTs), freewheeling diodes, bipolar junction transistors (BJTs), metal-oxide-semiconductor field-effect transistors (MOSFETs), gate turn-off thyristors (GTOs), MOS-controlled thyristors (MCTs), integrated gate-commutated thyristors (IGCTs), silicon carbide (SiC) switching devices, gallium nitride (GaN) switching devices, or any other type of switch structured to selectively control the flow of electric current.

The phase converter includes a second plurality of switching devices coupled together in parallel, the second plurality of switching devices coupled in series with the first plurality of switching devices. The second plurality of switching devices may be coupled between the output terminal and a ground.

In the illustrated embodiment, the phase converter includes six switching devices, wherein the first plurality of switching devices includes four switching devices and the second plurality of switching devices includes two switching devices. In certain embodiments, the number of the first plurality of switching devices is greater than the number of the second plurality of switching devices. In certain embodiments, the ratio of the first plurality of switching devices to the second plurality of switching devices is 2:1.

The phase converter includes a controller, which may include a gate driver. In certain embodiments, the controller operates the switching devices of a single phase converter. In other embodiments, the controller operates switching devices of multiple phase converters.

The controller is configured to operate the first plurality of switching devices by applying the same duty cycle to each switching device simultaneously, though the duty cycle simultaneously to each switching device may be vary. The controller is also configured to operate the second plurality of switching devices by applying the same duty cycle to each switching device simultaneously, though the duty cycle simultaneously to each switching device may be vary. In certain embodiments, the duty cycle applied to the second plurality of switching devices and the duty cycle applied to the first plurality of switching devices are applied independently. In certain embodiments, the first plurality of switching devices and the second plurality of switching devices are operated by applying a duty cycle as if the pluralities were a pair of switches. For example, a 90% duty cycle means the first plurality of switching devices are turned on 90% of the time during one cycle while the second plurality of switching devices are turned on the remaining 10% of the cycle while the first plurality of switching devices are turned off.

In certain embodiments, the difference in the number of first plurality of switching devices and second plurality of switching devices is due to the specific load, the resistive heating device. While providing power to the resistive heating device from the output terminals of the power converter, the current increases as the duty cycle increases. For example, at 10% duty cycle, the second plurality of switching devices are on 90% of the time, but the current conducted by the second plurality of switching devices is 10% of rated current. At a 90% duty cycle, 90% of rated current is flowing through the first plurality of switching devices. The larger number of the switching devices of the first plurality of switching devices are structured to conduct the increased current as the duty cycle increases, whereas the second plurality of switching devices does not require the same number of switching device as the first plurality, since the second plurality of switching devices does not conduct a similar current magnitude as the duty cycle decreases and the second plurality of switching devices are turned on for a longer period during the duty cycle.

The power converter may be configured to operate a subset of the plurality of phase converters in response to a converter condition or an electric heater device condition. For example, a power converter having six phase converter may operate only four phase converters. The converter condition may be based on at least one of a current balance threshold or a ripple threshold. The electric heater condition may be a heat requirement of a vehicle aftertreatment system. In certain embodiments, power converter is configured to time shift a duty cycle for one phase converter relative to a duty cycle of a second phase converter. For example, where two of six phase converters are operating at one time, the power converter may time shift the beginning of the duty cycles by 180 degrees.

The number of phase converters operating at a given time is controllable. As the number of operated phase converters decreases, ripple current increases, which will decrease the lifespan of a bulk capacitor coupled to the power converter. However, where the electric heater device requires a small amount of power, reducing the number of operating phase converters decreases switching losses.

Figure 26:
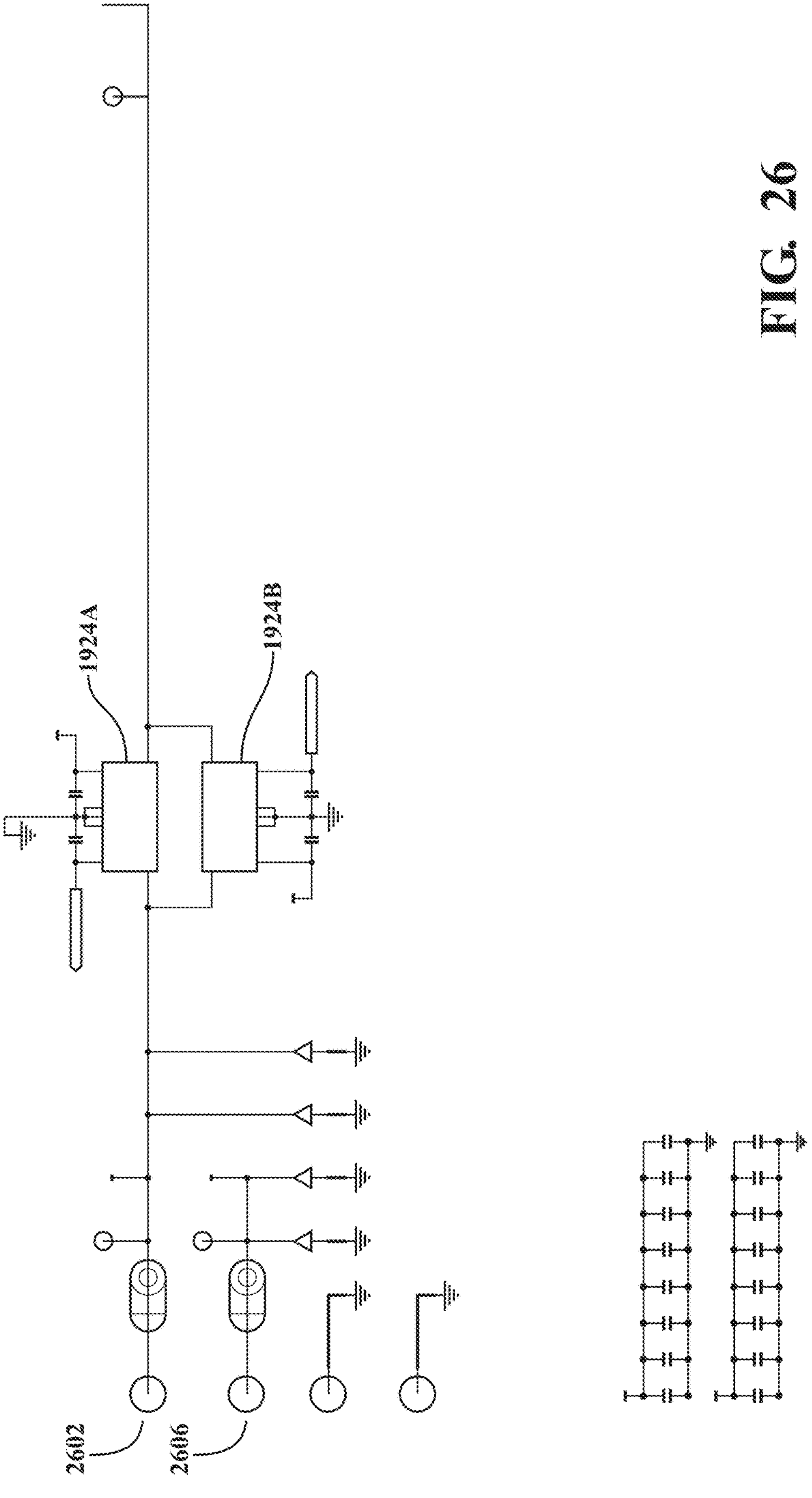
FIG. 26 schematically depicts a main power circuit for the electronic heater controller.
Figure 27:
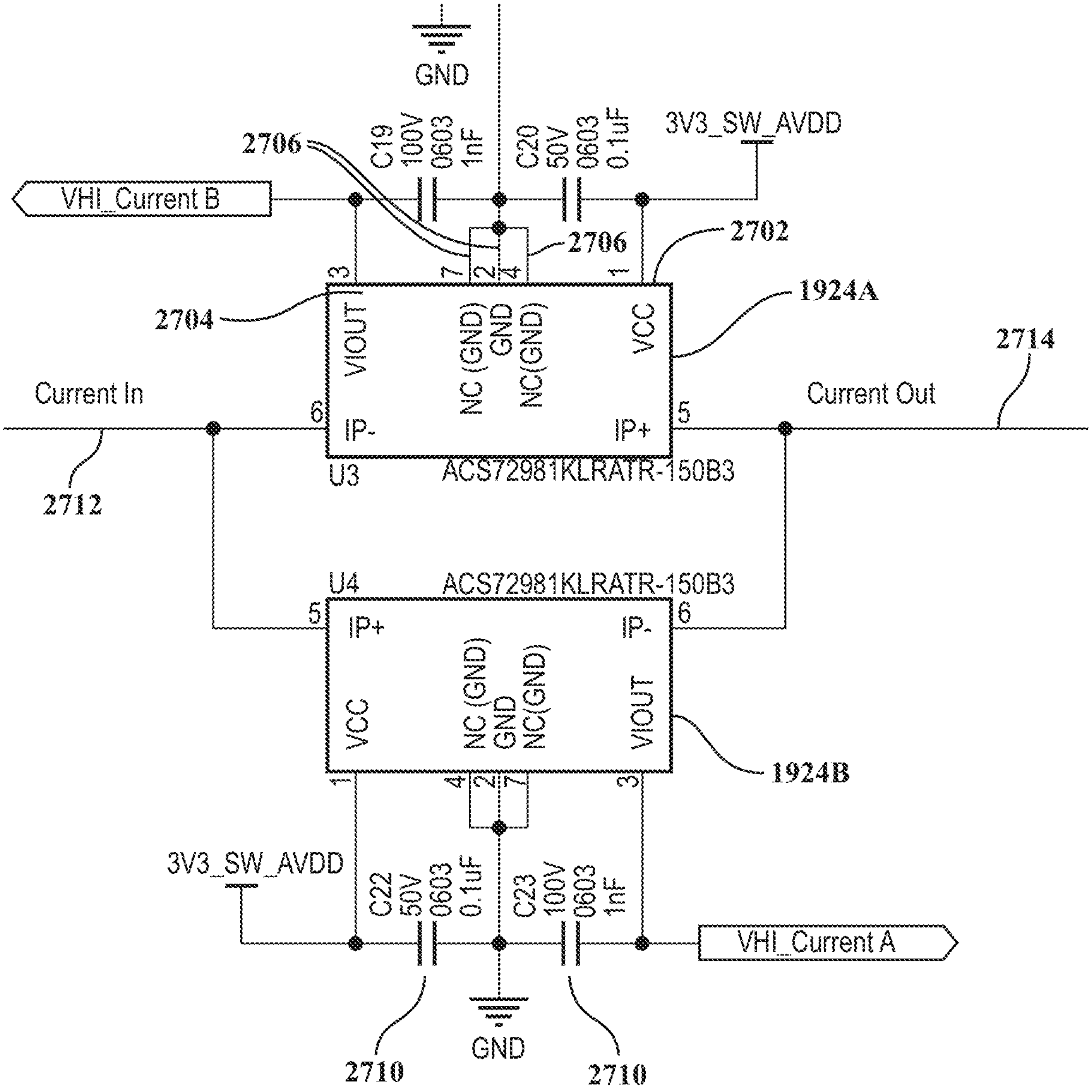
FIG. 27 depicts a close-up rendering of the paired inverse current sensors on the electronic heater control board.
Figure 28B:
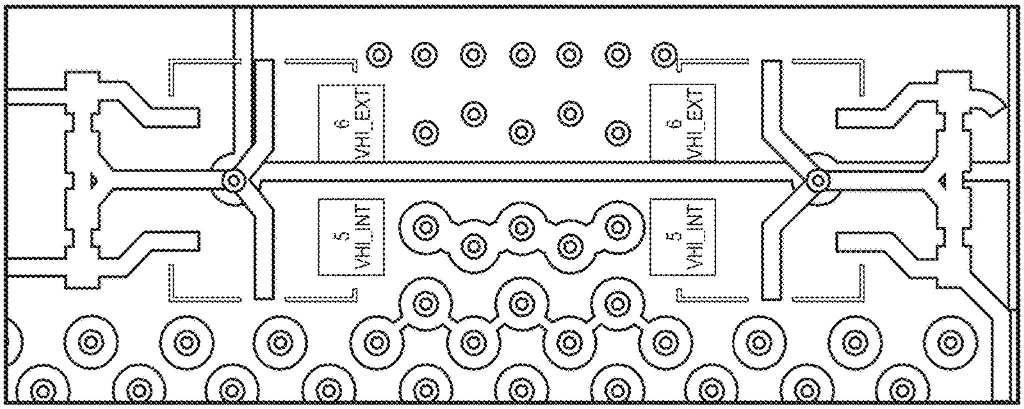
FIG. 28A and FIG. 28B depict a close-up rendering of the Vin/Vout on the electronic heater control board.

In embodiments and referring to FIG. 26, a bi-directional current sensing element with reversed sensing direction/polarity is shown. An input connector 2602, 2802 receives power from an alternator or battery or voltage bus, which flows to two current sensors in opposition to optimize the layout of the PCB (and may be advantageous in very high current situations), and then flows to the bulk capacitance and the internals of the PCB, as depicted in FIG. 28B. The system also has a Vout 2606. As depicted in FIG. 27, and with reference to FIG. 28B, the current sensor itself has 7 leads, including signals coming in and out, power for the sensor ground, and signal out for the current sensor. A pair of 150 Amp current sensors are used to detect 200 Amp current. The pair of sensors are run in parallel to split the current are used in the design and if they were to be laid out in parallel in the same orientation in the same current flow, the sense lines would be in the high current path in the middle. In order to avoid cutting the main path for the current to pass, the current sensor is flipped by having the positive input on the left and the negative input on the right. In this way, the main copper is thick that goes directly to the current sensors and then the output is also thick which goes directly to the rest of the board. The more copper you have, the less resistance, which is less voltage drop and higher efficiency, and there is also less heat loss. By putting the sensors in 180 degree rotation means that one sensor reports positive current and the other sensor reports negative current, which enables simplification of sourcing surface mount parts while still maintaining an efficient current path through the high side input. Also, using two sensors enables dividing the current in half and power is $i^2r$, so actually half the current is a quarter of the power in each of the sensors. The design may also reduce heat generation (less total $i^2r$ heat, greater surface area, thermal mass, etc.).

Figure 28A:
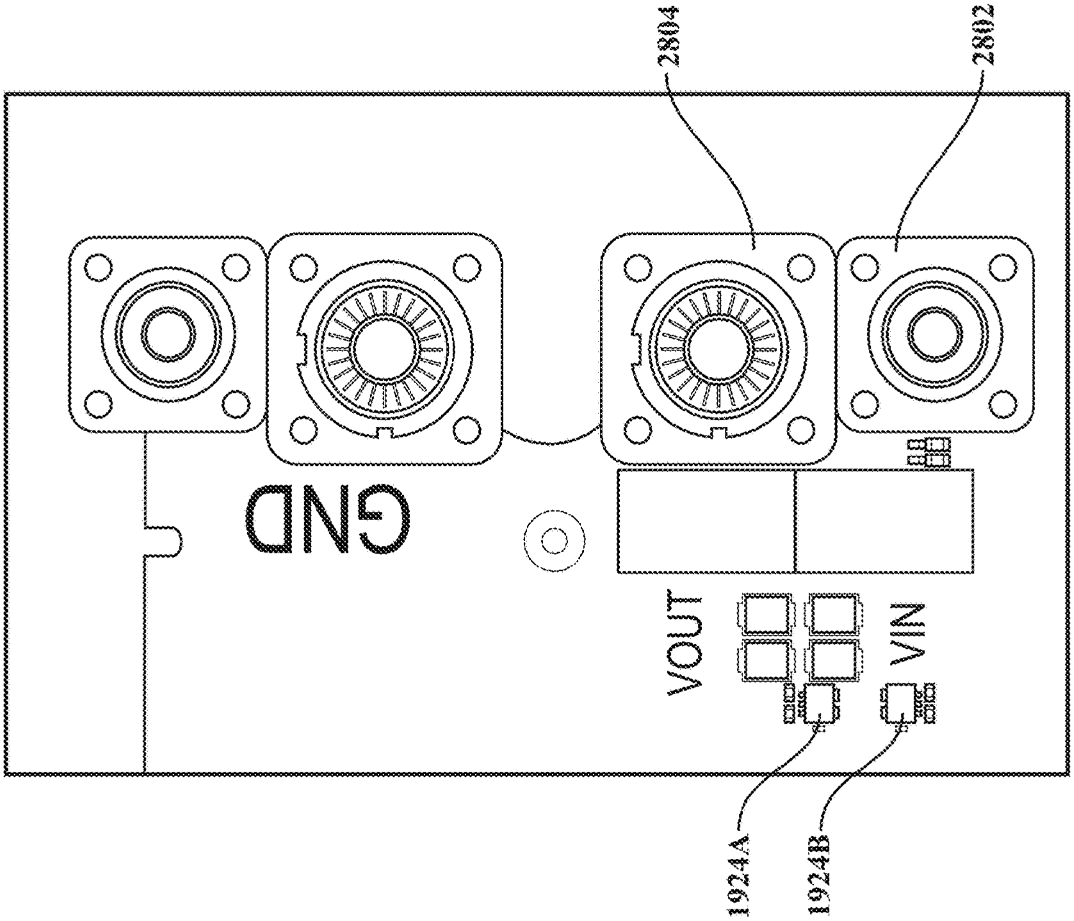

In an embodiment and referring to FIG. 28A, the input 2802 to and output 2804 from the board may be through separate coupling fingers. As described herein, the input connector 2602, 2802 receives power from an alternator or battery or voltage bus, which flows to two current sensors placed in opposition (see detail in FIG. 28B) from where current flows to the bulk capacitance and the internals of the PCB. Having the input and output on separate fingers advantageously allows for separate chokes on each finger. The chokes may be identical, or may be different. Both fingers may be choked, or only one of the two may have a choke. One of skill in the art would choose a choke based on the noise profile experienced at the board, a desired noise profile, a current density, and the like. In an embodiment, the choke may be ferrite. In embodiments, the finger may only be as thick as the choke. The chokes, which may be ribbon cable ferrites, may enable EMI suppression. The fingers themselves enable flexibility in tolerancing between the connector and the board as the finger can accept misalignment stress. In this embodiment, a ferrite choke is slipped over the finger to act as a high frequency cut, wherein the choke comprises surface mount caps. Effectively, there is a large amount of capacitance on the inside and the choke adds a little bit of capacitance on the outside for high frequency bypass.

In embodiments and referring to FIG. 28A, the electric heater ground may return ground current back to the EHC, wherein the EHC may effectively serve as a 200 amp current jumper from the chassis ground to the output. In a buck mode, a 100 amp current may be an input to the EHC and the EHC may output 250 amps to the heater. In this example, 250 Amps may return to the EHC and only 200 amps would return back to the chassis with the additional 50 amps recirculated on the circuit board internally to the converter. This avoids high recirculating current in wiring harness. In embodiments, more or less ground current can be returned to the EHC and/or chassis. In embodiments, the EHC may control an amount of ground current sent to a particular location. In embodiments, the EHC may control which location to which ground current is sent. This capability of the EHC provides an opportunity to monitor and control ground current that would not be available if returned via chassis ground from the electric heater directly. This capability of the EHC enables aspects of buck mode, such as recirculating current on the board.

In an embodiment, the electric heater control may be de-contented relative to the DC/DC converter. For example, a high side switch (12V/48V isolation for over-voltage) may be omitted in a 48V system. Further, a high side switch may require a pre-charge circuit such that de-contenting of the high side switch also results in de-contenting the pre-charge circuit. In an embodiment, the electric heater controller may be based on a DC-to-DC converter, excluding optional items for the electric heater controller. FIG. 23 depicts the DC-to-DC converter while FIG. 26 depicts the electric heater controller. Common components may include current sensors, protective Zener diodes, and the ferrites. In the DC-to-DC, a high side switch may be needed for a number of operating modes. One of them is the possibility that in a DC-to-DC, 12V may be applied and that can shoot back into the 48V bus, and if there is a short to ground on the 48V bus, it can overstress the components. To mitigate potential overstress, a high side switch is used. There may also be a failure mode in the DC-to-DC where the high side switch turns on and can apply 48V to the 12V and damage every ECU in the vehicle, so the switch is also there for fault containment to shut off an overvoltage. Since there is less concern about overvoltage damage of inadvertently applying 48V to the electric heater, there is no need the fault mitigation, and because a resistor cannot generate current to backflow to the 48V bus, it does not need to be blocked. Therefore, no high side switch is necessary in the electric heater controller. Further, when high side switches are used, they may also utilize a precharge circuit to equalize the voltage on the capacitors on both sides of the switch before being closed. In the DC-to-DC converter, an input inductor is used to reduce conducted electromagnetic interference (EMI) emissions. In some embodiments, an inductor choke may be omitted from the electric heater controller since it may not be needed for electric heater operation (e.g., less filtering of high frequency noise required, less efficient filtering of high frequency noise needed), however, it may be needed for electromagnetic compatibility (EMC) management.

A person of skill in the art will recognize that utilization of product line commonality, as shown here for the DC-to-DC converter and electric heater controller, will have advantages in terms of at least reduced part count and ease of integration due to commonality of components.

Figure 29:
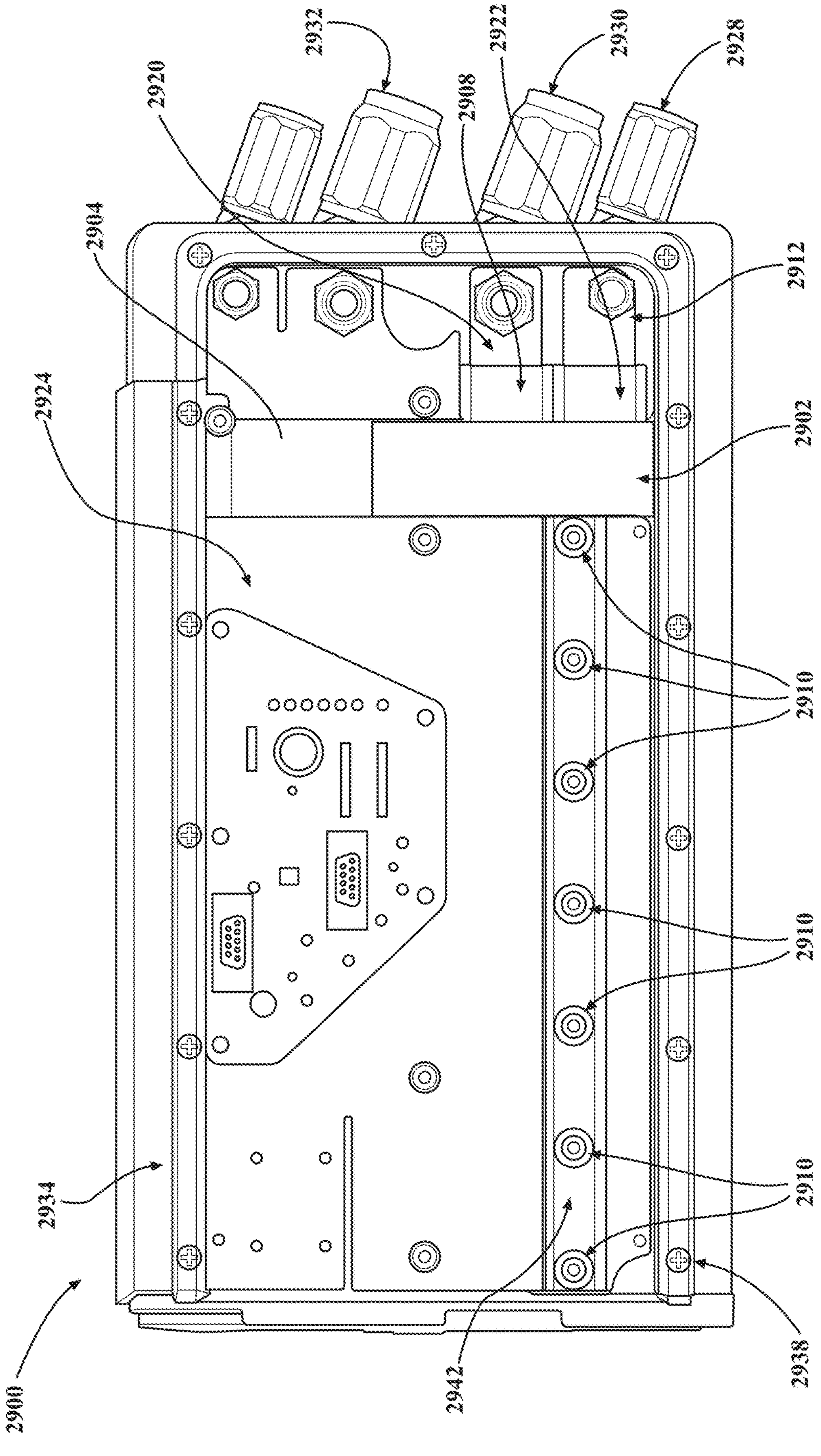
FIG. 29 depicts a rendering of a common choke on an embodiment of an EHC board.

In embodiments and referring to FIG. 29, the EHC board layout may support a common-mode choke. A cutout area 2904 of the board allows the common-mode choke to wrap around the board or snap together around the board. The arrangement of components on the board allows for an omission of parts in the cutout area 2904 enabling the common-mode choke design. The arrangement of components on the board allows for a simplification of circuits in at least one area that allows for power in and out to be choked together with the common-mode choke 2902. In some embodiments and referring to FIG. 19, a portion 1902 may be marked to support a cutout operation of a board with or without a choke. The portion 1902 may be cut out to enable placement of a common-mode choke that does not interfere with the main path to ground.

In embodiments and referring to FIG. 29, the EHC board may include a common-mode choke 2902 around the power in and power out on the board, in similar fashion to ferrites acting as differential chokes 2908 around fingers 2912 of the board that support connectors. The arrangement of power flow on the board may be designed to support the included common-mode choke and/or differential chokes. An opening 2904 in the board allows for the common mode choke to be placed on the board while avoiding choking the main path to ground. The common mode choke may be a split-mode choke of two pieces that clip together around the board. In embodiments, the choke may be ferrite. In embodiments, the common and/or differential chokes may be ferrite. The size of the common-mode choke may be variable in accordance to how much current path is needed on the board. In embodiments, the differential chokes 2908 may be the same material or different. Materials may be selected for the common-mode choke and differential chokes based on a desired noise profile, a desired frequency filtering, a current rating, the size of the current path, and the like.

Figure 30B:
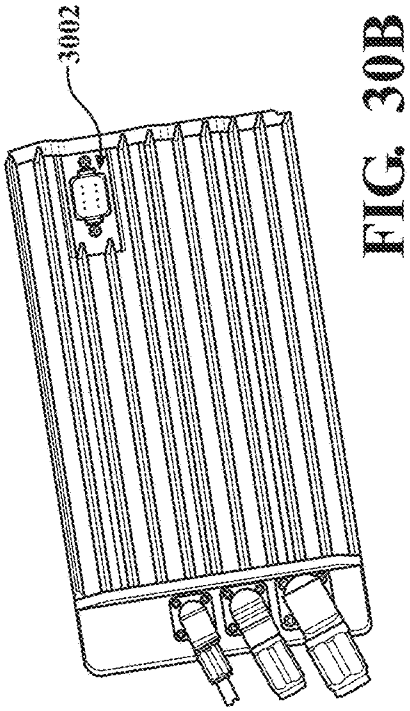
FIGS. 30A-30C depict renderings of the heat sink.
Figure 30C:
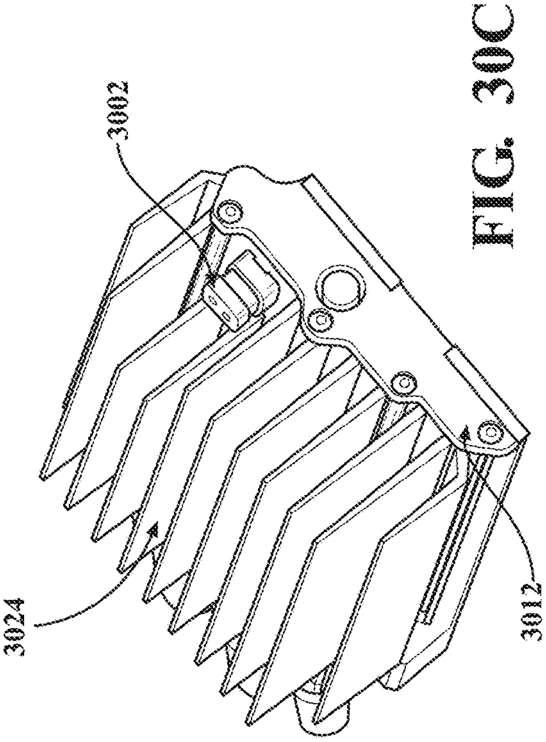
Figure 30A:
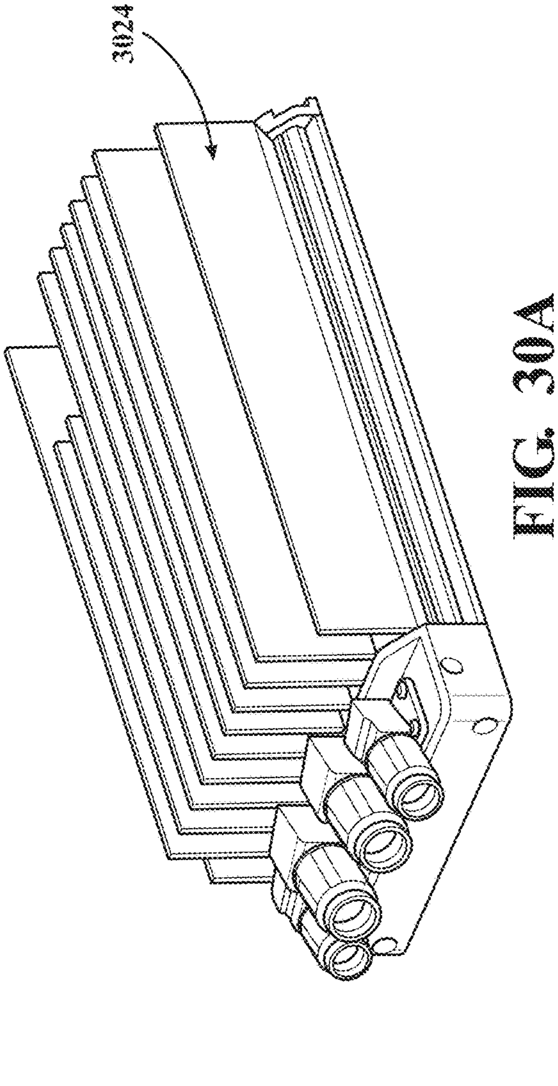

In embodiments and referring to FIG. 29, FIG. 30A, FIG. 30B, and FIG. 30C, the housing for the EHC board may be configured to support modularity/extensibility. FIG. 30A is a perspective view of the housing, FIG. 30B is a top-down, or overhead, view of the housing, and FIG. 30C is an end perspective view. A connector 3002 is shown on the top of the housing. An end plate 3012 may include a breather vent, such as made from polytetrafluoroethylene (ePTFE). An advantage of the board design is the ability to go to a different number of phases and to shorten or lengthen the housing to cater for that. Layouts on the PCB allow for extension and/or reduction of phase counts. This design is scalable—the EHC board can be "copy/pasted" or scaled from 80 amps with two phases, 160 amps with four phases, to 210 Amps and 8 phases, and so on, while the extrusion is stretched to accommodate the multi-phase scale, all of which results in minimal engineering and costs to scale power and length. To accommodate modularity and extensibility, the board layout may include common components on one end of the board with the phases on the other end. On the bottom left of the board as shown, the board layout depicts the phases 2910 all in a row, with the inductors in a line which then fit into an inductor valley in the extrusions so that they can be coupled to the housing/heat sink. MOSFETs may also be disposed in a row and clamped to the heat sink with a thermal interface material with a known pressure.

In some embodiments, the source of the power for the EHC board (e.g., 12V or 48V) may enable aspects of modularity. For example, the controller can be powered by the keyswitch input (e.g. 12V) from the control connector 3002 on the top of the heat sink, or it can powered by a 48V input as well, whether it's for fault management or to eliminate a pin from the connector, which may eliminate the need for the connector 3002 on top.

Figure 49A:
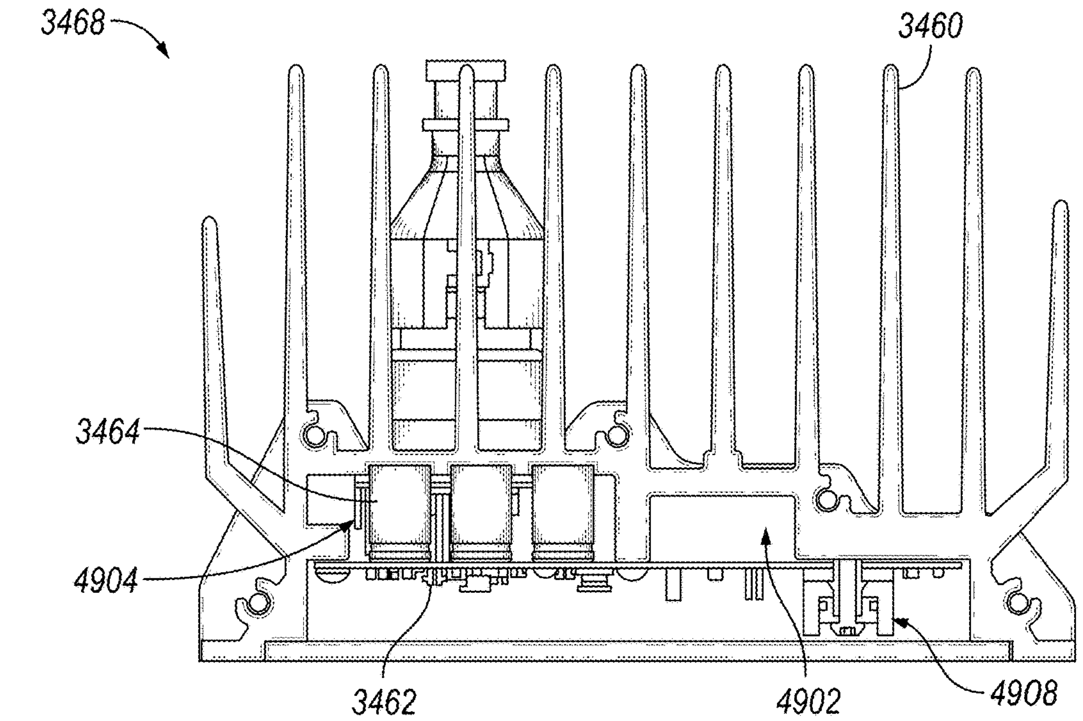
FIGS. 49A-D depicts a DC-DC with custom heatsink.
Figure 49B:
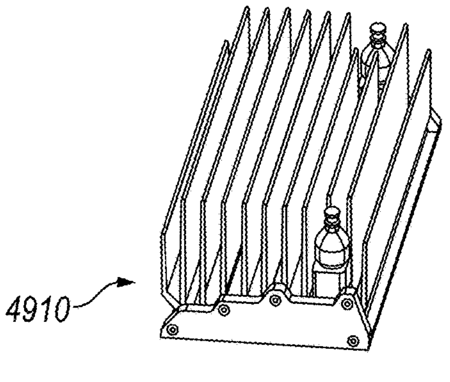
Figure 49C:
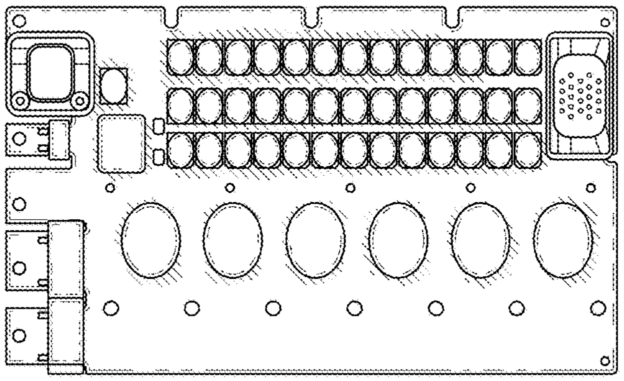
Figure 49D:
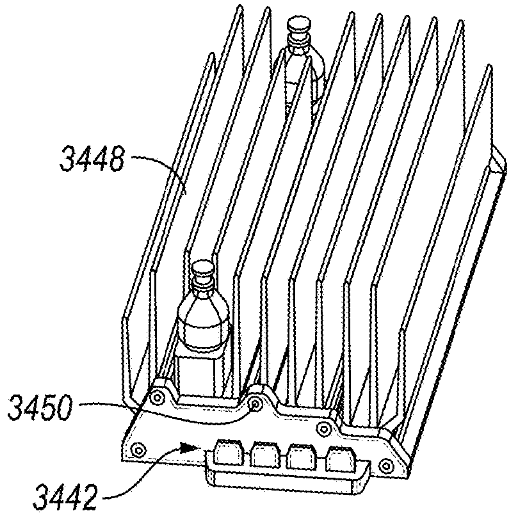

FIG. 49A, FIG. 49B, FIG. 49C, and FIG. 49D depict a DC/DC with custom heatsink, shown fully assembled FIG. 49A, FIG. 49B, and FIG. 49D, comprising an inductor valley, connector and capacitor valley 4904, and FET clamp, and is able to be used for varying number of phases with minimal change of hardware. In embodiments, the eheater controller may comprise similar elements as the embodiments described in FIG. 49A-D and FIG. 50. FIG. 49A is an end view of the DC-to-DC converter showing an inductor 4902 in an inductor valley of the extruded heat sink 3460, and capacitors 3464 inside the capacitor valley 4904 of the heat sink. In FIG. 49C, the DC-to-DC converter without the heat sink in place. In an embodiment, a custom extrusion for the housing may be used to reduce cost compared to die casting and to provide the ability to optimize for heat transfer and incorporate housing features at the same time. In FIG. 49C, the board layout depicts the phases all in a row, with the inductors in a line which then fit into the inductor valley in the extrusions so that they can be coupled to the heat sink. MOSFETs may also be disposed in a row and clamped to the heat sink with a thermal interface material with a known pressure. A capacitor valley 4904 may house the capacitors 3464. The primary life limit for power electronics may be electrolytic capacitors, which degrade with temperature (e.g., a base chemical reaction causing degradation of capacitors can be estimated as an Arrhenius wear law states, with every 10 degrees Celsius doubling the degradation rate). Accordingly, the service life of capacitors can be significantly increased by modest reduction in average and/or peak operating temperatures for the capacitors. In this embodiment, the heat generation is focused on the right side of the top right image, while the left side of the top right image remains at a lower ambient temperature. In some embodiments, there may be a 10 degree Delta between sides, which may increase (e.g. double) the life of the electrolytics in the valley. In embodiments, the heat sink fins may be sized for sufficient heat transfer through at least conduction and radiation. In embodiments, RTV may be placed between the tops of the capacitors, or between the capacitors and the extrusion to constrain vibration. A thermal epoxy may be used between the inductor and the heat sink. In a sense, the inductor supports the circuit board with screws to hold it while the epoxy cures. In embodiments, the inductors may be shimmed up and intentionally thermally decoupled and giving some compliance between the inductor lead and the extrusion. The gap between the inductor and heat sink should be as thin as possible. The mass of the inductor to be carried directly by the structural elements of the housing, not by the soldered connections to the circuit boards. Another advantage of the extrusion with this board design is the ability to go to a different number of phases and to shorten or lengthen the housing to cater for that. This design is scalable—the DC-to-DC converter can be "copy/pasted" or scaled from 80 amps with two phases, 160 amps with four phases, to 210 Amps and 8 phases, and so on, while the extrusion is stretched to accommodate the multi-phase scale, all of which results in minimal engineering and costs to scale power and length. In an embodiment, FET clamps may be used with the board. When a circuit board is screwed down to a heat sink, it compresses the thermal material of the screw hole and actually bubbles it up. In an embodiment, a U-shaped extrusion 4908 with Belleville Springs and a Silicon pad placed below the heat sink may provide localized pressure on the top of the MOSFET, loading the MOSFET into the thermal interface material and into the heat sink. In the embodiment shown in FIG. 49A, the FET clamp may be six individual pieces with two screws and Belleville springs each, or one long extrusion with seven screws, seven Belleville springs, and six rubber pads that press the heat generating source into the heat sink. An embodiment may include a PCB thermal interface and heatsink housing and a clamp providing localized pressure over the MOSFETs. In this embodiment, heat transfer occurs via thermal vias in the PCB to the thermal interface and heatsink housing. Most of the heat is in the MOSFETs and inductors and those are thermally coupled to the housing.

In embodiments, heat is shifted away from the capacitors and more of the heat can be taken off the circuit board by lifting the inductor slightly and some compliance. Through component selection, such as by choosing the control connector at the two ends of the valley to be the same height as the capacitors, manufacturability is enhanced by having a single, combined capacitor and connector valley sharing one feature on the extrusion.

In one embodiment of the DC-to-DC converter, an insulated metal substrate board with the MOSFETs carries the heat out, a heavy copper board carries the high currents backed with busbars, and a four layer standard FR4 circuit board carries the high density microprocessor and surface mount parts.

In another embodiment of the DC-to-DC converter, the DC-to-DC converter comprises a substrate that has good thermal performance by using a thin FR4 circuit board, very heavy copper wherein a cross section of the board is over 50% copper (e.g., a copper board separated by fiberglass layers), and wherein the outer layers are lower copper so that we can achieve high density with the inner layers being heavy copper. The DC/DC converter housing 3448 defines at least a portion of the DC/DC converter 3468, the DC/DC converter housing comprising fins 3460 thermally coupled to switching circuits 3462 of the DC/DC converter 3468, and the DC/DC converter housing having a substantially constant cross-section. Having a substantially constant cross-section may allow for machining operations to provide for one or more of: 1) control connection through the top, 2) tab forming for securing to the tray, or 3) accommodation for the connector/service disconnect.

Figure 50:
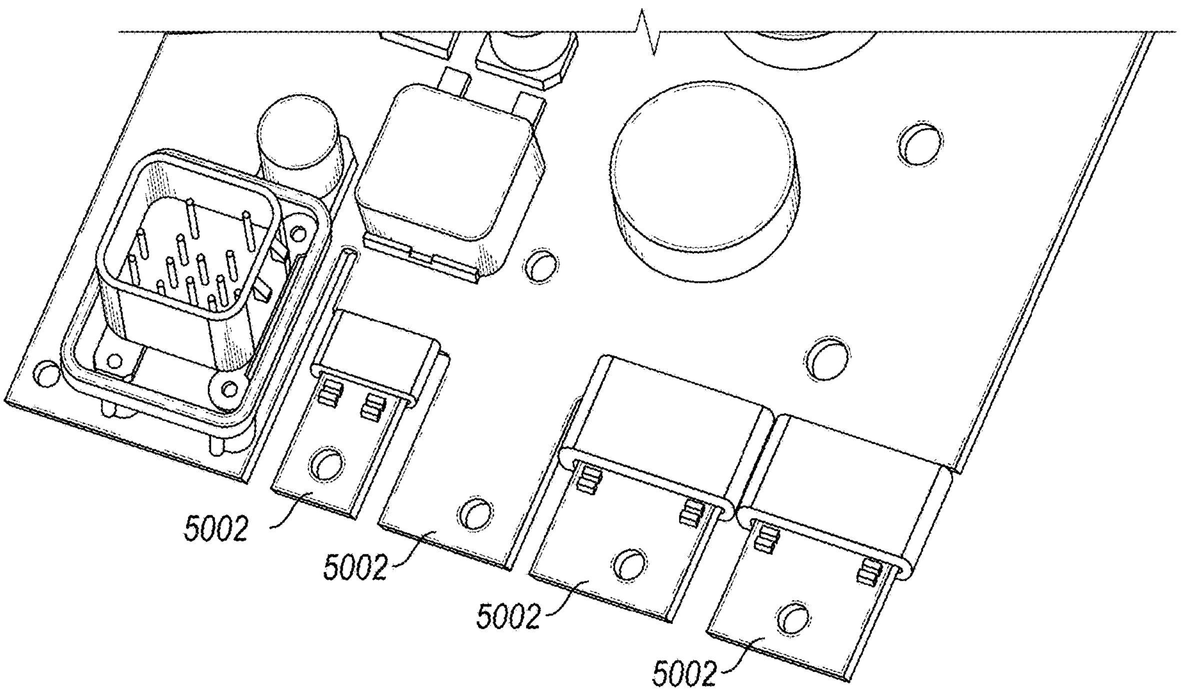
FIG. 50 depicts use of ribbon cable ferrites for EMI suppression on the power fingers of a PCB.

The connection to the outside usually involves custom copper pieces bolted to the board that typically go through a choke, however, as shown in FIG. 50, ribbon cable ferrites, or chokes, for EMI suppression are used on the power fingers 5002 of the PCB (FIG. 50 depicts a zoomed in version of the left side of the PCB shown in FIG. 49C.) In FIG. 50, ribbon cable connectors are used to create "fingers". The fingers also are for flexibility to deal with tolerancing between the connector and the board as the finger can accept the misalignment stress. In this embodiment, a ferrite choke is slipped over the finger to act as a high frequency cut, wherein the choke comprises surface mount caps. Effectively, there is a large amount of capacitance on the inside and the choke adds a little bit of capacitance on the outside for high frequency bypass. In this embodiment, the left most finger carries the 48V load, the second is ground, and the rightmost two are 12V (where one finger 5002 may be Vin and the other may be Vout, or where both may be outputs), however, 24V is also possible, possibly with a change in a Zener diode. In an embodiment, having the design include two outputs was to be able to run the vehicle at 14 volts while the 12 Volt battery fluctuates from 12½ to 14 volts with the help of a diode. There are cost and board space savings for the MOSFETs to carry 200 amps in a solid state, active diode that connects the battery to the vehicle if the DC-to-DC converter fails. In an embodiment, the outputs may be shorted together, both of them being 12 volts. This design enables an application where the power to the vehicle 12 Volt may be at a different voltage than the 12 Volt battery with the high current solid-state connection and reverse battery being on the board while keeping the same interface Referring again to FIG. 49A-D, the DC-to-DC converter is assembled with stainless, self-tapping screws into the aluminum extrusion, RTV to seal the end plate, and a snap-in, GORE-TEX breather vent 4910 that snaps into a plastic injection molded part on the back end. The front end, in FIG. 49D, is a similar construction and arrangement with just three bent or four bent pieces of copper to make the connections to the circuit board. FIG. 49D is the opposite end as that shown in FIG. 49B. The DC-to-DC converter includes one connector to the vehicle for Key In and Key Switch, one to the battery tray to talk to the battery sensors and monitor. An installed connector block 3442 is depicted in FIG. 49D. In embodiments, the connector block may further include a stainless steel, self tapping screw 3450 coupling the connector block 3442 to at least one of the extruded housing 3448 or the battery tray.

Figure 31:
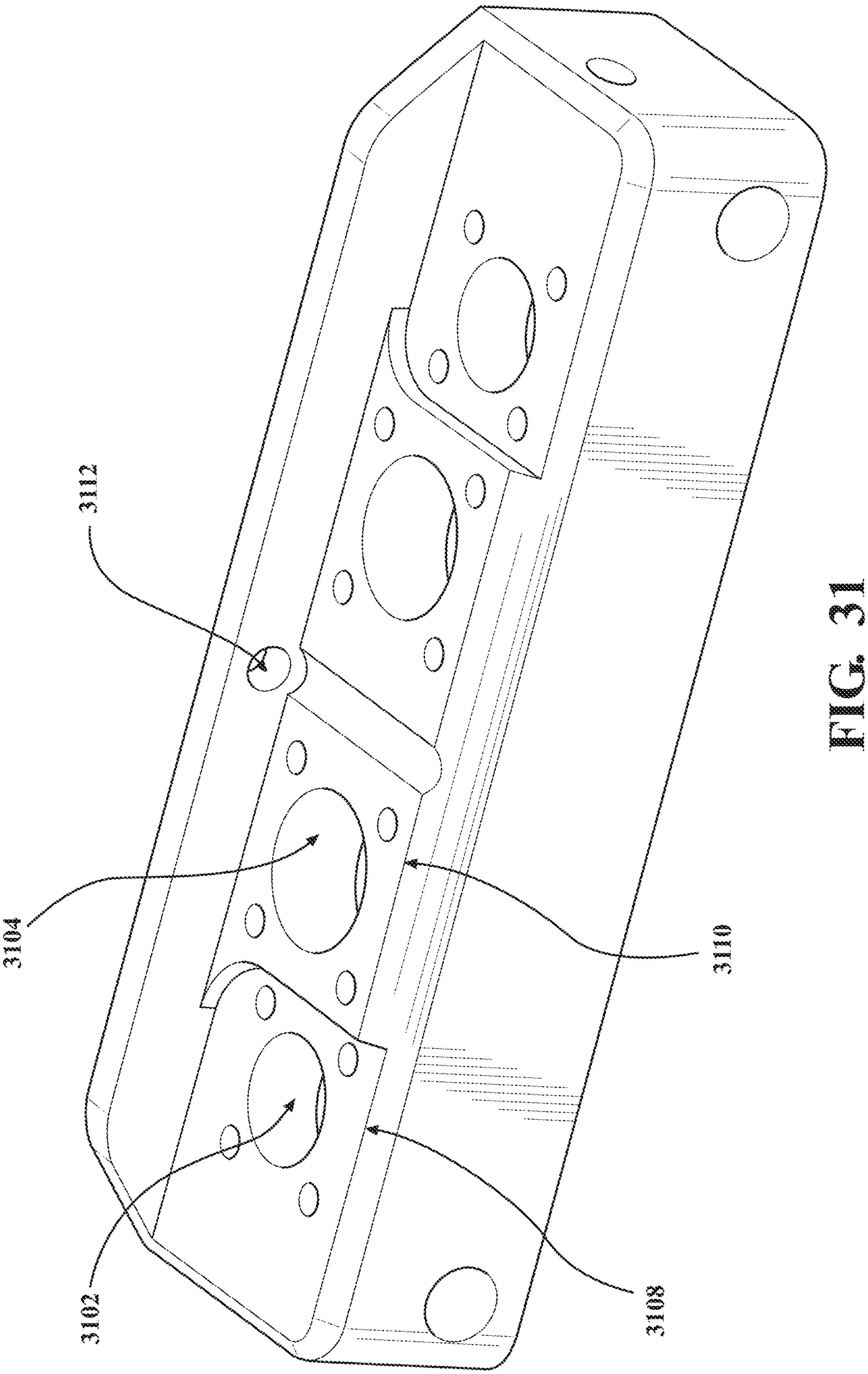
FIG. 31, FIG. 32, and FIG. 33 depict renderings of a connector block.
Figure 32:
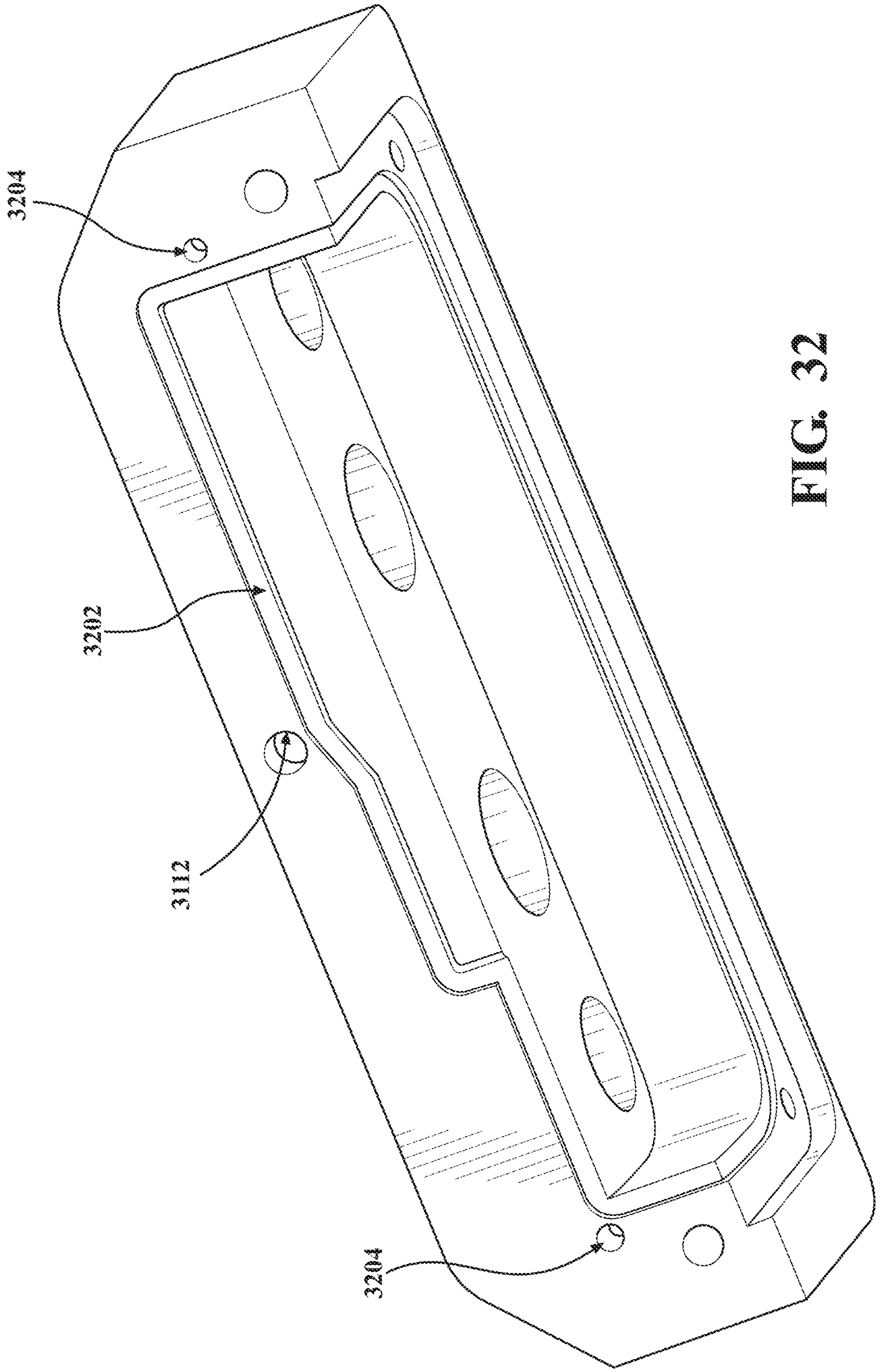
Figure 33:
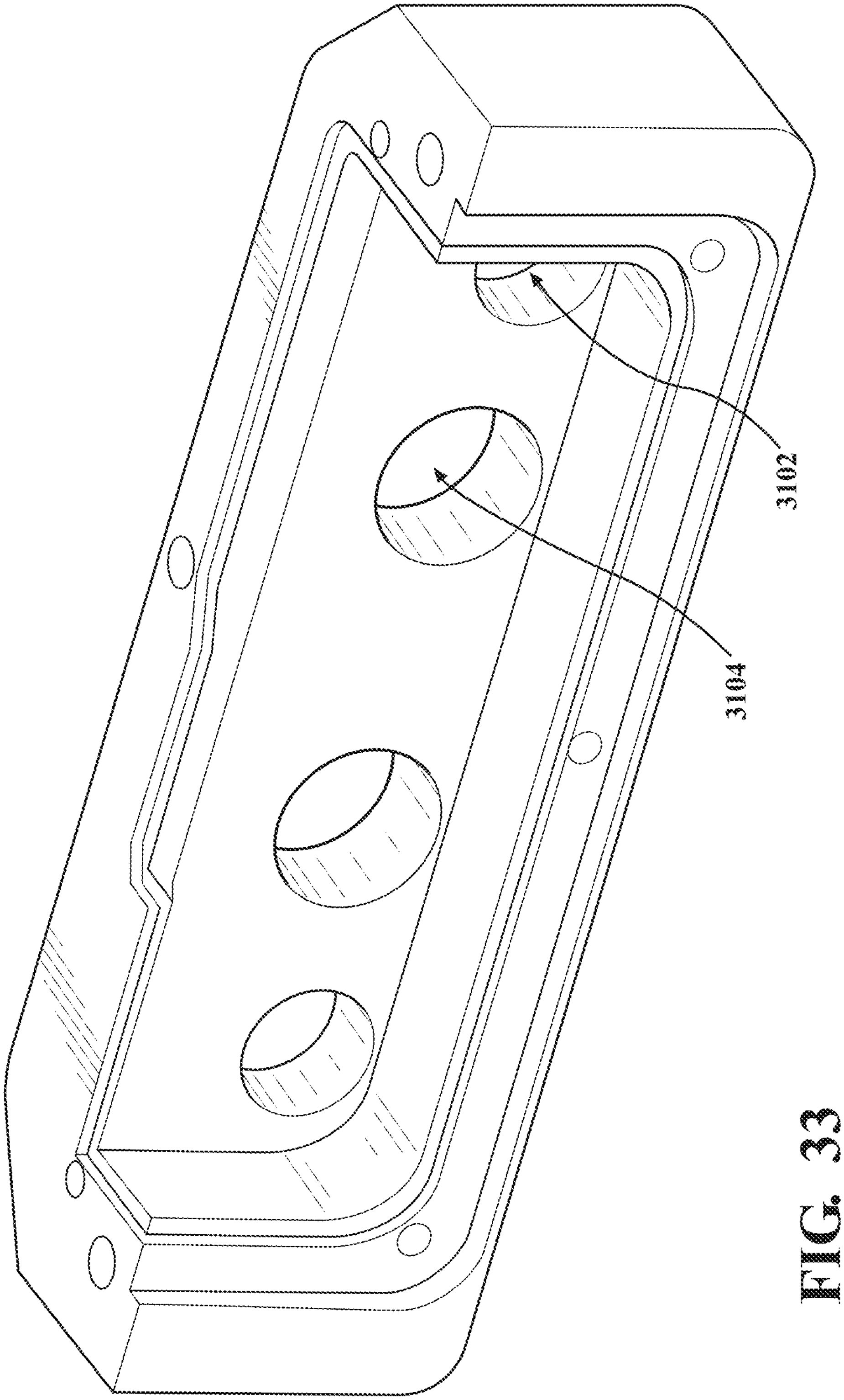

In an embodiment and referring to FIG. 31, FIG. 32, and FIG. 33, a connector block may be 3D printed, diecast, or injection molded. In embodiments, the connector block may be machined in one operation. Portions of the connector block may be formed at different heights to accommodate differently sized connectors so that they mount to the same level on the board, with a center point on at least one end for machining purposes. FIG. 32 depicts a groove 3202 for sealant to the housing and locating pinholes 3204. Effectively, the connector block design ensures a uniform Z height is attained on the PCB on the internal and adjust the Z height based on the connector family on the external.

Figure 34:
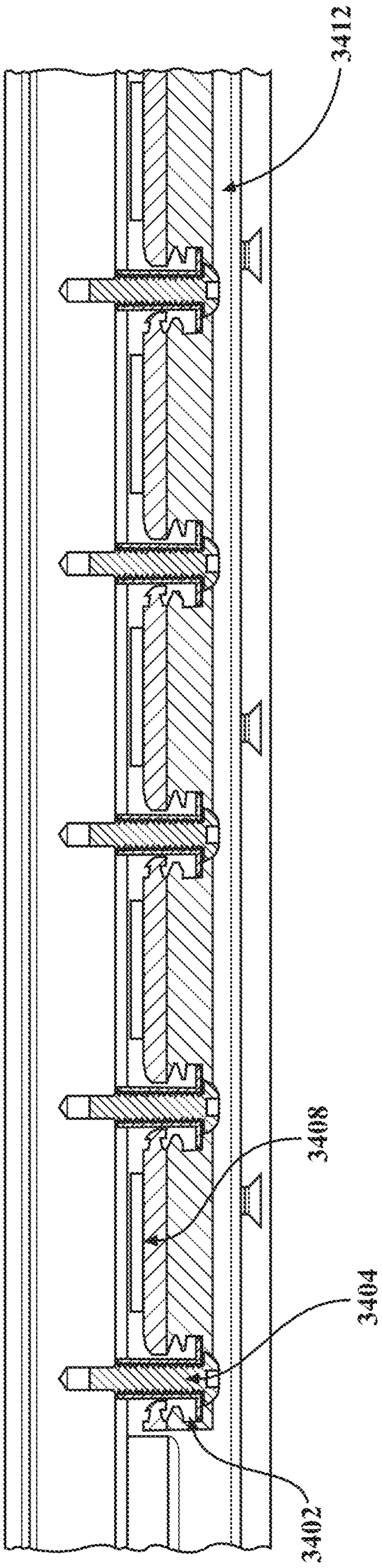
FIG. 34 depicts a clamp bar to enhance thermal contact between chips and a heat sink.
Figure 35:
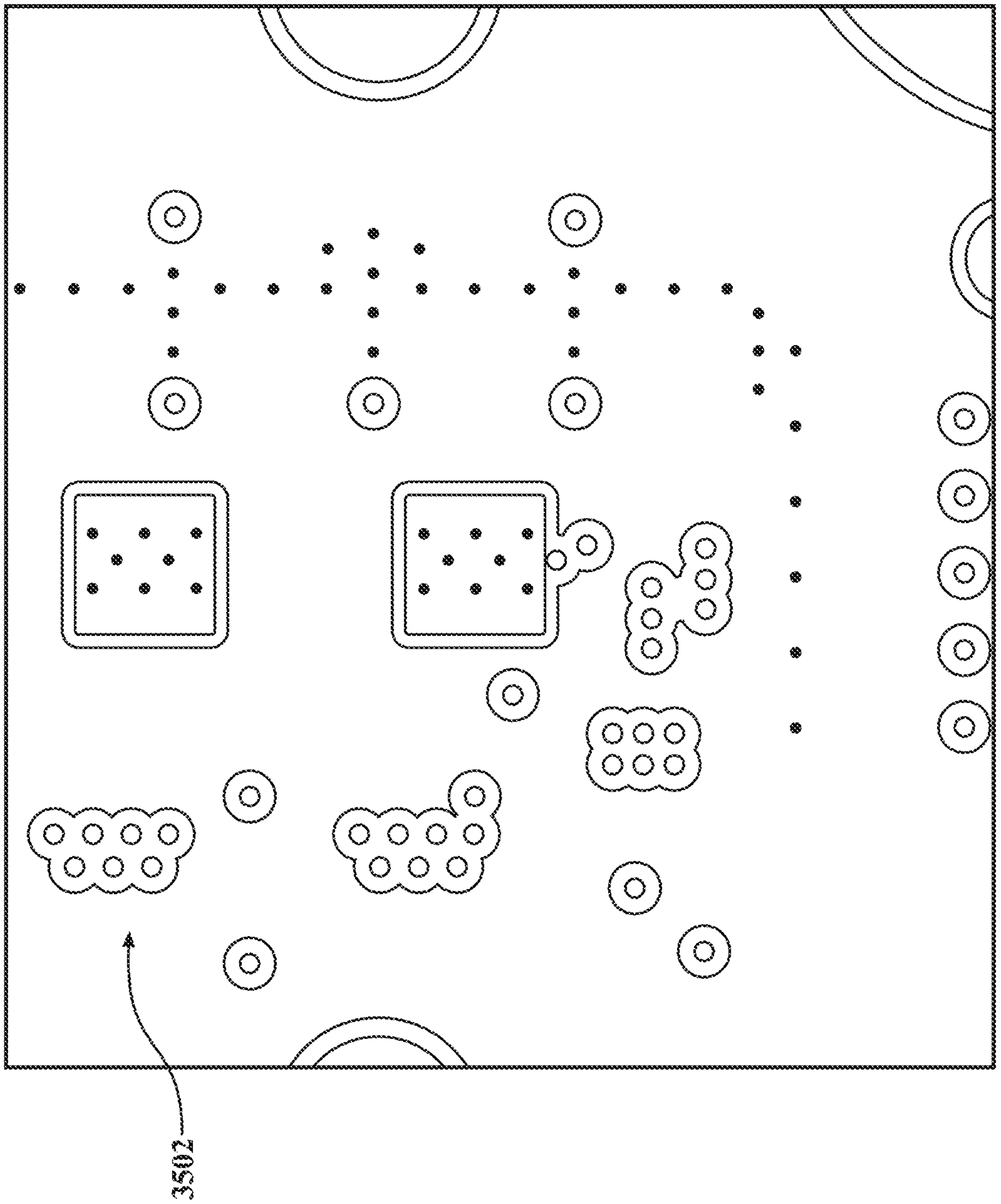
FIG. 35 depicts a close-up rendering of a layer for one of the phases of the EHC board showing the 4FET/2FET configuration and thermal vias.

In some embodiments and referring to FIG. 34, a clamp bar 3412 may be used to provide localized pressure on the top of the MOSFET to improve thermal transfer, optionally loading the MOSFET into a thermal interface material and into a heat sink. In some embodiments, the bar may be a spring-steel bar or an aluminum mounting bar. The pressure may compress one or more springs 3402. FIG. 34 also depicts a spacer 3404 and silicone pad 3408. The clamp bar may be aluminum. Clamping should improve thermal coupling, but high force, such as if a screw were used instead of a clamp bar, can cause deformation and reduce coupling. In this embodiment, heat transfer occurs via thermal vias 3502, depicted in FIG. 35, in the PCB to the thermal interface and heatsink housing. Most of the heat is in the MOSFETs and inductors and those are thermally coupled to the housing. In certain embodiments, elements of the clamp bar or its use may depend upon how the EHC is mounted, such as if it is mounted to an aftertreatment system.

Referring back to FIG. 19, a top view of the EHC board may be seen including the main power section 1922, including input connectors, Vin 1904 and Vout 1906, as well as ground connectors 1912, 1916. The power may be provided at a variety of power engagement points such as a battery, an alternator, a belt, a flywheel, after transmission, and the like. The main power section 1922 also includes two current sensors 1924A, 1924B which are connected in parallel. An example main power section includes the current sensors 1924A, 1924B arranged with one sensor reversed (e.g., reading a negative current). The EHC board may include six phase circuits 1932A to 1932F.

Referring back to FIG. 26, which depicts a schematic of the main power section corresponding to the board depicted in FIG. 19, the input current at Vin 2602 is run through two current sensors 1924A, 1924B in parallel (halt the current flowing through each current sensor 1924A, 1924B). The combined output of the current sensors is then provided to the rest of the board. Reducing the current run through each current sensor 1924A, 1924B by 50% results in the power, which is proportional to the square of the current ($V=I^2R$), being reduce to 25% at each current sensor 1924A, 1924B. The lower power results in less heat generation at each current sensor 1924A, 1924B and the use of two current sensors spreads the heat generated over a larger surface area and thermal mass. Additionally, dividing the current between two current sensors 1924A, 1924B allows for lower requirements on the individual current sensors 1924A, 1924B with the potential for using readily available, off-the-shelf components. For example, in the EHC board shown, the two current sensors 1924A, 1924B are rated for up to 150 Amps. In some embodiments, an inductor (not shown) may precede the two current sensors 1924A, 1924B and act as a choke to reduce ripple on the incoming signal.

The two current sensors 1924A, 1924B also act as a choke to reduce ripple on the output voltage going to the rest of the board.

As shown in FIG. 27, each current sensor 1924A, 1924B has 7 leads including current in 2712, current out 2714, power in 2702 for the sensor, signal out 2704 from the sensor and 3 ground leads 2706 which are tied together. If the two current sensors had the same orientation, the lead lines for power in 2702, signal out 2704 and the 3 ground leads 2706 of one sensor might interfere with Vin 2712, Vout 2714 for the other sensor. As shown in FIG. 27, current sensor 1924A and current sensor 1924B are reversed relative to one another such that the current in 2712 from Vin 2602 flows into IP− on one current sensor 1924A and into IP+ on current sensor 1924B such that 1924B will measure positive current and current sensor 1924A will measure negative current. Because of the reverse orientation of the two current sensors 1924A, 1924B, the input current is on the left side as shown, Having the same input in proximity allows for a thicker copper connection between Vin 2712 and the current sensors 1924A, 1924B. The thicker cooper may provide less resistance resulting in higher efficiency, reduced voltage loss, and reduced heat. So, while unidirectional current sensing is sufficient for the electric heater device, there are advantages to using the two current sensors in reversed orientation as disclosed elsewhere herein.

Figure 36:
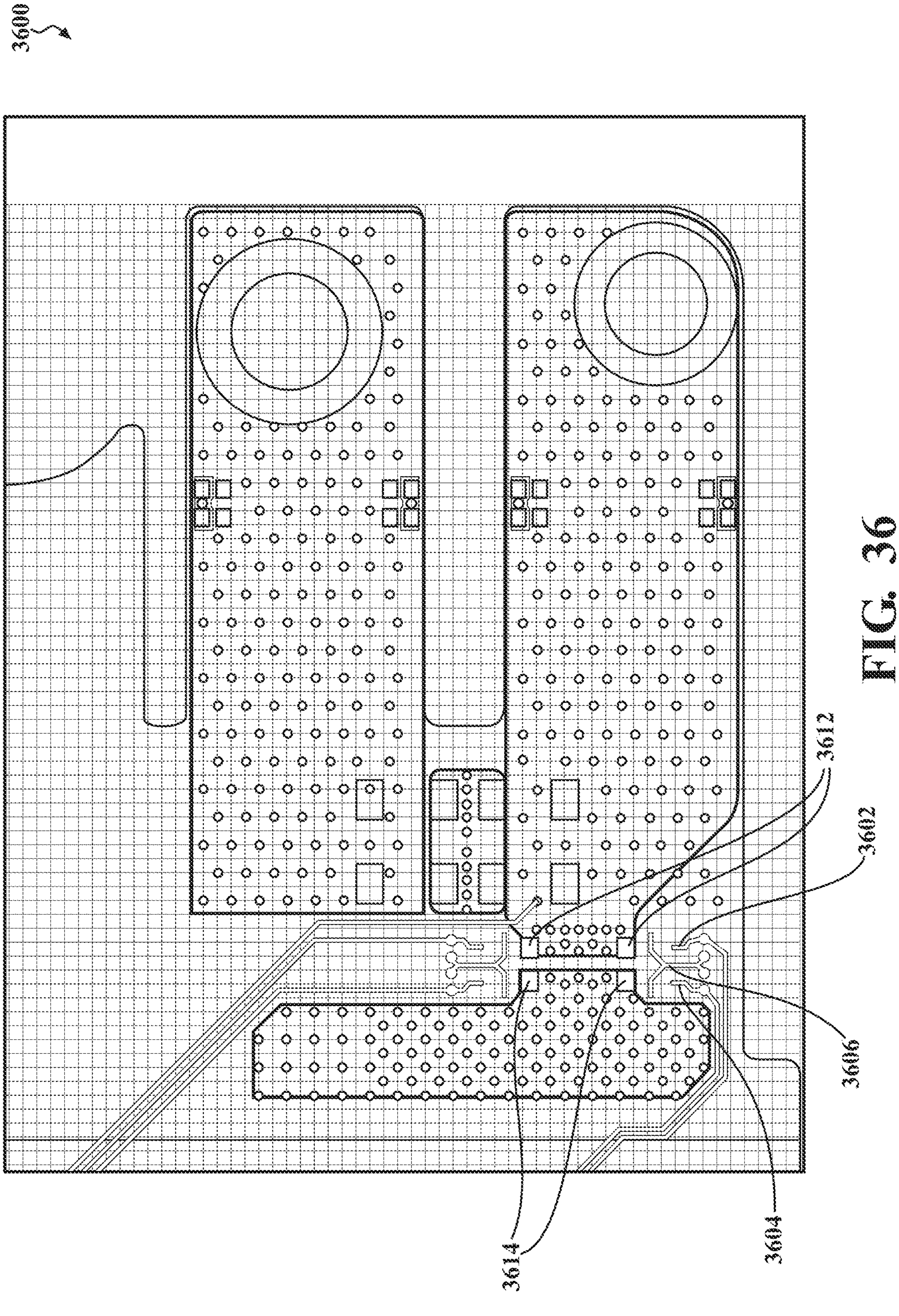
FIGS. 36-41 depict close-ups of the underlying layers on the electronic heater control board for Vin/Vout.

Referring to FIG. 36, the top plane of the main power section 3600 of the EHC board is shown. The arrangement and content of each layer is an example embodiment, and layers may be arranged differently in embodiments. The EHC board has 6 layers or planes, including two planes at 48V, 2 planes at the component output voltage, one plane at ground and a top plane. The utilization of multiple planes allows for configurable current carrying capacity and routing for the EHC board as set forth herein. The connections for Board Vin 3602, 3604 and Board Vout 3606 are located on the top plane. The top plane is also used for part placement of components on the board, such as the two current sensors 3614. An example top layer is thinner than the underlying planes. The connections for Board Vin 3602, Board Vout 3606 are, and board ground are located on fingers of the board where each finger acts as a choke. Example fingers for connection include ferrites, which reducing the EM noise of the EHC board.

Figure 37:
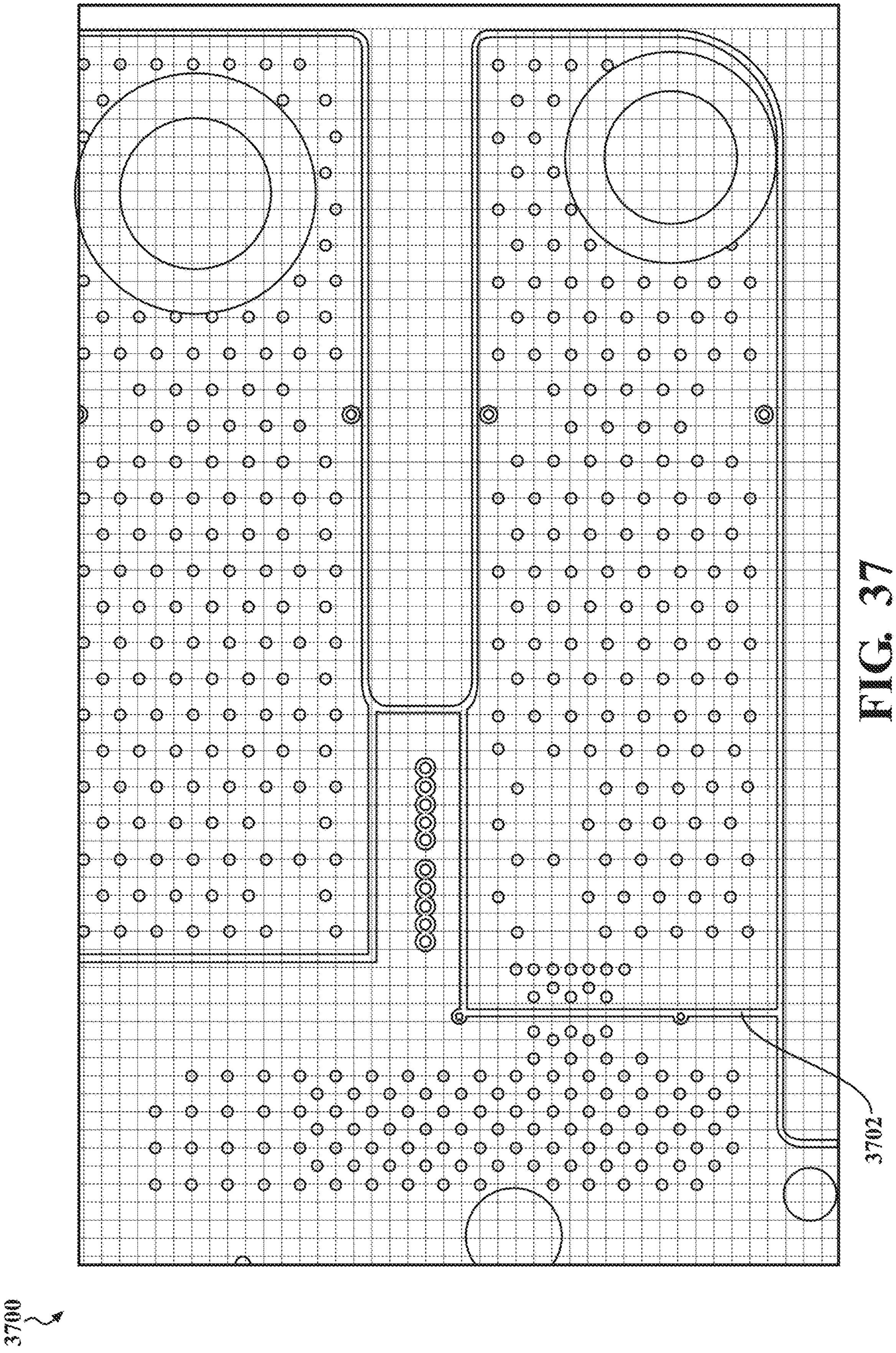

Referring to FIG. 37, a top layer view 3700 of the main power section (e.g., 1922) is depicted. It is possible to see the two current sensor components 3612, 3614. As described, there is a thicker copper connection for component Vin and component Vout compared to the connections for power in (Vcc) for the sensor, signal out from the sensor and 3 ground leads for the sensors (e.g., reference FIG. 36).

Figure 38:
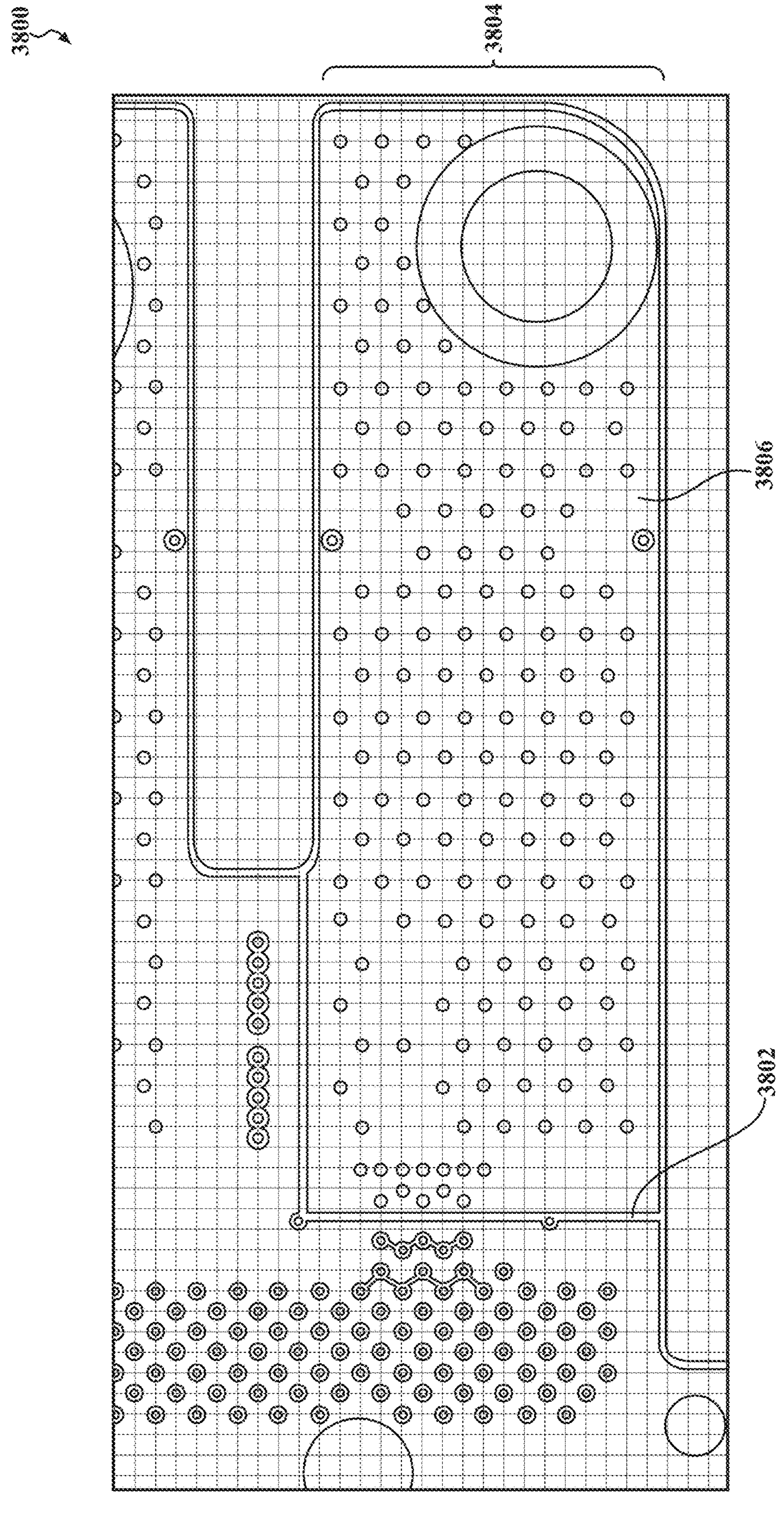

Referring to FIG. 38, a next layer 3800 of the main power section 1922 is depicted. It is possible to see that the copper is cut 3702, 3802 between the input finger 3804 and the rest of the board to isolate the Vin 2602 (48 V) from the internal 48V on the board. However, the Vin 2602 (48 V) finger 3806 is taken all the way to the current sensor inputs before being cut.

FIG. 38, representative of a next layer of the main power section 1922 of the example EHC board, is depicted. Certain layers, such as the layer depicted in FIG. 38, may be repeated, such that, for example, FIG. 38 represents layers 3 and 4. In the example of FIG. 38, the output voltage flows therethrough and again the copper is cut 3802 between the input finger 3804 and the rest of the board to isolate the Vin 2602 (e.g., 48 V; reference FIG. 26) from the output voltage on the board. However, the Vin 2602 (48 V) extends to the current sensor input(s) before being cut.

Figure 39:
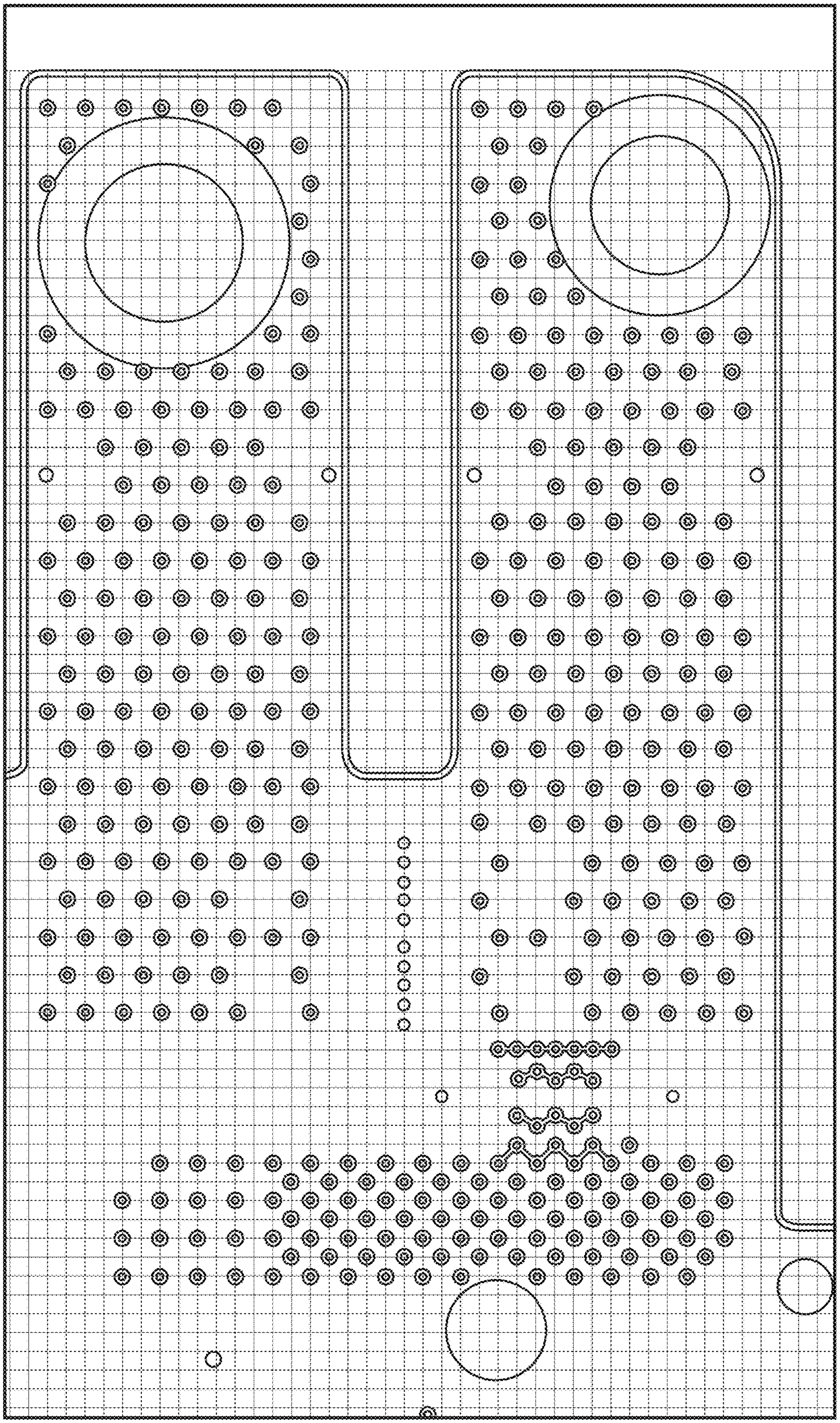

Referring to FIG. 39, a next layer of the board is depicted. In the example of FIG. 39, the layer is a continuous ground layer. In certain embodiments, the board is anticipated to run at a low duty cycle (e.g., providing electric heating for brief periods at a high load, with extended periods between operations), in certain embodiments a single ground plane is sufficient even though ground current tends to decrease as duty cycle and current increase. In certain embodiments, for example where frequent operation is expected, more than one ground layer may be present. The ground plane extends out onto the Vin Finger to provide ground for any components, such as capacitors used for EMC regulation.

Figure 40:
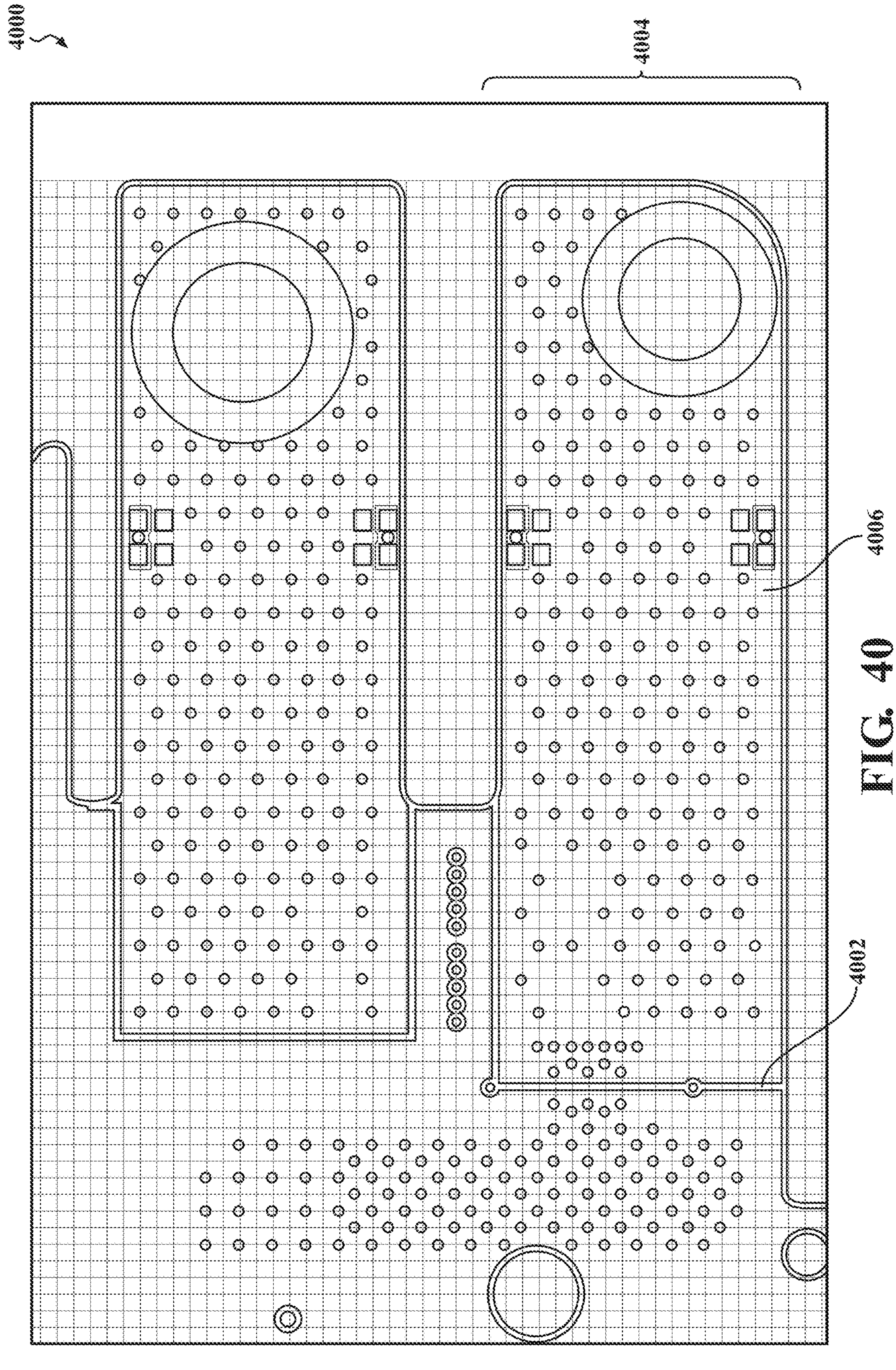

Referring to FIG. 40, the bottom layer for the example EHC board, is shown. Again the copper is cut 4002 between the input finger 4004 and the rest of the board to isolate the Vin 2602 (48 V) from the output voltage on the board. However, the Vin 2602 (48 V) 4006 extends to the current sensor inputs before being cut.

Figure 41:
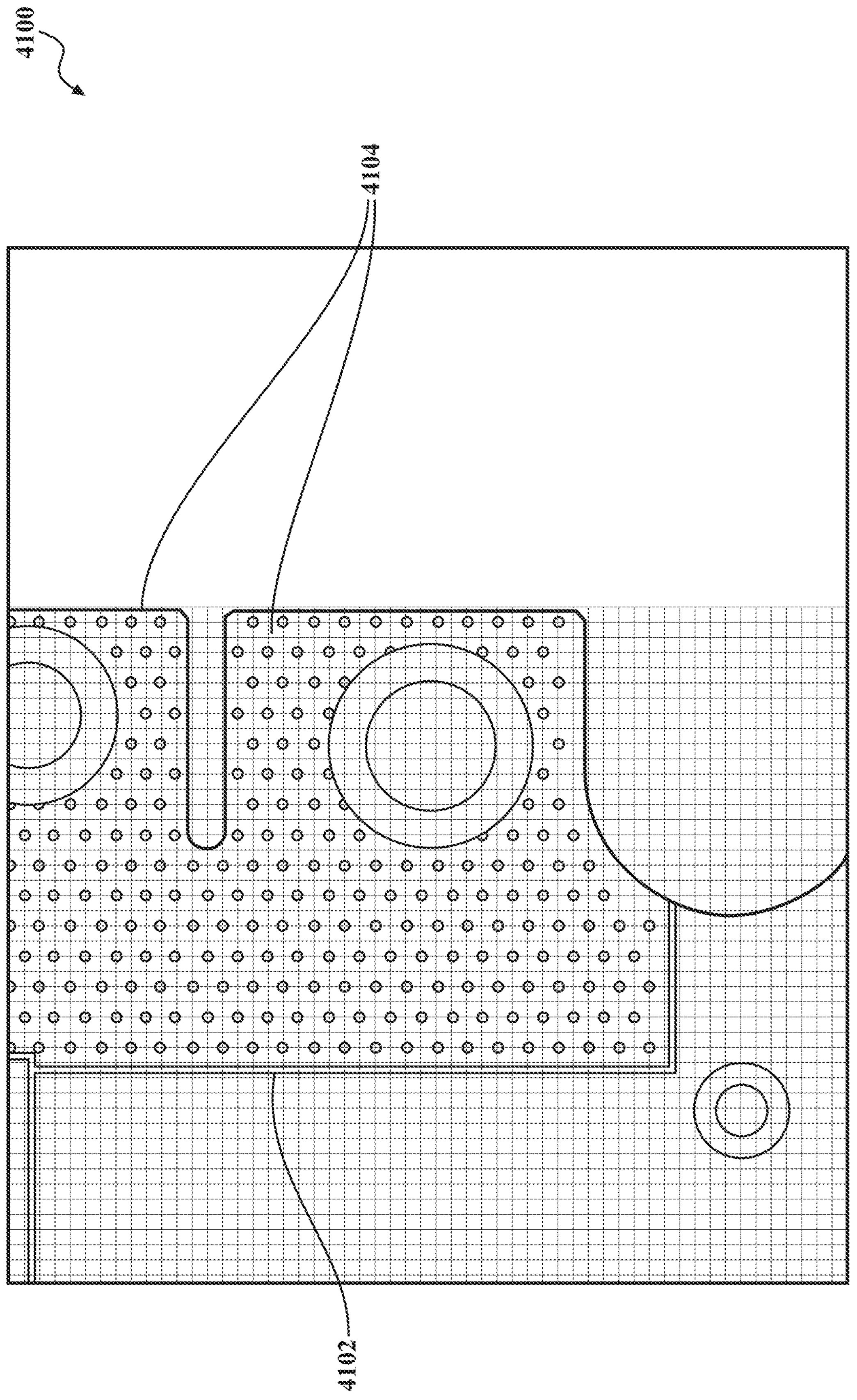

Referring to FIG. 41, an example embodiment 4100 includes ground fingers 4104. The ground fingers 4104 may be grounded to the chassis. The ground fingers SCV-5F04 may also act as a ground for the electronic heater. This may be beneficial in reducing the number of components grounded directly to the chassis. The ground layer copper is cut 4102 relative to the internal copper of the board to prevent short circuits.

Figure 42:
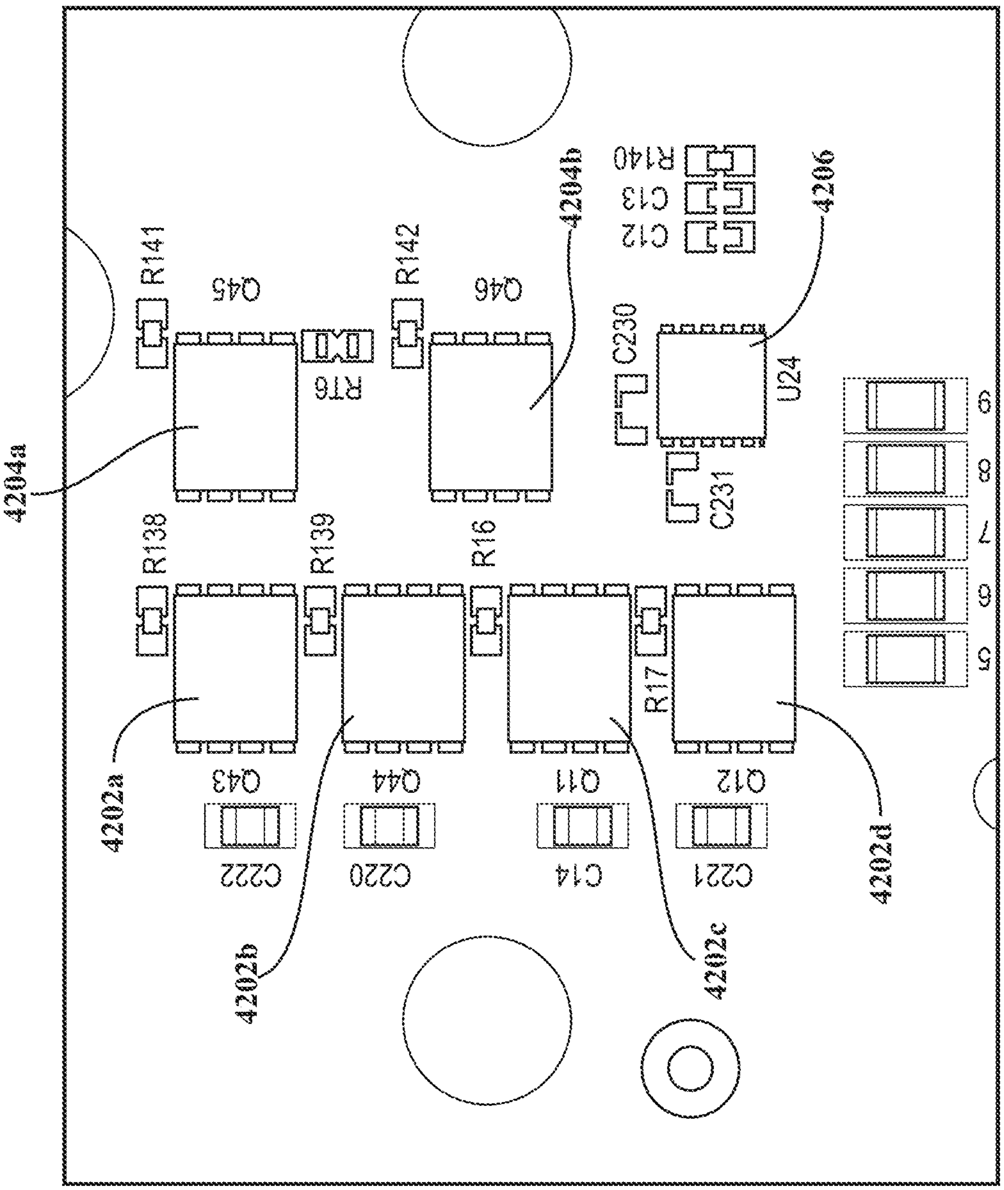
FIG. 42 depicts a close-up rendering of one of the phases of the rendering of EHC board showing an example 4FET/2FET configuration.

Referring to FIG. 42, the top plane of a phase circuit 1932 of the EHC board is shown. The phase circuit 1932 may include 4 high-side FETs 4204*a*-4202*d*, two low side FETs 4204*a*, 4204*b*, and a controller 4206. FIG. 25 shows a schematic depiction of a phase circuit 1932. Internal 48 V is tied to the drains of the high-side FETs while the sources of the high-side FETs are tied to the drains of the low side FETs. In the example, the sources of the low side FETs are tied to ground. The gates of all the FETs are connected to the controller 2506.

Figure 43:
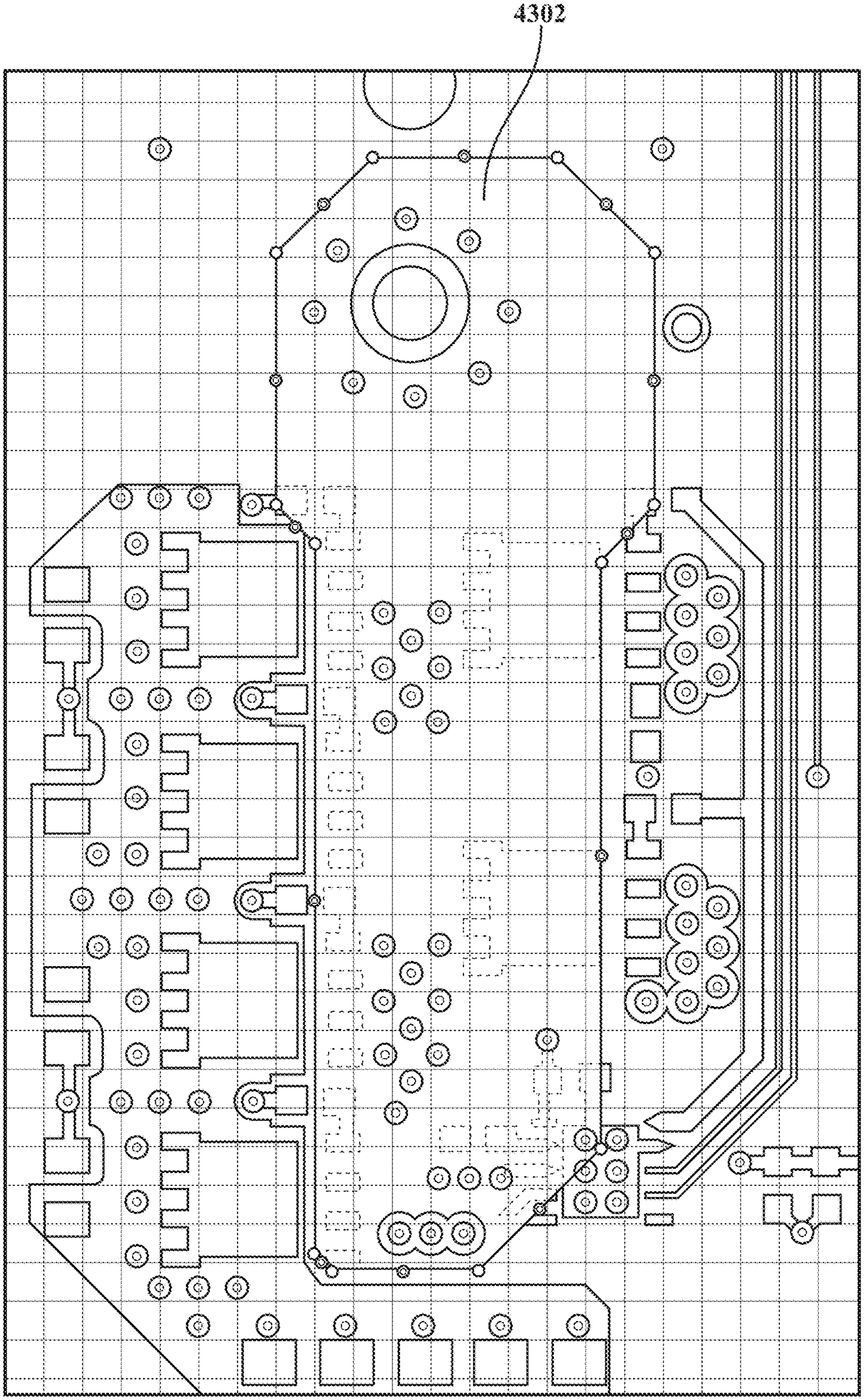
FIGS. 43-47 depict close-up views of the underlying layers of phases on the electronic heater control board.
Figure 44:
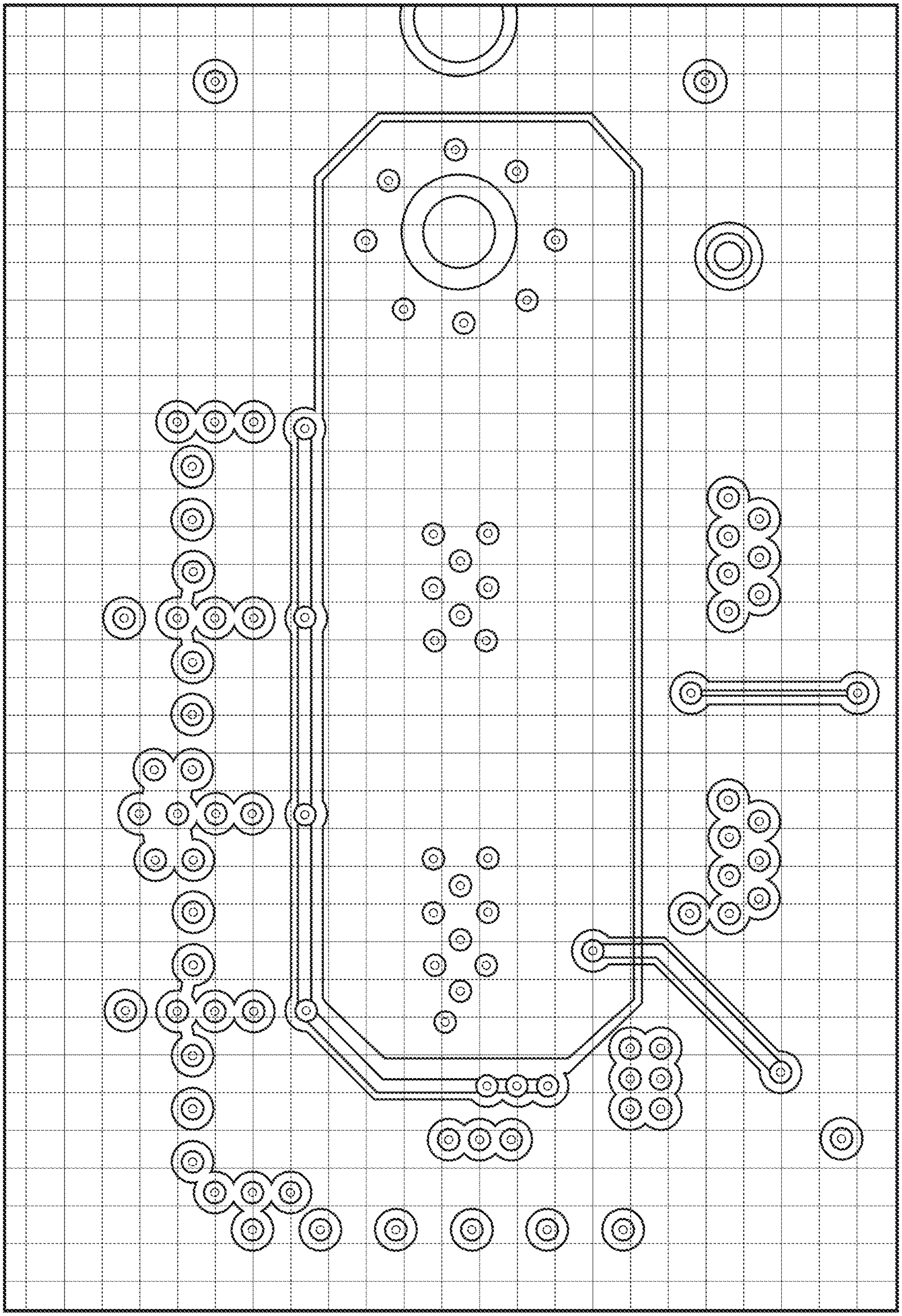

Referring to FIG. 43, as implemented on the EHC board, the top side layer may include a middle copper portion 4302 connecting the sources of all of the high side FETs to the drains of the low side FETs. This middle copper portion is then isolated (cut-off) from the rest of the copper (or other current carrying material) in the underlying layers (e.g., reference FIG. 44) so that the copper is thick for that middle copper portion 4302, improving current flow between the sources of all of the high side FETs to the drains of the low side FETs, limiting temperature generation and enhancing the current capacity range of the EHC board.

Figure 45:
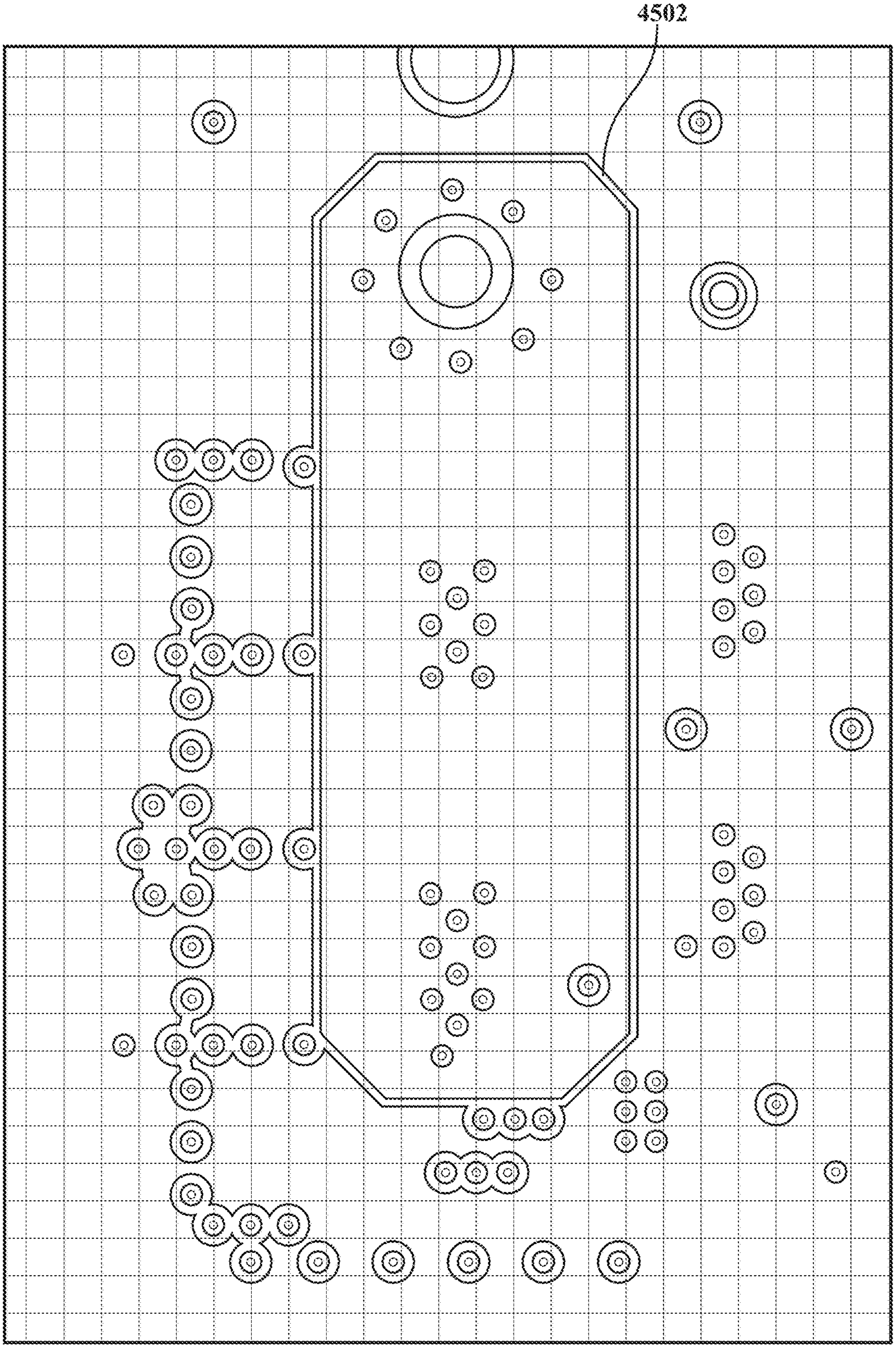
Figure 46:
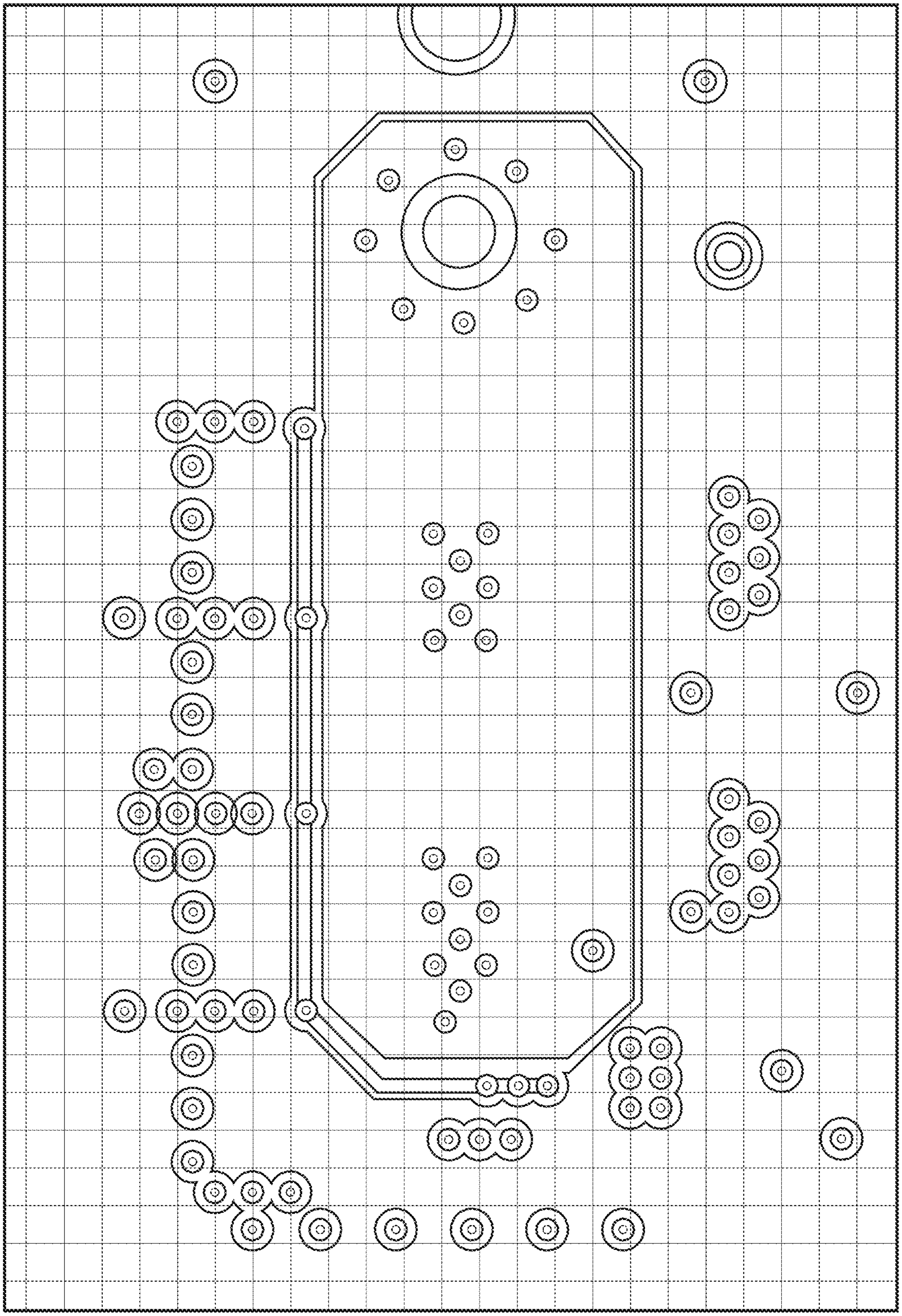

Referring to FIG. 45, in layer three, a slightly smaller middle copper portion 4502 (e.g., compare to FIG. 46) is isolated from the rest of copper layer, which is at component out, to enable the FET gate outputs to be connected to the controller FETs 4202*a*-4202*d*, 4204*a*-4204*b*.

Figure 47:
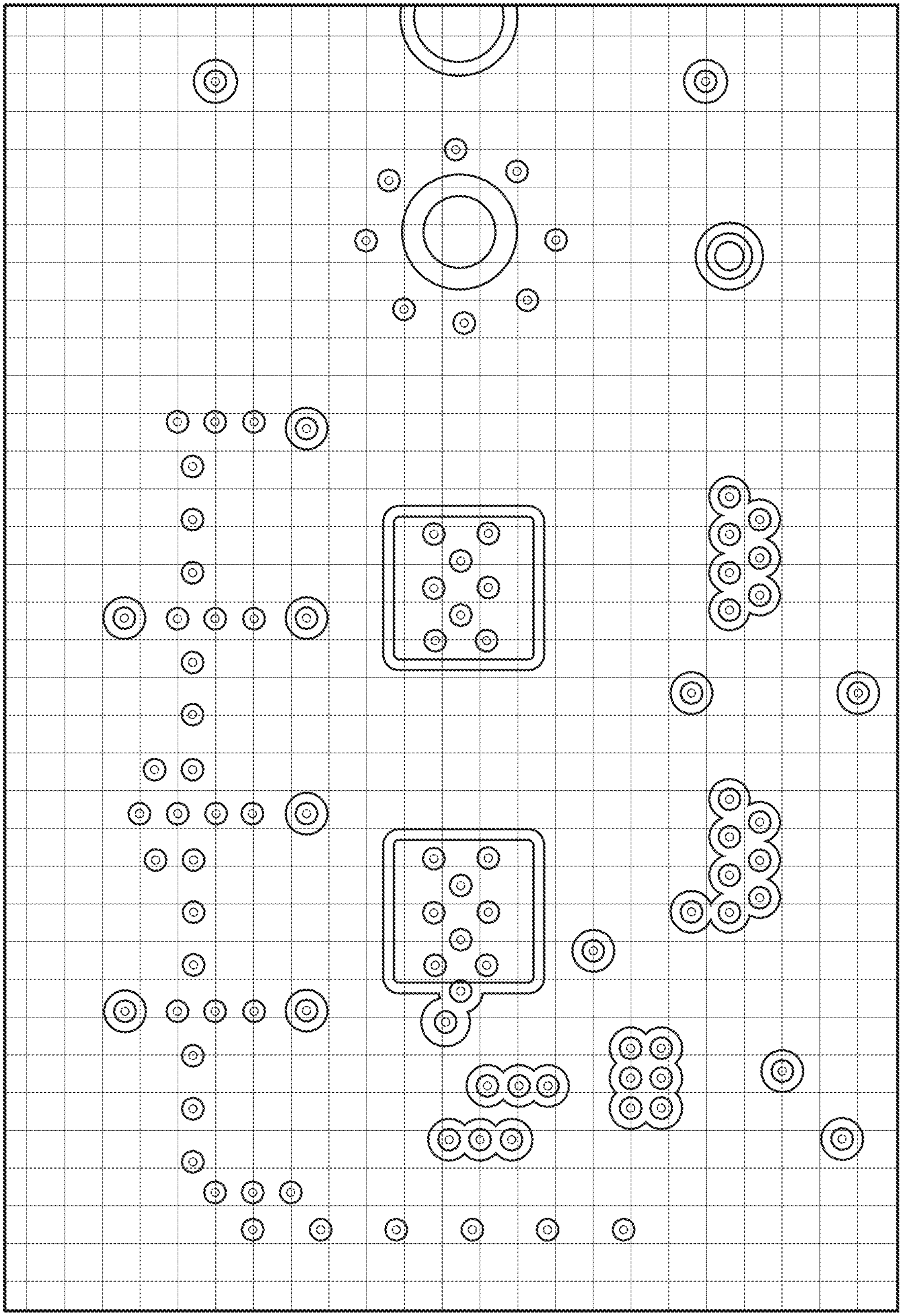

Referring to FIG. 47, the $6^{th}$ layer does not have supporting copper. However, it has windows, which are copper portions which are connected to the bottom side of the board. This makes sure that the copper is touching a thermally conductive material (e.g. a SIL pad) that connects the EHC board to a heat sink. The windows may be present or omitted for one or more phases, for example for phases that do not require as much thermal management, to determine the thermal management needed for proper operation, or the like.

Figure 48:
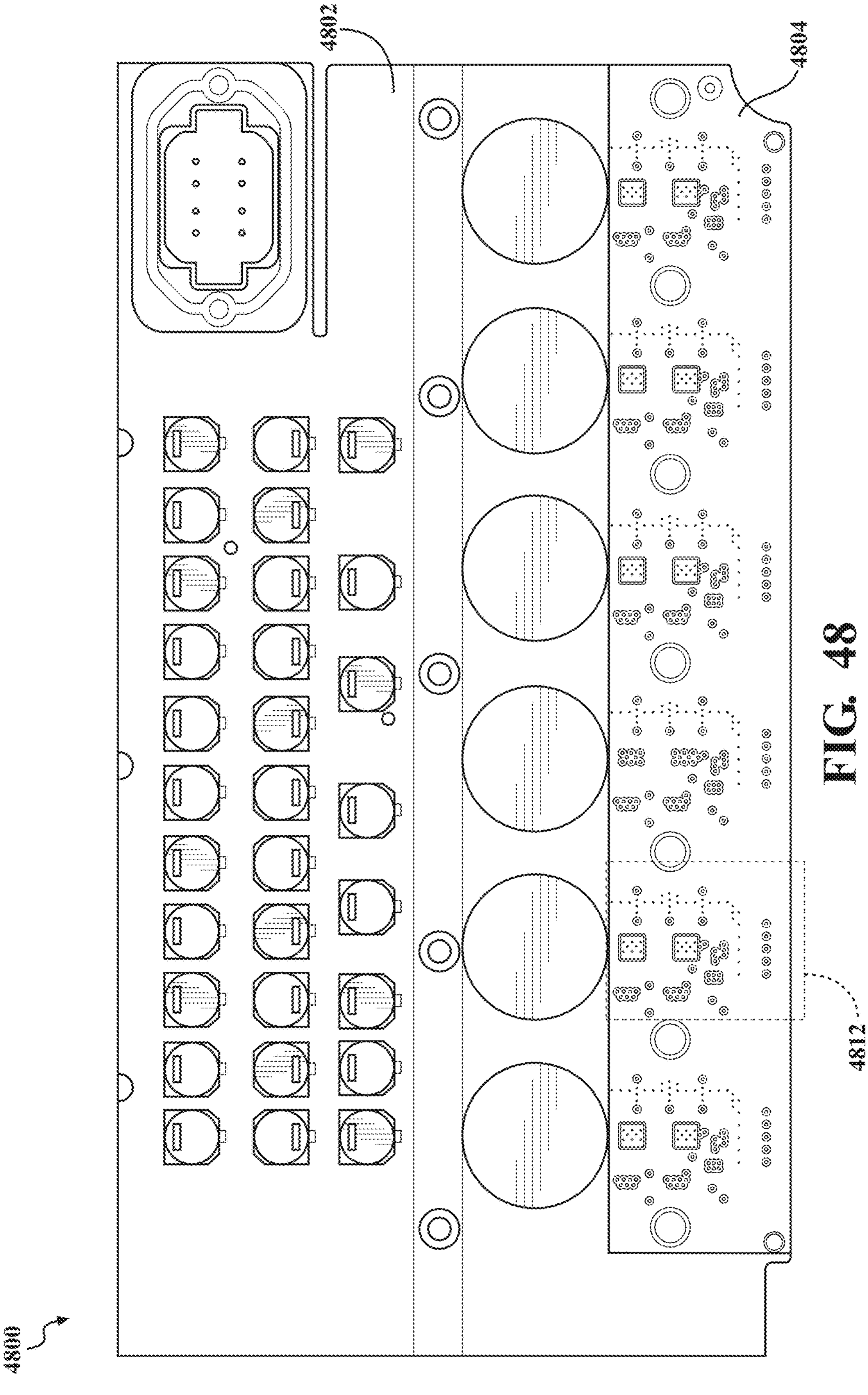
FIG. 48 depicts the back of the EHC board.

Referring to FIG. 48, the back 4800 of the EHC board is depicted. There is silk screening (for example) on the upper portion 4802 but not on the lower portion 4804. While silk screening typical helps with EMC compliance, it adds thermal impedance. The lower portion 4804, under the phase circuits 4812, has been left bare (no silk screen) to improve thermal connectivity with the heat sink. There are vias connected to the drains of the high side FETs 4202*a*-4202*d* to provide a path for heat to the bottom layer and the heatsink. Low side FETs 4204*a*-4204*b* also have vias connecting their sources to the bottom layer and, from there, to the heat sink.

With continuing reference to FIG. 25, in certain embodiments, a monitoring system is configured to monitor each the power converter or each phase converter to determine electrical characteristics of the power output to the electric heater device without a direct measurement of the output current provided to the electric heater device to reduce the number of data channels required by the controller. In certain embodiments, a plurality of monitoring systems is configured to monitor the power converter, each monitoring system configured to monitor one phase converter. In certain embodiments, the monitoring system reports a determined output current to a control system of the vehicle. By estimating the output current, the monitoring system may improve the accuracy of the reported output current compared to directly measuring the output current due to the margin of error of the current sensor.

A management strategy for balancing the current between phases of the EHC may be to monitor the phases for an isothermal condition rather than an iso-current condition. Temperature sensors are less expensive than current sensors, so this strategy may be efficient and cost-effective. If one phase tends to have a higher temperature than others, and because temperature impacts the life of the electronics, the phase that tends to run hotter may be programmed to run at a lower current in order to conserve its long-term viability.

The EHC may be programmed with fault bits. Thermal derating may include going from the full output current ramping down to zero output current and then at a little higher temperature, if zero output current still doesn't avoid overheating, then the EHC is shut down. Thermal derate may be more of a warning that less than full power is available. At some point, overtemperature status is determined (e.g., because the fins are full of mud) and we just completely shut off. Loss of the power ground may be detectable through the keyswitch power return and we measure the voltage offset. Certain fault states include: ground fault; non-receipt of a CAN message; other CAN error; scheduler overrun fault where the last task wasn't finished before the timer ticked for the next task to start indicating software is out of time; internal voltages VCC to the micro 12 Volt pre-driver high side switch (hardware fault); undervoltage and overvoltage lockout on the input and output; out-of-range current or voltage requests (relative to hardware capabilities). The input current and voltage ratio should result in a particular duty cycle, and that voltage should produce a particular current into a particular resistance. So whether the low side voltage detection fails, the high side voltage detection fails, the high side current sensor fails, or the resistor element is the wrong resistance, that equation has to balance or something is wrong. In embodiments, it may be reported as the element resistance is wrong and fault out an element resistance. So a current sensor out of range would indicate that the heater element resistance was incorrect. Any single piece of hardware failure will be a detectable fault, so the diagnostic code may indicate cross check of the heater element, the harness between the heater element and the controller, or the controller itself as a component that gave rise to the diagnostic code.

The EHC may be responsive to command messages. One control message provides a power mode, such as full power or standby (e.g., waiting for an enable signal over CAN). Another CAN message may be a power request. The power range for the request may be 0 to 32127.5 Watts. Another CAN message may be a current limit request. The current range may be −1600 to +1612.75 Amps. If a current level request is not received, the system defaults to the maximum. There could be a capability to manage the temperature of the heater element either directly or by setting up a temperature limit. The temperature range may be −40 to 210 degrees Celsius in one embodiment, or −273 to 1734.96 degrees Celsius in other embodiments. The EHC may include status messages. In an embodiment, the power mode is fed back to the set power set point and current limit set point for status purposes. Some diagnostics may also provided, such as the temperature of the e-heater controller itself and the amount of power coming out of the e-heater controller. Other status messages may include the fault code; the element resistance in microohms (e.g., the range may be 0 to 4211.1 Ohms); voltage out or in (e.g., 0 to 642.55V), and currents in and out (e.g., −1600 to +1612.75 Amps); element temperature, temperature of each phase, internal voltage VCC pre-driver, keyswitch voltage, ground offset voltage, readings from the two current sensors (e.g., reported as the sum of the two, or effectively the difference because the polarities are opposite).

FIG. 51 depicts data for different modes of electric heater (eheater, e-heater, or EH) operation based on simulation and experience. The Y axis is Temperature in degrees Celsius for the LO-SCR and the x axis is time in seconds. These data were collected under constant power set to different maximums and photoionization detector (PID) control with temperature setpoint. The feedback temperature was an average of LO-SCR inlet and outlet temperatures. The data demonstrate that the e-heater enables rapid achievement of a desired temperature and, albeit with some differences in performance, the e-heater can support multiple power settings, which is important in systems integration. In this test, the results based on simulation and experience for BSNOx (g/hp-hr) and $BSCO_2$ (g/hp-hr), respectively, at various max power settings were as follows: Base case (0.009, 511); 1.25 kW max (0.016, 509); 2.50 kW max (0.014, 510); 3.75 kW max (0.012, 510); 5.00 KW max (0.011, 504); and 10.0 kW max (0.013, 517). BSNOx is brake-specific oxides of nitrogen emissions and $BSCO_2$ are brake-specific carbon dioxide emissions. Based on simulation and experience, operation of the e-heater is capable of delivering fuel economy, albeit with a reduction in emissions performance for certain power settings.

FIG. 52 depicts illustrative emissions data for a low-load cycle. Based on simulation and experience, these findings demonstrate that: the electric heater and cylinder deactivation (CDA) (or other variable valve timing (VVT) or on-engine event) can enhance capability and fuel economy; the electric heater can reduce usage of high fuel penalty baseline engine operations, reducing overall CO2 and fuel consumption; and utilization of "free energy" (e.g., regeneration, braking energy, etc.) can further reduce fuel utilization. In this test, the results based on simulation and experience for BSNOx (g/hp-hr), BSCO2 (g/hp-hr), and BSFC (g/kW-hr), respectively, at various max power settings were as follows: Base case, CDA (0.024, 623, 262); EH (5 kW constant), CDA) (0.009, 659, 277); EH, CDA (0.012, 612, 257); EH (0.018, 673, 283); and EH (free), CDA (0.013, 585, 246). BSFC is brake-specific fuel consumption. While CDA is mentioned in this embodiment and elsewhere, it should be understood that any on-engine events, including VVT, CDA, timing injection or other in-cylinder technologies (e.g., iEGR, EEVO) or prime mover processes when in operation along with the eheater may result in improvement of fuel economy and NOx emissions reduction.

FIG. 53 depicts illustrative emissions data for an example drive cycle cold start operation. In this embodiment, a scenario including no elevated idle and CDA deactivation resulted in 40% more electrical power than the elevated idle cases.

In some example drive cycles, eheater with elevated idle shows a 0.8% reduction in BSFC. Using free energy, the BSFC reduction may be 1%. Without elevated idle and CDA, similar performance can be achieved with the eheater but with a 2.3% BSFC penalty. In this example drive cycle test, all of the idle conditions were variable based on need except for EH (normal idle), no CDA which was fixed at 600 rpm. In this test, the results based on simulation and experience for the example drive cycle include BSNOx (g/hp-hr) Engine Out, BSNOx (g/hp-hr) TailPipe, NOx conversion, BSCO2 (g/hp-hr), and BSFC (g/kW-hr), respectively: Base, CDA (2.74, 0.048, 98.2%, 538, 228.3); EH (normal idle), no CDA (2.90, 0.040, 98.6%, 550, 233.6); EH, CDA (2.78, 0.042, 98.5%, 534, 226.5); and EH (free), CDA (2.67, 0.043, 98.4%, 533, 226.1). The savings relative to the base case in terms of CO2 savings and BSFC savings, respectively, include: EH (normal idle), no CDA (−2.2%, −2.3%); EH, CDA (0.7%, 0.8%); EH (free), CDA (0.9%, 1.0%).

In another example hot drive cycle operation, EH without CDA has a 1.3% BSFC penalty. In this example, EH with free energy may not be the lowest BSFC tested, as there is heat added to the exhaust for the extra fuel burned to generate the electrical power. In this example, adding the eheater to the base and CDA provided a 0.9& reduction in BSFC.

In a composite of hot and cold example drive cycle operations, the lowest BSO and BSFC case was using the eheater with CDA, which resulted in a 0.9% savings in BSFC. Based on simulation and experience, the cheater may be used without CDA but with a 1.3% BSFC penalty. In this composite test, the results based on simulation and experience for the example drive cycle include BSNOx (g/hp-hr) Engine Out, BSNOx (g/hp-hr) TailPipe, NOx conversion, BSCO2 (g/hp-hr), and BSFC (g/kW-hr), respectively: Base, CDA (3.14, 0.015, 99.4%, 515, 218.8); EH (3.43, 0.018, 99.4%, 523, 221.7); EH, CDA (3.22, 0.016, 99.4%, 511, 216.8); EH (free), CDA (3.32, 0.020, 99.2%, 512, 217.6). Savings relative to the base case in terms of CO2 savings and BSFC savings, respectively, are: EH (−1.4%, −1.3%); EH, CDA (0.8%, 0.9%); EH (Free), CDA (0.6%, 0.6%).

FIG. 54 depicts engine and emissions data for another example drive cycle, such as that for a beverage delivery vehicle or other 4×2 delivery truck serving convenience stores and the like. Based on simulation and experience, data for this example drive cycle reveal that the base system with CDA does an excellent job of keeping the LO-SCR temperature above 200 degrees Celsius. As shown in FIG. 54, the eheater raises the temperature approximately 25 degrees Celsius.

FIG. 55 depicts illustrative data from a stay hot test. For certain example drive cycles, a strategy to keep the catalyst hot may include use of an eheater in two ways: 1) the eheater adds heat to the exhaust; and 2) the eheater drives the engine load up since it is driven off of the engine. Based on simulation and experience, the average heater power consumption during the idle portion for the non-CDA case was 1.4 KW and for the CDA case it was 0.6 kW with a similar ratio of exhaust flow rates.

FIG. 56 depicts summary illustrative data from a stay hot test. Based on simulation and experience, the lowest BSNOx was the base with CDA, the lowest BSCO2 was the eheater with CDA, and eheater cases have a spike in tailpipe NOX during the ramp back to load. The results based on simulation and experience for the example drive cycle include BSNOx (g/hp-hr) and BSCO2 (g/hp-hr), respectively: Base, no CDA (0.510, 727); Base, CDA (0.028, 646); EH (free), no CDA (0.127, 672); and EH (free), CDA (0.142, 620).

In another stay hot test performed during an idle portion, CDA provided a reduction in fuel and $CO_2$. The eheater kept the LO-SCR inlet temperature above 200 degrees Celsius the entire time and the lowest tailpipe NOx was found using the eheater and CDA. In this test, the results based on simulation and experience for the example drive cycle include NOx (g) Engine Out; NOx (g) Tailpipe; NOx conversion; CO2 (g); Fuel (g); and Delta Time Above 200 deg Celsius (min), respectively: Base, no CDA (41.64, 10.67, 74.4%, 4.11, 1428, n/a); Base, CDA (3.03, 0.17, 94.4%, 2.45, 870, 2.5); EH (free), no CDA (12.62, 0.22, 98.3%, 3.47, 1194, Always Hot); and EH (free), CDA (2.52, 0.15, 94.2%, 2.34, 838, Always Hot).

Example system capabilities include: 1) CDA combined with a close-coupled SCR has been shown to meet target emissions standards over various example drive cycles; 2) the addition of an eheater to the configuration can achieve the same NOx emissions while saving CO2/fuel; 3) a modest electric heater (e.g., 5 kW) provides a good tradeoff for the particular system evaluated; 4) an cheater can achieve target NOx emissions without CDA; 5) an example method to power the eheater is to generate the electricity on the engine as this raises the engine exhaust enthalpy to the aftertreatment systems; and 6) during vehicle coast or engine idle, an example system may power the eheater directly from the batteries if there is enough stored energy available.

In an embodiment, and referring back to FIG. 5, an e-heater for the configuration depicted with CDA (e.g., upstream of LO-SCR) may be capable of meeting target emissions at a range of maximum power settings, such as 2.5 kW, more preferably 2.0 kW, even more preferably, 1.5 kW and ideally 1 kW. In embodiments, the configuration depicted in FIG. 5 may be powered by a range of voltages, such as a 12V system, a 24 system, or a 48V system. For example, at 2.5 kW, a 48V system draws 52 Amps, a 24V system draws 104 Amps, and a 12V system draws 208 Amps. In another example, at 2.4 kW, a 48V system draws 50 Amps, and a 24V system draws 100 Amps. In another example, at 2.0 kW, a 48V system draws 42 Amps, a 24V system draws 83 Amps, and a 12V system draws 167 Amps. In another example, at 1.5 kW, a 48V system draws 31 Amps, a 24V system draws 63 Amps, and a 12V system draws 125 Amps. In another example, at 1.2 kW, a 12V system draws 100 Amps. In another example, at 1.0 kW, a 48V system draws 21 Amps, a 24V system draws 42 Amps, and a 12V system draws 83 Amps.

In an embodiment, and referring to FIG. 17, placement of the eheater in the arrangement affects how much power is needed. For example, in the embodiment of FIG. 17, a fuel burner is placed upstream of the DOC-DPF-SCR. The system heats up the DOC and DPF with a heat source. The DPF is a larger thermal mass that takes the heat and transfers the heat downstream to the SCR.

In an embodiment and referring to FIG. 18, this configuration is focused on placing an e-heater upstream of the SCR, without the LO-SCR. An electric heater in this position may require 3-5 kW of heat since it does not need to heat up the DPF first, as seen on other systems. More preferably, 3.0-4.5 kW is desired for a 48V system to maintain the max current draw at 100 Amps. In embodiments, the configuration of FIG. 18 with CDA may lower the kW usage. In some embodiments, the configuration of FIG. 18 operates with a CDA with 2.5 kW max using a 48V system. In some embodiments, the configuration of FIG. 18 operates with a CDA with 2.4 kW max using either a 48V or 24 V system. In some embodiments, the configuration of FIG. 18 operates with a CDA with a 2.0 or 1.5 kW max using a 48V or 24V system. In this example, at 5 KW, a 48V system draws 104 Amps, a 24V system draws 208 Amps, and a 12V system draws 417 Amps. In this example, at 4.8 kW, a 48V system draws 100 Amps, a 24V system draws 200 Amps, and a 12V system draws 400 Amps. In this example, at 3 kW, a 48V system draws 63 Amps, a 24V system draws 125 Amps, and a 12V system draws 250 Amps.

Figure 57:
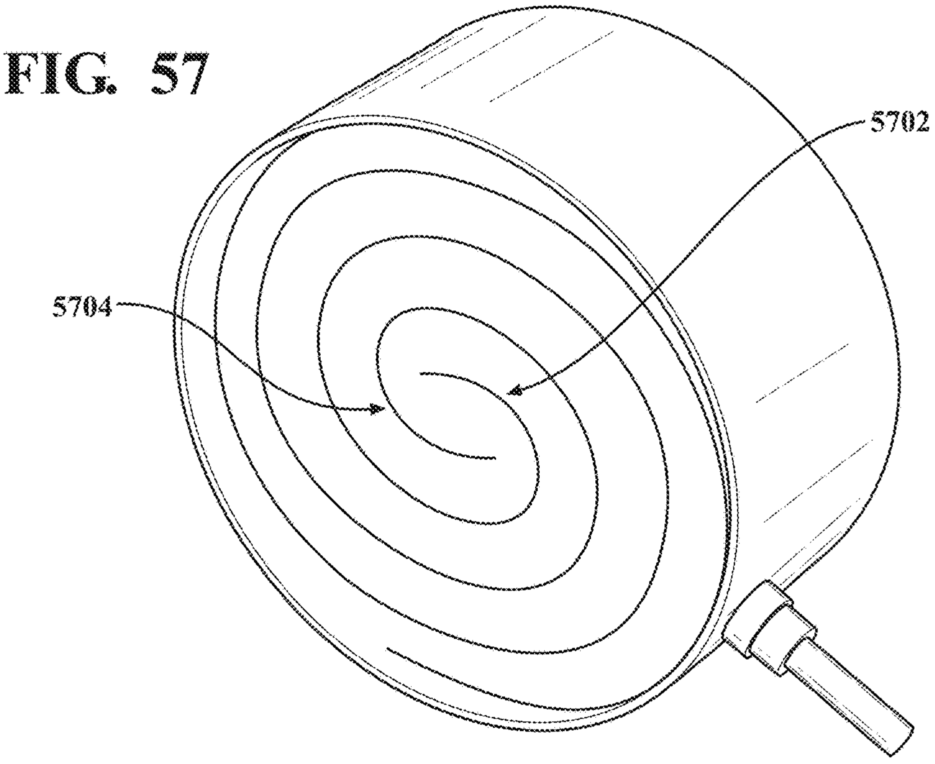
FIG. 57 depicts an electric heater configuration.

FIG. 57 depicts an electric heater configuration with two separately controllable heater coils 5702, 5704. In embodiments, the eheater may be configured with two separate power supplies. For example, a three wire system may be possible with the power supplies to coil 5702 and a separate power to coil 5704 with a common ground. In embodiments, the power electronics setup may have a maximum kW output of 2.5 kW at 48V upstream of an SCR catalyst for after treatment systems, a max of 2.4 kW at 24V, or 1.2 kW at 12V, or half of the max power usage of any of the above. In embodiments, the power can be cycled between coil 5702 and coil 5704 in order to provide more precise control at low kW usages. In embodiments, one or two power electronics modules can be used. If two are used, then the power electronics modules need to be sized to provide a maximum kW output of 0.5 to 1.25 KW. In other embodiments, the coils may be powered by one power unit in a cycled manner. In this example, coil 5702 is powered and the potential is used to start up coil 5704 and running coil 5704 with coil 5702 off. The configuration depicted in FIG. 57 may be powered by a range of voltages, such as a 12V system, a 24 system, or a 48V system. Power profiles may be similar to those described with respect to FIG. 5 herein.

Figure 58:
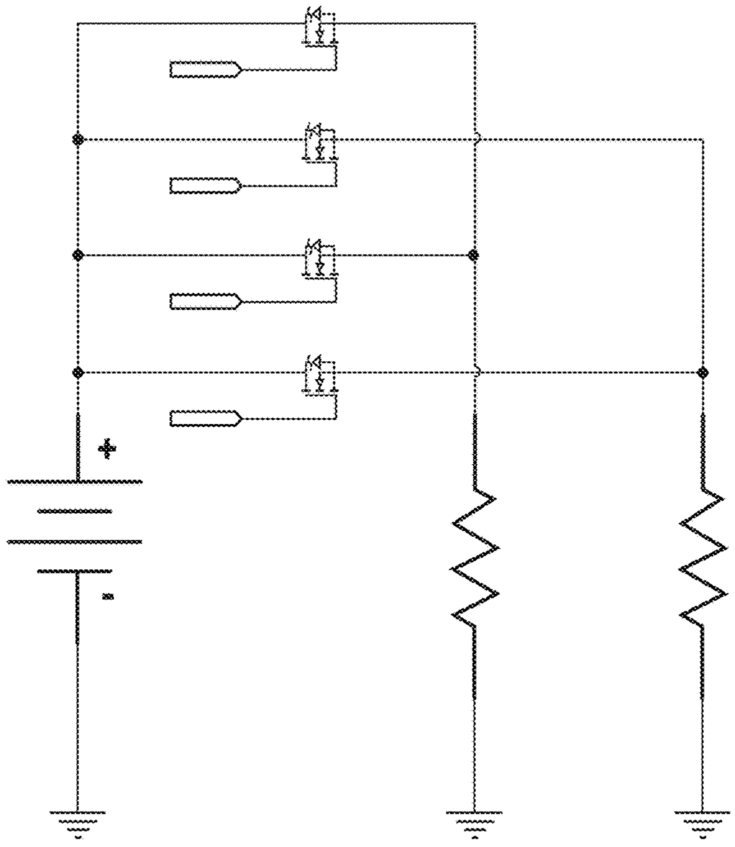
FIG. 58 depicts a circuit schematic for an electric heater modulator.

FIG. 58 depicts a circuit schematic for an electric heater modulator. In embodiments, a microprocessor may control the 4 phases based on CAN communications received from the e-heater after treatment controller. The e-heater modulator may sense voltage and current supplied to each coil of the e-heater to deliver the requested power.

Figure 59:
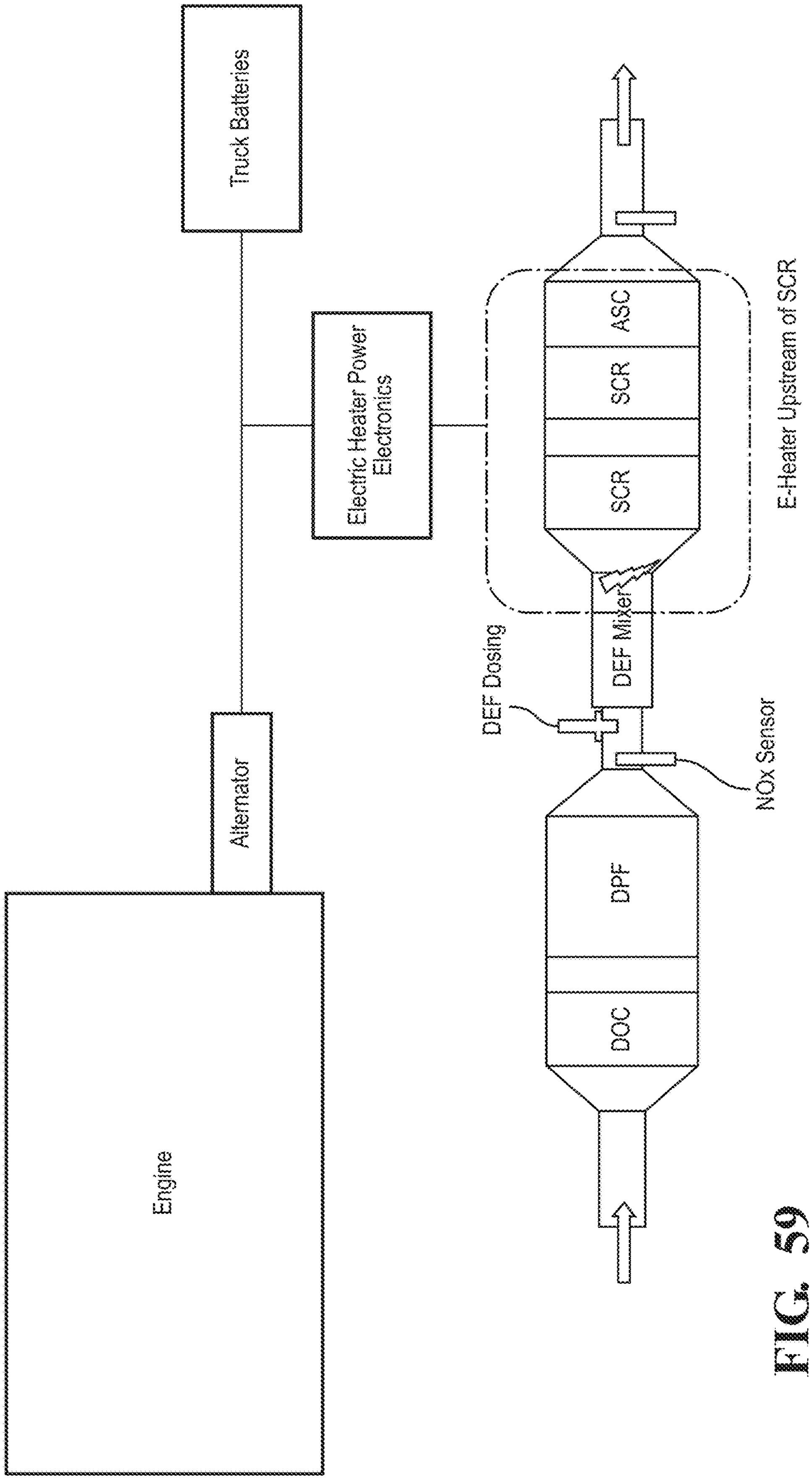
FIG. 59 depicts a block diagram for power take-off for an electric heater.

FIG. 59 depicts a block diagram for power take-off for an electric heater. In this configuration, the e-heater is capable of running directly from battery power, such as 12V, 24V, 48V or the like with management from power electronics/ e-heater controller.

Figure 60:
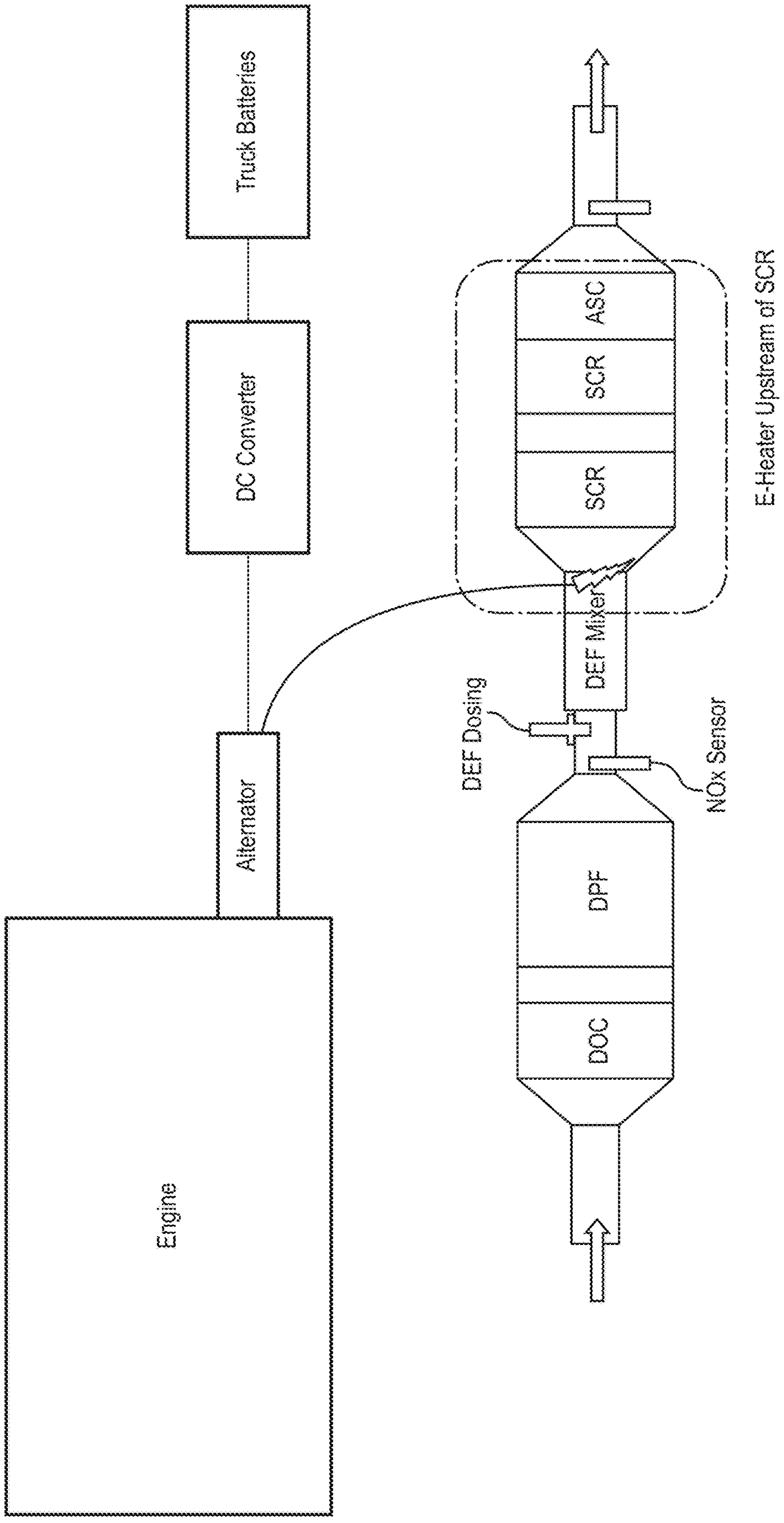
FIG. 60 depicts a block diagram for power take-off for an electric heater.

FIG. 60 depicts a block diagram for power take-off for an electric heater. In this embodiment, a DC converter is included. In this embodiment, the e-heater may be powered, at least in the short term (e.g., at start up), directly by AC power from the alternator but there may also be a path to receive power from the DC converter.

In certain embodiments, the monitoring system includes a current measuring device structured to measure an input current at the input terminal and the controller, which is configured to determine an output current provided at the output terminal in response to the measured input current and the duty cycle. In certain embodiments, the controller incorporates the current measuring device. In certain embodiments, the controller is configured to determine the output current provided at the output terminal in further response to a predicted converter loss value. The predicted converter loss value may be based in part on the duty cycle and other operation parameters of the phase converter monitored by the monitoring system, or the power converter. In certain embodiments, the monitoring system includes a voltage measuring device structured to measure an output voltage at the output terminal. The controller may then determine an output power in response to the determined output current and the measured output voltage.

In certain embodiments, the monitoring system includes two voltage measuring devices, a current measuring device, and the controller. A first voltage measuring device is structured to measure an input voltage at the input terminal. A second voltage measuring device is structured to measure an output voltage at the output terminal. A current measuring device is structured to measure an input current at the input terminal. The controller is configured to determine an output current provided at the output terminal in response to the measured input voltage, the measured input current, the measured output voltage, and a predicted loss value.

In certain embodiments, the monitoring system includes a voltage measuring device structured to measure the input voltage at the input terminal and a current measuring device structured to measure input current at the input terminal. The monitoring system also includes a controller configured determine an output current in response to the measured input voltage, the measured input current, and an operation condition of the phase converter. In certain embodiments, the operation condition is an efficiency value of the phase converter. In certain embodiments, the controller determines the output current using an efficiency model lookup table.

An example control operation to manage electrical interference of an electrical system of a vehicle having an electric heater integrated therewith is described following. Operations set forth may be performed in any order, and/or operations may be sub-divided or combined in whole or part. An example procedure includes an operation to determine a power requirement for the electric heater, which may additionally or alternatively include determining a current draw of the electric heater or other impact determination (e.g., a parameter describing the expected electrical impact of the electric heater operation on the system). In certain embodiments, for example where the electric heater is powered by an electrical coupling to a vehicle electric system having an alternator (e.g., where battery storage is not utilized and/or not available in whole or part), electrical current draw from the electric heater operation can result in a significant load increase sufficient to affect the vehicle operation, operation of the alternator, and/or a significant mechanical disturbance of the vehicle drive train (e.g., causing a high mechanical load that may lug the engine, slip a belt, and/or cause performance changes that are noticeable to an operator). In certain embodiments, the estimated impact may be unacceptable for either rising impact (e.g., electric heater commanded on and/or having a commanded heat generation increase), or for a falling impact (e.g., a load dump, such as the electric heater commanded off and/or having a commanded heat generation decrease). In certain embodiments, the determination of which parameter is utilized to determine the impact may be determined according to the type of power utilized to generate electricity for the electric heater (e.g., electrical power from a belt of the engine, from the flywheel, from a transmission interaction, from a stored battery, etc.), and/or according to mitigating components present in the system to manage large load changes (e.g., the presence or absence of a capacitor or other component to manage transient operations).

The example procedure includes an operation to limit an impact of the load change in response to the impact parameter. For example, operations to limit the impact may include adjusting a rate of change of commanded power to the electric heater (e.g., adjusting the commanded power to a selected slew rate, such as dI/dt and/or dP/dt, based on current I and/or power P). In certain embodiments, operations to limit the impact may include adjusting a configuration of the system, for example utilizing a pre-charge operation, coupling a resistor in line with the electric heater, coupling a capacitor to the electric heater power circuit, and/or adjusting a mechanical coupling to the drive train (e.g., allowing a belt pulley to fully or partially slip, adjusting a gear ratio between a driveline element and a motor/generator providing power to the electric heater, or the like), to limit the impact of the transient operation without adjusting the commanded power to the electric heater. The described operations are a non-limiting examples provided for illustration. In certain embodiments, the impact of the transient operation may be estimated or determined based on the power draw of the electrical heater (e.g., at full operation and/or according to the requested power), the capacity of the alternator and/or mechanical component providing the electrical power, and/or according to a specification (e.g., an allowed capacity provided for the vehicle system). In certain embodiments, the impact of the transient operation may be determined according to a feedback value—for example observing a voltage on the electrical system, an engine speed (or other driveline speed) parameter, or the like. In certain embodiments, the impact of the transient operation may include combined feedforward and feedback elements, for example with a specified slew rate determined according to design time parameters, with a feedback value also utilized to control the transient operation.

In an embodiment, an electric heater controller (EHC) may include one or more phase circuits 1932A-1932F disposed in a horizontal row along a length of a board adjacent to an edge of the board, a power input connector 1904 and a power output connector 1906 on an end of the board, at least one ground connector 1912 disposed on a same end of the board as the power input connector and the power output connector, and a choke region 1942 interposed between the end of the board and the one or more phase circuits 1932A-1932F, the choke region 1942 comprising a first region 1922 having a power input and a power output traverse therethrough, and an adjacent removal region 1902, 2904 devoid of components.

In embodiments, the removal region 1902 may include at least one of removal perforations or removal scoring or markings outlining the region to be removed.

In embodiments, the EHC may further include a common mode choke 2902 encircling the board across the choke region, and may further include a differential choke 2908 positioned on the power input connector 1904, wherein the differential choke 2908 may include a same material as the common mode choke 2902.

In embodiments, the EHC may further include a main path 1944 to the at least one ground connector 1912, wherein the main path does not traverse the choke region.

In embodiments, the EHC may further include a differential choke 2908 positioned on the power input connector 1904, wherein the differential choke 2908 may include a ferrite material.

In embodiments, the EHC may further include a differential choke 2908 positioned on the power output connector 1906.

In embodiments, the power input connector 1904 may be supported on a finger 2912 of the board, wherein the finger 2912 is connected to the board on one end. In embodiments, the fingers 2912, 2920 may be spaced apart from each other to enable the placement of differential chokes 2908 on one or both of the fingers 2912, 2920. In embodiments, the fingers 2912, 2920 may not be longer than they are wide. In embodiments, the power output connector 1906 may be supported on a finger 2920 of the board, wherein the finger 2920 may be connected to the board on one end.

In embodiments, the common-mode choke 2902 may wrap around the board, may be a split-mode choke that snaps on to the board, or may be ferrite.

In an embodiment, the power input connector 1904 and the power output connector 1906 may be adjacent to a same edge of the board as the one or more phase circuits 1932A-1932F.

In an embodiment, the EHC may further include a connector 3002 disposed on an upper surface of the board of the electric heater controller, accessible adjacent to an extruded housing 3024 defining at least a portion of the board.

In an embodiment, an EHC may include one or more phase circuits 1932A-1932F disposed in a horizontal row along a length of a board adjacent to an edge of the board, a power input connector 1904 and a power output connector 1906 on an end of the board, at least one ground connector 1912 disposed on a same end of the board as the power input connector 1904 and the power output connector 1906, a common-mode choke 2902 structured to choke both a power input and a power output, the common-mode choke 2902 encircling the board at a location in between the end of the board with the power input connector and power output connector and the one or more phase circuits 1932A-1932F, and wherein the board comprises a cut-out area 2904 to allow the common-mode choke 2902 to encircle the board without choking a main path 1944 to the at least one ground connector 1912.

In embodiments, the EHC may further include a first differential choke 2908 on the power output connector 1906, and may further include a second differential choke 2922 on the power input connector 1904, wherein a size of at least one of the first differential choke 2908, the second differential choke 2922, or the common mode choke 2902 may be selected according to a current capacity therethrough. A material of at least one of the first differential choke 2908, the second differential choke 2922, or the common mode choke may be selected according to at least one of: a desired noise profile, a desired frequency filtering, a current capacity therethrough, or a size of the current path therethrough.

In embodiments, the differential choke 2908, 2922 may include a ferrite material.

In embodiments, the power input connector 1904 may be supported on a finger 2912 of the board, wherein the finger 2912 is connected to the board on one end. In embodiments, the fingers 2912, 2920 may be spaced apart from each other to enable the placement of differential chokes 2908, 2922 on one or both of the fingers 2912, 2920. In embodiments, the fingers 2912, 2920 may not be longer than they are wide. In embodiments, the power output connector 1906 may be supported on a finger 2920 of the board, wherein the finger 2920 may be connected to the board on one end.

In embodiments, the common-mode choke 2902 may wrap around the board, may be a split-mode choke that snaps on to the board, or may be ferrite.

In an embodiment, the power input connector 1904 and the power output connector 1906 may be adjacent to a same edge of the board as the one or more phase circuits 1932A-1932F.

In an embodiment, the EHC may further include a connector 3002 disposed on an upper surface of the board of the electric heater controller, accessible adjacent to an extruded housing 3024 defining at least a portion of the board.

In an embodiment, a connector block for a DC-to-DC converter, as shown in FIG. 31, FIG. 32, and FIG. 33, and in an installed position in FIG. 22, FIG. 30A, and FIG. 30B, may include a block formed from a non-metallic insulator with one or more through-passages 3102, 3104 structured to accommodate at least one ground connector, a power input connector, and a power output connector, wherein portions of the block are formed at different heights, as seen in FIG. 31 with a first height 3108 and a second height 3110, to accommodate differently sized connectors so that they mount to the same level on a board, the board including a ground connector interface, a power input connector interface, and a power output connector interface.

In embodiments, the block may be 3D printed, injection-molded, or formed using a single machining operation, wherein the block may include a center point 3112 marking on at least one end, such as to facilitate machining. In embodiments, the block could be metal or die-cast, with appropriate insulation from electrical paths therethrough. In embodiments, the block may include a sealing groove 3202 disposed around a perimeter of a housing engagement surface of the block. In embodiments, the block may include locating pinholes 3204. In embodiments, a controller connector could be in the connector block element as well.

In an embodiment, an EHC 2900 may include a printed circuit board (PCB) 2924, including one or more phase circuits 2910 (or phase circuits 1932A-F, as seen in FIG. 19) disposed in a horizontal row along a length of the board adjacent to an edge of the PCB, an input connector 2928 and an output connector 2930 on an end of the PCB, and at least one ground connector 2932 disposed on a same end of the PCB as the input connector 2928 and the output connector 2930, where a length of the PCB 2924 is variable to accommodate a number of total phase circuits 2910, and an extruded housing 3024 sized to accommodate the variable length of the PCB 2924. In embodiments, the one or more phase circuits 2910 may include two phases having an 80 amp current capability at the output connector 2930. In embodiments, the one or more phase circuit 2910 may include four phases having a 160 amp current capability at the output connector 2930. In embodiments, the one or more phase circuits 2910 may include eight phases having a 210 amp current capability at the output connector 2930. In embodiments, and to accommodate modularity and extensibility, common components of the EHC 2900 may be grouped on a first end 2934 of the board, and the one or more phase circuits 2910 may be arranged adjacent to a second end 2938 of the board.

In embodiments, the EHC may further include a power controller 1948, which may be a single or a distributed device, and may include a processor, a memory, one or more sensors or access to one or more sensed values, a communications facility, a connector, etc., may be configured to modulate power flowing through the EHC, wherein the controller may be powered by a separate low voltage input. The separate low voltage input may include a keyswitch input, a 12V nominal input, or a control connector 3002 positioned on a vertically upper side of the board. In some embodiments, the control connector 3002 may include keyswitch (as power or not), power, and/or communications (e.g., coupling to one or more CANs).

In some embodiments, the EHC may further include a power controller 1948 configured to modulate power flowing through the EHC, wherein the power controller 1948 is powered by a power input coupling the input connector to the one or more phase circuits. In some embodiments, the EHC may further include a power controller 1948 configured to modulate power flowing through the EHC, wherein the power controller 1948 may be powered by a power output coupling the one or more phase circuits to the output connector.

In an embodiment, an electric heater controller (EHC) 2900 may include a printed circuit board (PCB) 2924 including one or more phase circuits 2910 disposed in a horizontal row along a length of the board adjacent to an edge of the PCB 2924, a power input connector 2928 and a power output connector 2930 on an end of the PCB 2924, and at least one ground connector 2932 disposed on a same end of the PCB 2924 as the power input connector 2928 and the power output connector 2930, and a clamp bar 2942, 3412 structured to compress the one or more phase circuits 2910. In embodiments, the clamp bar 2942, 3412 may include aluminum or spring steel.

In embodiments, the clamp bar 2942, 3412 may compress the one or more phase circuits toward a heat sink.

In an embodiment, the EHC may further include a silicone pad 3408 interposed between the one or more phase circuits 2910 and the clamp bar 2942, 3412.

In embodiments, the EHC may further include a thermal interface material interposed between the one or more phase circuits 2910 and the heat sink.

In embodiments, the PCB may further include thermal vias 3502 providing a thermal path between the one or more phase circuits 2910 and at least one of a heat sink, a thermal interface to the heat sink, or a housing, wherein the housing at least partially defines the PCB. The housing may include an extruded housing or a heat sink.

In embodiments, an electric heater device of a vehicle may demand a sudden and significant amount of power. For example, the electric heater device may suddenly demand a significant amount of power at a turn-on time, or in response to a heat generation increase as commanded by the vehicle. This power demand may cause an undesirable rising impact to an electrical system of the vehicle, and particularly to an alternator of the vehicle. Furthermore, the electric heater may suddenly decrease its power demand, such as by being turned off, or in response to a heat generation decrease commanded by the vehicle. Such a decrease in power demand may cause an undesirable falling impact on the electrical system, including the alternator, such as by causing a "load dump" on the alternator.

Figure 61:
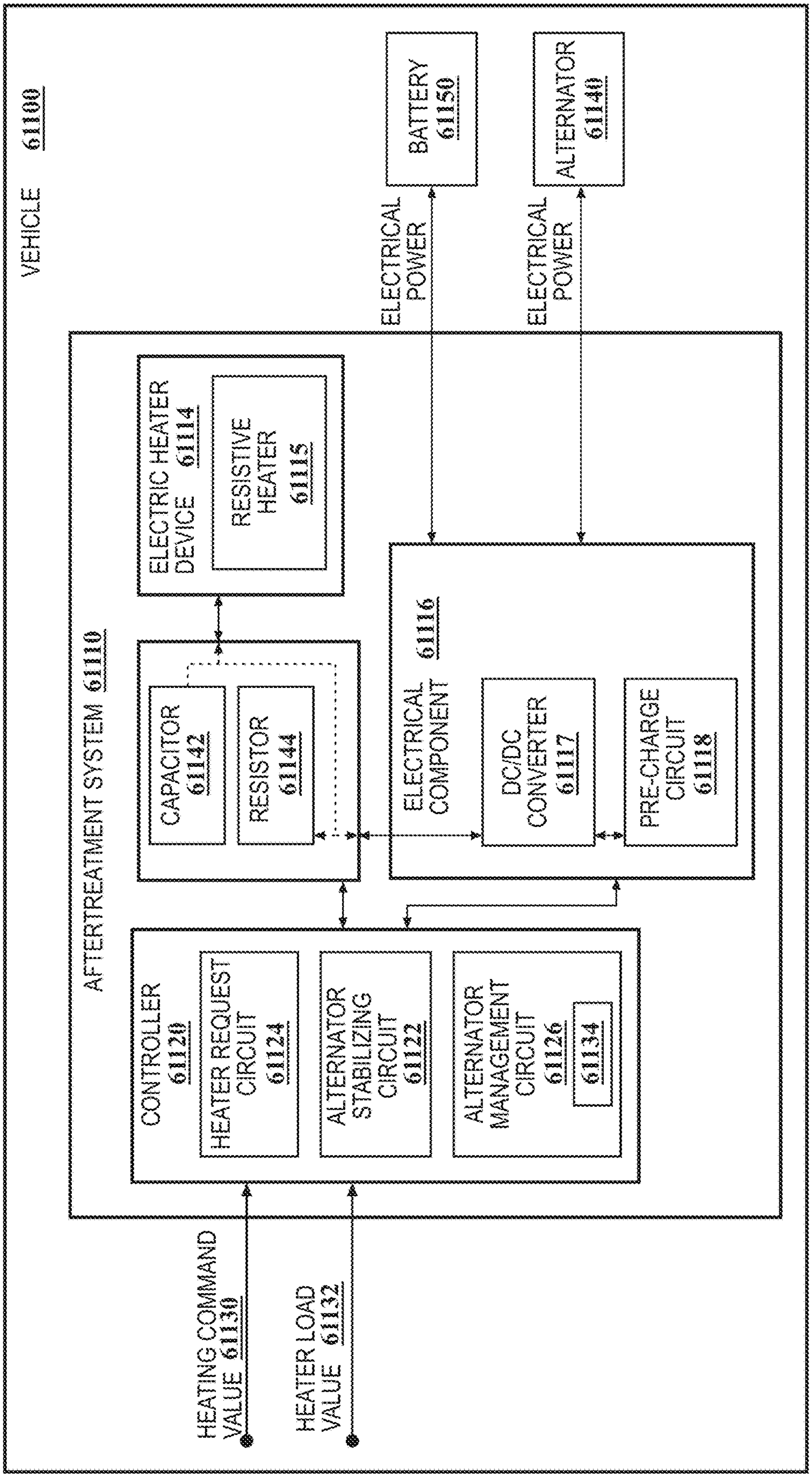
FIG. 61 depicts an example power schematic for an aftertreatment system of a vehicle according to embodiments.

With reference to FIG. 61, in embodiments, an aftertreatment system 61110 for a vehicle 61100 may include an electric heater device 61114, and an electrical component 61116 having a DC/DC converter 61117 structured to at least selectively electrically couple an alternator 61140 to the electric heater device 61114, and a controller 61120. The controller 61120 may include a heater request circuit 61124 structured to interpret a heating command value 61130, and an alternator management circuit 61126 structured to determine an alternator disturbance value 61134 in response to the heating command value 61130 and a heater load value 61132. In some embodiments, the electric heater device 61114 may include a resistive heater 61115.

The heating command value 61130 may be a command for an increase or a decrease in the heat generated by the electric heater device 61114, and the heater load value 61132 may include a power to be provided to the electric heater device 61114. The heating command value 61130 may be provided by another controller in the system, for example a vehicle controller, engine controller, or aftertreatment controller. In certain embodiments, the heating command value 61130 may be determined from other parameters, such as a temperature command, where the resulting heating command is determined as a heating power that will achieve or acceptably progress toward the temperature indicated by the temperature command. The heater load value 61132 may be determined from the heating command value 61130, and/or the heating command value 61130 for certain systems may be provided as a heating power level for the electric heater device 61114, and the heating load value 61132 may be the same as the heating command value 61130. The controller 61120 may further include an alternator stabilizing circuit 61122 structured to adjust at least one of the heating command value 61130 or the heater load value 61132 in response to the alternator disturbance value 61134.

In some embodiments, the alternator disturbance value 61134 may include one or more of a target magnitude of a change of the heating command value 61130, a maximum rate of change of at least one of the heating command value 61130 or the heater load value 61132, a feedback value of an operating parameter of the vehicle, or a slew rate of the heater load value 61132. In some embodiments, the feedback value may include one or more of a system voltage of the vehicle 61100, a prime mover speed, a total power output of a prime mover (e.g., less disturbance at idle versus rated operation), or a total load of a prime mover (e.g., torque—distinct but related to power).

In some embodiments, the slew rate of the heater load value 61132 may include a time derivative of the heater load value 61132 including a current flow value. And, in some embodiments, the slew rate may include a time derivative of the heater load value 61132 including a power value. In some embodiments, the slew rate may be dependent on a total capacity of the alternator 61140, and/or may depend on a magnitude of the change in requested power and/or heat.

In some embodiments, the alternator stabilizing circuit 61122 may be further structured to adjust at least one of the heating command value 61130 or the heater load value 61132 by operating a pre-charge circuit 61118 electrically coupled to the DC/DC converter 61117.

In some embodiments, the alternator stabilizing circuit 61122 may be further structured to adjust the at least one of the heating command value 61130 or the heater load value 61132 by electrically coupling a resistor to the electric heater device 61114 (e.g., in series between the DC/DC converter and the electric heater device).

In some embodiments, the alternator stabilizing circuit 61122 may be further structured to adjust the at least one of the heating command value 61130 or the heater load value 61132 by electrically coupling a capacitor 61142 to the electric heater device 61114 (e.g., coupling the capacitor 61142 between the power supplied from the DC/DC converter 61117 to the electric heater device 61114 and ground). In some embodiments, the capacitor 61142 may be a power make-up capacitor sized for a power surge only, or may be sized such that power draw limits from the alternator 61140 do not slow down the heating by the electric heater device 61114. In an example, the power make-up capacitor may be a super-capacitor.

In an example embodiment that include a super-capacitor, a super-capacitor sized to address transients such as alternator ripples of, e.g., 10 msec, and load dumps of, e.g., 100 msec, may have an example capacity of about 0.3 F. Furthermore, for an example embodiment including a super-capacitor to address large system transients, e.g., over the course of seconds, such a super-capacitor may be in the range of about 10-100 F. For addressing transients that are over the course of, e.g., a minute, such a super-capacitor may be sized at about 1000 F. In some embodiments, for start-up support, the super-capacitor may be charged before starting an engine of the vehicle.

In some embodiments, the alternator stabilizing circuit 61122 may be further structured to adjust the at least one of the heating command value 61130 or the heater load value 61132 by adjusting a power provision ratio for the electric heater device 61114 between the alternator 61140 and a battery pack 61150, and the battery pack 61150 may be at least selectively electrically coupled to the electric heater device 61114.

In some embodiments, the alternator stabilizing circuit 61122 may be further structured to adjust the at least one of the heating command value 61130 or the heater load value 61132 by adjusting a mechanical coupling to a drive train of the vehicle 61100.

Figure 62A:
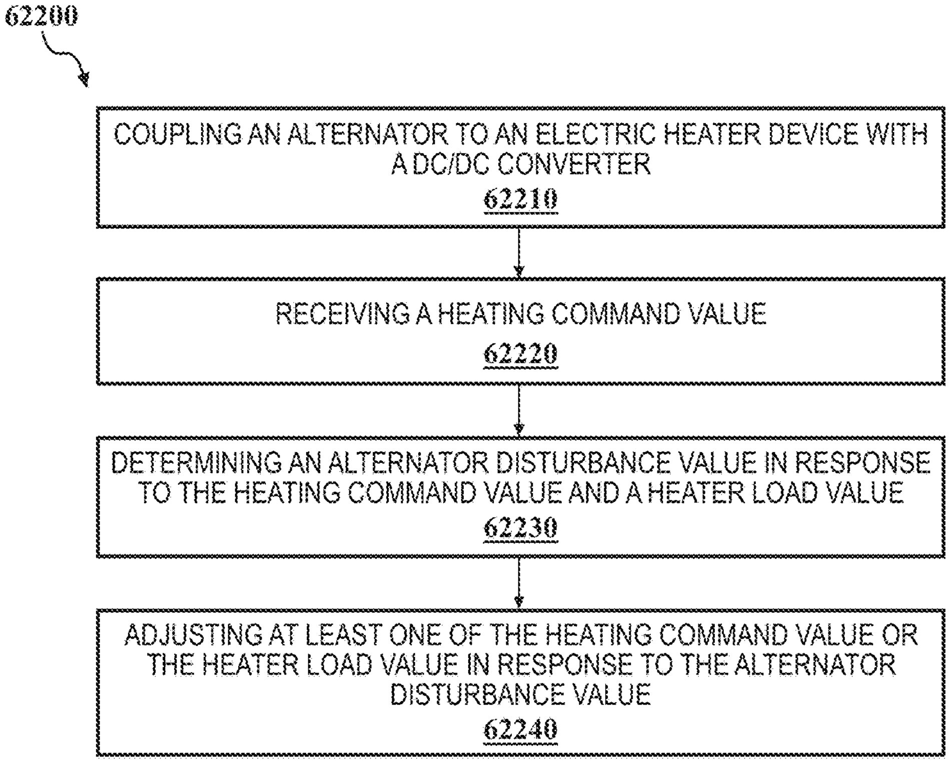
FIGS. 62A-62F depict a method of controlling load demands of an electric heater device according to embodiments.

With reference to FIG. 62A, a method 62200 according to embodiments may include coupling (62210) an alternator to an electric heater device with a DC/DC converter, receiving (62220) a heating command value, determining (62230) an alternator disturbance value in response to the heating command value and a heater load value, and adjusting (62240) at least one of the heating command value or the heater load value in response to the alternator disturbance value.

Figure 62B:
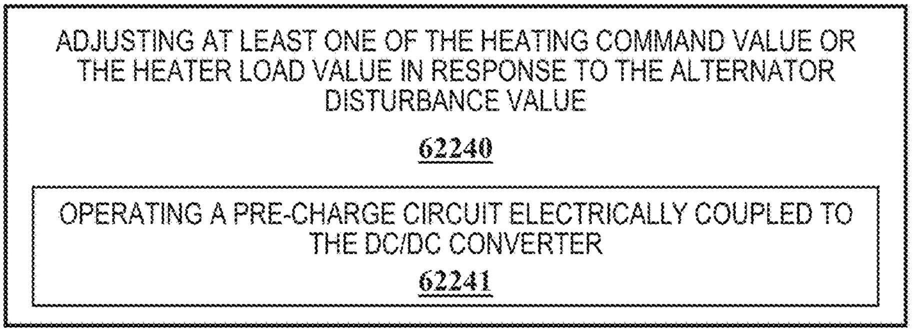

In some embodiments, with reference to FIG. 62B, the method may further include adjusting (62240) the at least one of the heating command value or the heater load value by operating (62241) a pre-charge circuit electrically coupled to the DC/DC converter.

Figure 62C:
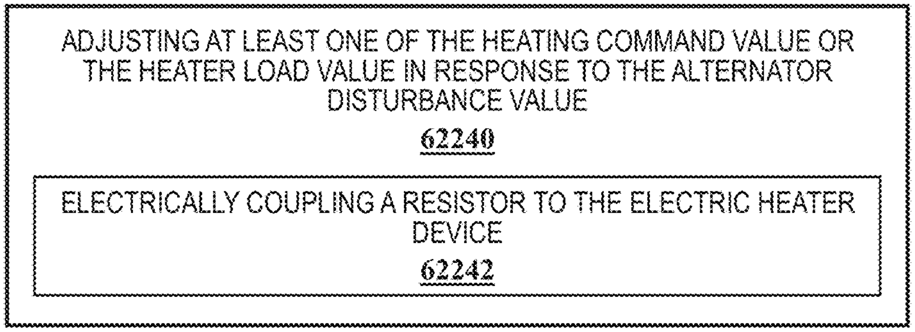

In some embodiments, with reference to FIG. 62C, the method may further include adjusting (62240) the at least one of the heating command value or the heater load value by electrically coupling (62242) a resistor to the electric heater device.

Figure 62D:
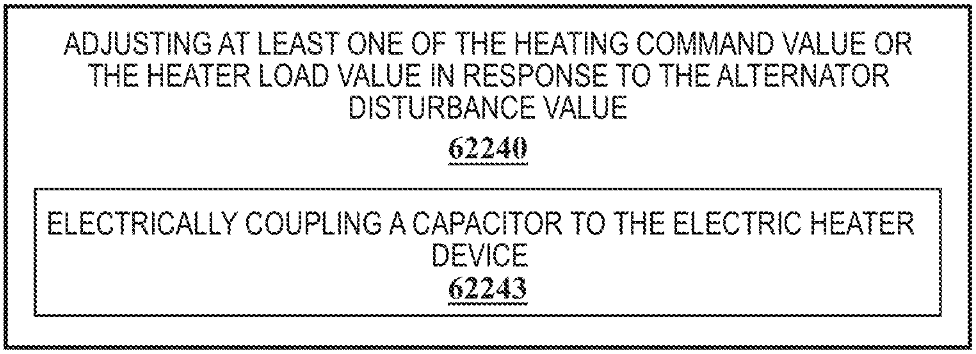

In some embodiments, with reference to FIG. 62D, the method may further include adjusting (62240) the at least one of the heating command value or the heater load value by electrically coupling (62243) a capacitor to the electric heater device.

Figure 62E:
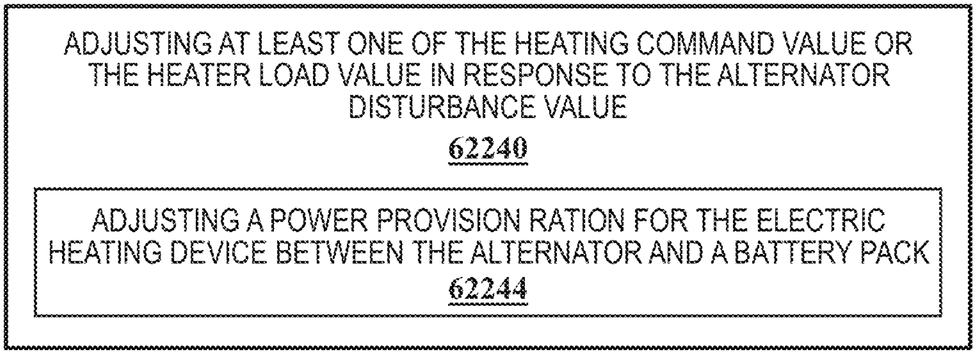

In some embodiments, with reference to FIG. 62E, the method may further include adjusting (62240) the at least one of the heating command value or the heater load value by adjusting (62244) a power provision ratio for the electric heating device between the alternator and a battery pack. The battery pack may be at least selectively electrically coupled to the electric heating device.

Figure 62F:
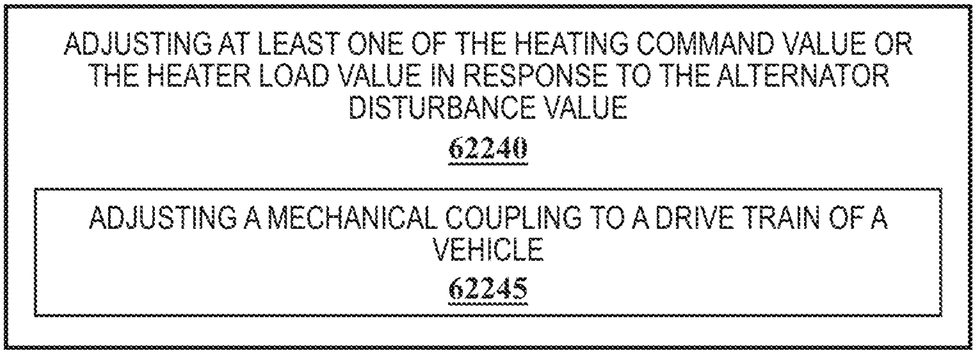

In some embodiments, with reference to FIG. 62F, the method may further include adjusting (62240) the at least one of the heating command value or the heater load value by adjusting (62245) a mechanical coupling to a drive train of a vehicle.

In some embodiments, the electric heater device according to the method may include a resistive heater.

Figure 63:
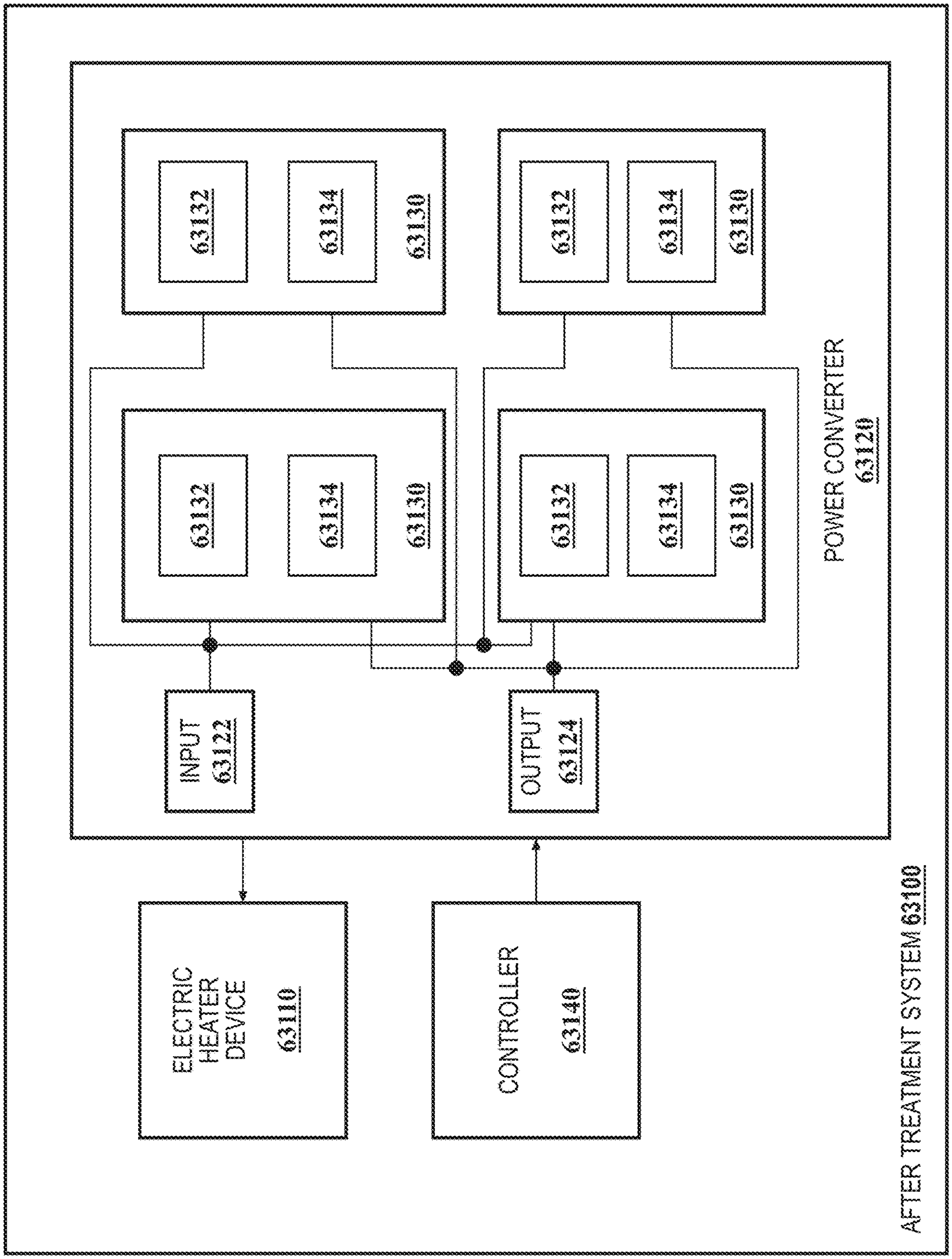
FIG. 63 depicts an aftertreatment system for a vehicle according to embodiments.

With reference to FIG. 63, in embodiments, an aftertreatment system 63100 of a vehicle may include an electric heater device 63110 and a power converter 63120 structured to provide power to the electric heater device 63110. In an example, the power converter 63120 may convert between 36-52 VDC (e.g., 48 VDC) to 12 VDC. The power converter 63120 may include at least one phase converter 63130. With reference to FIG. 63 as well as FIG. 25, which shows an example phase converter 63130 according to some embodiments, each phase converter 63130 may include a first plurality of switching devices 63132 (e.g., 2502*a*-2502*d* in FIG. 25) coupled together in parallel, and a second plurality of switching devices 63134 (e.g., 2405*a*-2504*b* in FIG. 25) coupled together in parallel. As illustrated in the example of FIG. 25, the second plurality of switching devices 2405*a*-2504*b* may be coupled in series with the first plurality of switching devices 2502*a*-2502*d*, and a number of the first plurality of switching devices 2502*a*-2502*d* may be different from a number of the second plurality of switching devices 2405*a*-2504*b* (as will be discussed with reference to FIG. 25).

In some embodiments, the aftertreatment system 63100 may further include a controller 63140 (e.g., 2506 in the example embodiment of FIG. 25) structured to apply, in each phase converter 63130, a first duty cycle to the first plurality of switching devices 63132 and a second duty cycle to the second plurality of switching devices 63134. For example, the controller 63140 may apply the first duty cycle to gates of the first plurality of switching devices 63132, and the second duty cycle to gates of the second plurality of switching devices 63134.

In some embodiments, the first duty cycle may be a 25% duty cycle and the second duty cycle may be a 75% duty cycle. For example, the first duty cycle may be a 25% duty cycle and the second duty cycle may be a 75% duty cycle in an embodiment where the power converter 63120 converts 48V to 12V.

In some embodiments, the controller 63140 may apply the first duty cycle and the second duty cycle independently. For example, the controller 63140 may apply the first duty cycle without regard to the timing of the second duty cycle, and/or vice versa.

In some embodiments, the controller 63140 may apply the first duty cycle and the second duty cycle such that the first plurality of switching devices 63132 is on when the second plurality of switching devices 63134 is off, and the first plurality of switching devices 63132 is off when the second plurality of switching devices 63134 is on.

In some embodiments, the first and second duty cycles may correspond to load dynamics. For example, a load (e.g., the electric heater device 63110) that draws a greater current may correspond to a higher first duty cycle and/or lower second duty cycle. In some embodiments, as the first duty cycle increases, the current provided to a load may increase. Thus, in an example where constant current is provided to the load, the duty cycles may dictate the amount of constant current provided to the load. In an example, for a 50% duty cycle (e.g., where the first duty cycle may be a 50% duty cycle and the second duty cycle may be a 50% duty cycle), the current may be split equally between the first plurality of switching devices 63132 and the second plurality of switching devices 63134, and thus, half of the current input to the phase converter may be provided to the load. In another example, for a 25% duty cycle (e.g., where the first duty cycle may be a 25% duty cycle and the second duty cycle may be a 75% duty cycle), 75% of the current may flow through the second plurality of switching devices 63134, and the other 25% of the current may flow through the first plurality of switching devices 63132 (e.g., the "high side" switching devices), and thus, 25% of the current may be provided to the load.

An example embodiment with a resistive load (e.g., the electric heater device 63110 including a resistive heater) may be provided with a higher current at a higher first duty cycle. In some embodiments, the power converter 63120 may boost the voltage provided to the load in order to reduce the current, although the load may need to be structured for receiving this boosted voltage.

In some embodiments, each of the first plurality of switching devices 63132 may be coupled together in parallel between an input terminal 63122 of the power converter 63120 and an output terminal 63124 of the power converter 63120, and each of the second plurality of switching devices 63134 may be coupled together in parallel between the output terminal 63124 and a ground. In an example, the input 63122 to the power converter may be an output from a current sensor, as described elsewhere herein, and the output 63124 from the power converter may be to the electric heater device 63110. For example, FIG. 25 shows an exemplary embodiment with a phase converter having a first plurality of switching devices 2502*a*-2502*d* coupled together in parallel between an input terminal of a power converter (not shown) and an output terminal of the power converter (not shown), and a second plurality of switching devices 2504*a*-2504*b* coupled together in parallel between the output terminal (not shown) and a ground.

With reference to FIG. 63, in some embodiments, the power converter 63120 may be structured to receive power having a first voltage at the input terminal 63122, decrease the first voltage to a second voltage, and provide a converted power having the second voltage at the output terminal 63124.

In some embodiments, the electric heater device 63110 may include a resistive heater.

In some embodiments, in an example phase converter 63130, the number of the first plurality of switching devices 63132 may be greater than the number of the second plurality of switching devices 63134. Furthermore, in some embodiments, a ratio of the number of the first plurality of switching devices 63132 to the number of the second plurality of switching devices 63134 may be 2:1. Also, in some embodiments, the number of the first plurality of switching devices 63132 in an example phase converter 63130 may be four, and the number of the second plurality of switching devices 63134 in an example phase converter 63130 may be two. For example, the embodiment shown by FIG. 25 includes four of the first plurality of switching devices 2502*a*-2502*d*, and two of the second plurality of switching devices 2504*a*-2504*b* in the illustrated phase converter.

In some embodiments, the power converter 63120 may include a plurality of the phase converters 63130. For example, in some embodiments, the power converter 63120 may include four or six of the phase converters 63130. Also, in some embodiments, the power converter 63120 may be structured to operate (e.g., using controller 63140) a subset of the plurality of phase converters 63130 in response to at least one of a converter condition or a condition of the electric heater device 63110.

In some embodiments, the power converter 63120 may be structured to operate (e.g., using controller 63140) the subset of the plurality of phase converters 63130 in response to the converter condition. The converter condition may be based on at least one of a current balance threshold (e.g., maximum differential between phases, and/or a statistical description of differences between phases) or a ripple threshold.

In some embodiments, the power converter 63120 may be structured to operate (e.g., using controller 63140) a sub-set of the first plurality of switching devices 63132 and the second plurality of switching devices 63134 in each phase converter 63130. For example, each phase converter 63130 may include four of the first plurality of switching devices 63132 and four of the second plurality of switching devices 63134, and the power converter 63120 may operate all four of the first plurality of switching devices 63132 and two of the second plurality of switching devices 63134. In another example, each phase converter 63130 may include four of the first plurality of switching devices 63132 and four of the second plurality of switching devices 63134, and the power converter 63120 may operate three of the first plurality of switching devices 63132 and three of the second plurality of switching devices 63134.

In some embodiments, the power converter 63120 may be structured to time shift (e.g., using controller 63140) a duty cycle for one phase converter of the plurality of phase converters 63130 relative to a duty cycle of another phase converter of the plurality of phase converters 63130.

In some embodiments, each of the first plurality of switching devices 63132 and each of the second plurality of switching devices 63134 may be a field effect transistor (FET), such as a junction field effect transistor (JFET) or a metal oxide semiconductor field effect transistor (MOSFET). In an example, by providing the switching devices (e.g., MOSFETs) in parallel in the first plurality and the second plurality, "ON" resistance may be reduced, thereby increasing efficiency and lowing total heat production. However, an increase in the number of switching devices in the first and/or second pluralities of switching devices may also cause a decrease in efficiency from the parasitic capacitance. MOSFETs may perform well at sharing current when in parallel, and the MOSFETs may self-regulate by an increase in their resistance as they heat up.

Figure 64:
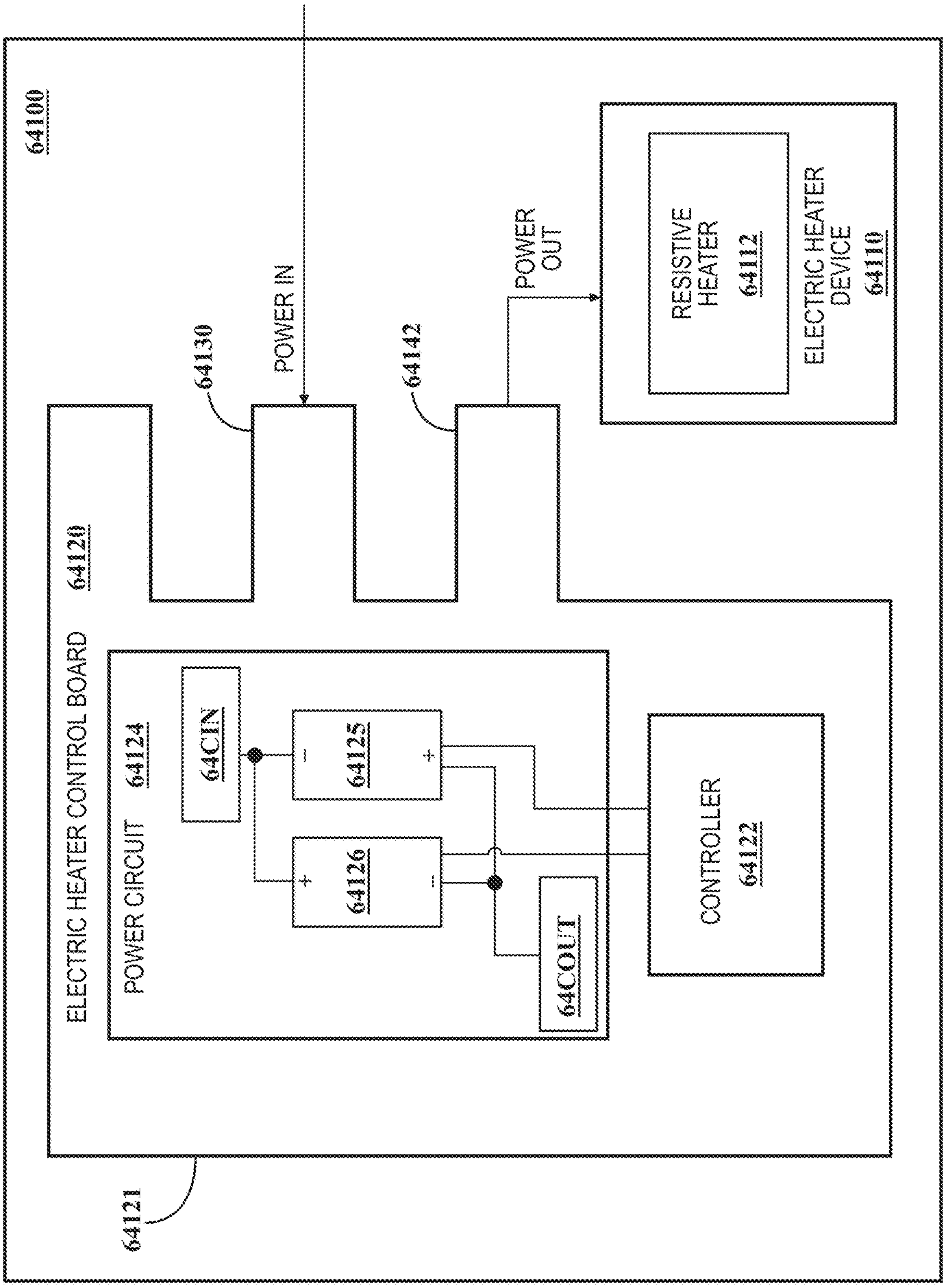
FIG. 64 depicts an aftertreatment system for a vehicle according to embodiments.

With reference to FIG. 64, in embodiments, an aftertreatment system 64100 for a vehicle may include an electric heater device 64110 and an electric heater control board 64120. The electric heater control board 64120 may include a controller 64122 and a power circuit 64124. In some embodiments, the power circuit 64124 may provide power to the electric heater device 64110. In some embodiments, the electric heater device 64110 may include a resistive heater 64112.

In embodiments, the power circuit 64124 may include a first current sensor 64125 and a second current sensor 64126 connected in parallel between an input 64CIN and an output 64COUT. In an example, the input 64CIN may include a current provided to the electric heater control board 64120 (e.g., from the vehicle), and the output 64COUT may include a current provided to the rest of the electric heater control board 64120 from the power circuit 64124, including a DC/DC converter as described elsewhere herein. The first current sensor 64125 and the second current sensor 64126 may be each structured to sense bi-directional current, and the second current sensor 64126 may be connected between the input 64CIN and the output 64COUT with a reverse sensing polarity relative to the first current sensor 64125. For example, because only unidirectional current may need to be measured in an aftertreatment system having an electric heater device 64110 with a resistive heater 64112, the two current sensors may be configured to measure the reverse polarities of current.

In some embodiments, the first current sensor 64125 may be positioned to measure a first polarity of the current flow between input 64CIN and output 64COUT, and the second current sensor 64126 may be positioned to measure a second polarity of the current flow between input 64CIN and output 64COUT. For example, FIGS. 26 and 27 show an example configuration where a first current sensor 1924A is positioned to measure a first polarity of current from input 2712, and a second current sensor 1924B is positioned to measure a second polarity of current from input 2712, and both the current sensors 1924A and 1924B output the current to output 2714.

With reference again to FIG. 64, the controller 64122 may be structured to calculate a total current flowing between the input 64CIN and the output 64COUT as a summation of a magnitude (e.g., an absolute value) of each of the first polarity of current and the second polarity of current, as measured by the first current sensor 64125 and the second current sensor 64126.

In some embodiments, the electric heater control board 64120 may include a printed circuit board (PCB) 64121. The controller 64122 and the power circuit 64124 may be on the PCB 64121 (e.g., soldered to the PCB 64121), as well as various other components. In an example, the PCB 64121 may include a coupling finger 64130 structured to receive power, such as the power for current input 64CIN.

Figure 65:
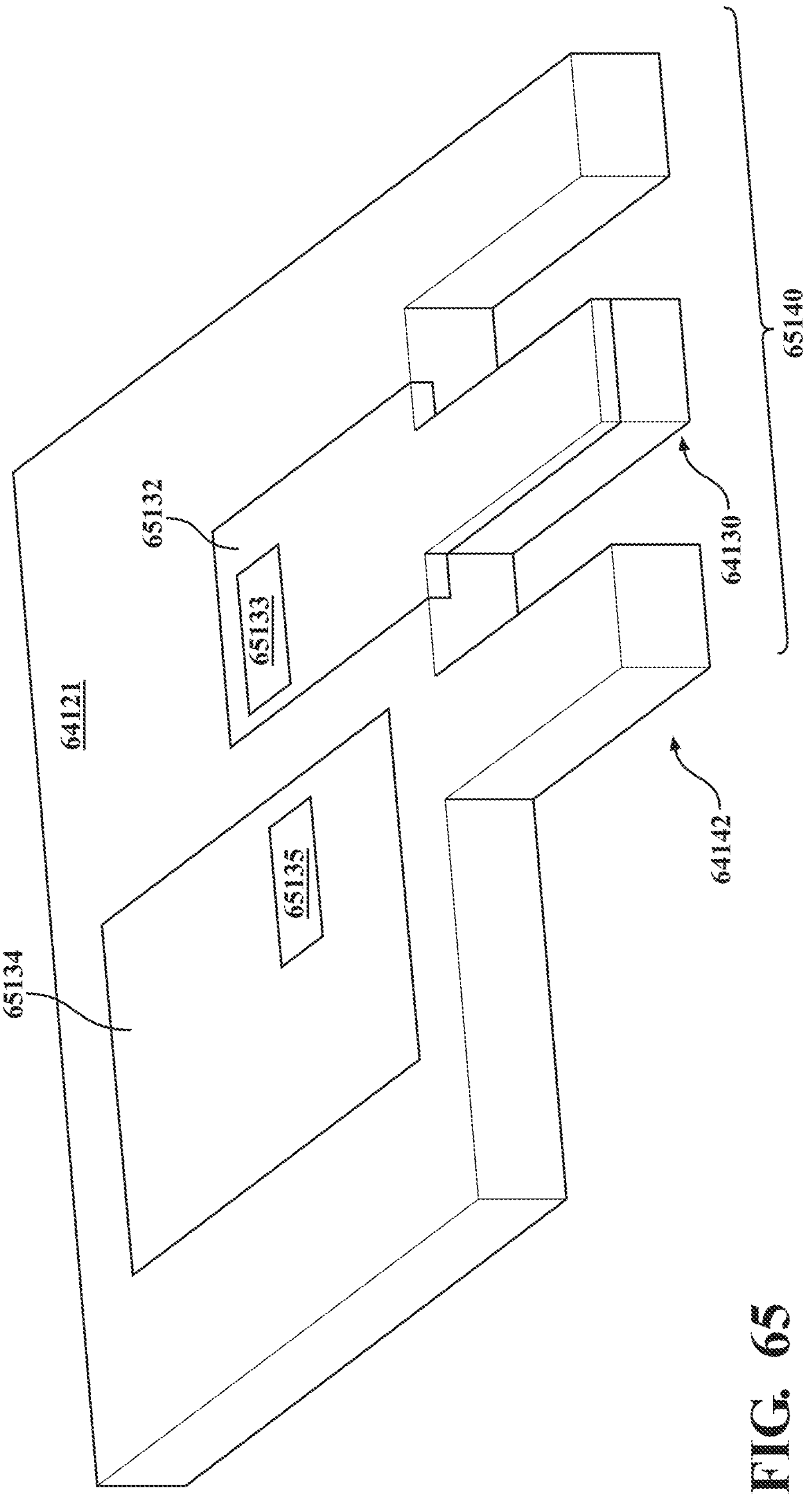
FIG. 65 depicts a printed circuit board of an aftertreatment system for a vehicle according to embodiments.

In some embodiments, with reference to FIG. 65, the coupling finger 64130 may include a first conductive plane 65132 that extends to the first current sensor 64125 and the second current sensor 64126. Furthermore, in some embodiments, the first conductive plane 65132 may include a pad or via 65133 for the input 64CIN to connect to the first current sensor 64125 and/or the second current sensor 64126. In some embodiments, the first conductive plane 65132 may be a layer of the PCB 64121.

In some embodiments, the aftertreatment system may include a plurality of coupling fingers 65140, which may include the coupling finger 64130 structured to receive power. The plurality of coupling fingers 65140 may be spaced apart from each other.

In some embodiments, the PCB 64121 may further include a second conductive plane 65134 including a pad or via 65135 for the output 64COUT. In some embodiments, the second conductive plane 65134 is part of the same layer of the PCB 64121 as the first conductive plane 65132, and the first conductive plane 65132 and the second conductive plane 65134 may be electrically isolated, as shown by example in FIG. 28B.

In some embodiments, the plurality of coupling fingers 65140 may include a coupling finger 64142 structured to provide power to the electric heater device 64110 (which may be provided via circuitry including a DC/DC converter, as described elsewhere herein).

In some embodiments, providing first current sensor 64125 and the second current sensor 64126 with the configurations described by example herein may avoid a need to cut the main current path between power input and the rest of the board. For example, if both current sensors were configured to measure a same polarity of current, the arrangement of the pinouts of the current sensors (e.g., on integrated circuits for the circuit sensors) may require cutting the main current path to make room for connections to the current sensor pinouts. In contrast, in some embodiments, the current sensors may be arranged in reverse sensing polarity as described herein, thereby allowing the pinouts of the two current sensors to be arranged such that the main current paths do not need to be cut. This is shown by example in FIG. 28B. By avoiding the need to cut the main current path, the board may retain a thick main copper current path that goes directly to the current sensors, and another thick copper current path that provides the current to the rest of the board. This may provide advantages in power and heat loss. For example, a thicker conductive path offers less resistance to current flow, and therefore less power and heat loss. Furthermore, the use of the two sensors may permit measurements of greater current (e.g., 200 amps) than may be measured by an individual one of the sensors, which may each be rated for a lower maximum current (e.g., 150 amps). Also, dividing the sensed current between the first current sensor 64125 and the second current sensor 64126 may reduce heat generation and power loss as opposed to using a single current sensor, due to less total I2R power loss/heat generation, greater surface area, thermal mass, etc.

Figure 66:
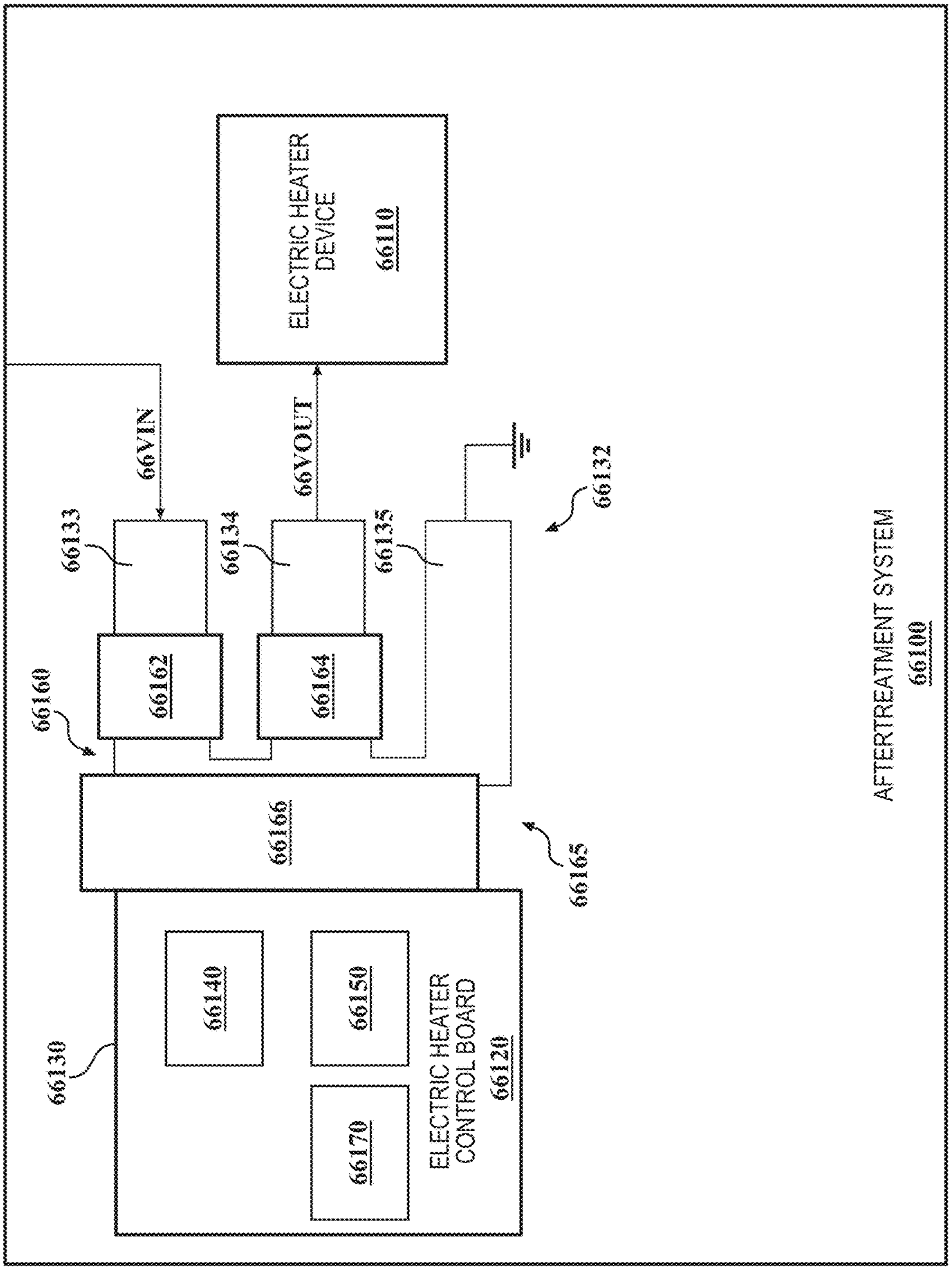
FIG. 66 depicts an aftertreatment system for a vehicle according to embodiments.

With reference to FIG. 66, in embodiments, an aftertreatment system 66100 for a vehicle may include an electric heater device 66110 and an electric heater control board 66120 including a printed circuit board (PCB) 66130 having a plurality of coupling fingers 66132. The electric heater control board 66120 may be structured to electrically connect to the electric heater device 66110 through at least one of the plurality of coupling fingers 66132, and to accommodate a choke 66160 on the at least one of the plurality of coupling fingers 66132.

In some embodiments, each of the plurality of coupling fingers 66132 may be spaced apart from each other.

In some embodiments, the coupling fingers 66132 may include an input voltage coupling finger 66133 structured to receive an input voltage 66VIN (e.g., an input power, shown by example in FIG. 19 as VIN) from the vehicle (not shown), and an output voltage coupling finger 66134 structured to provide an output voltage 66VOUT (e.g., an output power, shown by example in FIG. 19 as VOUT) to the electric heater device 66110. In some embodiments, the input voltage 66VIN may be received from an alternator or voltage bus of the vehicle (not shown), and may flow to two current sensors placed in opposition, as described elsewhere herein, and to internals from the PCB thereafter, which collectively may be viewed as a bulk capacitance by the input voltage.

In some embodiments, the coupling fingers 66132 may provide an advantage of enabling flexibility in tolerancing between a connector and the PCB, as the coupling fingers may accept misalignment stress.

In some embodiments, the input voltage coupling finger 66133 and the output voltage coupling finger 66134 may be adjacent to each other with a space therebetween. In some embodiments, having the input voltage and the output voltage on separate fingers may advantageously allow for separate chokes on each finger.

For example, in some embodiments, the choke 66160 may include two differential chokes 66162 and 66164 (also both shown by example in FIG. 29 as 2908). A first of the two differential chokes 66162 may be on the input voltage coupling finger 66133, and a second of the two differential chokes 66164 may be on the output voltage coupling finger 66134. In some embodiments, the choke 66160 (e.g., the two differential chokes 66162 and 66164) may include a ferrite that respectively surrounds each of the 66VIN and 66VOUT coupling fingers, as shown by example in the ferrites surrounding the VIN and VOUT coupling fingers of FIG. 19.

In some embodiments, the choke 66160 may include a ferrite such as a ferrite bead. In some embodiments, the choke 66160 may include a surface mount capacitor in addition or alternatively to the ferrite. In some embodiments, a ground plane may extend onto the input voltage coupling finger 66133 to provide ground for the surface mount capacitor. Effectively, there may be a large amount of capacitance from the inside components of the PCB, and the choke 66160 may add capacitance on the outside for high frequency bypass.

In some embodiments, each of a common-mode choke 66166 and the two differential chokes 66162, 66164 may include a ferrite, such as a ferrite bead or a ferrite that surrounds the PCB. In some embodiments, the chokes 66166, 66162, and 66164 may be ribbon cable ferrites, and may suppress electromagnetic interference (EMI). In some embodiments, the chokes may be selected based on a noise profile experienced at the PCB, a desired noise profile, a current density, and the like. In some embodiments, the chokes may be identical, or may be different from each other.

In some embodiments, the PCB may include a cutout area 66165 structured (also shown by example in FIG. 29 as 2904) to accommodate a common-mode choke 66166 (also shown by example in FIG. 29 as 2902) that surrounds both an electrical path of the input voltage 66VIN and an electrical path of the output voltage 66VOUT on the PCB 66130. Some embodiments may include both the common-mode choke 66166 and differential chokes 66162 and 66164 (respectively shown by example in FIG. 29 as 2902 and 2908).

In an example, with reference to FIG. 19, the area 1902 may be marked to support a cutout operation of a board with or without a choke, thereby leaving an open cutout area through which the common-mode may surround the PCB. In an example, the common mode choke 66166 may be a ferrite that clips together around the PCB. In an example, the cutout area may be a notch or hole in the PCB, and there may be no parts on the other side of the PCB where the cutout area is to be cut. In some embodiments, the PCB may include no parts at the cutout area, but the cutout area may remain intact as a later option for cutting and adding the common mode choke 66166. The opening provided by the cutout area 66165 may allow for the common mode choke 66166 to be placed on the board to choke the input and output power while avoiding choking the main path to ground.

In some embodiments, the coupling fingers 66133 and 66134 may be sized to accommodate the differential chokes 66162 and 66164 and/or the common-mode choke 66166. For example, the coupling fingers 66133 and 66134 may only be as thick as an inside of the differential chokes 66162 and 66164 that surround the coupling fingers. Also, in some embodiments, the arrangement of power flow on the board may be designed to support the included common-mode 66166 choke and/or differential chokes 66162 and 66164, such that the chokes choke the input and output power.

Some embodiments may include both the differential chokes 66162 and 66164 respectively on input voltage coupling finger 66133 and output voltage coupling finger 66134, as well as the common-mode choke 66166 surrounding power flow for both coupling fingers. However, embodiments are not limited thereto, and some embodiments may include one or more of the common-mode choke 66166 or the differential chokes 66162 and 66164.

In some embodiments, a conductor of the input voltage coupling finger 66133 may be cut to isolate the input voltage 66VIN from the output voltage 66VOUT, as shown by example in FIG. 28B.

In some embodiments, the electric heater control board 66120 may further include a current sensor 66140. The conductor of the input voltage coupling finger 66133 may extend to an input of the current sensor 66140 before being cut, and the input of the current sensor 66140 may be electrically connected to the input voltage coupling finger 66133 to thereby receive the input voltage 66VIN.

In some embodiments, the electric heater control board 66120 may further include a power converter 66150 including a high-side field effect transistor (FET) and a low-side FET, as described and illustrated elsewhere herein. For example, as illustrated in FIG. 25, a drain of the high-side FET 2502*a* may be electrically connected to the input voltage, and a source of the high-side FET 2502*a* may be electrically connected to a drain of the low-side FET 2504*a*. A source of the low-side FET 2504*a* may be electrically connected to a ground.

In some embodiments, the electric heater control board 66120 may further include a controller 66170. The gate of the high-side FET and the gate of the low-side FET may each be electrically connected to respective outputs of the controller 66170. (See, for example, the controller 2506 as illustrated in FIG. 25.)

In some embodiments, the coupling fingers 66132 may further include a ground coupling finger 66135. The ground coupling finger may be structured to ground to a chassis of the vehicle (not shown). As discussed herein, the electric heater control board 120 may be structured such that the choke 66160 does not choke a main path to the ground.

Figure 67:
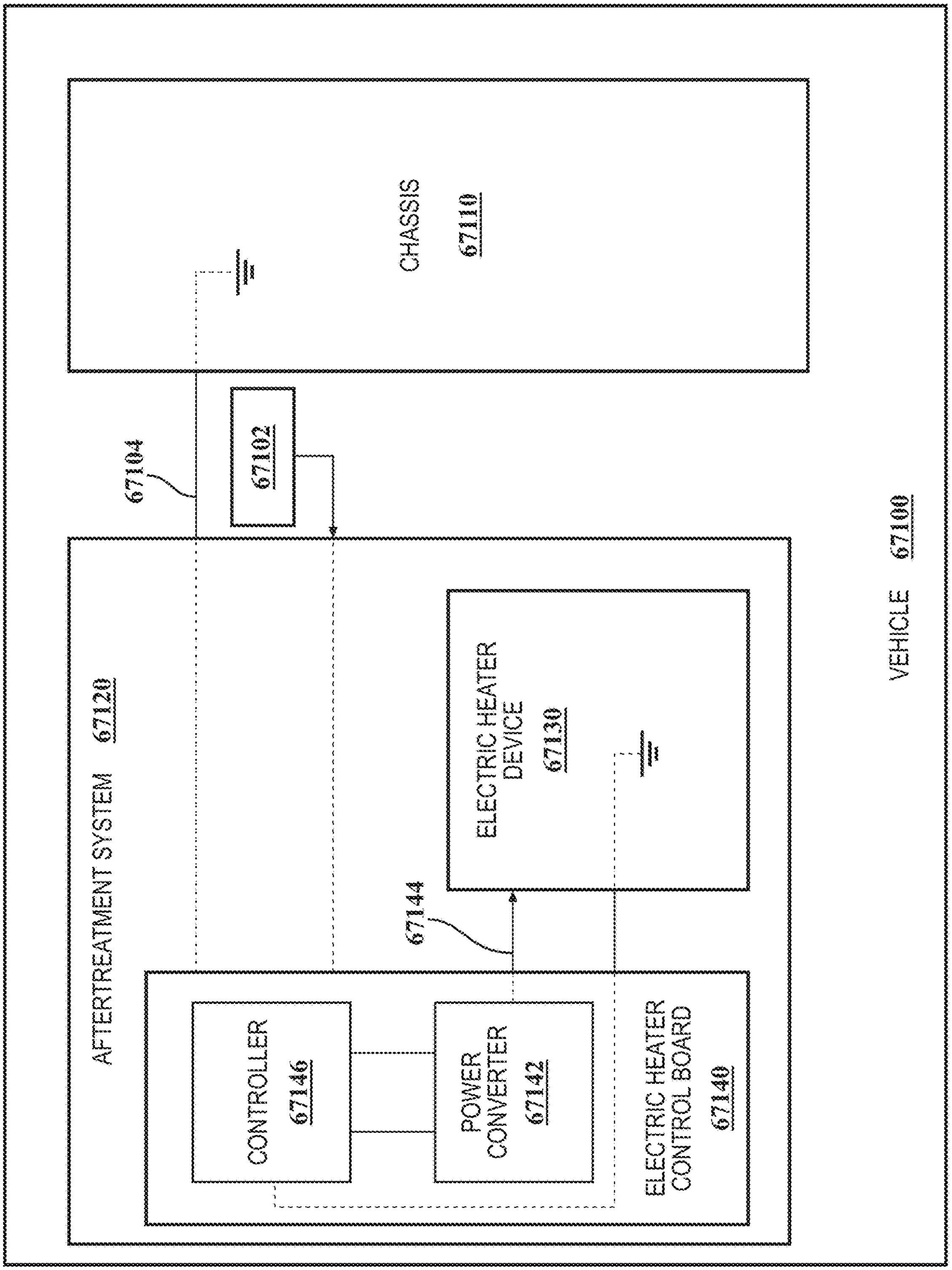
FIG. 67 depicts an aftertreatment system for a vehicle according to embodiments.

With reference to FIG. 67, in embodiments, an aftertreatment system 67120 for a vehicle 67100 may include an electric heater device 67130 and an electric heater control board 67140 including an electric heater controller 67146. The electric heater control board 67140 may be structured to connect to a chassis 67110 ground of the vehicle 67100, receive an input current 67102 from the vehicle, connect to a ground of the electric heater device 67130, provide an output current 67144 to the electric heater device 67130, receive a ground current from the electric heater device 67130 through the ground of the electric heater device 67130, and control an amount of the ground current that may be output to the chassis 67110 ground, where a remaining amount of the ground current that is not output to the chassis 67110 ground may be recirculated on the electric heater control board 67140. A benefit of this system is that return paths may be more deterministic, and there may be the ability to control return paths in a vehicle environment.

In some embodiments, the electric heater control board 67140 may include a power converter 67142, and the remaining amount of the ground current may be recirculated on the electric heater control board internally to the power converter 67142.

In some embodiments, the output current 67144 may be higher than the input current 67102. For example, in some embodiments, the input current 67102 may be about 100 amps, and the output current 67144 may be about 250 amps.

In some embodiments, the electric heater controller 67146 may be structured to monitor the ground current.

In some embodiments, the electric heater control board 67140 may be further structured to vary (e.g., using the electric heater controller 67146) the amount of the ground current that may be output to the chassis 67110 ground. Also, in some embodiments, the electric heater control board 67140 may be further structured to control the amount of the ground current that may be output to one of a plurality of specific locations on the chassis 67110 ground.

With continued reference to FIG. 67, in embodiments, a vehicle 67100 having an aftertreatment system 67120 may include a chassis 67110, an electric heater device 67130, an electric heater control board 67140, and a connector 67104 between the chassis and the electric heater control board 67140. The electric heater control board 67140 may include an electric heater controller 67146, and may be structured to connect to a chassis 67110 ground of the vehicle 67100 via the connector 67104, receive an input current 67102 from the vehicle 67100, connect to a ground of the electric heater device 67130, provide an output current 67144 to the electric heater device 67130, receive a ground current from the electric heater device 67130 through the ground of the electric heater device 67130, and control an amount of the ground current that may be output to the chassis 67110 ground via the connector 67104, where a remaining amount of the ground current that may not be output to the chassis 67110 ground may be recirculated on the electric heater control board 67140.

In some embodiments, the connector 67104 may be connected to one or more locations on the chassis 67110 such that the amount of the ground current may be output to the one or more locations on the chassis 67110. In some embodiments, the one or more locations include a dedicated chassis ground of the vehicle, and/or a ground strip of the vehicle (although such a ground strip may be more distant from the connector 67104).

By providing the connector 67104, a manufacturer of the vehicle may be able to choose where to output the ground current, rather than requiring a specific grounding requirement that the manufacturer may be forced to accommodate. This may allow a manufacturer to keep ground runs short.

In some embodiments, the electric heater controller 67146 may control an amount of ground current sent to a particular location. In some embodiments, the electric heater controller 67146 may control which location to which ground current is sent.

In an example, an aftertreatment system according to some embodiments as described herein may operate in a "buck" mode, where the electric heater control board may send 250 A of current to the electric heater device, and only send back 200 A to the ground of the chassis while recirculating the other 50 A on the electric heater control board (e.g., in a power converter of the electric heater control board). This may avoid high recirculating current in a connector such as a wiring harness. Furthermore, such embodiments may provide opportunities for the electric heater control board 67140 to monitor and control ground current that may not be available if the ground current were returned directly to the chassis ground from the electric heater device 67130, thereby enabling aspects of a buck mode, such as recirculating current on the board. In some embodiments, more or less ground current can be returned to the electric heater control board 67140 and/or chassis.

In some embodiments, the electric heater control board 67140 may effectively serve as a current jumper (e.g., a 200 A current jumper) from the chassis ground to the output current.

In an embodiment, the electric heater controller (e.g., an electric heater control board) may be based on a DC-to-DC converter, excluding optional items for the electric heater controller. For example, FIG. 23 depicts an example DC-to-DC converter while FIG. 26 depicts an example electric heater controller. Common components may include current sensors, protective Zener diodes, and ferrites. In the DC-to-DC converter, a high side switch may sometimes be needed for a number of operating conditions. One operating condition may address the possibility that in a DC-to-DC converter, 12V may be applied (e.g., as a PWM using a 48V source), which may be coupled to the ground for the 48V bus. If there is a short to ground on the 48V bus, this may overstress the 12V components. Thus, to mitigate potential overstress, a high side switch may be used. Another operating condition may address a failure mode in the DC-to-DC converter where the high side switch turns on and may apply 48V to the 12V line, possibly damaging other electronic control units in the vehicle. Thus, the high side switch may be present for fault containment to shut off an overvoltage.

However, in some embodiments, because there may be less concern about overvoltage damage from inadvertently applying 48V to the electric heater (e.g., a resistive heater), there may be no need to include some fault mitigations such as those described above. Furthermore, because a resistor such as used in an electric heater device may not generate current to backflow to the 48V bus, it may not need to be blocked. Therefore, no high side switch may be necessary in the electric heater controller according to embodiments. Also, when high side switches are used, they may also require use of a pre-charge circuit to equalize the voltage on the capacitors on both sides of the high side switch before being closed. However, in embodiments, because the high side switch may not be used, a pre-charge circuit may also not be needed.

In a DC-to-DC converter, an input inductor may be included to reduce conducted emissions. However, in some embodiments, an inductor choke may be omitted from the electric heater controller because it may not be needed for electric heater operation (e.g., less filtering of high frequency noise may be required, and/or less efficient filtering of high frequency noise may be needed), although in some embodiments, an inductor choke may be included for EMC management.

Figure 68:
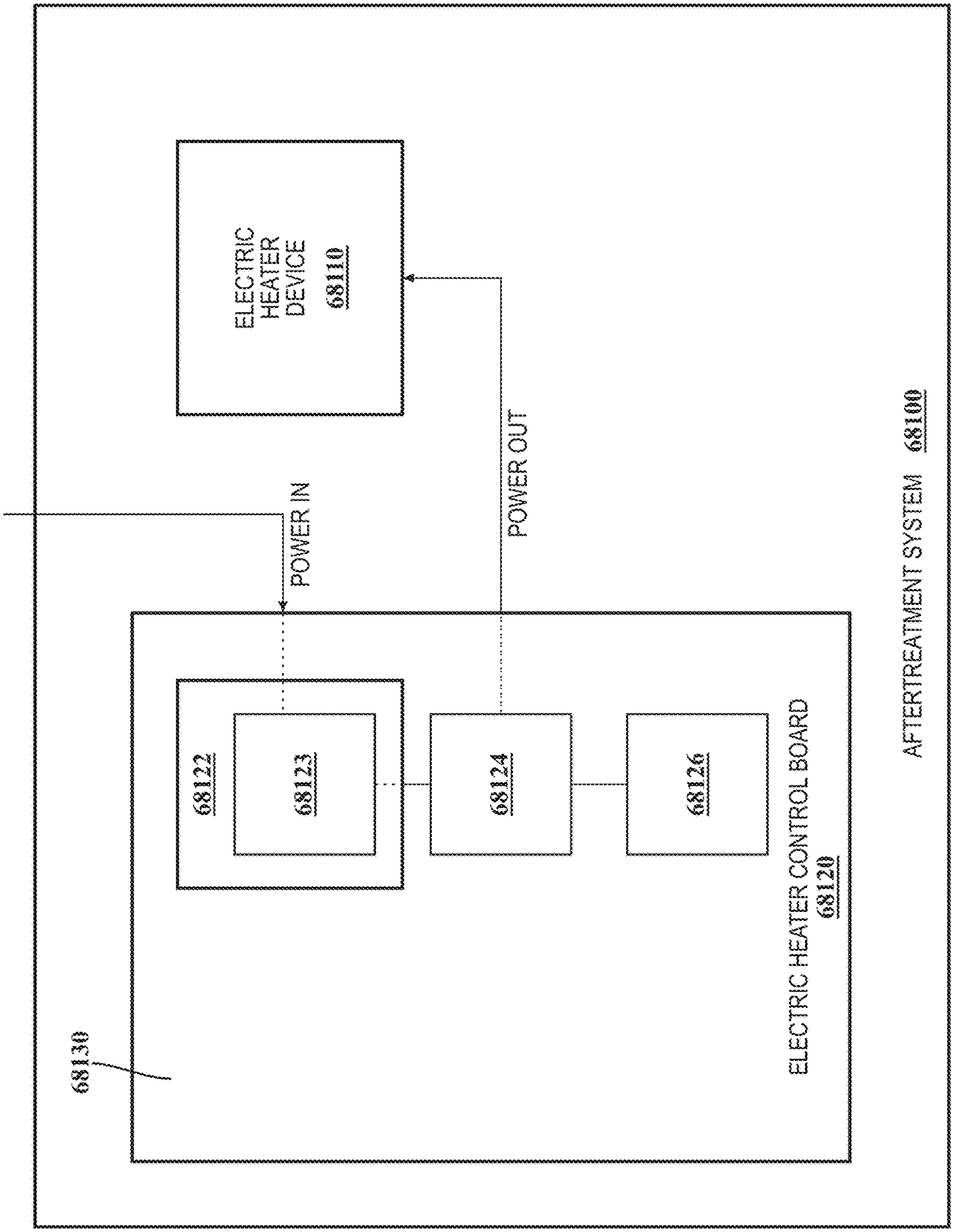
FIG. 68 depicts an aftertreatment system for a vehicle according to embodiments.

With reference to FIG. 68, in embodiments, an aftertreatment system 68100 for a vehicle may include an electric heater device 68110 and an electric heater control board 68120. The electric heater control board 68120 may be structured to provide power to the electric heater device 68110, and towards this purpose, the electronic heater control board 68120 may include a power circuit 68122.

In some embodiments, the electric heater control board 68120 may exclude some components. For example, in some embodiments, the electric heater control board 68120 may not include a high side switch to provide isolation for an over-voltage condition. In one example, a high side switch (12V/48V isolation for over-voltage) may be omitted in a 48V system. Furthermore, in some embodiments, the electric heater control board 68120 may not include a pre-charge circuit. For example, a pre-charge circuit may not be required when a high side switch is not included. Also, in some embodiments, the electric heater control board 68120 may not include an inductor choke on the power input.

In some embodiments, the power circuit 68122 may include a current sensor 68123, and the electric heater control board 68120 may further include a power converter 68124 and a controller 68126. In an example, the power converter 68124 may include a 48V-to-12V DC/DC converter, as may be described elsewhere herein.

In some embodiments, the power circuit 68122, the power converter 68124, and the controller 68126 may share a common printed circuit board (PCB) 68130.

In some embodiments, the electric heater device 68110 may include a resistive heater.

Utilization of product line commonality, as described herein for the DC-to-DC converter and electric heater control board, may provide advantages of reduced part count and ease of integration due to commonality of components.

With reference to FIG. 25, in embodiments, a monitoring system may be structured to monitor a power converter, and/or each phase converter of a power converter, to determine electrical characteristics of a power output to the electric heater device without directly measuring the output current provided to the electric heater device. Such embodiments may reduce the number of data channels required by the controller. Furthermore, in some embodiments, a plurality of monitoring systems may be structured to monitor the power converter, where each monitoring system is structured to monitor one phase converter of the power converter. In some embodiments, the monitoring system(s) may report a determined output current to a control system of the vehicle.

By estimating the output current, the monitoring system(s) may improve the accuracy of the reported output current compared to directly measuring the output current, for example, due to the margin of error of a current sensor that would directly measure the output current. Furthermore, by measuring the input current and estimating the output current, an input current trace that corresponds to a lower current (e.g., 50 A) may be cut and measured, rather than cutting the trace for the higher output current (e.g., 200 A) at the output side of the power converter.

Figure 69:
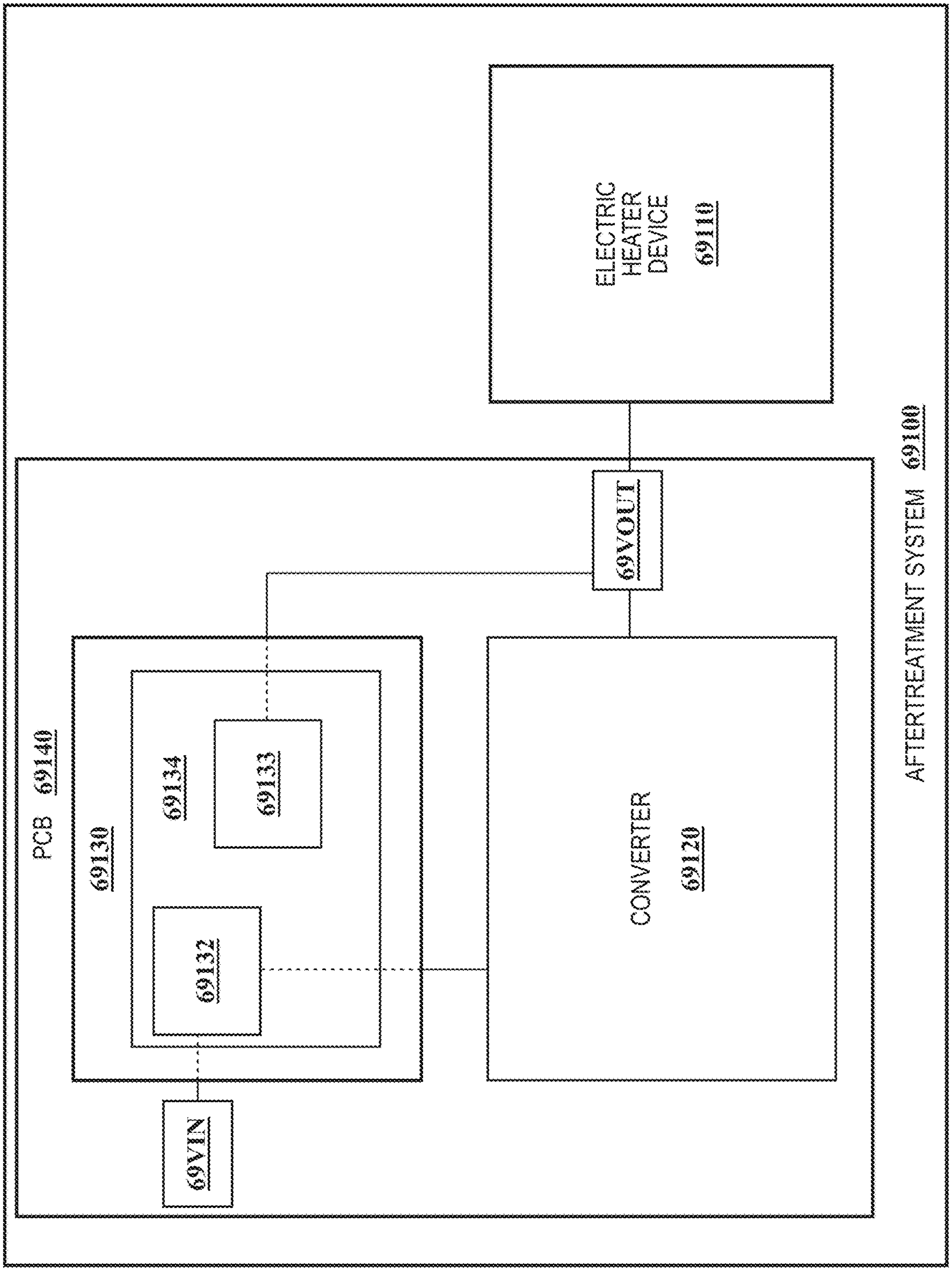
FIG. 69 depicts an aftertreatment system for a vehicle according to embodiments.

With reference to FIG. 69, in embodiments, an aftertreatment system 69100 for a vehicle may include an electric heater device 69110, a converter 69120 structured to provide power to the electric heater device 69110, and a monitoring system 69130. The monitoring system 69130 may include a current measuring device 69132 structured to measure an input current at an input terminal 69VIN of the converter 69120, and a controller 69134 structured to determine an output current at an output terminal 69VOUT of the converter 69120 based on the input current measured at the input terminal 69VIN and a duty cycle of the converter 69120. In some embodiments, the electric heater device 69110 may include a resistive heater. In some embodiments, the controller 69134 may include the current measuring device 69132.

In some embodiments, the converter 69120 and the monitoring system 69130 may share a same printed circuit board (PCB) 69140. In other embodiments, the converter 69120 and the monitoring system 69130 may be on separate boards.

In some embodiments, the controller 69134 may be further structured to report the determined output current to a control system of the vehicle (not shown).

In some embodiments, the controller 69134 may be further structured to determine a predicted loss value of the converter 69120 based on the duty cycle of the converter 69120.

In some embodiments, the converter 69120 is or may include a phase converter. In some embodiments, the converter 69120 is or may include a power converter, and the power converter may include one or more phase converters. In some embodiments, the converter 69120 may include a plurality of switching devices operated using a duty cycle. In some embodiments, the predicted loss value of the converter may additionally be based on other operating parameters of the power converter 69120 or a phase converter included in the power converter 69120, as monitored by the monitoring system 69130.

In some embodiments, the monitoring system 69130 may further include a voltage measuring device 69133 structured to measure an output voltage at the output terminal 69VOUT. And, in some embodiments, the controller 69134 may include the voltage measuring device 69133, and the controller 69134 may be further structured to determine an output power based on the determined output current and the measured output voltage, and to output the determined output power to a control system of the vehicle (not shown).

Figure 70:
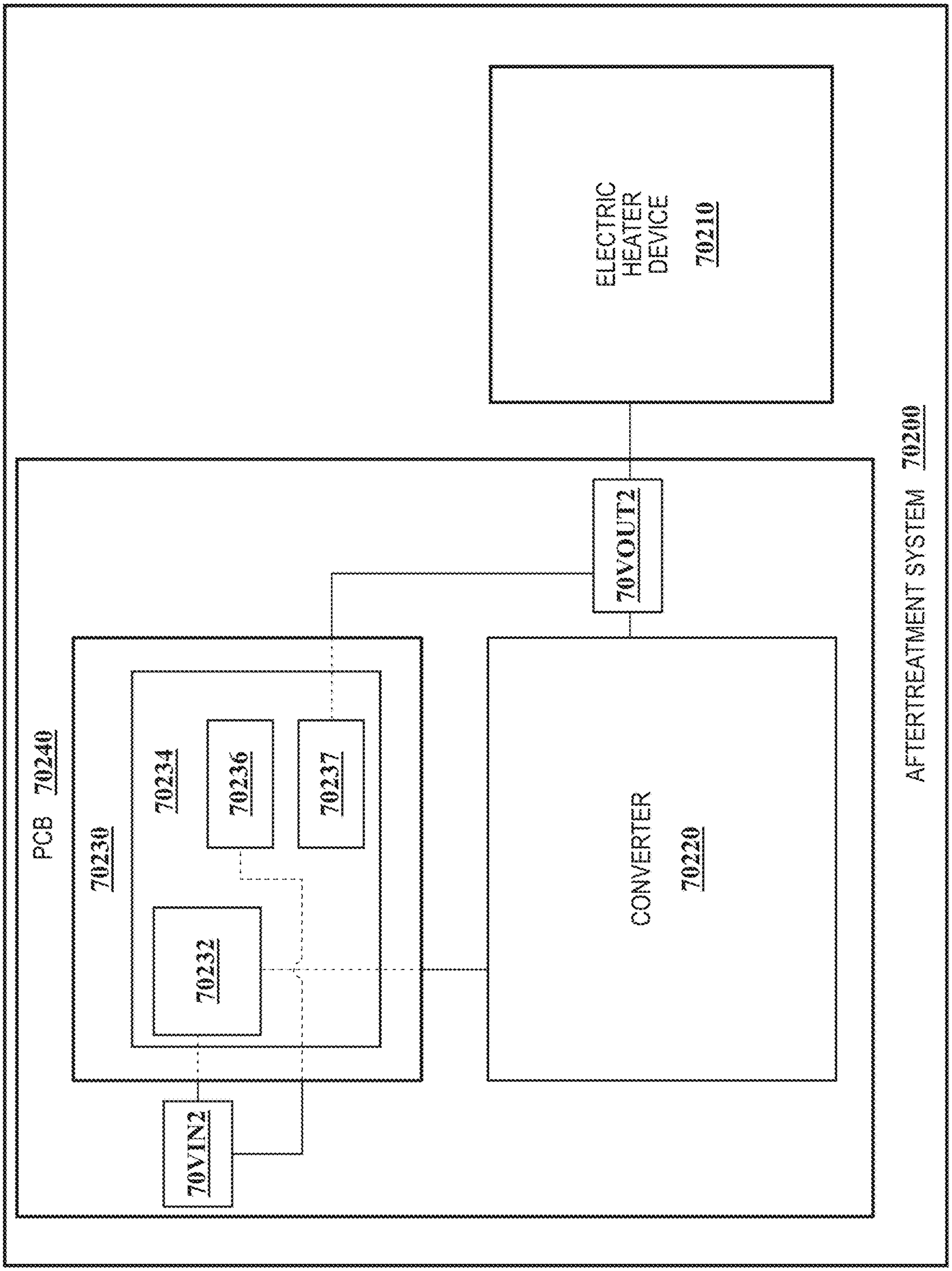
FIG. 70 depicts an aftertreatment system for a vehicle according to embodiments.

With reference to FIG. 70, in embodiments, an aftertreatment system 70200 for a vehicle may include an electric heater device 70210, a converter 70220 structured to provide power to the electric heater device 70210, and a monitoring system 70230. The monitoring system may include a first voltage measuring device 70236 structured to measure an input voltage at an input terminal 70VIN2 of the converter 70220, a second voltage measuring device 70237 structured to measure an output voltage at an output terminal 70VOUT2 of the converter, a current measuring device 70232 structured to measure an input current at the input terminal 70VIN2, and a controller 70234 structured to determine an output current at the output terminal 70VOUT2 based on the input voltage measured at the input terminal 70VIN2, the input current measured at the input terminal 70VIN2, the output voltage measured at the output terminal 70VOUT2, and a predicted loss value of the converter 70220. In some embodiments, the electric heater device 70210 may include a resistive heater. Furthermore, in some embodiments, the controller 70234 may include the first voltage measuring device 70236, the second voltage measuring device 70237, and the current measuring device 70232.

In some embodiments, the converter 70220 and the monitoring system 70230 may share a same printed circuit board (PCB) 70240. In other embodiments, the converter 69120 and the monitoring system 69130 may be on separate boards.

In some embodiments, the converter 70220 is or may include a phase converter. In some embodiments, the converter 70220 is or may include a power converter, and the power converter may include one or more phase converters. In some embodiments, the converter 70220 may include a plurality of switching devices operated using a duty cycle.

In some embodiments, the controller 70234 may be further structured to determine the output current by calculating an input power based on the input voltage and the input current, reduce the input power by the predicted loss value to estimate an output power, and calculate the output current by dividing the estimated output power by the output voltage.

In some embodiments, the controller 70234 may be further structured to report the determined output current to a control system of the vehicle (not shown).

Figure 71:
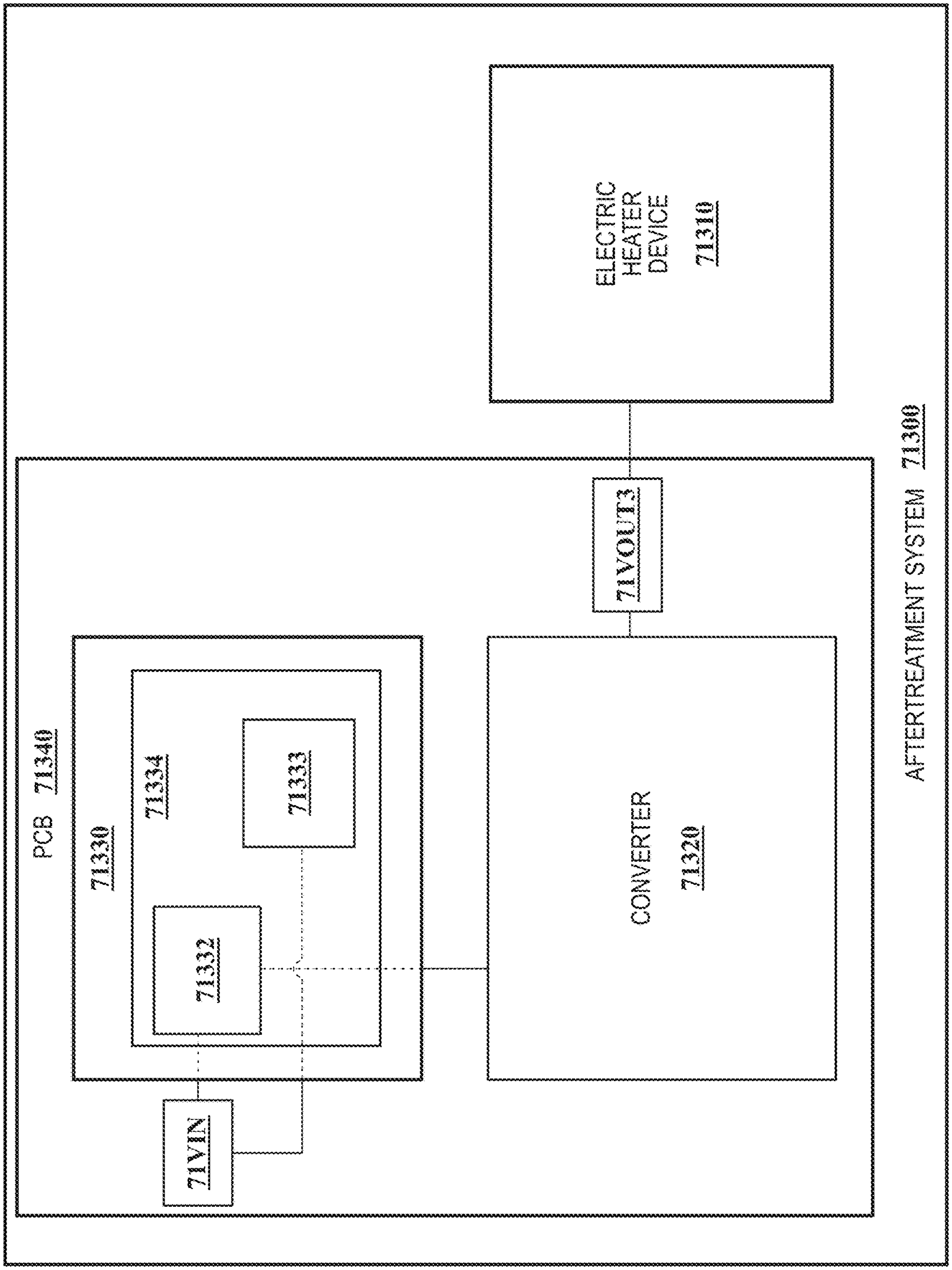
FIG. 71 depicts an aftertreatment system for a vehicle according to embodiments.

With reference to FIG. 71, in embodiments, an aftertreatment system 71300 for a vehicle may include an electric heater device 71310, a converter 71320 structured to provide power to the electric heater device 71310, and a monitoring system 71330. The monitoring system 71330 may include a voltage measuring device 71333 structured to measure an input voltage at an input terminal 71VIN3 of the converter 71320, a current measuring device 71332 structured to measure an input current at the input terminal 71VIN3, and a controller 71334 structured to determine an output current at an output terminal of the converter 71320 based on the input voltage measured at the input terminal 71VIN3, the input current measured at the input terminal 71VIN3, and an operation condition of the converter 71320. In some embodiments, the operating condition of the converter 71320 may be an operating condition of a phase converter included in the converter 71320. In some embodiments, the electric heater device 71310 may include a resistive heater. Furthermore, in some embodiments, the controller 71334 may include the voltage measuring device 71333 and the current measuring device 71332.

In some embodiments, the converter 71320 and the monitoring system 71330 may share a same printed circuit board (PCB) 71340. In other embodiments, the converter 71320 and the monitoring system 71330 may be on separate boards.

In some embodiments, the converter 71320 is or may include a phase converter. In some embodiments, the converter is or may include a power converter, and the power converter may include one or more phase converters. In some embodiments, the converter 71320 may include a plurality of switching devices operated using a duty cycle.

In an example where the converter 71320 is or includes a phase converter, the operation condition may be an efficiency value of the phase converter.

In some embodiments, the controller 71334 may determine the output current using an efficiency model lookup table.

In some embodiments, the controller 71334 may be further structured to report the determined output current to a control system of the vehicle (not shown).

In embodiments, an aftertreatment system for a vehicle may include an electric heater device, a converter structured to provide power to the electric heater device, and a monitoring system. The monitoring system may estimate an output power provided to the electric heater device in accordance with measuring a total current draw and voltage of the converter to calculate total power consumption, and using a known efficiency of the converter (e.g., around 98%) to estimate the provided power. Furthermore, in embodiments, measuring a temperature rise may also indicate an amount of degradation in the converter. For example, a power converter that is 98% efficient but which has degraded to 92% efficiency may generate four times the heat. Thus, output current may continue to be predicted based on the efficiency indicated by the measured temperature.

In embodiments of estimating the output current described herein, a per-phase current determination in the converter (e.g., power converter) may be avoided.

Mobile applications may include vehicles such as on-road vehicles (cars, trucks, and the like), and off-road vehicles (all-terrain vehicles (ATVs), construction equipment, and the like). Mobile applications may include industrial machines, and vehicle mounted devices (e.g. a pump or mixer powered by the prime mover). The prime mover for the vehicle mounted devices may be distinct from the motive power of the prime mover of the vehicle on which the device is mounted.

Figure 72:
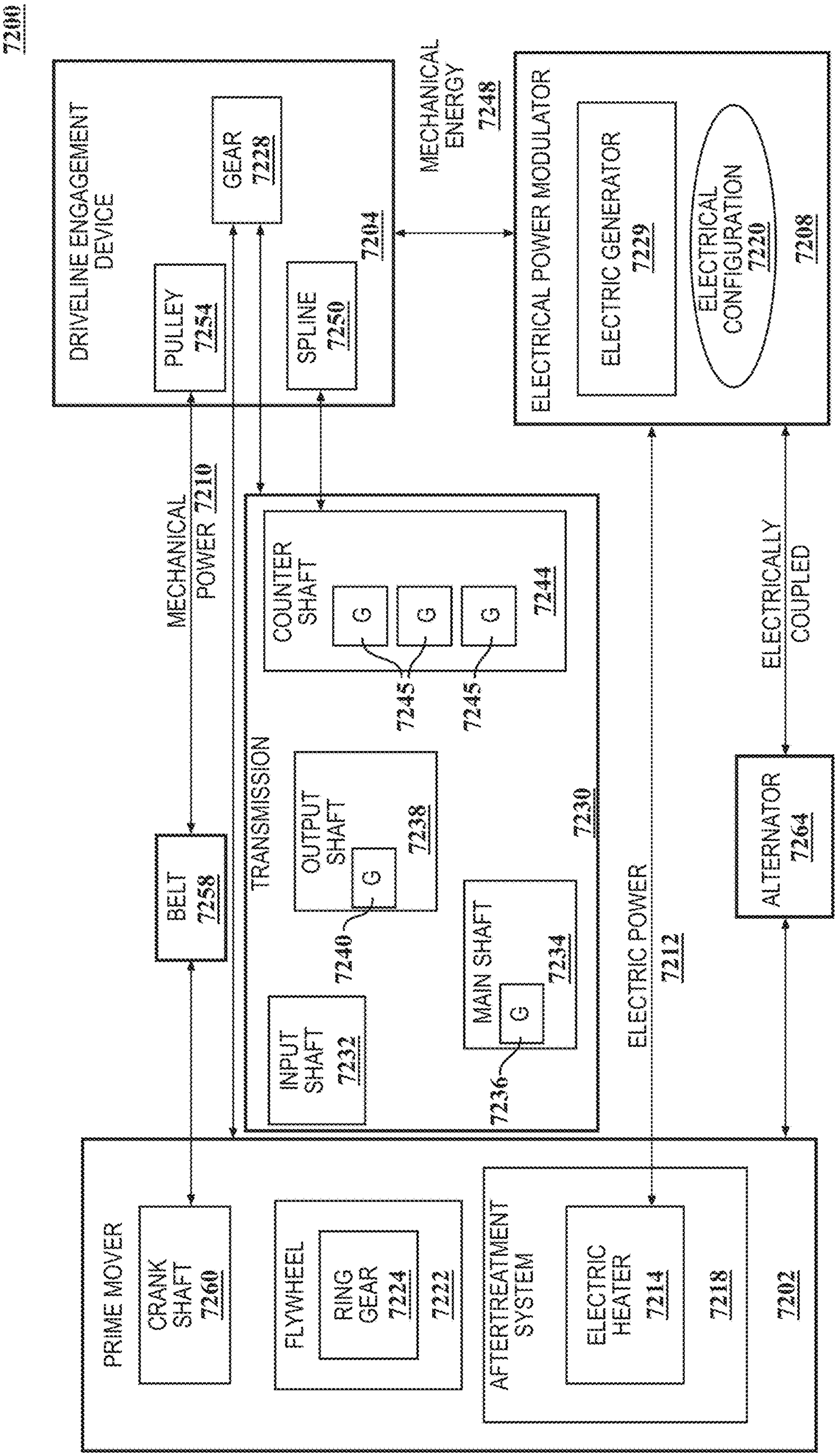
FIG. 72 depicts an example power schematic for an electric heater.

Referring to FIG. 72, a system 7200 may include a prime mover 7202, a driveline engagement device 7204, and an electric power modulator 7208. The prime mover 7202 is structured to provide power for a mobile application (such as those described elsewhere herein). The driveline engagement device 7204, which may be operationally coupled to the electric power modulator 7208, is structured to access the mechanical power 7210 provide by the prime mover 7202.

The prime mover 7202 may include a flywheel 7222 having a ring gear 7224. The driveline engagement device 7204 may have a gear 7228 which interacts with the ring gear 7224. The prime mover 7202 may interact with a belt 7258 to transfer mechanical power 7210 to a pulley 7254 of the driveline engagement device 7204. In some instances the prime mover 7202 includes a crankshaft 7260 that interacts with the belt 7258.

The prime mover 7202 may be coupled to a transmission 7230 which may include an input shaft 7232, a main shaft 7234 with at least one main gear 7236, an output shaft 7238 with at least one output gear 7240, and a counter shaft 7244 with a variety of gears 7245. The driveline engagement device 7204 may include a spline 7250 to interact with the counter shaft. The driveline engagement device 7204 may include a gear 7224 to interact with a main gear 7236, an output gear 7240, or one of the gears 7245 of the counter shaft 7244.

The electric power modulator 7208, which may be an electric generator 7229, is structured to convert mechanical energy 7248 from the driveline engagement device to an electrical generator 7229 which converts the mechanical energy 7248 to provide electric power 7212. The electric power 7212 may be provided to an electric heater 7214 in an aftertreatment system 7218 of the prime mover 7202. The electric power modulator 7208 provides the electric power 7212 at a selected electrical configuration 7220 to the electric heater 7214. The electrical power modulator 7208 may be coupled to an alternator 7264.

Figure 73:
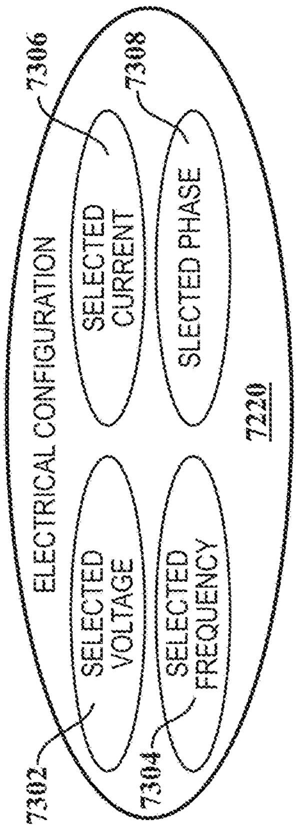
FIG. 73 depicts electrical configuration options.

Referring to FIG. 73, the selected electrical configuration 7220 may include a selected voltage value 7302, a selected frequency value 7304, a selected current value 7306, a selected phase value 7308, and the like. In response to a target power value for the electric heater 7214, the electric power modulator may adjust a selected voltage value 7302, a selected frequency value 7304, a selected current value 7306, or a selected phase value 7308.

Figure 74:
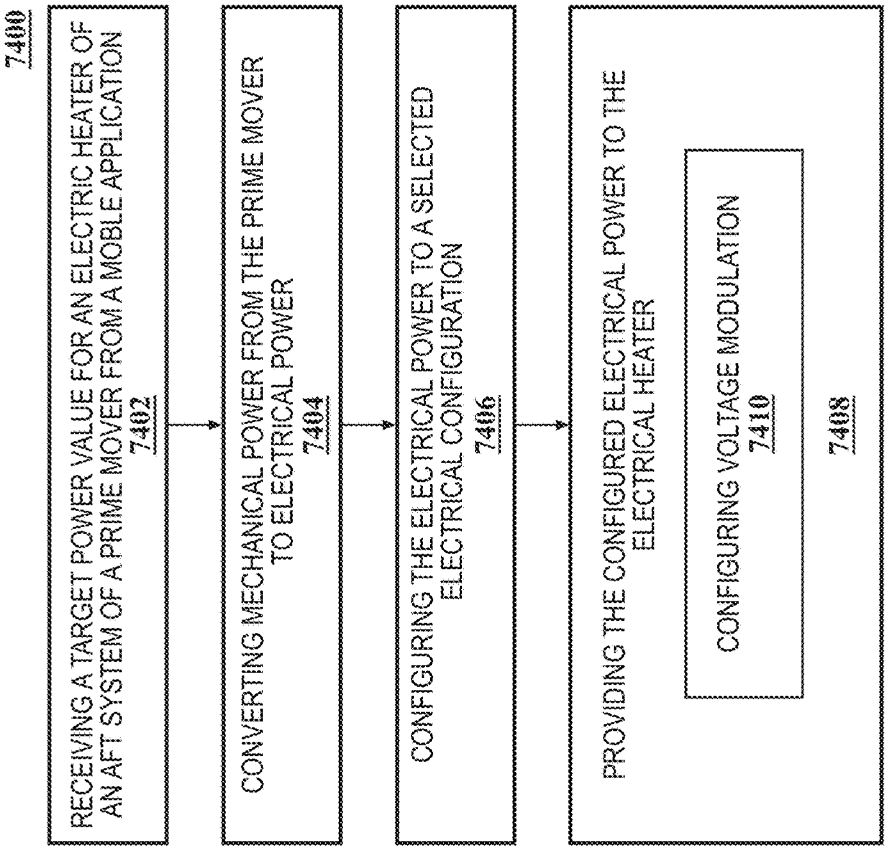
FIG. 74 depicts a method of providing configured electrical power to an electric heater.
Figure 75:
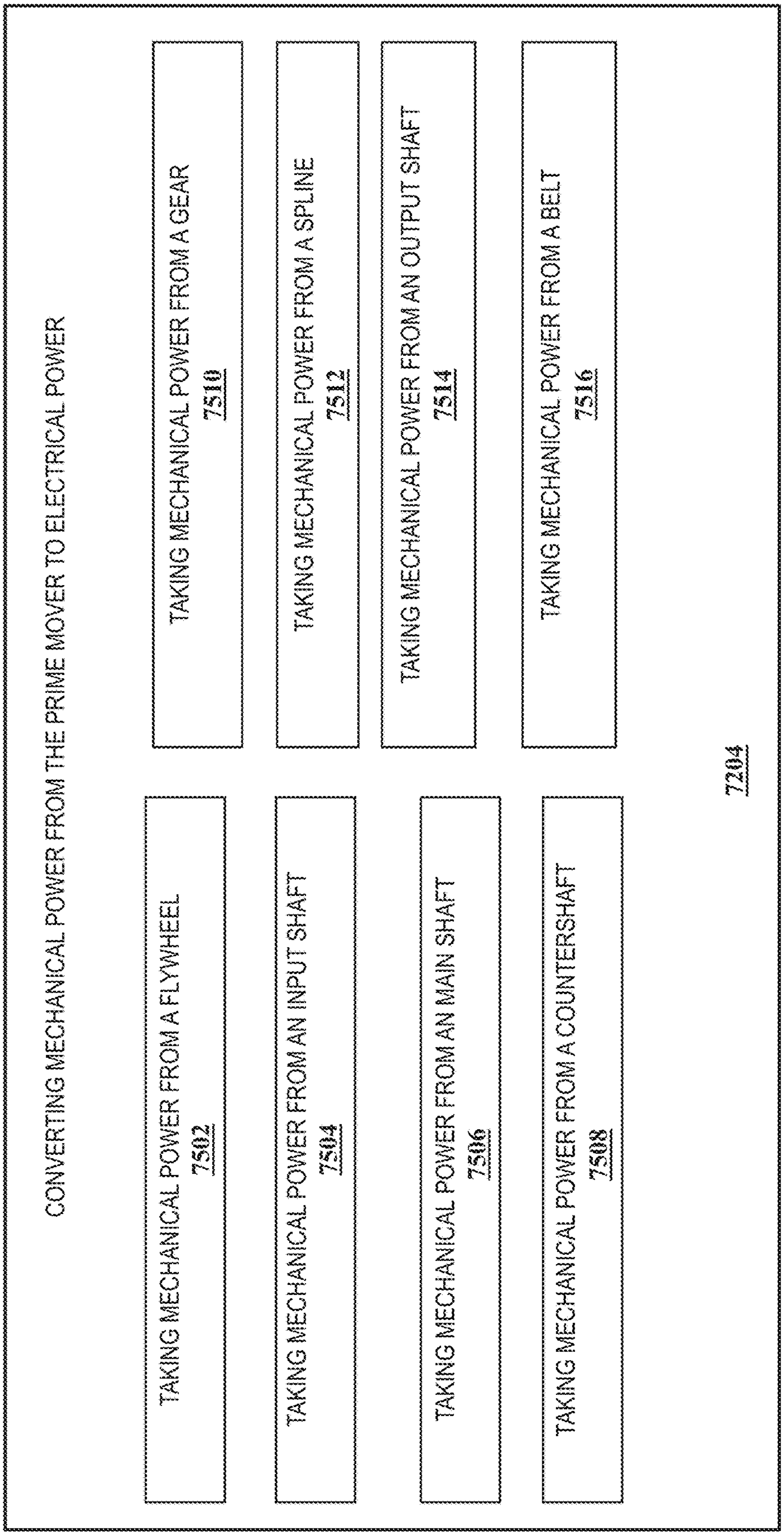
FIG. 75 depicts options for converting mechanical power from the prime mover to electrical power.

Referring to FIGS. 74 and 75, a method 7400 for providing configured electrical power to an electric heater is depicted. The method 7400 may include receiving a target power value (step 7402) for an electric heater of an aftertreatment system of a prime mover from a mobile application. The method 7400 further includes converting mechanical power from the prime mover to electrical power (step 7404), configuring the electrical power to a selected electrical configuration (step 7406) and providing the configured electrical power to the electric heater (step 7408). The method 7400 may further include configuring voltage modulation (step 7410). Converting mechanical power from the prime mover to electrical power (step 7404) may include taking mechanical power from a flywheel 7502, taking mechanical power from an input shaft 7504, taking mechanical power from a main shaft 7506, or taking mechanical power from a countershaft 7508. Converting mechanical power from the prime mover to electrical power (step 7404) may include taking mechanical power from a gear 7510, taking mechanical power from a spline 7512, taking mechanical power from an output shaft 7514 or taking mechanical power from a belt 7516. Examples of these may be seen in FIGS. 72 and 73.

Figure 80:
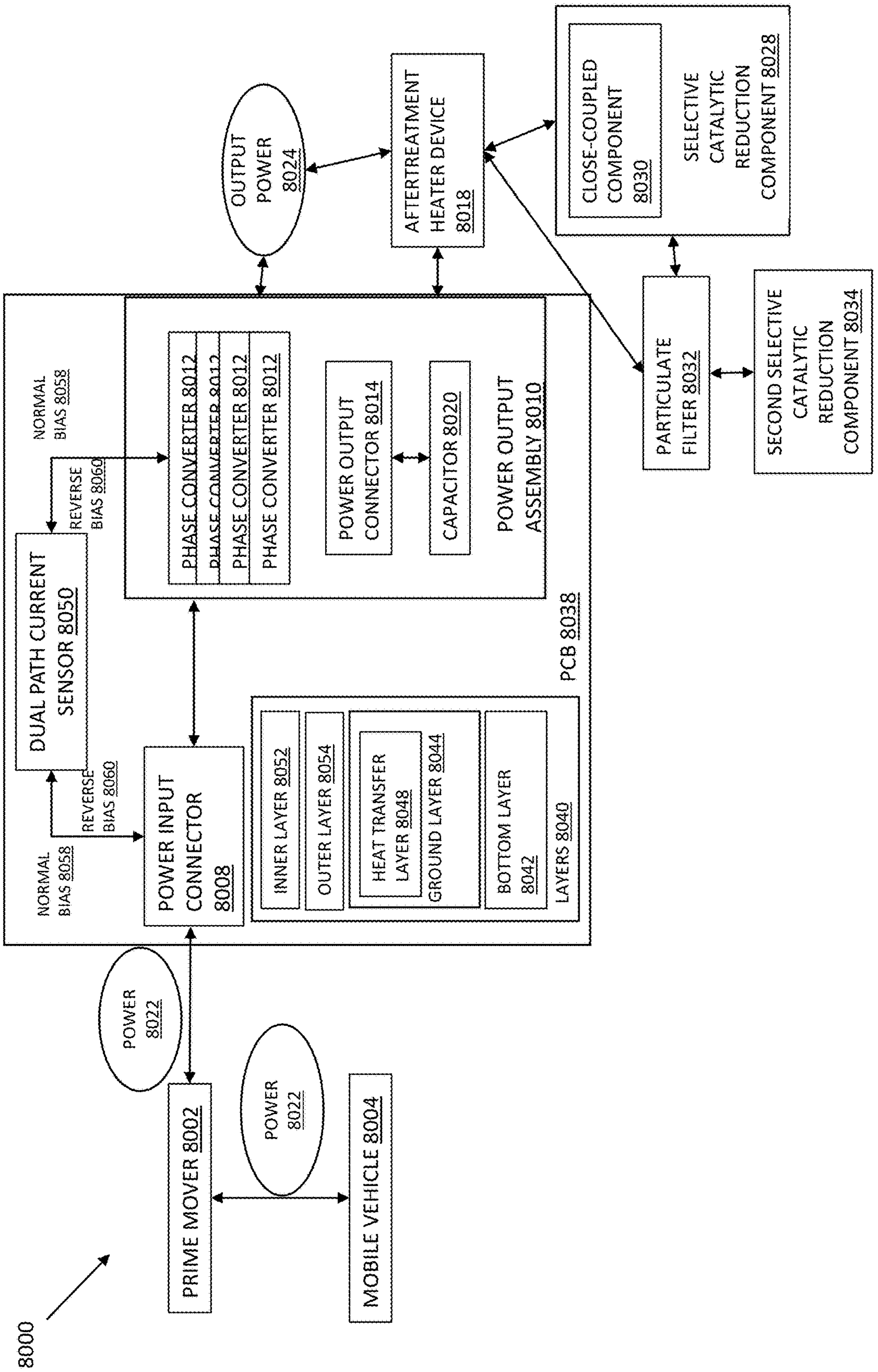
FIG. 80 depicts an example system configured for highly flexible power provision and electrical power rating support.

Referencing FIG. 80, an example system 8000 configured for highly flexible power provision and electrical power rating support is schematically depicted. The example system 8000 includes a prime mover 8002 that generates power 8022 for a mobile vehicle 8004, and a power input connector 8008 that receives a portion of the generated power 8022 at a first voltage. In certain embodiments, the power input connector 8008 is associated with, and/or included as a part of, a DC/DC converter and/or a printed circuit board 8038. In certain embodiments, the power input connector 8008 receives power from a vehicle electrical system, for example being electrically coupled to the alternator or another electrical coupling to the vehicle electrical system. In certain embodiments, the power input connector 8008 receives power from a motor/generator (not shown) that is at least selectively mechanically coupled to the prime mover 8002, for example by coupling to a driveline of the prime mover 8002. The example system 8000 further includes a power output assembly 8010 including a number of phase converters 8012 (e.g., FET based DC/DC conversion circuits) that convert the received input power 8022 to an output power 8024 at a second voltage. In certain embodiments, the first voltage is a voltage of the vehicle electrical system. Additionally or alternatively, the first voltage may be a voltage provided by the motor/generator and/or a voltage provided by a battery pack. The phase converters 8012 may be capable of voltage boosting (e.g., increasing the output voltage relative to the input voltage) and/or voltage bucking (e.g., decreasing the output voltage relative to the input voltage). The example power output assembly 8010 includes a power output connector 8014 that electrically couples the output power 8024 to an aftertreatment heater device 8018. In certain embodiments, the power output assembly 8010 includes a capacitor 8020 electrically coupled to the output connector, where the capacitor 8020 includes an energy storage capacity determined in response to a power rating of the aftertreatment heater device 8018. The example capacitor 8020 may be sized to smooth out ripple voltages in the power output, for example due to operations of the phase converters 8012, capacitance and/or inductance of the power providing circuit for the aftertreatment device heater 8018, variability in the source power (e.g., from the vehicle electrical system, motor/generator, and/or battery pack), or the like. In certain embodiments, the capacitor 8020 is sized to support electrical stability during transient events, such as when power to the aftertreatment device is initiated and/or changes rapidly.

In certain embodiments, the number of phase converters 8012 is a selected number of phase converters, where the selected number of phase converters is determined in response to the power rating of the aftertreatment heater device and a voltage ratio between the first voltage and the second voltage. For example, the power rating of the aftertreatment device 8018 and the second voltage inform the current to be applied to the aftertreatment heater device, and the ratio of the first voltage to the second voltage then informs the current that will be required by low side and high side switching stages within the phase converters 8012. Accordingly, the number of phase converters 8012 can then be determined according to a target current amount flowing through each phase. For example, a 48V nominal (e.g., the second voltage) aftertreatment heater device having a 5 kW power rating would utilize a current of about 100 A on the high side. In the example, where the first voltage is 24V (e.g., vehicle electrical system voltage), the current to be supported is about 200 A on the low side, and an example number of phase converters (e.g., each limited to 40 A) would be eight phase converters (e.g., in a 5/3 configuration, with a distinct number of phase converters supporting the high side and the low side). It can be seen that the number of phase converters will depend upon the first voltage, the second voltage, the power rating of the aftertreatment heater device, the current limits through the phase converters, and whether redundancy and/or additional capacity is to be provided. Additionally or alternatively, the phase converters may have varied current ratings and/or may be operated in distinct current regimes—for example where the phase converters are varied in size, have a variable environment (e.g., a heat transfer environment such as thermal path to a heat sink, distinct EM environment such as associated capacitance and/or inductance, etc.), and/or may be cycled through current regimes such as to distribute component wear. In certain embodiments, the selected current limit for each of the phase converters may be any value, such as between 10 A and 40 A, between 2 A and 60 A, between 20 A and 100 A, etc.

In certain embodiments, the power rating of the aftertreatment heater device may be any value to support any system configuration. Embodiments that have some utility for supporting aftertreatment operations include power rating values between 0.5 kW and 30 kW. In certain embodiments, power rating values between 1 kW and 2.5 kW support certain aftertreatment configurations. In certain embodiments, power rating values between 5 KW and 15 kW support certain aftertreatment configurations. In certain embodiments, the aftertreatment heater device 8018 supports aftertreatment component operations by providing additional heat to the exhaust of the prime mover 8002, and is utilized to bring an aftertreatment component up to a useful operating temperature, and/or to maintain an operating temperature for certain vehicle operating conditions (e.g., idle operations, coasting operations, etc.). In certain embodiments, for example on a cold start operation of the prime mover 8002, emissions occurring during operations immediately after the start operation until the aftertreatment component(s) warm up form a significant portion of the emissions for the entire vehicle operating cycle. Accordingly, reducing the time until the aftertreatment component is warmed to an operating temperature is critical to meeting an overall emissions target, and/or to allow vehicle operations at other operating regimes to run at a slightly higher emissions value, which can promote vehicle performance and/or fuel efficiency goals. Example aftertreatment arrangements may be any type, for example with an aftertreatment heating device 8018 positioned upstream of a component that may be the target of the heating, and/or that may be upstream of the target of the heating. Example aftertreatment components that may be the target of heating include one or more of: an oxidation catalyst (e.g., to begin oxidation based emissions control such as conversion of CO to CO2, conversion of unburned hydrocarbons, reduction of organic particles, to promote conversion of NO to NO2, etc.), a selective catalytic reduction (SCR) component 8028 that converts NOx (e.g., NO and NO2) to nitrogen and water, and/or a particulate filter 8032 (e.g., especially a catalyzed particulate filter). In certain embodiments, heating operations are performed to warm up an aftertreatment component to an operating temperature, to keep an aftertreatment component warmed up (e.g., to an operating temperature, and/or close to an operating temperature, for example to reduce a time required to bring the component to the operating temperature at a later time), and/or to provide an elevated temperature for the aftertreatment component (e.g., during a regeneration event, such as events performed for particulate filters and/or desulfation operations for a catalyst based component). Additionally or alternatively, a thermal mass of aftertreatment components, for example components that are targeted for heating, and/or components positioned between the aftertreatment heater device and the target component to be heated, can be significant and cause a high variability in the power rating of the aftertreatment heater device. In certain embodiments, the prime mover may have thermal support features, such as cylinder deactivation and/or variable valve timing, fuel injection control (e.g., post injection and/or very late post injection capability) that can provide direct thermal support and/or unburned hydrocarbon support (e.g., where oxidation on a catalyst of the aftertreatment provides thermal support) for temperature management and generation. Additionally or alternatively, one or more components of the aftertreatment system may be closely coupled 8030 (e.g., positioned close to the prime mover, with limited exhaust distance to reduce thermal mass and negative heat transfer), allowing for those components to be more rapidly heated. Further, in certain embodiments, and aftertreatment system may have multiple paths, for example with aftertreatment components provided in parallel paths to enhance aftertreatment capacity while maintaining selected sizes for the components, preserving flow regimes within the aftertreatment, or the like. Accordingly, a number of significant system configurations result in a wide range of aftertreatment device power ratings to support heating operations for otherwise similar vehicles.

In certain embodiments, the availability of prime mover thermal support, positioning of the aftertreatment component to be heated, relationship of the aftertreatment heater device to the component to be heated (and/or any intervening components), and/or the thermal mass of the component to be heated (and/or other components that need to be heated to achieve heating of the target component), will determine the power rating of the aftertreatment heater device. For example, heating of a small mass, closely coupled, and low operating temperature SCR component (e.g., using a low temperature catalyst formulation), where the prime mover has thermal support capability such as cylinder deactivation, may lead to a relatively low power rating requirement, such as between 0.5 to 2.5 kW. In another example, heating of an SCR component downstream of a particulate filter 8032, where the aftertreatment heater device is positioned upstream of the particulate filter, may lead to a moderate power rating, such as between 5 kW and 15 kW. In another example, heating of parallel SCR components 8034 downstream of additional devices, such as a particulate filter and/or an oxidation catalyst, may lead to high power ratings, such as between 10 KW and 30 kW. Additionally or alternatively, the power rating may be affected by the desired time to temperature, for example a system capable of heating within 15 seconds will require significantly more power than a system capable of heating within 120 seconds. The determination of heating times is a part of the entire emissions plan for the system, and will be known to the person of skill in the art, having the benefit of the present disclosure, and information ordinarily available about the system. Additionally or alternatively, the power rating of the aftertreatment heater device may be affected by the exhaust flow rate (e.g., volumetric and/or mass flow rate), where a higher exhaust flow rate may lead to a higher power rating, both to provide sufficient temperature for the higher exhaust flow, and/or because the higher exhaust flow is capable to absorb more of the heat generated, and to maintain a heating element of the aftertreatment heater device within specified temperature ranges even at higher power output values. In certain embodiments, aspects set forth herein provide for support of a wide range of power ratings for an aftertreatment heater device utilizing identical hardware between systems, utilizing hardware with minimal configuration differences (e.g., changing a number of phases, with boards, connectors, housings, etc. being the same), and/or utilizing hardware having identical and/or minimally changed interfaces (e.g., connector couplings, geometric footprint, weight footprint, electrical interfaces, control interfaces, or the like). Thus, embodiments herein support providing for a range of capabilities for the aftertreatment heater device with reduced design and/or verification effort, increased confidence that the designed system will be fully capable, support for upfitting a vehicle after the time of initial manufacture, and longitudinal stability in the design over multiple model years, changing emissions regulations, and changing emissions strategies.

The second voltage (e.g., operating voltage of the aftertreatment heater device) may be any value, and may be a variable value based on operating conditions (e.g., where a resistive heating element is operable over a wide range of voltages). In certain embodiments, the selection of the heating element resistance and operating voltage may be made in response to the power rating required for heating, the available system configuration, or the like. In certain embodiments, the availability of multiple phase converters, and/or the capability to utilize distinct numbers of low side and high side phase converters, provides for the capability of a single power output assembly 8010 to support multiple aftertreatment heater devices, aftertreatment configurations, and the like. In certain embodiments, the second voltage may be 12V nominal, 24V nominal, 36V nominal, or 48V nominal. The second voltage is not limited to these, but may be any value. In certain embodiments, keeping the second voltage below a threshold that may be deemed high voltage, and/or that may require additional management such as insulation, service procedure changes, and/or isolation, may be desirable. In certain embodiments, the second voltage is a voltage value below 60V nominal.

An example system includes a printed circuit board (PCB 8038) having the power output assembly 8010, and/or the power input connector 8008, where the PCB is a multi-layer board having a number of layers 8040 that electrically couple the power input connector 8008 to the phase converters 8012. In certain embodiments, the PCB also electrically couples the phase converters to the power output connector 8014. In certain embodiments, a bottom layer 8042 of the PCB is a ground layer 8044, which may include and/or be formed of a conductive material, such as copper or aluminum. In certain embodiments, the ground layer 8044, which may include a heat transfer layer 8048, provides for improved heat transfer to a heat sink, which may be a radiator, a housing of the power output assembly, or the like. In certain embodiments, the ground layer 8044 may be coupled to one or more phases directly (e.g., the ground or drain for FETs of the phase converters), and/or coupled to one or more phases using vias through other layers of the PCB 8038. In certain embodiments, the ground layer may extend through all of the phases (e.g., geometrically positioned to be adjacent to all of the phases), and/or may stop short of one or more phases. In certain embodiments, the ground layer stopping short of one or more phases allows for the shape, size, and/or other characteristics of the ground layer 8044 to improve EM performance, for example reducing disturbance from capacitance of the ground layer, reducing EMI generated by the power converter, or the like. In certain embodiments, the phases have distinct heat transfer environments and/or heat generation, where the ground layer is adjacent to the highest heat generating phases, and not adjacent to lower heat generating phases.

An example system includes a dual path current sensor 8050 in the electrical path between the power input connector 8008 and the phase converters 8012. In the example, the dual path current sensor 8050 provides for low side current measurement. In certain embodiments, current detection on individual phases is omitted, with current estimates being made from models, the detected low side current, voltage measurements, and/or temperature measurements of individual phases. In certain embodiments, current measurements or estimates for individual phases are omitted, with power conversion performed in an open loop operation (e.g., providing scheduled PWM operations for each phase depending upon the requested power, input voltage, low side current, or the like, without a feedback element to the control), and/or temperature based operation (e.g., adjusting operations for each phase in response to a temperature of the phase, either balancing temperatures, targeting selected differential temperatures, or the like). The dual path current sensor 8050 in the example of FIG. 80 is depicted on the low side, between the power input connector 8008 and the phase converters 8012, but may additionally or alternatively be positioned on the high side, for example between the phase converters 8012 and the power output connector 8014. In certain embodiments, the utilization of a dual path current sensor 8050 allows for the parallel operation of the sensor to enable an off the shelf sensor to have sufficient current capacity without creating a significant restriction or resistance in the electrical path, and is therefore lower cost, and able to leverage higher part volumes, reliability, and the like relative to a custom current sensor. In certain embodiments, the dual path current sensor is electrically coupled with a forward bias 8058 (e.g., the normal designed current flow direction) on one side, and with a reverse bias 8060 (e.g., the current flow direction is reversed, which may result in a "negative" current determination, which can be corrected by a controller) on the other side. The utilization of a forward/reverse bias arrangement allows for full utilization of the dual path current sensor, without excess routing of power flow paths, which would increase resistance and/or negative electrical characteristics such as capacitance, inductance, increased ripple, and/or EMI (electromagnetic interference) generation. In certain embodiments, the multi-layer PCB includes electrical coupling to the phase converters, whether high side coupling, low side coupling, or both, utilizing a number of conductive layers. In certain embodiments, one or more inner layers 8052 of the number of conductive layers have a higher conductivity, such as a higher copper loading, relative to outer layer(s) 8054.

Figure 81:
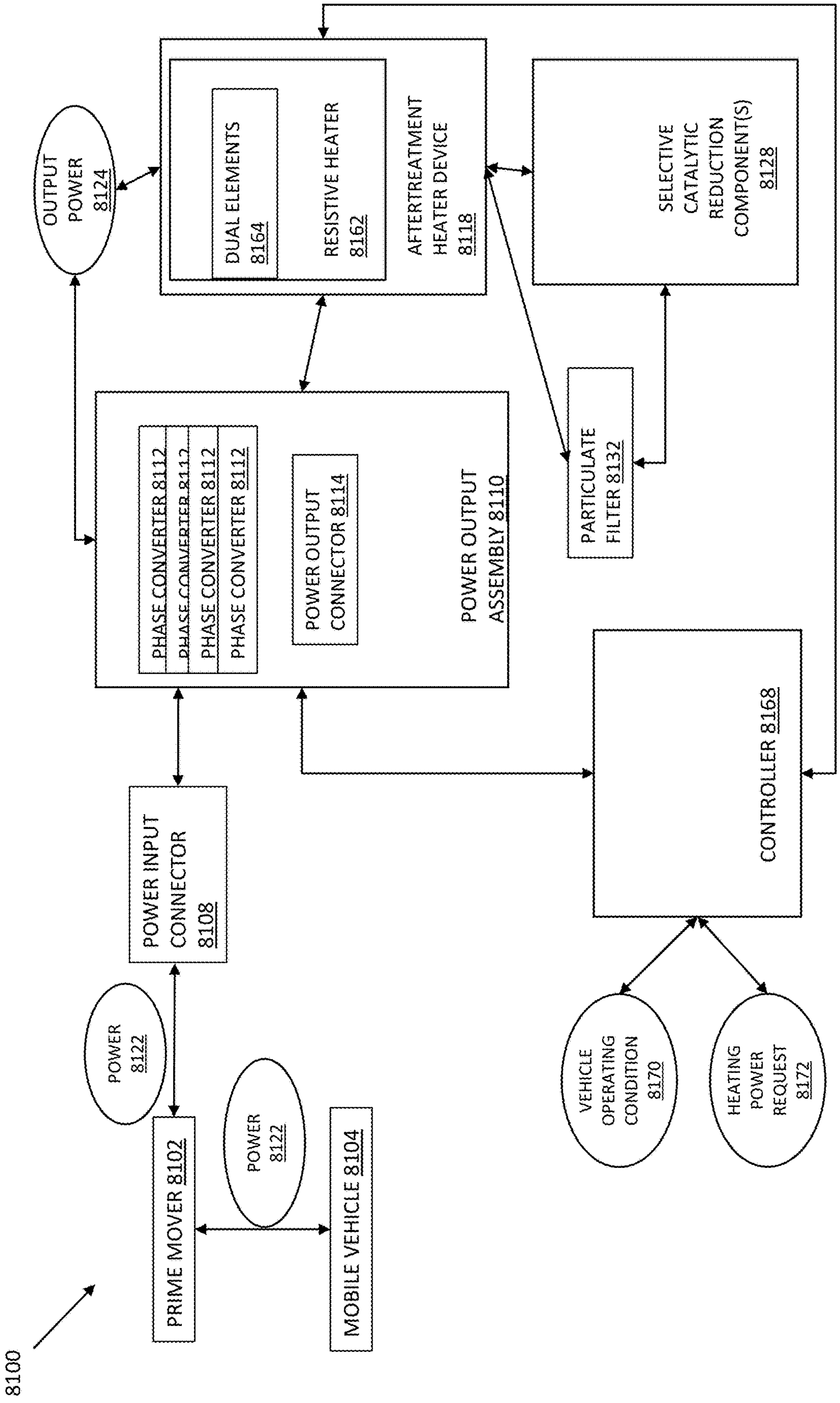
FIG. 81 depicts an example power conversion system.

Referencing FIG. 81, an example power conversion system 8100 includes a prime mover 8102 that generates power 8122 for a mobile vehicle 8104, a power input connector 8108 that receives a portion of the generated power 8122 at a first voltage, and a power output assembly 8110 that selectively powers an aftertreatment heater device 8118 at a second voltage. The power conversion system 8100 is otherwise similar to the system depicted in FIG. 80. The example aftertreatment heater device 8118 includes a resistive element 8162 (or resistive heater) having a resistance selected in response to one or more of: a power rating of the aftertreatment device, the first voltage (e.g., the source voltage for the power output assembly), and/or the second voltage (e.g., the voltage provided to power the aftertreatment heater device). The power output assembly 8110 can include a DC/DC converter and/or power converter of any type as set forth throughout the present disclosure. The example power conversion system 8100 allows for accommodation of a variety of power ratings for the aftertreatment heater device 8118 to meet a variety of emissions schemes and aftertreatment arrangements, with minimal or no change to the power output assembly.

An example aftertreatment heater device 8118 includes a dual element resistive heater 8162, where the dual elements 8164 are controlled separately, arranged in series, arranged in parallel, and/or selectively arranged (e.g., utilizing switches or contactors to manipulate the electrical arrangement). The dual element resistive heater allows for variation in the available heating power, and/or adjustment based on variation in the second voltage (which may be affected by variation in the first voltage, and/or may be controlled variation applied by the power output assembly 8110). In certain embodiments, the power conversion system 8100 includes a controller 8168 configured to select either element of the dual element resistive heater 8162, and/or both elements 8164 of the dual element resistive heater, for example by providing selected power to each element (e.g., where the power output connector 8114 couples individually to each element), and/or by adjusting switches or contactors to provide the selected power arrangement for each element. In certain embodiments, the controller 8168 is configured to select which heating element(s) to utilize based on vehicle operating condition 8170 (e.g., start-up, warm hold, rapid heating, regeneration, etc.) and/or a heating power request 8172 (e.g., receiving the heating power request, and controlling the elements to implement aftertreatment heater device operations responsive to the heating power request). In certain embodiments, the controller 8168 is configured to operate the phase converters 8112 responsive to the heating power request 8172, for example to apply a selected voltage and/or current to one or both of the dual elements 8164.

An example aftertreatment heater device 8118 includes a resistive element having a resistance selected such that a current of the output power 8124 does not exceed 200 A at a power rating (e.g., full nominal power) of the aftertreatment heater device. An example aftertreatment heater device includes a resistive element having a resistance selected such that a current of the output power does not exceed 80 A at the power rating of the aftertreatment heater device. The selection of the resistance and the maximum current will depend upon the desired sizing of electrical conduits, the EMI characteristics of the system, the expected duty cycle and service life of the aftertreatment heater device, and/or the rated power of the aftertreatment heater device. In certain embodiments, the maximum current may be determined from a grounding scheme of the aftertreatment heater device and the ground current capability, for example whether a chassis ground is utilized, ground current is returned to the power output assembly, and/or whether an amount of current recycle is utilized within the power output assembly.

An example aftertreatment heater device is positioned upstream of an SCR component 8128, where the second voltage is a 12V nominal voltage, and where the resistance is between 0.05Ω and 0.15Ω, inclusive. An example aftertreatment heater device is positioned upstream of an SCR component, where the second voltage is a 24V nominal voltage, and where the resistance is between 0.25Ω and 0.6Ω, inclusive. An example aftertreatment heater device is positioned upstream of an SCR component, where the second voltage is a 48V nominal voltage, and where the resistance is between 0.8Ω and 2.5Ω, inclusive. The example systems are readily capable to provide for heating power between 1 and 2.5 kW, depending upon the current provided to the aftertreatment heater device.

An example aftertreatment heater device is positioned upstream of at least two SCR components 8128, whether in series or parallel arrangement, where the second voltage is a 24V nominal voltage, and where the resistance is between 0.05Ω and 0.6Ω, inclusive. An example aftertreatment heater device is positioned upstream of at least two SCR components, whether in series or parallel arrangement, where the second voltage is a 48V nominal voltage, and where the resistance is between 0.2Ω and 2.5Ω, inclusive. The example systems are readily capable to provide for heating power between 1 and 10 kW, depending upon the current provided to the aftertreatment heater device.

An example aftertreatment heater device is positioned upstream of a particulate filter 8132 component, where the second voltage is a 48V nominal voltage, and where the resistance is between 0.05Ω and 0.6Ω, inclusive. An example aftertreatment heater device is positioned upstream of a particulate filter component, where the second voltage is between 48V and 60V nominal, and where the resistance is between 0.15Ω and 0.7Ω, inclusive. The example systems are readily capable to provide for heating power between 5 KW and 15 KW, depending upon the current provided to the aftertreatment heater device.

The example systems are a non-limiting illustration. Any arrangements of the aftertreatment heater device and aftertreatment system, values for the second voltage, values for the resistance, values for the heating power, and values for available current to be supplied, are contemplated herein.

Figure 82:
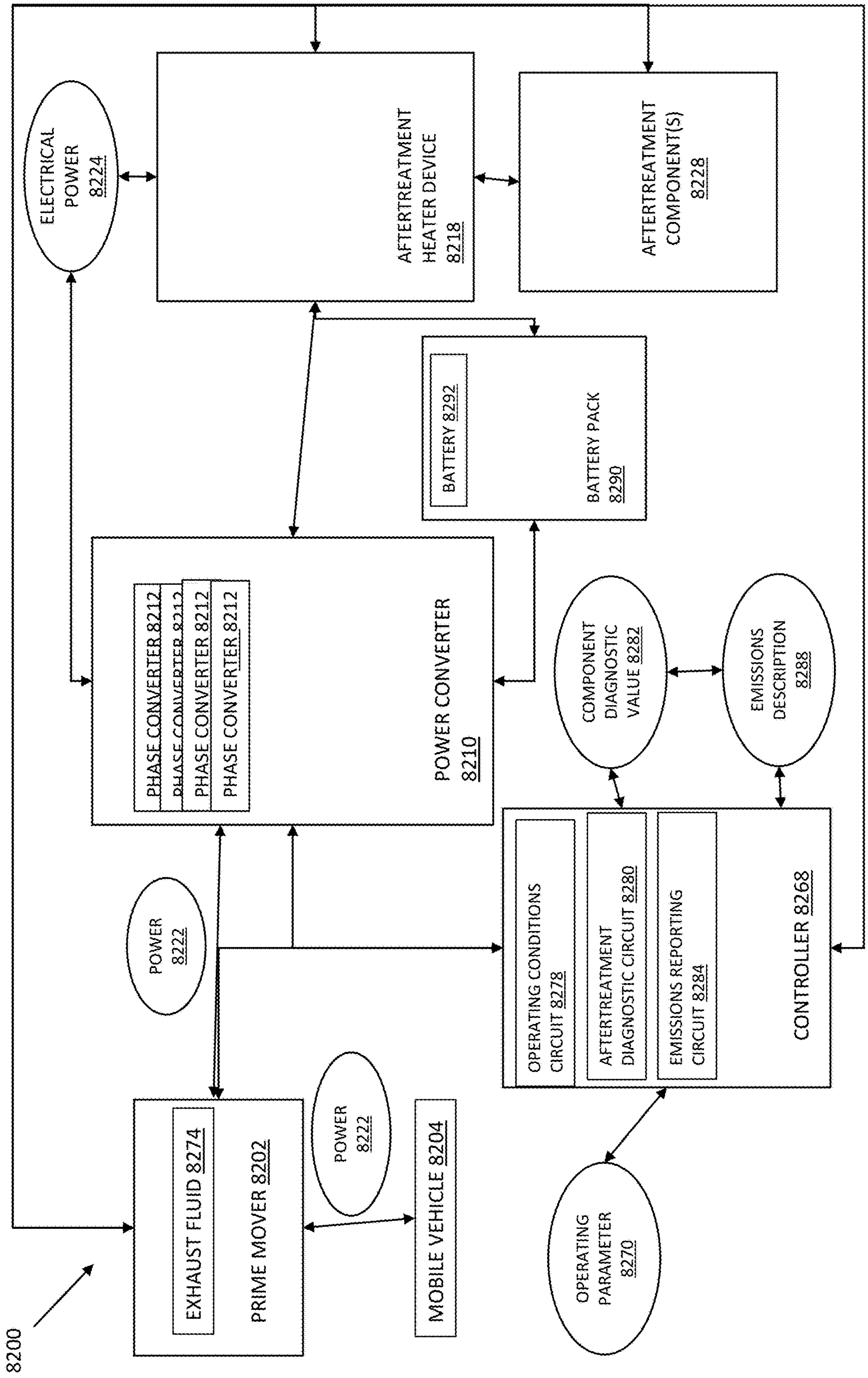
FIG. 82 depicts an example system for OBD level diagnostics and/or diagnostic support for critical components.

Referencing FIG. 82, an example system 8200 includes a prime mover 8202 that generates power 8222 for a mobile vehicle 8204, and a power converter 8210 that receives a portion of the generated power 8222 (e.g., through direct access to the vehicle electrical system, and/or through mechanical access, for example using a motor/generator to transfer power, which have mechanical access at a flywheel, transmission, from a belt, and/or any other mechanical access), and that provides configured electrical power 8224 to an aftertreatment heater device 8218 that selectively heats an exhaust fluid 8274 of the prime mover 8202. Configured electrical power, as utilized herein, includes at least power provided at a selected voltage, a selected current, and/or with compensation for voltage ripple in the configured electrical power. The example system includes an aftertreatment component 8228 positioned downstream of the aftertreatment heater device, and configured to treat at least one constituent (e.g., CO, NOx, particulates, unburned hydrocarbons, etc.) of the exhaust fluid 8274. The power conversion system 8200 is otherwise similar to the system depicted in FIG. 80.

Figure 83A:
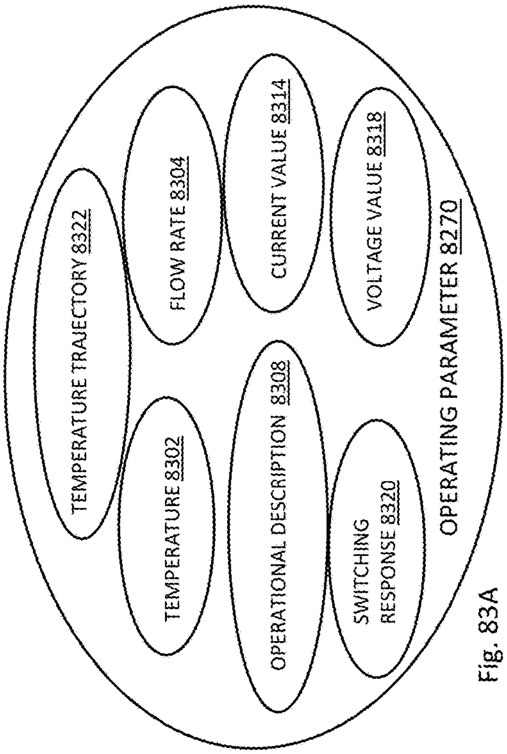
FIG. 83A, FIG. 83B, FIG. 83C, and FIG. 83D depict example operating conditions and various values.
Figure 83B:
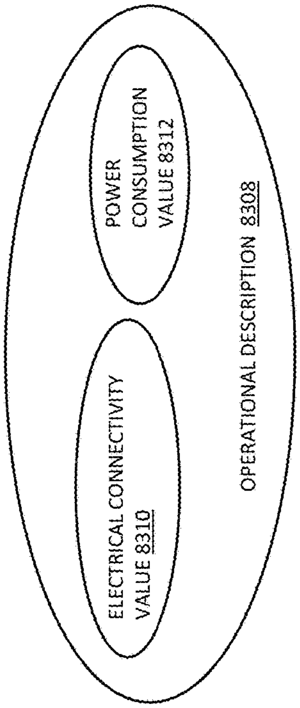

The example system 8200 further includes a controller 8268 having a number of circuits configured to execute certain operations of the controller. A controller, circuit, processor, computing device, or other similar terminology as utilized herein, includes elements configured to perform the selected functions, and may include one or more of: sensors, actuators, processors, memory storage, computer readable instructions configured to execute operations in response to execution by a processor, programmable logic circuits, and/or hardware elements configured to be responsive to conditions to perform one or more operations as described herein. Example sensors that may be a part of such devices, and/or in communication with such devices, include, without limitation, a current sensor, a voltage sensor, a temperature sensor, and/or an actuator feedback sensor. Example actuators that may be a part of such devices, and/or responsive to commands from such devices, include, without limitation, a contactor, a switch, a solid state component, a DC/DC conversion device (including phases 8212 thereof), or the like. The example controller includes an operating conditions circuit 8278 that interprets operating parameter(s) 8270 of the power converter, the aftertreatment heater device, and/or the exhaust fluid. Referring to FIG. 83A and FIG. 83B, example operating conditions 8270 (or parameters) include one or more of: a temperature of the exhaust fluid at any position in the aftertreatment system, including in certain embodiments at a position downstream of the aftertreatment heater device; a temperature 8302 of the exhaust fluid (including at a specific location); a flow rate 8304 of the exhaust fluid (e.g., a volumetric flow rate, molar flow rate, and/or mass flow rate); operational descriptions 8308 such as an electrical connectivity value 8310 (e.g., connectivity to a power source, to the heater, a configuration of the heater, coupling of the phases, etc.) and a power consumption value 8312 (e.g., power consumed by the heater, by one or more phases, and/or resistive losses in an electrical conduit); a current value 8314 (e.g., low side current, high side current, phase current, and/or heater current, including potentially a current of the configured electrical power); a voltage value 8318 (e.g., low side voltage, source voltage, high side voltage, output voltage, voltage drop on the heater, and/or a voltage of the configured electrical power); a temperature 8302 of one or more phase converters; a temperature 8302 of the heater; a temperature 8302 of an electrical conduit; and/or a switching response 8320 of one or more phase converters (e.g., switching performance, switching scheme, and/or diagnostic feedback). In certain embodiments, the operating parameter 8270 includes a temperature associated with an aftertreatment component (e.g., an inlet temperature, outlet temperature, bulk temperature, surface temperature, etc., which may be measured and/or estimated), and/or a temperature trajectory 8322 associated with an aftertreatment component (e.g., progression along a planned temperature path, a time/temperature rise threshold, etc.).

Figure 83C:
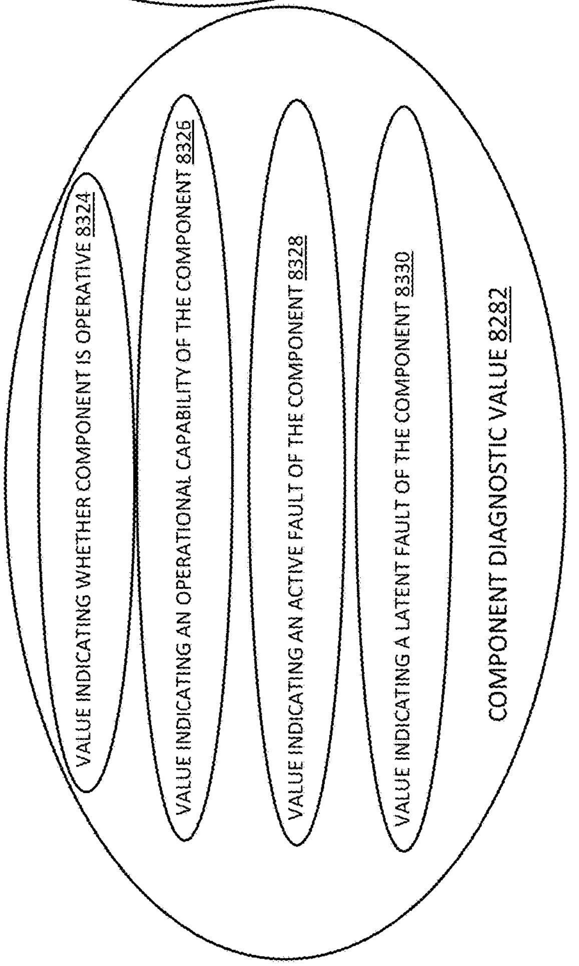

The example controller 8268 further includes an aftertreatment diagnostic circuit 8280 that determines a component diagnostic value 8282 in response to the operating parameter(s) 8270. Example and non-limiting component diagnostic values 8282, and referring to FIG. 83C, include one or more of: a value indicating whether the component is operative 8324 (e.g., indications that the component is functional, including determining electrical connectivity, and/or confirming expected electrical and/or temperature response); a value indicating an operational capability of the component 8326 (e.g., an indication that the performance of the component is within nominal constraints, and/or sufficiently functional to stay within mission capable performance); a value indicating an active fault of the component 8328 (e.g., where conditions of the component indicate that a fault condition is present, for example operation cannot be confirmed, and/or self reporting of the fault condition by a smart or self-diagnosing component, actuator, or the like); and/or a value indicating a latent fault of the component 8330 (e.g., where conditions of the component indicate that a fault condition is present or imminent, for example where event counts of the fault have not arisen to the point of setting the fault, and/or a historical indication that a fault was recently active for the component).

Figure 83D:
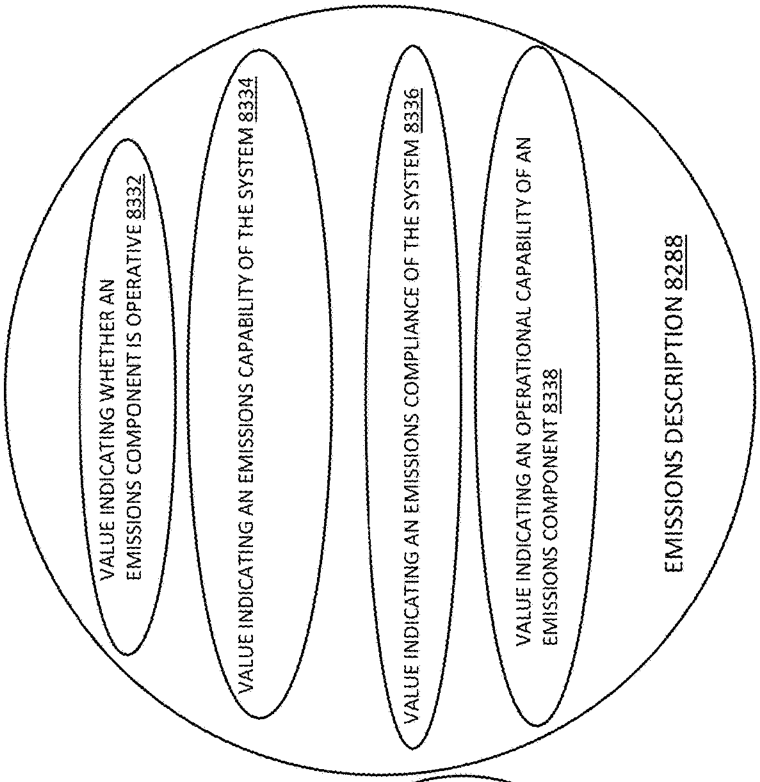

In certain embodiments, the component may be an emissions component, for example a component where a failure of the component may cause an emissions variation or failure, and in certain embodiments where the vehicle is otherwise operable despite a fault or failure of the component. In certain embodiments, the controller 8268 includes an emissions reporting circuit 8284 that transmits an emissions description 8288 in response to the component diagnostic value 8282. In certain embodiments, the emissions description 8288 includes a qualitative value (e.g., emissions degradation, emissions capability value, an operating state value such as "heater unavailable", "aftertreatment component unresponsive", or the like), a quantitative value (e.g., a power limit for the heater, an emissions impact based upon the current component diagnostic value, etc.), and/or the emissions description 8288 may be transmitted by providing all or a part of the component diagnostic value 8282 as the emissions value. In certain embodiments, other aspects of the system (e.g., a vehicle controller, engine controller, transmission controller, the prime mover, etc.) may be responsive to the emissions value—for example to perform operations to compensate for potential emissions impact, to light a service light or malfunction indicator light, to provide a notification of the emissions value (e.g., to the operator, a service person, a fleet owner, a manufacturer, etc.), to derate the vehicle and/or prime mover (e.g., to prevent further emissions impact while preserving some capability to position the vehicle), and/or to disable the vehicle. In certain embodiments, and referring to FIG. 83D, the emissions value includes one or more of: a value indicating whether the emissions component is operative 8332; a value indicating an emissions capability of the system 8334 (e.g., in view of a fault, failure, or diagnostic condition, and which may further include available mitigating operations available in the system); a value indicating an emissions compliance of the system 8336 (e.g., indicating whether an emissions threshold can be met, and/or which one of available emissions thresholds can be met); and/or an operational capability of an emissions component 8338 (e.g., vehicle performance available while meeting emissions, vehicle performance available in view of the emissions performance, a power rating available to the heater, a temperature and/or heat transfer capability of the heater, etc.).

An example system includes a battery pack 8290 having at least one battery 8292, where the power converter 8210 selectively transfers power between the battery pack 8290 and the aftertreatment heater device. In certain embodiments, the battery pack 8290 may be a dedicated battery pack 8290 for providing and storing power from regeneration operations, to the heater, and/or other electrical devices, including devices powered by the power converter or powered by other electrical control devices on the vehicle. In certain embodiments, the battery pack 8290 stores power from the prime mover 8202 by direct electrical coupling to the vehicle electrical system and/or through mechanical power capture using a motor/generator. In certain embodiments, the battery pack is associated with the vehicle electrical system, and additionally or alternatively may be a primary battery for the vehicle, for example utilized to perform prime mover start operations, powering electrical accessories and/or loads of the vehicle, or the like. In certain embodiments, the controller does not determine the component diagnostic value and/or emissions value utilizing a state of charge of the battery pack, and/or utilizing parameters related to the battery pack (e.g., a state of life, confirmation of electrical coupling, available voltage and/or current from the battery pack, etc.). In certain embodiments, the battery pack is not an emissions component (e.g., emissions compliance can be achieved independently of the battery pack, mitigating actions can be performed in response to a failure of the battery pack sufficient to perform the vehicle mission, a failure of the battery pack prevents operation of the vehicle such that a failure of the battery pack will not result in emissions variation, and/or a failure of the battery pack will necessarily be detected through a failure of capability in another component such as a failure of the heater to respond to power commands).

Figure 84B:
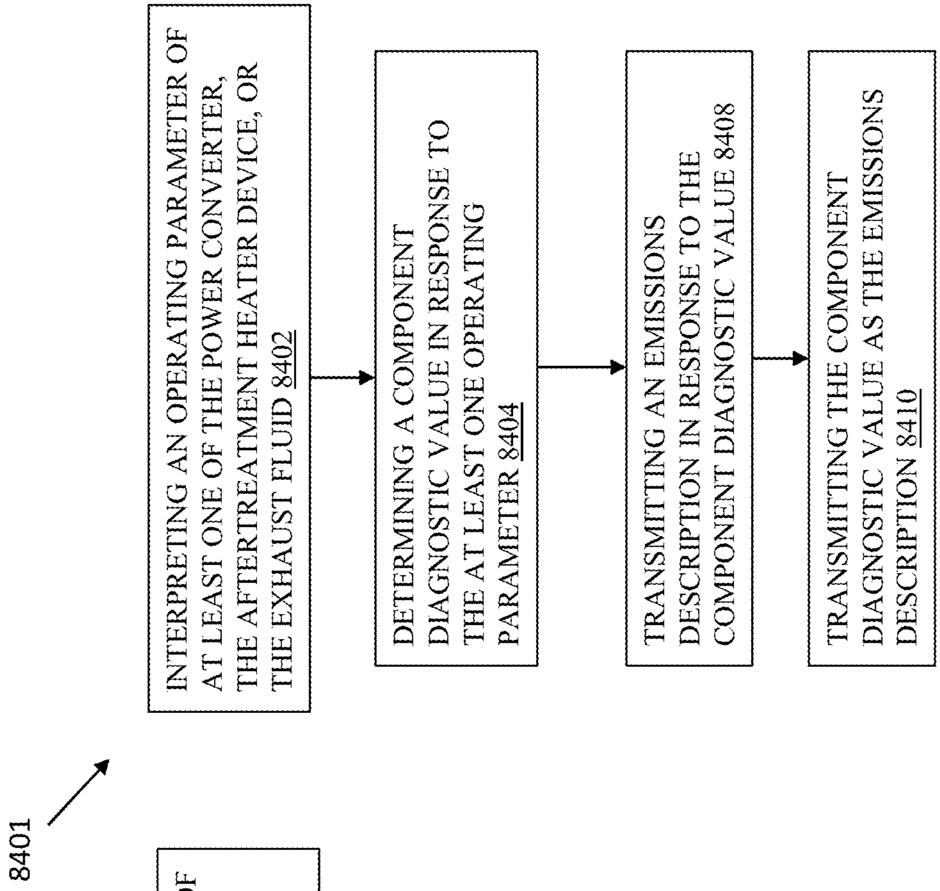
FIG. 84A and FIG. 84B depict example procedures.
Figure 84A:
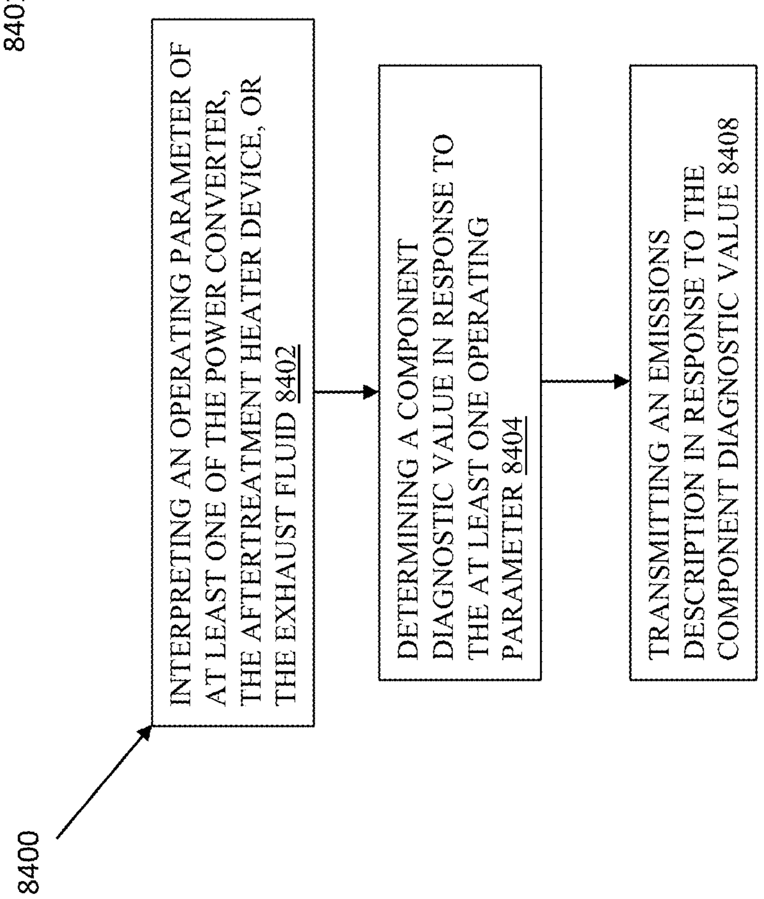

Referring to FIG. 84A, an example procedure 8400 includes interpreting an operating parameter of at least one of the power converter, the aftertreatment heater device, or the exhaust fluid 8402; determining a component diagnostic value in response to the at least one operating parameter 8404; and transmitting an emissions description in response to the component diagnostic value 8408. Referring to FIG. 84B, an example procedure 8401 further includes transmitting the component diagnostic value as the emissions description 8410.

Figure 76:
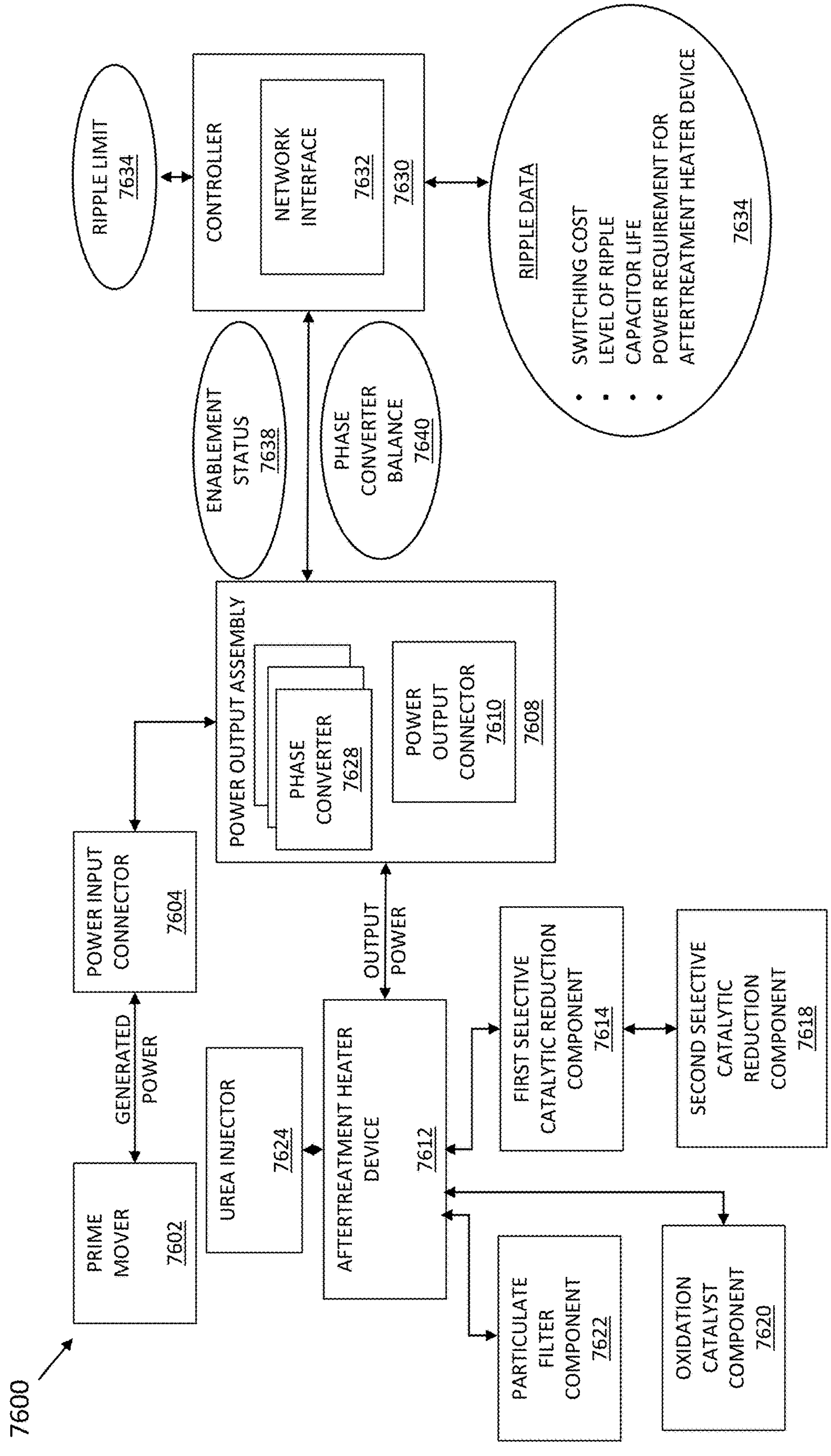
FIG. 76 depicts an example power conversion system.

Referring to FIG. 76, an example power conversion system 7600 includes a prime mover 7602 that generates power for a mobile vehicle, a power input connector 7604 that receives a portion of the generated power at a first voltage, and a power output assembly 7608. The example power output assembly includes a number of phase converters 7628 that convert the received input power to an output power at a second voltage, and a power output connector 7610 that electrically couples the output power to an aftertreatment heater device 7612. The power conversion system 7600 is otherwise similar to the system depicted in FIG. 80.

The example system 7600 includes a subset of the phase converters 7628 selected based on the aftertreatment heater device 7612 and a ripple limit 7634 for the aftertreatment heater device. In certain embodiments, selection of the phase converters includes one or more of: selection of a current capability for the phase converters, selection of a switching frequency for the phase converters, and/or selection of a duty cycle operating range (and/or an efficient or inefficient range of the phase converters in terms of duty cycle/pulse width values). In certain embodiments, selection of the phase converters may be implemented by replacing a phase converter with a different phase converter and/or selecting a different phase converter for installation (e.g., a hardware switch), and/or by configuration of the phase converter (e.g., a controller 7630 configured to adjust operating parameters of the phase converter such as switching frequency, pulse width mapping, operation based on current balancing and/or temperature balancing, current and/or temperature targets, etc.). In certain embodiments, the ripple for the aftertreatment heater device may be induced by the capacitance and/or inductance of the powering circuits, artefacts of a square-wave implementation of DC/DC conversion operations, and/or due to power initiation and/or transient power commands for the heater. In certain embodiments, the ripple limit may be described in any manner, including for example amplitude of current and/or voltage deviations, frequency of deviations, area of deviation under a specified curve, and/or based on a statistical description of variability of the current and/or voltage of the provided electrical power to the heater. In certain embodiments, the ripple may be determined relative to any component and/or portion of an electrical circuit, and/or more than one ripple value may be utilized, for example a ripple on a low side power circuit, a high side power circuit, related to any one or more of the phases, ripple at the power input connector, and/or ripple at the power output connector.

Figure 77:
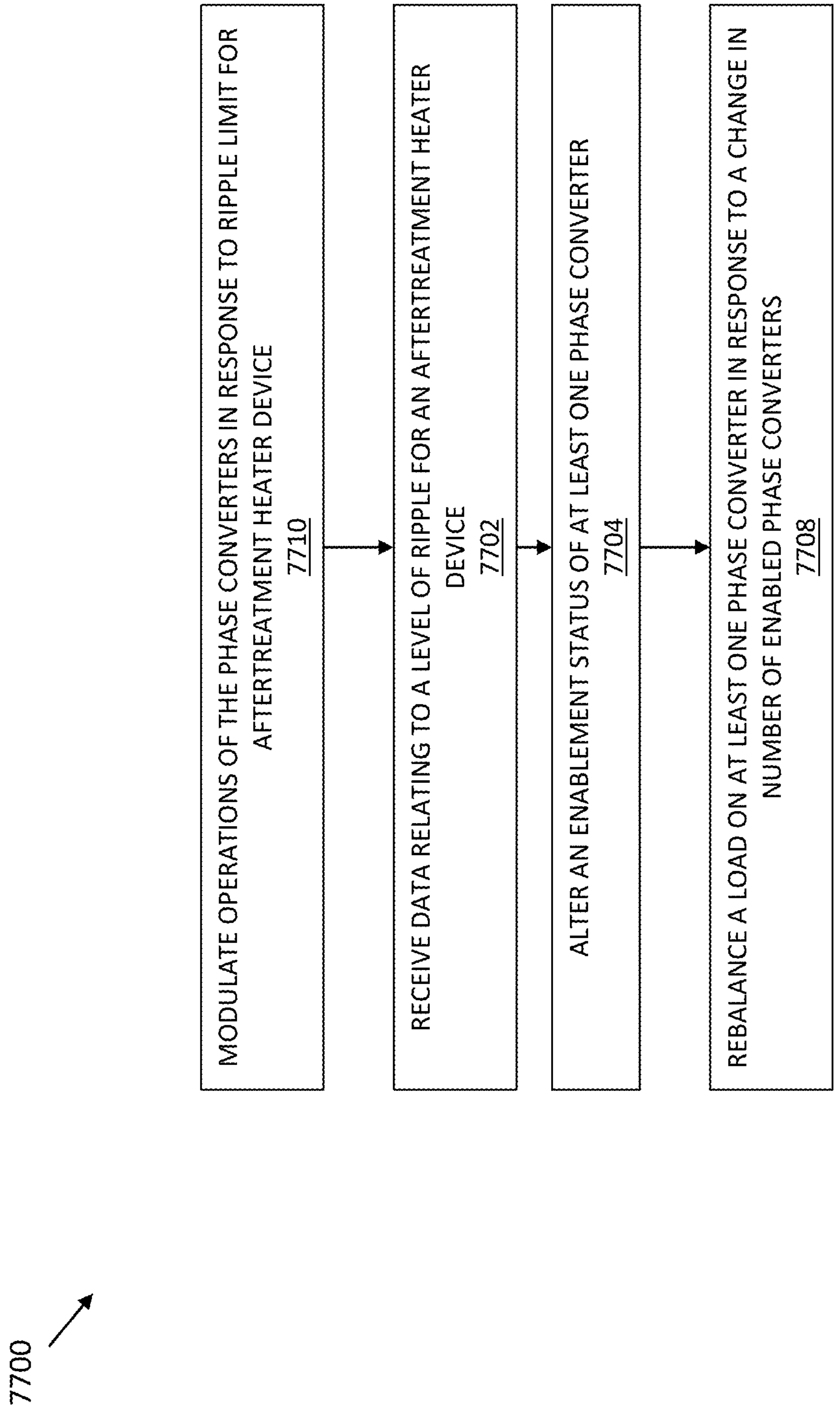
FIG. 77 depicts an example procedure executed by a controller.

In certain embodiments, and referring to FIG. 77, an example procedure 7700 is executed by the controller, which is configured to modulate operations of the phase converters in response to the ripple limit 7710, for example to mitigate, reduce, and/or eliminate the ripple current and/or voltage. In certain embodiments, the system includes a multi-layer PCB, where the controller is positioned (in whole or part) on the multi-layer PCB, and/or where the controller is in communication with controls on the multi-layer PCB that are configured to operate the phase converters in response to commands from the controller. In certain embodiments, the power input connector is located on a first finger of the multilayer PCB, where the power output connection is located on a second finger of the multi-layer PCB. An example system further includes a choke positioned between the first finger and a main body of the multilayer PCB, and a second choke positioned between the second finger and the main body of the multi-layer PCB. In certain embodiments, the chokes assist with transient response of power through the power converter, which assists in reducing the ripple current experienced in the power output assembly, and/or broadens the hardware and/or operational configurations of the phase converters that are able to meet the ripple limit. An example multi-layer PCB includes a number of power transfer layers, allowing for modulation of the transient response of the power transfer circuits, and/or where an inner layer(s) of the number of power transfer layers include an increased copper loading relative to an outer layer of the number of power transfer layers. In certain embodiments, a bottom layer of the multi-layer PCB is a grounding layer, and/or may further be a heat transfer layer. In certain embodiments, the grounding layer is positioned adjacent to some of the phase converters, but not all of the phase converters-allowing for manipulation of capacitance and inductance of the power transfer, and accordingly managing the ripple current, and/or broadening the hardware and/or operation configuration of the phase converters that are able to meet the ripple limit.

An example controller further includes a network interface 7632 (e.g., a controller area network, or CAN, or any other type of network) that receives data relating to a level of ripple for the aftertreatment heater device 7702 (e.g., parameters used to detect or determine a ripple amount, and/or limits or target values for the ripple). The example controller is further configured to alter an enablement status 7638 of one or more phase converters 7704—for example disabling a phase converter, adding additional phase converters, switching FETs between high side and low side operation, and/or switching from using a first one of the phase converters to a second one of the phase converters. An example controller is configured to rebalance a load on a phase converter (e.g., phase converter balance 7640) in response to a change in the number of enabled phase converters 7708 (e.g., increasing or decreasing a throughput of the phase converter, a duty cycle command, or the like). An example controller alters the enablement status of phase converter(s) and/or rebalances a load on phase converter(s) in response to ripple data 7634, including: a switching cost of a phase converter (e.g., power losses, wear costs, operational impact costs, etc.); a level of ripple measured or estimated; a ripple limit (e.g., which may be varied based on the operating conditions); a capacitor life (e.g., accounting for an effect on conditioning capacitors in response to exhibited ripple and/or corrected ripple); and/or a power requirement for the aftertreatment heater device (e.g., adjusting the ripple limit and/or ripple response based on the current power to be provided to the heater).

An example system includes a supercapacitor electrically coupled to the power output connector. In certain embodiments, the supercapacitor may additionally or alternatively be electrically coupled to another system location, such as a power input connector, low side location, high side location, or the like. A supercapacitor, as utilized herein, indicates a capacitor configured to perform at least an increment of power storage rather than mere circuit conditioning, including power storage for circuit conditioning to manage ripple. An example supercapacitor includes any capacitor having a capacity of at least 0.3F, a capacitor having sufficient energy storage to power the aftertreatment heater device for a selected period, or the like. In certain embodiments, the selected period may be determined according to the source and/or type of ripple or transient response on the selected circuit (e.g., at the power output connector, power input connector, low side, and/or high side), and may be a value such as: between 10 ms to 100 ms; between 100 ms to 1 second; between 1 second to 10 seconds; and/or between 10 seconds to 180 seconds. Example and non-limiting transient operations to be managed by the supercapacitor include operations such as: ripple-based transients, load dump based transients (e.g., turning off the power to the heater from a full powered condition, and/or a significant reduction in power requested in a short period of time); a prime mover ramp-up event (e.g., transient of an engine from a low power and/or speed condition to a high power and/or speed condition); support for the heater over an extended period (e.g., 30 seconds+/−), and/or support for a fuel economy cycle, cold start event, and/or regeneration support (e.g., 60-120 seconds).

The example aftertreatment heater device may be positioned anywhere within an aftertreatment system as set forth throughout the present disclosure, including at least upstream of an SCR component 7614, upstream of more than one SCR components 7618 (e.g., arranged in series or parallel), upstream of an oxidation catalyst component 7620, upstream of a particulate filter component 7622, and/or downstream of an injector (e.g., a urea injector 7624, ammonia injector, hydrocarbon injector, etc.).

Figure 78:
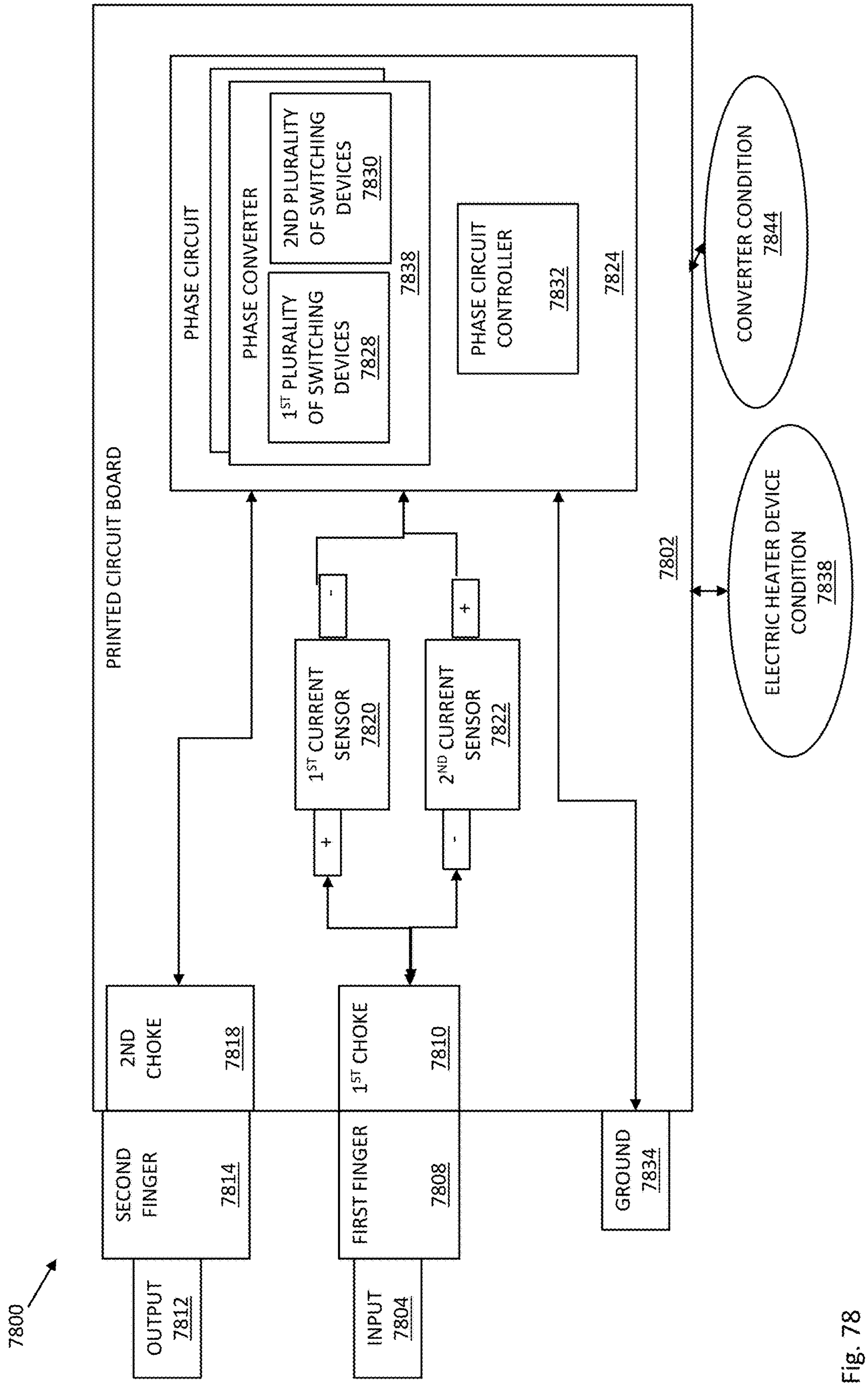
FIG. 78 depicts an example system including a heater controller.

Referring to FIG. 78, an example system includes a heater controller 7800, the heater controller including a PCB 7802, where the PCB includes an electrical input terminal 7804 that receives electricity in a first electrical configuration (e.g., having a voltage and current provided by a source, such as a battery pack, motor/generator, and/or vehicle electrical system), a first finger 7808 including a first choke point, where the electrical input terminal is electrically coupled to the first finger 7808, and an electrical output terminal 7812 that provides electricity in a second electrical configuration (e.g., at a selected voltage, current, managed ripple, and/or managed transient value). In certain embodiments, the provided electricity in the second electrical configuration is provided to an aftertreatment heater device configured to provide heat to an aftertreatment system. The example system includes a first current sensor 7820 electrically coupled to the electrical input terminal 7804, and a second current sensor 7822 electrically coupled to the electrical input terminal 7804, where the first and second current sensors 7820, 7822 are coupled in parallel. In certain embodiments, the current sensors are provided as two sides of a dual channel current sensor. In certain embodiments, a positive input of the first current sensor is coupled to the electrical input terminal after the first choke point, and a negative input of the second current sensor is coupled to the electrical input terminal after the first choke point.

In certain embodiments, the system includes a first choke 7810 positioned at the first choke point, and/or a second choke 7818 positioned at the second choke point. In certain embodiments, one or more of the chokes 7810, 7818 may be a ferrite choke. In certain embodiments, the PCB 7802 includes a second finger 7814 including a second choke point, where the electrical output terminal 7812 is electrically coupled to the second finger 7814. An example PCB 7802 includes a number of layers as described herein, where an inner layer of the number of layers includes a higher conductivity, for example a thicker and/or higher loading of conductive material, than one or more outer layers of the number of layers, as described herein. An example PCB 7802 further includes a phase circuit 7824, where the phase circuit includes a first number of switching devices 7828 coupled together in parallel, and a second number of switching devices 7830 coupled together in parallel, where the first number of switching devices 7828 are coupled in series with the second number of switching devices 7830.

Figure 79:
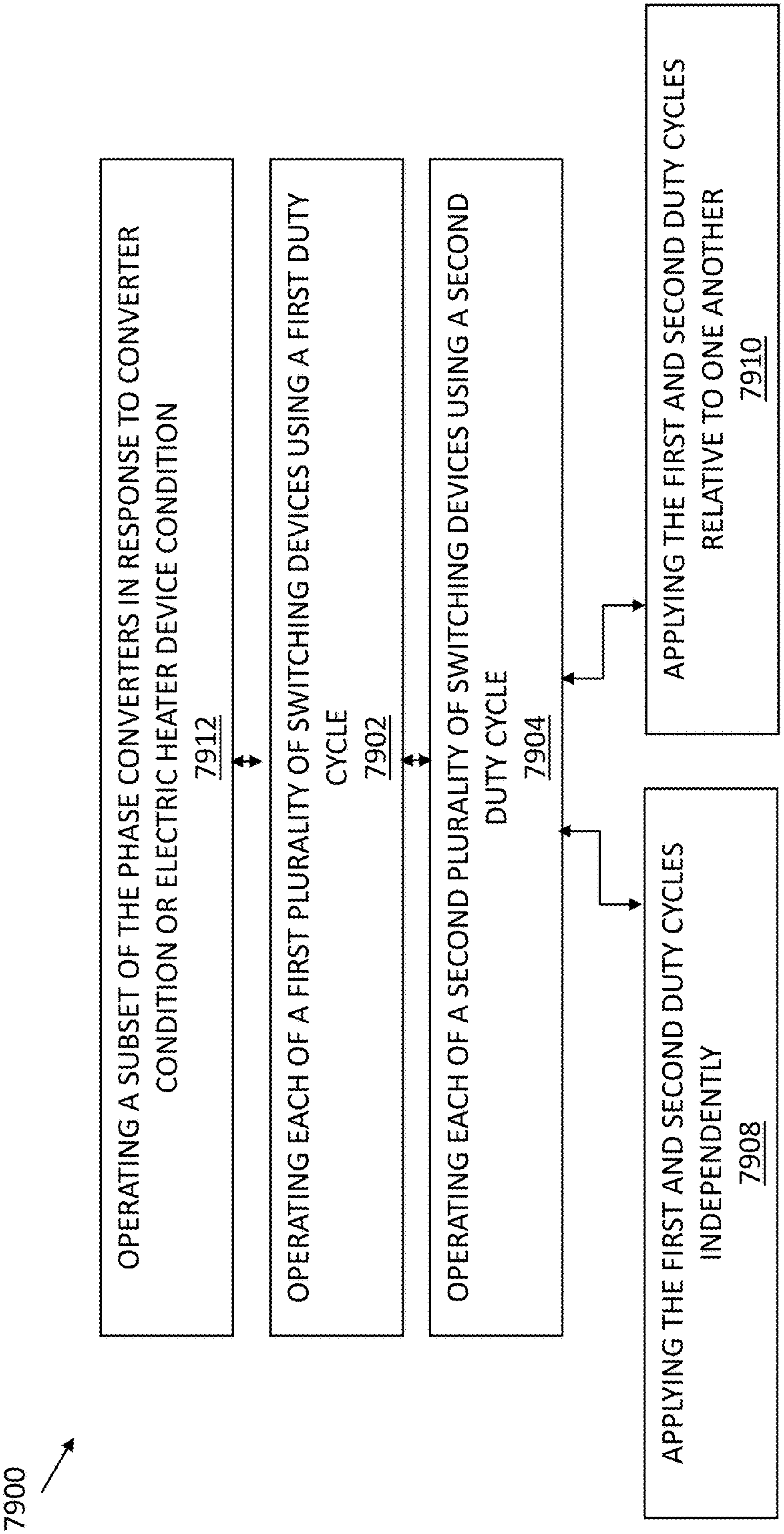
FIG. 79 depicts an example procedure of an electronic heater controller.

In certain embodiments, the phase circuit 7824 may be a phase converter 7838, and/or a phase of a DC/DC converter as set forth throughout the present disclosure. In certain embodiments, the first number of switching devices 7828 is greater than the second number of switching devices 7830. In certain embodiments, the first number of switching devices 7828 are coupled between the electrical input terminal 7804 and the electrical output terminal 7812, and the second number of switching devices 7830 are coupled between the electrical output terminal 7812 and a ground 7834. In certain embodiments, a ratio of the first number of switching devices to the second number of switching devices is 2:1. In certain embodiments, the first number of switching devices and the second number of switching devices is a phase converter 7838, and the example PCB 7802 includes an additional number of phase converters. In certain embodiments, and referring to an example embodiment 7900 in FIG. 79, the electronic heater controller 7800 is configured to operate 7912 a subset of the phase converters in response to a converter condition 7844 or an electric heater device condition 7838. Example and non-limiting converter conditions include conditions such as: a current balance threshold; a ripple threshold; and/or a phase temperature threshold. An example electronic heater controller is configured to time shift a duty cycle for one phase converter relative to a duty cycle for another phase converter (e.g., to smooth out electric power delivery). An example system includes a phase circuit controller 7832 having a driver configured to execute an example procedure 7900: operate each of the first number of switching devices using first duty cycle 7902, operate each of the second number of switching devices using a second duty cycle 7904, and to apply the first duty cycle and the second duty cycle independently 7908 or relative to one another 7910. An example electronic heater controller includes one or more of the second number of switching devices thermally coupled to an area of a bottom layer of the PCB. An example area of the bottom layer of the PCB includes a bare conductive material such as copper. An example second area of the bottom layer of the PCB includes an insulation layer, for example to limit capacitance and/or inductance of the power circuits. An example bottom layer includes a ground layer.

Figure 85:
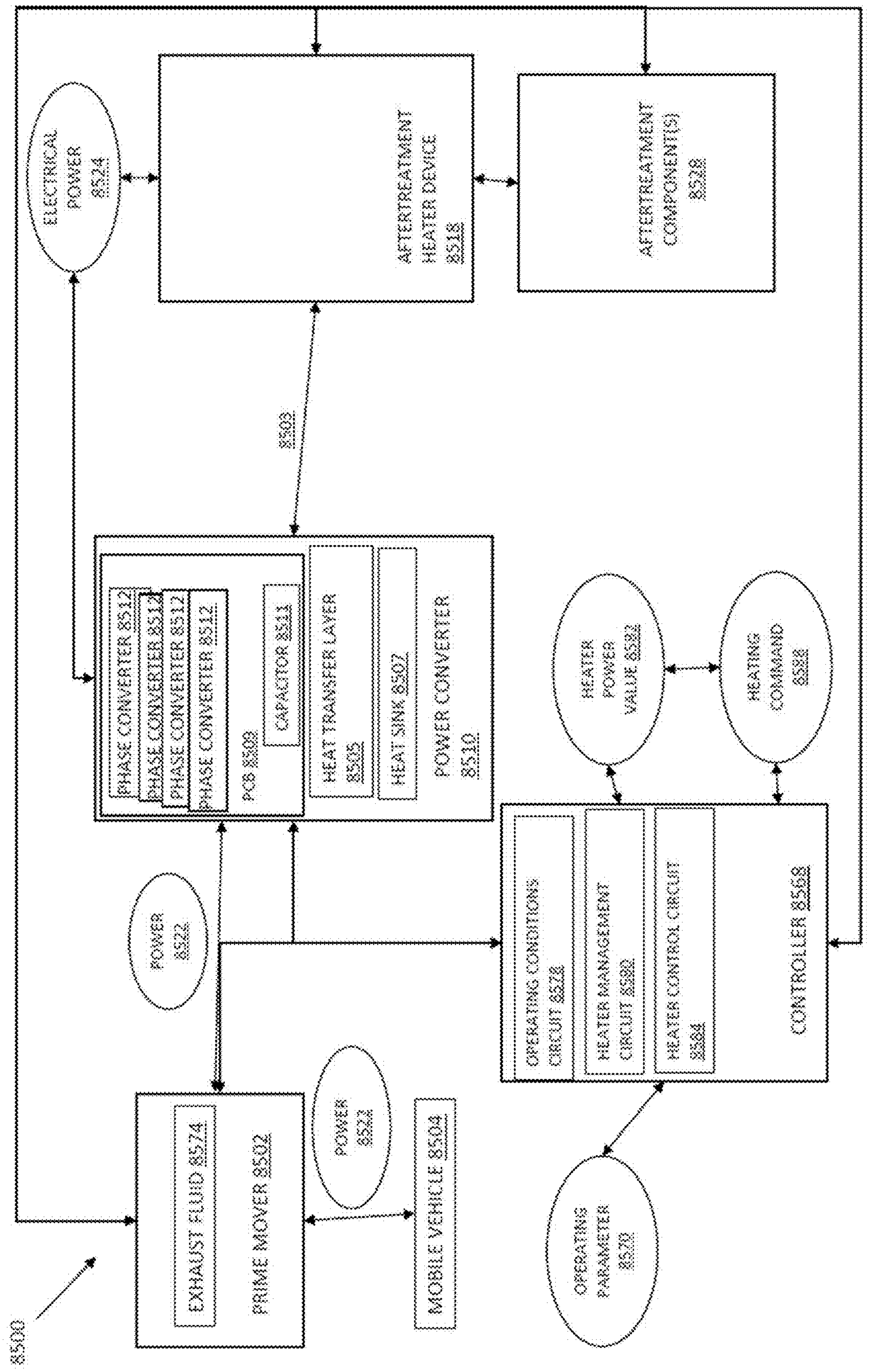
FIG. 85 depicts an example power conversion system.

Referring to FIG. 85, an example system 8500 includes a prime mover 8502 that generates power 8522 for a mobile vehicle 8504, and a power converter 8510 that receives a portion of the generated power, and provides configured electrical power 8524 to an aftertreatment heater device 8518 configured to selectively heat an exhaust fluid 8574 of the prime mover. The system further includes an aftertreatment component 8528 positioned downstream of the aftertreatment heater device, and configured to treat at least one constituent of the exhaust fluid. The power conversion system 8500 is otherwise similar to the system depicted in FIG. 80.

The example system includes a controller 8568 having a number of circuits configured to perform operations of the controller, including an operating conditions circuit 8578 that interprets an operating parameter 8570 of the power converter, the aftertreatment heater device, the prime mover, and/or the exhaust fluid. The example controller 8568 further includes a heater management circuit 8580 that determines a heater power value 8582 in response to the operating parameter, and a heater control circuit 8584 that provides a heating command 8588 in response to the heating power value 8582. The example power converter 8510 is responsive to the heating command to heat the exhaust fluid of the prime mover. An example heater management circuit determines the heater power value as a power and/or configured electrical power to the heater, for example based on a condition of the vehicle and/or prime mover (e.g., a cold start condition, an exhaust temperature of the engine, an amount of emissions of the engine combined with a capability of the aftertreatment under present conditions to acceptably treat the emissions, etc.), based on a condition of the aftertreatment heater device (e.g., a power rating of the heater, a temperature of the heater, etc.), the power converter (e.g., low side voltage, high side voltage, which phase converters are active and/or available, etc.), and/or the exhaust fluid (e.g., a flow rate, temperature, and/or composition of the exhaust fluid). In certain embodiments, the heater power value includes a power to be provided to the heater, a current to be provided to the heater, a voltage to be provided to the heater, and/or a description related to these (e.g., 80% of rated power). The example controller further includes a heater control circuit 8584 that provides a heating command in response to the heating power value, where the heating command includes actuator commands and/or signals to implement the heating power value, and/or to progress toward the heating power value. The example system includes the power converter responsive to the heating command(s) to heat the exhaust fluid of the prime mover (e.g., by providing configured electrical power to the heater).

Example and non-limiting operating parameter(s) include a voltage of the configured electrical power and/or a temperature limit of an electrical conduit 8503 coupling the power converter to the aftertreatment heater device. An example heater management circuit 8580 further determines the heating power value to modulate a current in the electrical conduit 8503. An example voltage of the configured electrical power includes a vehicle electrical system voltage. An example voltage of the configured electrical power includes a 48V nominal voltage. An example heater management circuit determines the heating power value to modulate a current in the electrical conduit in response to the voltage of the configured electrical power being an off-nominal voltage (e.g., correcting for 52V versus 48V, 44V versus 48V, 28V versus 24V, etc.). The modulation in response to the off-nominal voltage allows for sufficient power to be provided to the heater, to keep the power provided to the heater within specified limits, and/or to limit temperature generated in the electrical conduit 8503.

Example and non-limiting operating parameter(s) include a temperature of a phase converter of the power converter (e.g., one or more of the phase converters), where the heater management circuit determines the heating power value in response to a temperature limit of the phase converter of the power converter. An example power converter includes a number of phase converters 8512, where the system includes a heat transfer layer 8505 thermally coupling at least a subset of the phase converters to a heat sink 8507—for example allowing operations of the heater management circuit to differentially provide power through the phases in response to differential heat transfer capacity for the phases. An example power converter 8510 includes the phase converters 8512 on a first part of a PCB 8509, and a capacitor 8511 electrically coupled to the configured electrical power, where the capacitor(s) is positioned on another part of the PCB—for example reducing a temperature burden on the capacitor(s). Example configurations with the phase converters and the capacitor on different parts of the PCB include: the phase converters on a first quadrant of the PCB and the capacitor on a third opposing quadrant of the PCB; the phase converters on a first half of the PCB and the capacitor(s) on an opposing second half of the PCB; and/or a distance between a closest one of the phase converters and the capacitor(s) is configured to be greater than a threshold distance.

In certain embodiments, heat generation of the phase converters is increased significantly in certain operating regions of the phase converter, for example at certain duty cycle values for a PWM (pulse width modulation) operated phase converter. For example, at moderate to high duty cycle values, heat generation may be elevated due to switching operations at high power. In certain embodiments, when the duty cycle is close to or at 100%, the temperature generation may be reduced, for example due to reduced switching losses. In certain embodiments, the heater control circuit 8584 is configured to operate the phase converters to avoid low conversion efficiency regions (e.g., regions where an elevated amount of the converted power is instead lost as heat, and/or a high temperature generation region). In certain embodiments, the low conversion efficiency region includes a duty cycle between 70% and 95%. In certain embodiments, the low conversion efficiency region includes a duty cycle between 60% and 99%. In certain embodiments, the heater control circuit 8584 determines operations of the phase converters based on one or more of: heat transfer environment of particular phase; current throughput capacity of a particular phase; and/or operations to balance temperature generation and/or utilization between phases. In certain embodiments, the heater control circuit 8584 provides the heating command to avoid and/or minimize operations in a low conversion efficiency region of at least one of the phase converters.

Figure 86A:
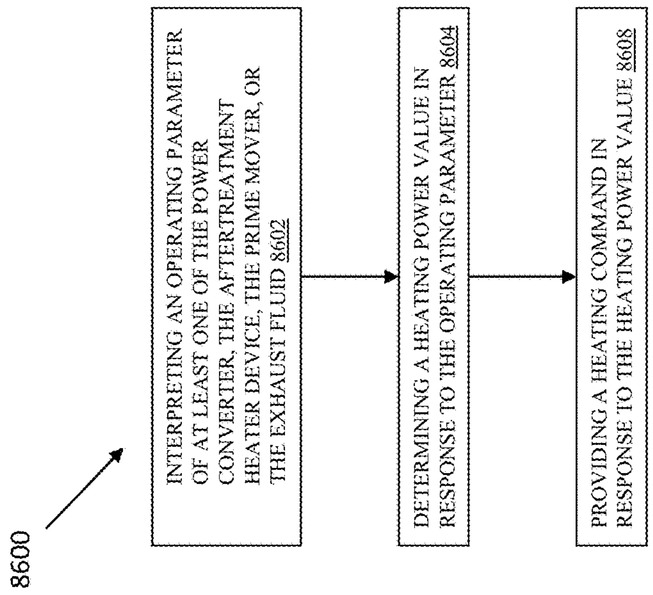
FIG. 86A, FIG. 86B, and FIG. 86C depict example procedures of a controller.
Figure 86B:
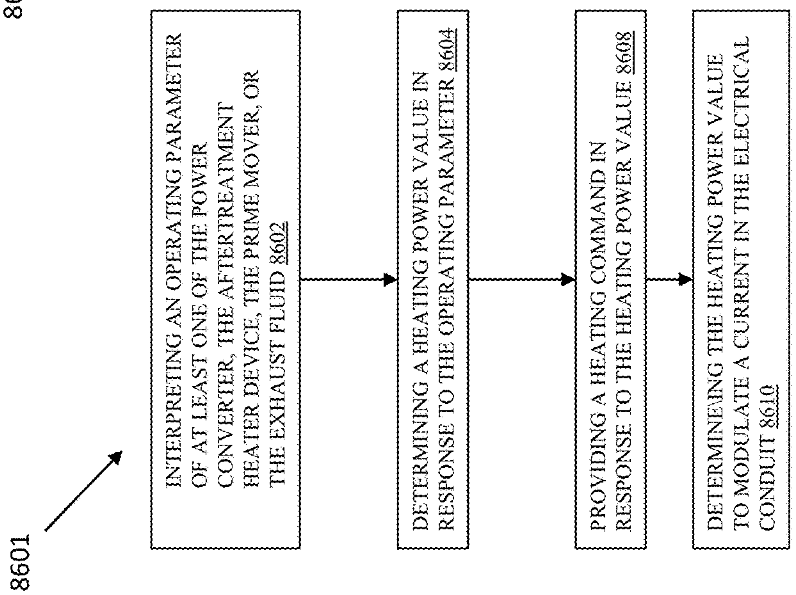
Figure 86C:
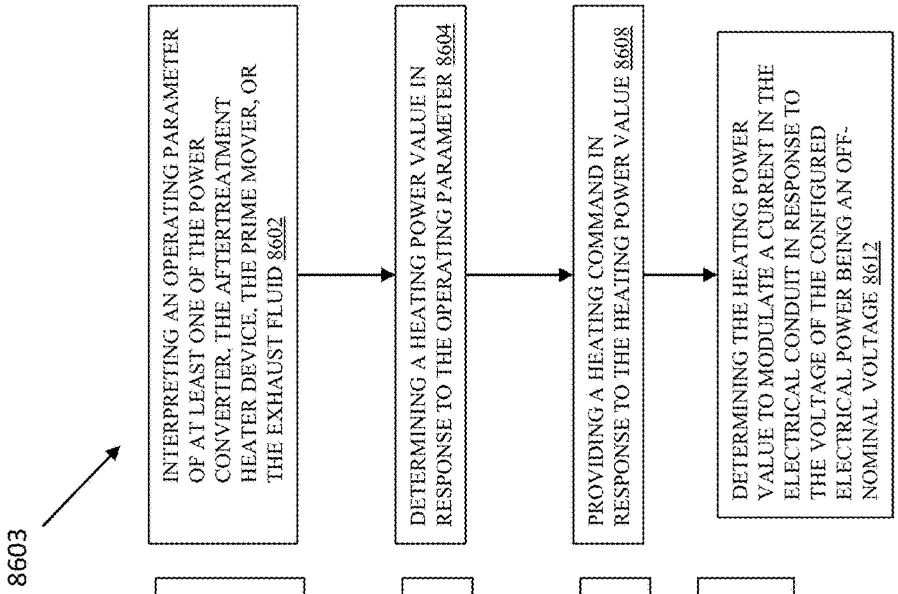
Figure 87C:
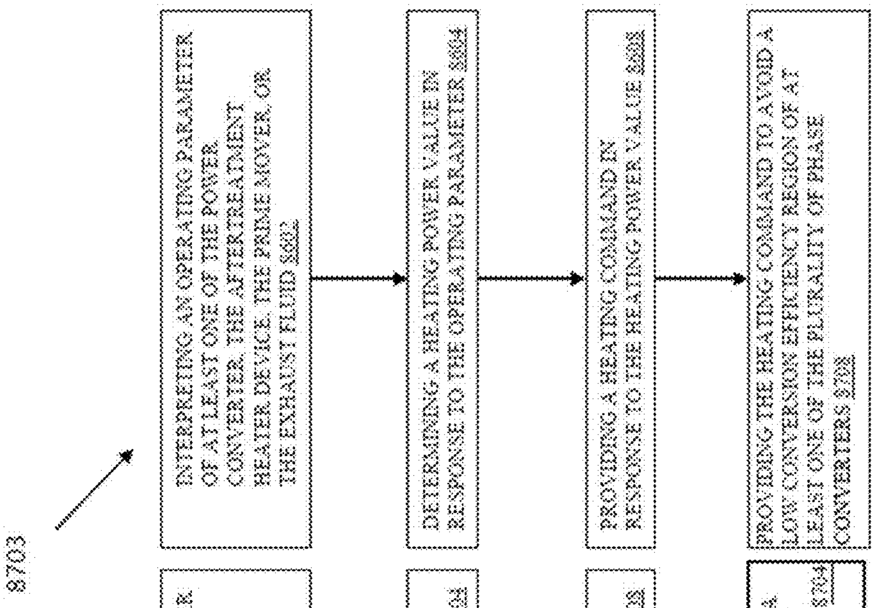
FIG. 87A, FIG. 87B, and FIG. 87C depict example procedures of a controller.
Figure 87B:
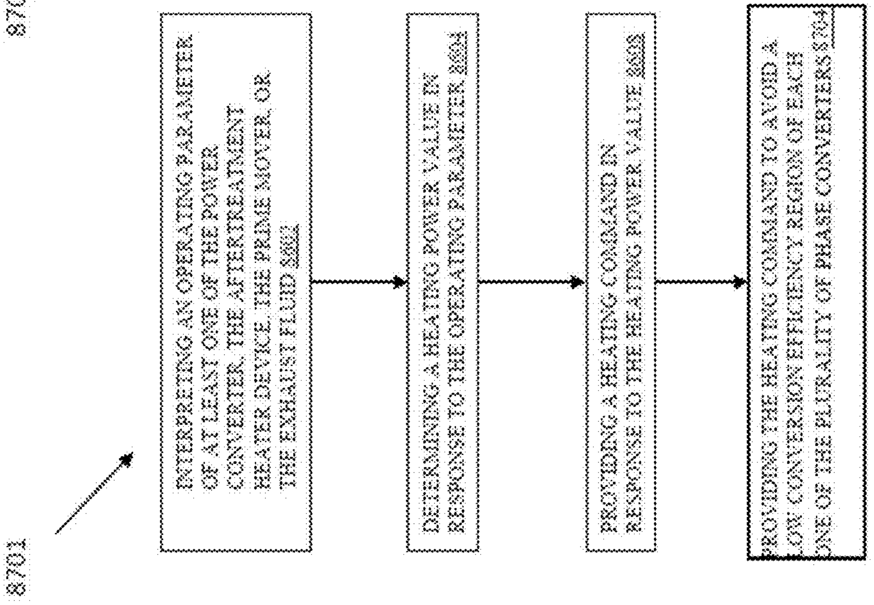
Figure 87A:
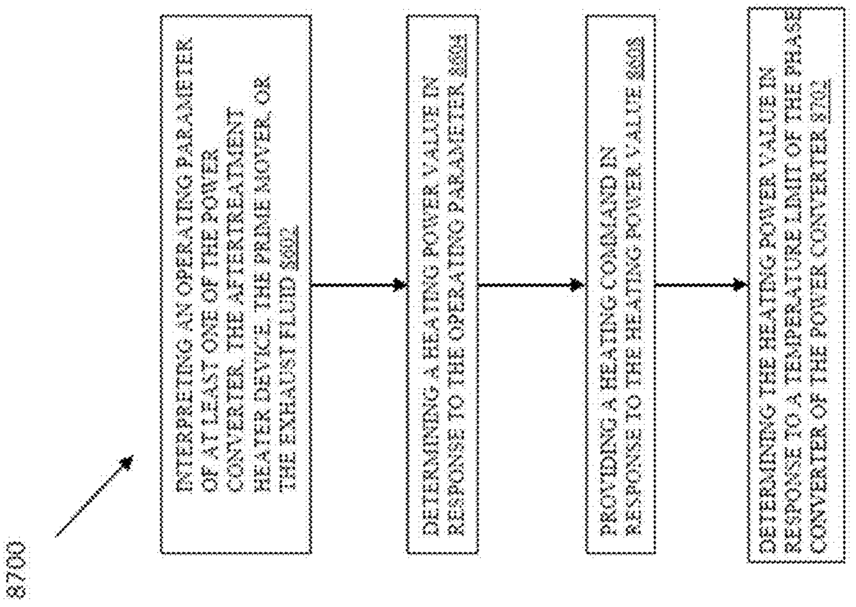

Referring to FIG. 86A, an example procedure 8600 includes interpreting an operating parameter of at least one of the power converter, the aftertreatment heater device, the prime mover, or the exhaust fluid 8602; determining a heating power value in response to the operating parameter 8604; and providing a heating command in response to the heating power value 8608. Referring to FIG. 86B, an example procedure 8601 further includes determining the heating power value to modulate a current in the electrical conduit 8610. Referring to FIG. 86C, an example procedure 8603 further includes determining the heating power value to modulate a current in the electrical conduit in response to the voltage of the configured electrical power being an off-nominal voltage 8612. Referring to FIG. 87A, the example procedure 8700 further includes determining the heating power value in response to a temperature limit of the phase converter of the power converter 8702. Referring to FIG. 87B, the example procedure 8701 further includes providing the heating command to avoid a low conversion efficiency region of each one of the plurality of phase converters 8704. Referring to FIG. 87C, the example procedure 8703 further includes providing the heating command to avoid a low conversion efficiency region of at least one of the plurality of phase converters 8708.

The methods and systems described herein may be deployed in part or in whole through a machine that executes computer software, program codes, and/or instructions on a processor. The processor may be part of a server, client, network infrastructure, mobile computing platform, stationary computing platform, or other computing platform. A processor may be any kind of computational or processing device capable of executing program instructions, codes, binary instructions and the like. The processor may be or include a signal processor, digital processor, embedded processor, microprocessor or any variant such as a co-processor (math co-processor, graphic co-processor, communication co-processor and the like) and the like that may directly or indirectly facilitate execution of program code or program instructions stored thereon. In addition, the processor may enable execution of multiple programs, threads, and codes. The threads may be executed simultaneously to enhance the performance of the processor and to facilitate simultaneous operations of the application. By way of implementation, methods, program codes, program instructions and the like described herein may be implemented in one or more thread. The thread may spawn other threads that may have assigned priorities associated with them; the processor may execute these threads based on priority or any other order based on instructions provided in the program code. The processor may include memory that stores methods, codes, instructions and programs as described herein and elsewhere. The processor may access a storage medium through an interface that may store methods, codes, and instructions as described herein and elsewhere. The storage medium associated with the processor for storing methods, programs, codes, program instructions or other type of instructions capable of being executed by the computing or processing device may include but may not be limited to one or more of a CD-ROM, DVD, memory, hard disk, flash drive, RAM, ROM, cache and the like.

A processor may include one or more cores that may enhance speed and performance of a multiprocessor. In embodiments, the process may be a dual core processor, quad core processors, other chip-level multiprocessor and the like that combine two or more independent cores (called a die).

The methods and systems described herein may be deployed in part or in whole through a machine that executes computer software on a server, client, firewall, gateway, hub, router, or other such computer and/or networking hardware. The software program may be associated with a server that may include a file server, print server, domain server, internet server, intranet server and other variants such as secondary server, host server, distributed server and the like. The server may include one or more of memories, processors, computer readable transitory and/or non-transitory media, storage media, ports (physical and virtual), communication devices, and interfaces capable of accessing other servers, clients, machines, and devices through a wired or a wireless medium, and the like. The methods, programs or codes as described herein and elsewhere may be executed by the server. In addition, other devices required for execution of methods as described in this application may be considered as a part of the infrastructure associated with the server.

The server may provide an interface to other devices including, without limitation, clients, other servers, printers, database servers, print servers, file servers, communication servers, distributed servers and the like. Additionally, this coupling and/or connection may facilitate remote execution of program across the network. The networking of some or all of these devices may facilitate parallel processing of a program or method at one or more location without deviating from the scope of the disclosure. In addition, all the devices attached to the server through an interface may include at least one storage medium capable of storing methods, programs, code and/or instructions. A central repository may provide program instructions to be executed on different devices. In this implementation, the remote repository may act as a storage medium for program code, instructions, and programs.

The software program may be associated with a client that may include a file client, print client, domain client, internet client, intranet client and other variants such as secondary client, host client, distributed client and the like. The client may include one or more of memories, processors, computer readable transitory and/or non-transitory media, storage media, ports (physical and virtual), communication devices, and interfaces capable of accessing other clients, servers, machines, and devices through a wired or a wireless medium, and the like. The methods, programs or codes as described herein and elsewhere may be executed by the client. In addition, other devices required for execution of methods as described in this application may be considered as a part of the infrastructure associated with the client.

The client may provide an interface to other devices including, without limitation, servers, other clients, printers, database servers, print servers, file servers, communication servers, distributed servers and the like. Additionally, this coupling and/or connection may facilitate remote execution of program across the network. The networking of some or all of these devices may facilitate parallel processing of a program or method at one or more location without deviating from the scope of the disclosure. In addition, all the devices attached to the client through an interface may include at least one storage medium capable of storing methods, programs, applications, code and/or instructions. A central repository may provide program instructions to be executed on different devices. In this implementation, the remote repository may act as a storage medium for program code, instructions, and programs.

The methods and systems described herein may be deployed in part or in whole through network infrastructures. The network infrastructure may include elements such as computing devices, servers, routers, hubs, firewalls, clients, personal computers, communication devices, routing devices and other active and passive devices, modules and/or components as known in the art. The computing and/or non-computing device(s) associated with the network infrastructure may include, apart from other components, a storage medium such as flash memory, buffer, stack, RAM, ROM and the like. The processes, methods, program codes, instructions described herein and elsewhere may be executed by one or more of the network infrastructural elements.

The methods, program codes, and instructions described herein and elsewhere may be implemented on a cellular network having multiple cells. The cellular network may either be frequency division multiple access (FDMA) network or code division multiple access (CDMA) network. The cellular network may include mobile devices, cell sites, base stations, repeaters, antennas, towers, and the like.

The methods, programs codes, and instructions described herein and elsewhere may be implemented on or through mobile devices. The mobile devices may include navigation devices, cell phones, mobile phones, mobile personal digital assistants, laptops, palmtops, netbooks, pagers, electronic books readers, music players and the like. These devices may include, apart from other components, a storage medium such as a flash memory, buffer, RAM, ROM and one or more computing devices. The computing devices associated with mobile devices may be enabled to execute program codes, methods, and instructions stored thereon. Alternatively, the mobile devices may be configured to execute instructions in collaboration with other devices. The mobile devices may communicate with base stations interfaced with servers and configured to execute program codes. The mobile devices may communicate on a peer to peer network, mesh network, or other communications network. The program code may be stored on the storage medium associated with the server and executed by a computing device embedded within the server. The base station may include a computing device and a storage medium. The storage device may store program codes and instructions executed by the computing devices associated with the base station.

The computer software, program codes, and/or instructions may be stored and/or accessed on machine readable transitory and/or non-transitory media that may include: computer components, devices, and recording media that retain digital data used for computing for some interval of time; semiconductor storage known as random access memory (RAM); mass storage typically for more permanent storage, such as optical discs, forms of magnetic storage like hard disks, tapes, drums, cards and other types; processor registers, cache memory, volatile memory, non-volatile memory; optical storage such as CD, DVD; removable media such as flash memory (e.g. USB sticks or keys), floppy disks, magnetic tape, paper tape, punch cards, standalone RAM disks, Zip drives, removable mass storage, off-line, and the like; other computer memory such as dynamic memory, static memory, read/write storage, mutable storage, read only, random access, sequential access, location addressable, file addressable, content addressable, network attached storage, storage area network, bar codes, magnetic ink, and the like.

The methods and systems described herein may transform physical and/or or intangible items from one state to another. The methods and systems described herein may also transform data representing physical and/or intangible items from one state to another.

The elements described and depicted herein, including in flow charts and block diagrams throughout the figures, imply logical boundaries between the elements. However, according to software or hardware engineering practices, the depicted elements and the functions thereof may be implemented on machines through computer executable transitory and/or non-transitory media having a processor capable of executing program instructions stored thereon as a monolithic software structure, as standalone software modules, or as modules that employ external routines, code, services, and so forth, or any combination of these, and all such implementations may be within the scope of the present disclosure. Examples of such machines may include, but may not be limited to, personal digital assistants, laptops, personal computers, mobile phones, other handheld computing devices, medical equipment, wired or wireless communication devices, transducers, chips, calculators, satellites, tablet PCs, electronic books, gadgets, electronic devices, devices having artificial intelligence, computing devices, networking equipment, servers, routers and the like. Furthermore, the elements depicted in the flow chart and block diagrams or any other logical component may be implemented on a machine capable of executing program instructions. Thus, while the foregoing drawings and descriptions set forth functional aspects of the disclosed systems, no particular arrangement of software for implementing these functional aspects should be inferred from these descriptions unless explicitly stated or otherwise clear from the context. Similarly, it will be appreciated that the various steps identified and described above may be varied, and that the order of steps may be adapted to particular applications of the techniques disclosed herein. All such variations and modifications are intended to fall within the scope of this disclosure. As such, the depiction and/or description of an order for various steps should not be understood to require a particular order of execution for those steps, unless required by a particular application, or explicitly stated or otherwise clear from the context.

The methods and/or processes described above, and steps thereof, may be realized in hardware, software or any combination of hardware and software suitable for a particular application. The hardware may include a dedicated computing device or specific computing device or particular aspect or component of a specific computing device. The processes may be realized in one or more microprocessors, microcontrollers, embedded microcontrollers, programmable digital signal processors or other programmable device, along with internal and/or external memory. The processes may also, or instead, be embodied in an application specific integrated circuit, a programmable gate array, programmable array logic, or any other device or combination of devices that may be configured to process electronic signals. It will further be appreciated that one or more of the processes may be realized as a computer executable code capable of being executed on a machine readable medium.

The computer executable code may be created using a structured programming language such as C, an object oriented programming language such as C++, or any other high-level or low-level programming language (including assembly languages, hardware description languages, and database programming languages and technologies) that may be stored, compiled or interpreted to run on one of the above devices, as well as heterogeneous combinations of processors, processor architectures, or combinations of different hardware and software, or any other machine capable of executing program instructions.

Thus, in one aspect, each method described above and combinations thereof may be embodied in computer executable code that, when executing on one or more computing devices, performs the steps thereof. In another aspect, the methods may be embodied in systems that perform the steps thereof, and may be distributed across devices in a number of ways, or all of the functionality may be integrated into a dedicated, standalone device or other hardware. In another aspect, the means for performing the steps associated with the processes described above may include any of the hardware and/or software described above. All such permutations and combinations are intended to fall within the scope of the present disclosure.

While the disclosure has been disclosed in connection with the preferred embodiments shown and described in detail, various modifications and improvements thereon will become readily apparent to those skilled in the art. Accordingly, the spirit and scope of the present disclosure is not to be limited by the foregoing examples, but is to be understood in the broadest sense allowable by law.

What is claimed is:

1. An aftertreatment system of a vehicle, comprising:

an electric heater device;

a power converter structured to provide power to the electric heater device, the power converter including at least one phase converter, each phase converter including:

a first plurality of switching devices coupled together in parallel; and a second plurality of switching devices coupled together in parallel, wherein the second plurality of switching devices is coupled in series with the first plurality of switching devices, and wherein a number of the first plurality of switching devices is different from a number of the second plurality of switching devices.

2. The aftertreatment system of claim 1, wherein the electric heater device includes a resistive heater.

3. The aftertreatment system of claim 1, wherein the number of the first plurality of switching devices is greater than the number of the second plurality of switching devices.

4. The aftertreatment system of claim 1, wherein a ratio of the number of the first plurality of switching devices to the number of the second plurality of switching devices is 2:1.

5. The aftertreatment system of claim 1, wherein each of the first plurality of switching devices and each of the second plurality of switching devices is a field effect transistor (FET).

6. The aftertreatment system of claim 1, further comprising a converter controller including a gate driver, wherein the gate driver is electrically coupled to gates of each of the first plurality of power switching devices and gates of each of the second plurality of power switching devices.

7. The aftertreatment system of claim 1, wherein:

each of the first plurality of switching devices are coupled together in parallel between an input terminal of the power converter and an output terminal of the power converter; and each of the second plurality of switching devices are coupled together in parallel between the output terminal and a ground.

8. The aftertreatment system of claim 7, wherein the power converter is structured to receive power having a first voltage at the input terminal, decrease the first voltage to a second voltage, and provide a converted power having the second voltage at the output terminal.

9. The aftertreatment system of claim 1, wherein the first plurality of power switching devices is coupled together in parallel between an input terminal of the power converter and an output terminal of the power converter, and wherein the second plurality of power switching devices is coupled together in parallel between the output terminal and a ground.

10. The aftertreatment system of claim 9, wherein the power converter is structured to receive power having a first voltage at the input terminal, decrease the first voltage to a second voltage, and provide converted power having the second voltage at the output terminal.

11. The aftertreatment system of claim 1, further comprising:

a converter controller structured to apply a first duty cycle to the first plurality of switching devices and a second duty cycle to the second plurality of switching devices.

12. The aftertreatment system of claim 11, wherein the controller applies the first duty cycle and the second duty cycle independently.

13. The aftertreatment system of claim 11, wherein the controller applies the first duty cycle and the second duty cycle such that the first plurality of switching devices is on when the second plurality of switching devices is off, and the first plurality of switching devices is off when the second plurality of switching devices is on.

14. The aftertreatment system of claim 11, wherein the first duty cycle is a 25% duty cycle and the second duty cycle is a 75% duty cycle.

15. The aftertreatment system of claim 14, wherein the number of the first plurality of switching devices is four, and the number of the second plurality of switching devices is two.

16. The aftertreatment system of claim 1, wherein the power converter includes a plurality of the phase converters.

17. The aftertreatment system of claim 16, wherein the power converter includes four or six of the phase converters.

18. The aftertreatment system of claim 16, wherein the power converter is structured to operate a subset of the plurality of phase converters in response to at least one of a converter condition or a condition of the electric heater device.

19. The aftertreatment system of claim 18, wherein:

the power converter is structured to operate the subset of the plurality of phase converters in response to the converter condition; and the converter condition is based on at least one of a current balance threshold or a ripple threshold.

20. The aftertreatment system of claim 18, wherein the power converter is structured to time shift a duty cycle for one phase converter of the plurality of phase converters relative to a duty cycle of another phase converter of the plurality of phase converters.

* * * * *